(12) United States Patent
Okada

(10) Patent No.: US 7,754,346 B2
(45) Date of Patent: Jul. 13, 2010

(54) ORGANIC ELECTROLUMINESCENT DEVICE

(75) Inventor: Hisashi Okada, Kanagawa (JP)

(73) Assignee: Fujifilm Corporation, Tokyo (JP)

(*) Notice: Subject to any disclaimer, the term of this patent is extended or adjusted under 35 U.S.C. 154(b) by 1258 days.

(21) Appl. No.: 11/269,816

(22) Filed: Nov. 9, 2005

(65) Prior Publication Data

US 2006/0222887 A1 Oct. 5, 2006

(30) Foreign Application Priority Data

Nov. 10, 2004 (JP) ............................. 2004-326225

(51) Int. Cl.
*H01L 51/54* (2006.01)
*C09K 11/06* (2006.01)

(52) U.S. Cl. ...................... 428/690; 428/917; 313/504; 313/506; 257/E51.044

(58) Field of Classification Search ........................ None
See application file for complete search history.

(56) References Cited

U.S. PATENT DOCUMENTS

| 6,303,238 | B1 | 10/2001 | Thompson et al. | |
| 6,653,564 | B2 | 11/2003 | Scheidle | |
| 2002/0074935 | A1* | 6/2002 | Kwong et al. | ............... 313/504 |
| 2005/0123788 | A1* | 6/2005 | Huo et al. | ................... 428/690 |
| 2006/0134461 | A1* | 6/2006 | Huo et al. | ................... 428/690 |

FOREIGN PATENT DOCUMENTS

| JP | 2002-313583 A | 10/2002 |
| JP | 2002-324673 A | 11/2002 |
| WO | WO 2004/108857 A1 * | 12/2004 |

* cited by examiner

*Primary Examiner*—Marie R. Yamnitzky
(74) *Attorney, Agent, or Firm*—Birch, Stewart, Kolasch & Birch, LLP.

(57) ABSTRACT

The invention provides an organic electroluminescent device including an organic compound layer provided between a pair of electrodes. The organic compound layer has at least a luminescent layer. The luminescent layer has at least a metal complex containing a tri- or higher-dentate ligand and plurality of host compounds. The metal complex is preferably a metal complex capable of obtaining light emission from a triplet exciton. The ligand of the metal complex is preferably chained or cyclic. Further, an ionization potential of the metal complex is preferably larger than a minimum value out of ionization potentials of the plurality of host compounds.

15 Claims, No Drawings

ORGANIC ELECTROLUMINESCENT DEVICE

CROSS-REFERENCE TO RELATED APPLICATION

This application claims priority under 35 USC 119 from Japanese Patent Application No. 2004-326225, the disclosure of which is incorporated by reference herein.

BACKGROUND OF THE INVENTION

The present invention relates to an organic electroluminescent device (hereinafter, also referred to as "organic EL device" or "luminescent device") which can emit light by the conversion of electric energy to light.

Description of the Related Art

Recently, research and development on various display devices have been conducted. In particular, organic electroluminescent devices (organic EL devices) have attracted attention because emission can be obtained with high luminance by driving at low voltage.

Luminescence efficiency improvements, savings in energy consumption, and improvements in driving durability by the use of organic EL devices have become of interest.

As technologies for improving the luminescence efficiency, devices which include octaethylporphine platinum complexes including cyclo tetra dentate ligands (see, for example U.S. Pat. No. 6,303,238 B1), and platinum complexes including bipyridine and phenanthroline straight chain tetra dentate ligands (see, for example U.S. Pat. No. 6,653,564 B1), have been disclosed. However, the devices disclosed in these patents do not have sufficient durability, and firer improvement is demanded.

Further, the use of many compounds as the host material for the luminescent layer, reduction of energy consumption and improvement in driving durability have been shown (see, for example, Japanese Patent Application Laid-Open (JP-A) Nos. 2002-313583 and 2002-324673). In these known technologies, a high luminescence efficiency has been shown to be obtainable, as the carrier introduced into the luminescent layer is trapped by the luminescent dopant, and caused to emit light on re-bonding.

However, since by this method a carrier is trapped by a luminescent dopant, the deterioration of the luminescent dopant by the carrier can not be avoided, and it is difficult to obtain sufficient driving durability.

Further more, from the perspective of energy consumption a reduction in the driving voltage is desirable, but conventional techniques have not been able to demonstrate sufficient voltage reduction, and an improvement of this aspect is required.

SUMMARY OF THE INVENTION

The current invention provides an organic EL device that is capable of producing superior emission characteristics and driving durability at a low driving voltage.

In the light of the above described circumstances the inventor has carried out diligent research and thereby found that by having a luminescent layer which includes metallic complexes with tri or above dentate ligands and includes multiple host materials, the above organic EL device producing increased emission efficiency and driving durability, possible at a low driving voltage, can be demonstrated. As a result of this, it has been discovered that superior effects can be obtained through the host materials used within the luminescent layer, and by making the energy levels of the luminescent dopant electron affinities and ionization potentials and the like within a certain range. In this way the invention was completed.

Namely, the present invention provides an organic electroluminescent device comprising an organic compound layer provided between a pair of electrodes, wherein: the organic compound layer comprises a luminescent layer, and the luminescent layer comprises: a metal complex containing a tri- or higher-dentate ligand; and a plurality of host compounds.

In one embodiment of the present invention, the metal complex is a metal complex capable of obtaining light emission from a triplet exciton.

In another embodiment of the present invention, the ligand of the metal complex is chained In another embodiment of the present invention, the ligand of the metal complex is cyclic.

In another embodiment of the present invention, the metal complex is represented by the following Formula (I).

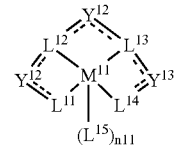

Formula (I)

In Formula (I), $M^{11}$ represents a metal ion; $L^{11}$ to $L^{15}$ each independently represent a ligand coordinated to $M^{11}$; in no case does an additional atomic group connect $L^{11}$ and $L^{14}$ to form a cyclic ligand; in no case, $L^{15}$ is bonded to both $L^{11}$ and $L^{14}$ to form a cyclic ligand; $Y^{11}$ to $Y^{13}$ each independently represent a connecting group, a single bond, or a double bond; when $Y^{11}$, $Y^{12}$, or $Y^{13}$ represent a connecting group, the bond between $L^{11}$ and $Y^{11}$, the bond between $Y^{12}$ and $L^{12}$, the bond between $L^{12}$ and $Y^{11}$, the bond between $Y^{11}$ and $L^{13}$, the bond between $L^{13}$ and $Y^{13}$, and the bond between $Y^{13}$ and $L^{14}$ are each independently a single bond or a double bond; and $n^{11}$ represents an integer of 0 to 4.

In another embodiment of the present invention, the metal complex is represented by the following Formula (II):

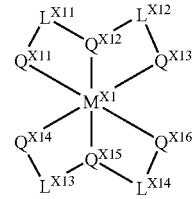

Formula (II)

In Formula (II), $M^{X1}$ represents a metal ion; $Q^{X11}$ to $Q^{X16}$ each independently represent an atom coordinating to $M^{X1}$ or an atomic group containing an atom coordinating to $M^{X1}$; $L^{X11}$ to $L^{X14}$ each independently represent a single bond, a double bond or a connecting group; the atomic group comprising $Q^{X11}$-$L^{X11}$-$Q^{X12}$-$L^{X12}$-$Q^{X13}$ and the atomic group comprising $Q^{X14}$-$L^{X13}$-$Q^{X15}$-$L^{X14}$-$Q^{X16}$ each independently form a tridentate ligand; and each of the bonds between $M^{X1}$ and each of $Q^{X11}$ to $Q^{X16}$ is independently a coordination bond or a covalent bond.

In another embodiment of the present invention, the metal complex is represented by the following Formula (III).

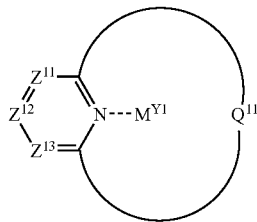

Formula (III)

In Formula (III), $Q^{11}$ represents an atomic group forming a nitrogen-containing heterocycle; $Z^{11}$, $Z^{12}$, and $Z^{13}$ each independently represent a substituted carbon atom, an unsubstituted carbon atom, a substituted nitrogen atom, or an unsubstituted nitrogen atom; and $M^{Y1}$ represents a metal ion that may have an additional ligand.

According to the present invention, an organic electroluminescent device that provides emission with high luminance and efficiency, driving at low voltage and driving durability can be obtained.

DETAILED DESCRIPTION OF THE INVENTION

Organic Electroluminescent Device

The organic electroluminescent device of the invention is characterized by having a pair of electrodes and at least one organic compound layer provided between the electrodes. The organic compound layer has at least one luminescent layer. The luminescent layer has at least a metal complex and plurality of host compounds. The metal complex contains a tri- or higher-dentate ligand.

The organic electroluminescent device of the invention is able to provide reduction of driving voltage, excellent emission efficiency and driving durability by having the above-described structure.

Metal Complex Having Tri- or Higher-dentate Ligand

Hereinafter, the metal complex having a tri- or higher-dentate ligand used in the invention will be described in detail.

The atom in the metal complex coordinating to the metal ion is not particularly limited. Preferable examples thereof include an oxygen atom, a nitrogen atom, a carbon atom, a sulfur atom or a phosphorus atom, more preferably an oxygen atom, a nitrogen atom or carbon atom, and still more preferable examples thereof include a nitrogen atom and a carbon atom.

The metal ion in the metal complex is not particularly limited. In view of improving emission efficiency and driving durability and reducing of driving voltage, the metal is preferably a transition metal ion or a rare earth metal ion. Examples thereof include an iridium ion, a platinum ion, a gold ion, a rhenium ion, a tungsten ion, a rhodium ion, a ruthenium ion, an osmium ion, a palladium ion, a silver ion, a copper ion, a cobalt ion, a zinc ion, a nickel ion, a lead ion, an aluminum ion, a gallium ion, a rare-earth metal ion (such as an europium ion, a gadolinium ion, or a terbium ion). More preferable examples thereof include an iridium ion, a platinum ion, a gold ion, a rhenium ion, a tungsten ion, a palladium ion, a zinc ion, an aluminum ion, a gallium ion, a europium loll, a gadolinium ion, and a terbium ion. When the metal complex is used as a luminescent material, preferable examples of the metal ion include an iridium ion, a platinum ion, a rhenium ion, a tungsten ion, a europium ion, a gadolinium ion, and a terbium ion. When the metal complex is used as a charge transfer material or a host material in a luminescent layer, preferable examples of the metal ion include an iridium ion, a platinum ion, a palladium ion, a zinc ion, an aluminum ion, and a gallium ion.

In view of improving emission efficiency and driving durability, the metal complex having a tri- or higher-dentate ligand used in the invention is preferably a metal complex having a tri- to hexa-dentate ligand. When a metal ion in the metal complex is selected from those which tend to form a six-coordinated complex (such as an iridium ion), the metal complex is more preferably that has a tri-, tetra- or hexa-dentate ligand. When a metal ion in the metal complex is selected from those which tend to form a four-coordinated complex (such as a platinum ion), the metal complex is more preferably that has a tri- or tetra-dentate ligand, and is still more preferably that has a tetra-dentate ligand.

In view of improving emission efficiency and driving durability, the ligand contained in the metal complex used in the invention is preferably a chained or cyclic, and preferably has at least one nitrogen-containing heterocycle (e.g., a pyridine ring, a quinoline ring, a pyrimidine ring, a pyrazine ring, a pyrrole ring, an imidazole ring, a pyrazole ring, an oxazole ring, an thiazole ring, an oxadiazole ring, a thiadiazole ring, a triazole ring, and the like) that coordinates to the central metal (e.g., $M^{11}$ in the compound represented by Formula (I) described below) via the nitrogen. The nitrogen-containing heterocycle is more preferably a nitrogen-containing six-membered heterocycle or a nitrogen-containing five-membered heterocycle. These heterocycles may condense with another ring to form a condensed ring.

The term "chained" used herein for the ligand contained in the metal complex described above refers to a structure of the ligand not encircling the central metal completely (e.g., terpyridyl ligand). The term "cyclic" used for the ligand contained in the metal complex refers to a closed structure of the ligand encircling the central metal (e.g., phthalocyanine or crown ether ligand).

When the ligand of the metal complex used in the invention is chained the metal complex is preferably a compound represented by Formula (I) or (II) described in detail below.

The compound represented by Formula (I) will be described first.

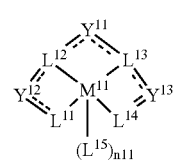

Formula (I)

In Formula (I), $M^{11}$ represents a metal ion; $L^{11}$ to $L^{15}$ each independently represent a ligand coordinated to $M^{11}$; in no case does an additional atomic group connect $L^{11}$ and $L^{14}$ to form a cyclic ligand; in no case, $L^{15}$ is bonded to both $L^{11}$ and $L^{14}$ to form a cyclic ligand; $Y^{11}$ to $Y^{13}$ each independently represent a connecting group, a single bond, or a double bond; when $Y^{11}$, $Y^{12}$, or $Y^{13}$ represent a connecting group, the bond between $L^{11}$ and $Y^{12}$, the bond between $Y^{12}$ and $L^{12}$, the bond between $L^{12}$ and $Y^{11}$, the bond between $Y^{11}$ and $L^{13}$, the bond between $L^{13}$ and $Y^{13}$, and the bond between $Y^{13}$ and $L^{14}$ are each independently a single bond or a double bond; and $n^{11}$ represents an integer of 0 to 4. Each of the bonds connecting $M^{11}$ and each of $L^{11}$ to $L^{15}$ may be selected from a coordinate bond, an ionic bond and a covalent bond.

Hereinafter, details of the compound represented by Formula (I) will be described.

In Formula (I), $M^{11}$ represents a metal ion. The metal ion is not particularly limited, but preferably a divalent or trivalent metal ion. Preferable examples of divalent or trivalent metal ion include a platinum ion, an iridium ion, a rhenium ion, a palladium ion, a rhodium ion, a ruthenium ion, a copper ion, a europium ion, a gadolinium ion, and a terbium ion. More preferable examples thereof include a platinum ion, an iridium ion, and a europium ion. Still more preferable examples thereof include a platinum ion and an iridium ion. Particularly preferable examples thereof include a platinum ion.

In Formula (I), $L^{11}$, $L^{12}$, $L^{13}$, and $L^{14}$ each independently represent a moiety coordinating to $M^{11}$. Preferable examples of the atom coordinating to $M^{11}$ contained in $L^{11}$, $L^{12}$, $L^{13}$, or $L^{14}$ include preferably a nitrogen atom, an oxygen atom, a sulfur atom, a carbon atom, and a phosphorus atom. More preferable examples thereof include a nitrogen atom, an oxygen atom, a sulfur atom, and a carbon atom. Still more preferable examples thereof include a nitrogen atom, an oxygen atom, and a carbon atom.

The bonds between $M^{11}$ and $L^{11}$, between $M^{11}$ and $L^{12}$, between $M^{11}$ and $L^{13}$, between $M^{11}$ and $L^{14}$ each may be independently selected from a covalent bond, an ionic bond, and a coordination bond. In this specification, the terms "ligand" and "coordinate" are used also when the bond between the central metal and the ligand is a bond (an ionic bond or a covalent bond) other than a coordination bond, as well as when the bond between the central metal and the ligand is a coordination bond, for convenience of the explanation.

The entire ligand comprising $L^{11}$, $Y^{12}$, $L^{12}$, $Y^{11}$, $L^{13}$, $Y^{13}$, and $L^{14}$ is preferably an anionic ligand. The term "anionic ligand" used herein refers to a ligand having at least one anion bonded to the metal. The number of anions in the anionic ligand is preferably 1 to 3, more preferably 1 or 2, and still more preferably 2.

When the moiety represented by any of $L^{11}$, $L^{12}$, $L^{13}$, and $L^{14}$ coordinates to $M^{11}$ via a carbon atom, the moiety is not particularly limited, and examples thereof include imino ligands, aromatic carbon ring ligands (e.g., a benzene ligand, a naphthalene ligand, an anthracene ligand, and a phenanthrene ligand), and heterocyclic ligands [e.g., a thiophene ligand, a pyridine ligand, a pyrazine ligand, a pyrimidine ligand, a thiazole ligand, an oxazole ligand, a pyrrole ligand, an imidazole ligand, and a pyrazole ligand, ring-condensation products thereof (e.g., a quinoline ligand and a benzothiazole ligand), and tautomers thereof].

When the moiety represented by any of $L^{11}$, $L^{12}$, $L^{13}$, and $L^{14}$ coordinates to $M^{11}$ via a nitrogen atom, the moiety is not particularly limited, and examples thereof include nitrogen-containing heterocyclic ligands such as a pyridine ligand, a pyrazine ligand, a pyrimidine ligand, a pyridazine ligand, a triazine ligand, a thiazole ligand, an oxazole ligand, a pyrrole ligand, an imidazole ligand, a pyrazole ligand, a triazole ligand, an oxadiazole ligand, and a thiadiazole ligand, and ring-condensation products thereof (e.g., a quinoline ligand, a benzoxazole ligand, and a benzimidazole ligand), and tautomers thereof [in the invention, the following ligands (pyrrole tautomers) are also included in tautomers, in addition to normal isomers: the five-membered heterocyclic ligand of compound (24), the terminal five-membered heterocyclic ligand of compound (64), and the five-membered heterocycle ligand of compound (145), the compounds (24), (64), (145) being shown below as typical examples of the compound represented by formula (I)]; amino ligands such as alkylamino ligands (preferably having 2 to 30 carbon atoms, more preferably 2 to 20 carbon atoms, and particularly preferably 2 to 10 carbon atoms, such as methylamino), arylamino ligands (e.g., and phenylamino), acylamino ligands (preferably having 2 to 30 carbon atoms, more preferably 2 to 20 carbon atoms, and particularly preferably 2 to 10 carbon atoms, such as acetylamino and benzoylamino), alk-oxycarbonylamino ligands (preferably having 2 to 30 carbon atoms, more preferably 2 to 20 carbon atoms, and particularly preferably 2 to 12 carbon atoms, such as methoxycarbonylamino), aryloxycarbonylamino ligands (preferably having 7 to 30 carbon atoms, more preferably 7 to 20 carbon atoms, and particularly preferably 7 to 12 carbon atoms, such as phenyloxycarbonylamino), sulfonylamino ligands (preferably having 1 to 30 carbon atoms, more preferably 1 to 20 carbon atoms, and particularly preferably 1 to 12 carbon atoms, such as methanesulfonylamino and benzenesulfonylamino), and imino ligands. These ligands may be substituted.

When the moiety represented by any of $L^{11}$, $L^{12}$, $L^{13}$, and $L^{14}$ coordinates to $M^{11}$ via an oxygen atom, the moiety is not particularly limited, and examples thereof include alkoxy ligands (preferably having 1 to 30 carbon atoms, more preferably 1 to 20 carbon atoms, and particularly preferably 1 to 10 carbon atoms, such as methoxy, ethoxy, butoxy, and 2-ethylhexyloxy), aryloxy ligands (preferably having 6 to 30 carbon atoms, more preferably 6 to 20 carbon atoms, and particularly preferably 6 to 12 carbon atoms, such as phenyloxy, 1-naphthyloxy, and 2-naphthyloxy), heterocyclic oxy ligands (preferably having 1 to 30 carbon atoms, more preferably 1 to 20 carbon atoms, and particularly preferably 1 to 12 carbon atoms, such as pyridyloxy, pyrazyloxy, pyrimidyloxy, and quinolyloxy), acyloxy ligands (preferably having 2 to 30 carbon atoms, more preferably 2 to 20 carbon atoms, and particularly preferably 2 to 10 carbon atoms, such as acetoxy and benzoyloxy), silyloxy ligands (preferably having 3 to 40 carbon atoms, more preferably 3 to 30 carbon atoms, and particularly preferably 3 to 24 carbon atoms, such as trimethylsilyloxy and triphenylsilyloxy), carbonyl ligands (e.g., ketone ligands, ester ligands, and amido ligands), and ether ligands (e.g., dialkylether ligands, diarylether ligands, and furyl ligands).

When the moiety represented by any of $L^{11}$, $L^{12}$, $L^{13}$, and $L^{14}$ coordinates to $M^{11}$ via a sulfur atom, the moiety is not particularly limited, and examples thereof include alkylthio ligands (preferably having 1 to 30 carbon atoms, more preferably 1 to 20 carbon atoms, and particularly preferably 1 to 12 carbon atoms, such as methylthio and ethylthio), arylthio ligands (preferably having 6 to 30 carbon atoms, more preferably 6 to 20 carbon atoms, and particularly preferably 6 to 12 carbon atoms, such as phenylthio), heterocyclic thio ligands (preferably having 1 to 30 carbon atoms, more preferably 1 to 20 carbon atoms, and particularly preferably 1 to 12 carbon atoms, such as pyridylthio, 2-benzimidazolylthio, 2-benzoxazolylthio, and 2-benzothiazolylthio), thiocarbonyl ligands (e.g., thioketone ligands and thioester ligands), and thioether ligands (e.g., dialkylthioether ligands, diarylthioether ligands, and thiofuryl ligands). These substitution ligands may respectively have a substitutent.

When the moiety represented by any of $L^{11}$, $L^{12}$, $L^{13}$, and $L^{14}$ coordinates to $M^{11}$ via a phosphorus atom, the moiety is not particularly limited, and examples thereof include dialkylphosphino groups, diarylphosphino groups, trialkylphosphine groups, triarylphosphine groups, phosphinine groups and the like. These groups may respectively have a substituent In a preferable embodiment, $L^{11}$ and $L^{14}$ each independently represent a moiety selected from an aromatic carbon ring ligand, an alkyloxy ligand, an aryloxy ligand, an ether ligand, an alkylthio ligand, an arylthio ligand, an alkylamino ligand, an arylamino ligand, an acylamino ligand, or a nitrogen-containing heterocyclic ligand [e.g., a pyridine ligand, a pyrazine ligand, a pyrimidine ligand, a pyridazine ligand, a triazine ligand, a thiazole ligand, an oxazole ligand, a pyrrole ligand, an imidazole ligand, a pyrazole ligand, a triazole ligand, an oxadiazole ligand, a thiadiazole ligand, or a condensed ring ligand containing one or more of the above ligands (e.g., a quinoline ligand, a benzoxazole ligand, or a benzimidazole ligand), or a tautomer of any of the above ligands]; more preferably, an aromatic carbon ring ligand, an aryloxy ligand, an arylthio ligand, an arylamino ligand, a pyridine ligand, a pyrazine ligand, an imidazole ligand, a condensed ring ligand containing one or more of the above ligands (e.g., a quinoline ligand, a quinoxaline ligand, or a benzimidazole ligand), or a tautomer of any of the above ligands; still more preferably, an aromatic carbon ring ligand or an aryloxy ligand, an arylthio ligand, or an arylamino ligand; and particularly preferably, an aromatic carbon ring ligand or an aryloxy ligand.

In a preferable embodiment, $L^{12}$ and $L^{13}$ each independently represent a moiety forming a coordination bond with $M^{11}$. The moiety forming a coordination bond with $M^{11}$ is preferably a pyridine, pyrazine, pyrimidine, triazine, thiazole, oxazole, pyrrole or triazole ring, a condensed ring containing one or more of the above rings (e.g., a quinoline ring, a benzoxazole ring, a benzimidazole ring, an indolenine ring), or a tautomer of any of the above rings; more preferably a pyridine, pyrazine, pyrimidine, or pyrrole ring, a condensed ring containing one or more of the above rings (e.g., a quinoline ring, a benzopyrrole ring), or a tautomer of any of the above rings; still more preferably a pyridine, pyrazine or pyrimidine ring, or a condensed ring containing one or more of the above rings (e.g., quinoline ring); particularly preferably a pyridine ring or a condensed ring containing a pyridine ring (e.g., a quinoline ring).

In Formula (I), $L^{15}$ represents a ligand coordinating to $M^{11}$. $L^{15}$ is preferably a monodentate to tetradentate ligand and more preferably a monodentate to tetradentate anionic ligand. The monodentate to tetradentate anionic ligand is not particularly limited, but is preferably a halogen ligand, a 1,3-diketone ligand (e.g., an acetylacetone ligand), a monoanionic bidentate ligand containing a pyridine ligand [e.g., a picolinic acid ligand or a 2-(2-hydroxyphenyl)-pyridine ligand], or a tetradentate ligand $L^{11}$, $Y^{12}$, $L^{12}$, $Y^{11}$, $L^{13}$, $Y^{13}$, and $L^{14}$ can form; more preferably, a 1,3diketone ligand (e.g., an acetylacetone ligand), a monoanionic bidentate ligand containing a pyridine ligand [e.g., a picolinic acid ligand or a 2-(2-hydroxyphenyl)-pyridine ligand], or a tetradentate ligand $L^{11}$, $Y^{12}$, $L^{12}$, $Y^{11}$, $L^{13}$, $Y^{13}$, and $L^{14}$ can form; still more preferably, a 1,3-diketone ligand (e.g., an acetylacetone ligand) or a monoanionic bidentate ligand containing a pyridine ligand [e.g., a picolinic acid ligand or a 2-(2-hydroxyphenyl)-pyridine ligand]; and particularly preferably, a 1,3diketone ligand (e.g., an acetylacetone ligand). The number of coordination sites and the number of ligands do not exceed the valency of the metal. $L^{15}$ does not bind to both $L^{11}$ and $L^{14}$ to form a cyclic ligand.

In Formula (I), $Y^{11}$, $Y^{12}$ and $Y^{13}$ each independently represent a connecting group or a single or double bond. The connecting group is not particularly limited, and examples thereof include a carbonyl connecting group, a thiocarbonyl connecting group, an alkylene group, an alkenylene group, an arylene group, a heteroarylene group, a connecting group which connects moieties via an oxygen atom, a nitrogen atom, a silicon atom or a sulfur atom, and connecting groups comprising combinations of connecting groups selected from the above. When $Y^{11}$ is a connecting group, the bond between $L^{12}$ and $Y^{11}$ and the bond between $Y^{11}$ and $L^{13}$ are each independently a single or double bond. When $Y^{12}$ is a connecting group, the bond between $L^{11}$ and $Y^{12}$ and the bond between $Y^{12}$ and $L^{12}$ are each independently a single or double bond. When $Y^{13}$ is a connecting group, the bond between $L^{13}$ and $Y^{13}$ and the bond between $Y^{13}$ and $L^{14}$ are each independently a single or double bond.

Specific examples of the connecting group include the following connecting groups.

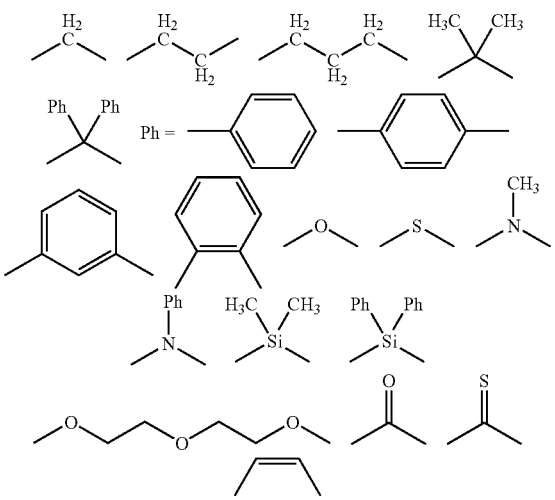

Preferably, $Y^{11}$, $Y^{12}$, and $Y^{13}$ each independently represent a single bond, a double bond, a carbonyl connecting group, an alkylene connecting group, or an alkenylene group. $Y^{11}$ is more preferably a single bond or an alkylene group, and still more preferably an alkylene group. Each of $Y^{12}$ and $Y^{13}$ is more preferably a single bond or an alkenylene group and still more preferably a single bond.

The ring formed by $Y^{12}$, $L^{11}$, $L^{12}$, and $M^{11}$, the ring formed by $Y^{11}$, $L^{12}$, $L^{13}$, and $M^{11}$, and the ring formed by $Y^{13}$, $L^{13}$, $L^{14}$, and $M^{11}$ are each preferably a four- to ten-membered ring, more preferably a five- to seven-membered ring, and still more preferably a five- to six-membered ring.

In Formula (I), $n^{11}$ represents an integer of 0 to 4. When $M^{11}$ is a tetravalent metal, $n^{11}$ is 0. When $M^{11}$ is a hexavalent metal, $n^{11}$ is preferably 1 or 2 and more preferably 1. When $M^{11}$ is a hexavalent metal and $n^{11}$ is 1, $L^{15}$ represents a bidentate ligand. When $M^{11}$ is a hexavalent metal and $n^{11}$ is 2, $L^{15}$ represents a monodentate ligand. When $M^{11}$ is an octavalent metal, $n^{11}$ is preferably 1 to 4, more preferably, 1 or 2, and still more preferably 1. When $M^{11}$ is an octavalent metal and $n^{11}$ is 1, $L^{15}$ represents a tetradentate ligand. When $M^{11}$ is an octavalent metal and $n^{11}$ is 2, $L^{15}$ represents a bidentate ligand. When $n^{11}$ is 2 or larger, there are plural $L^{15}$'s, and the $L^{15}$'s may be the same as or different from each other.

Preferable embodiments of the compound represented by Formula (I) include compounds represented by the following Formulae (1), (2), (3) or (4).

Firstly, explanation of the compound represented by Formula (1) is provided.

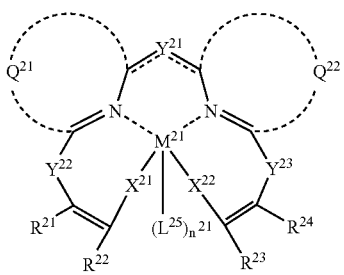

Formula (1)

In Formula (1), $M^{21}$ represents a metal ion; and $Y^{21}$ represents a connecting group or a single or double bond. $Y^{23}$ and $Y^{23}$ each represent a single bond or a connecting group. $Q^{21}$ and $Q^{22}$ each represent an atomic group forming a nitrogen-containing heterocycle, and the bond between $Y^{21}$ and the ring containing $Q^{21}$ and the bond between $Y^{21}$ and the ring containing $Q^{22}$ are each a single or double bond. $X^{21}$ and $X^{22}$ each independently represent an oxygen atom, a sulfur atom, or a substituted or unsubstituted nitrogen atom. $R^{21}$, $R^{22}$, $R^{23}$, and $R^{24}$ each independently represent a hydrogen atom or a substituent. $R^{21}$ and $R^{22}$ may bind to each other to form a ring, and $R^{23}$ and $R^{24}$ may bind to each other to form a ring. $L^{25}$ represents a ligand coordinating to $M^{21}$, and $n^{21}$ represents an integer of 0 to 4.

The compound represented by formula (1) will be described in detail.

In Formula (1), the definition of $M^{21}$ is the same as the definition of $M^{11}$ in Formula (I), and their preferable ranges are also similar.

$Q^{21}$ and $Q^{22}$ each independently represent an atomic group forming a nitrogen-containing heterocycle (ring containing a nitrogen atom coordinating to $M^{21}$). The nitrogen-containing heterocycles formed by $Q^{21}$ and $Q^{22}$ are not particularly limited, and may be selected, for example, from a pyridine ring, a pyrazine ring, a pyrimidine ring, a triazine ring, a thiazole ring, an oxazole ring, a pyrrole ring, an imidazole ring, and a triazole ring, and condensed rings containing one or more of the above rings (e.g., a quinoline ring, a benzoxazole ring, a benzimidazole ring, a benzthiazole ring, an indole ring, and an indolenine ring), and tautomers thereof $X^{21}$ and $X^{22}$ each independently represent an oxygen atom, a sulfur atom, or a substituted or unsubstituted nitrogen atom. $X^{21}$ and $X^{22}$ are each preferably an oxygen atom, a sulfur atom, or a substituted nitrogen atom, more preferably an oxygen atom or a sulfur atom, and particularly preferably an oxygen atom.

The definition of $Y^{21}$ is the same as that of $Y^{11}$ in Formula (I), and their preferable ranges are also similar.

$Y^{22}$ and $Y^{23}$ each independently represent a single bond or a connecting group, preferably a single bond. The connecting group is not particularly limited, and examples thereof include a carbonyl connecting group, a thiocarbonyl connecting group, an alkylene group, an alkenylene group, an arylene group, a heteroarylene group, connecting groups which connects moieties via an oxygen atom, a nitrogen atom or a silicon atom, and connecting groups comprising combinations of connecting groups selected from the above.

The connecting group represented by $Y^{22}$ or $Y^{23}$ is preferably a carbonyl connecting group, an alkylene connecting group, or an alkenylene connecting group, more preferably a carbonyl connecting group or an alkenylene connecting group, and still more preferably a carbonyl connecting group.

$R^{21}$, $R^{22}$, $R^{23}$, and $R^{24}$ each independently represent a hydrogen atom or a substituent. The substituent is not particularly limited, and examples thereof include alkyl groups (preferably having 1 to 30 carbon atoms, more preferably 1 to 20 carbon atoms, and particularly preferably 1 to 10 carbon atoms, and examples thereof include a methyl group, an ethyl group, an isopropyl group, a tert-butyl group, a n-octyl group, a n-decyl group, a n-hexadecyl group, a cyclopropyl group, a cyclopentyl group, and a cyclohexyl group), alkenyl groups preferably having 2 to 30 carbon atoms, more preferably 2 to 20 carbon atoms, and particularly preferably 2 to 10 carbon atoms, and examples thereof include a vinyl group, an allyl group, a 2-butenyl group, and a 3-pentenyl group), alkynyl groups (preferably having 2 to 30 carbon atoms, more preferably 2 to 20 carbon atoms, and particularly preferably 2 to 10 carbon atoms, and examples thereof include a propargyl group and a 3-pentynyl group), aryl groups (preferably having 6 to 30 carbon atoms, more preferably 6 to 20 carbon atoms, and particularly preferably 6 to 12 carbon atoms, and examples thereof include a phenyl group, a p-methylphenyl group, a naphthyl group, and an anthranyl group), amino groups (preferably having 0 to 30 carbon atoms, more preferably 0 to 20 carbon atoms, and particularly preferably 0 to 10 carbon atoms, and examples thereof include an amino group, a, methylamino group, a dimethylamino group, a diethylamino group, a dibenzylamino group, a diphenylamino group, and a ditolylaamino group), alkoxy groups (preferably having 1 to 30 carbon atoms, more preferably 1 to 20 carbon atoms, and particularly preferably 1 to 10 carbon atoms, and examples thereof include a methoxy group, a ethoxy group, a butoxy group, and a 2-ethylbexyloxy group), aryloxy groups (preferably having 6 to 30 carbon atoms, more preferably 6 to 20 carbon atoms, and particularly preferably 6 to 12 carbon atoms, and examples thereof include a phenyloxy group, a 1-naphthyloxy group, and a 2-naphthyloxy group), heterocyclic oxy groups (preferably having 1 to 30 carbon atoms, more preferably 1 to 20 carbon atoms, and particularly preferably 1 to 12 carbon atoms, and examples thereof include a pyridyloxy group, a pyrazloxy group, a pyrimidyloxy group, and a quinolyloxy group), acyl groups (preferably having 1 to 30 carbon atoms, more preferably 1 to 20 carbon atoms, and particularly preferably 1 to 12 carbon atoms, and examples thereof include a acetyl group, a benzoyl group, a formyl group, and a pivaloyl group), alkoxycarbonyl groups (preferably having 2 to 30 carbon atoms, more preferably 2 to 20 carbon atoms, and particularly preferably 2 to 12 carbon atoms, and examples thereof include a methoxycarbonyl group and an ethoxycarbonyl group), aryloxycarbonyl groups (preferably having 7 to 30 carbon atoms, more preferably 7 to 20 carbon atoms, and particularly preferably 7 to 12 carbon atoms, and examples thereof include a phenyloxycarbonyl group), acyloxy groups (preferably having 2 to 30 carbon atoms, more preferably 2 to 20 carbon atoms, and particularly preferably 2 to 10 carbon atoms, and examples thereof include an acetoxy group and a benzoyloxy group), acylamino groups (preferably having 2 to 30 carbon atoms, more preferably 2 to 20 carbon atoms, and particularly preferably 2 to 10 carbon atoms, and examples thereof include an acetylamino group and a benzoylamino group), alkoxycarbonylamino groups (preferably having 2 to 30 carbon atoms, more preferably 2 to 20 carbon atoms, and particularly preferably 2 to 12 carbon atoms, and examples thereof include a methoxycarbonylamino group), aryloxycarbonylamino groups (preferably having 7 to 30 carbon atoms, more preferably 7 to 20 carbon atoms, and particularly preferably 7 to 12 carbon atoms, and examples thereof include a phenyloxycarbonylamino group), sulfonylamino groups (preferably having 1 to 30 carbon atoms, more preferably 1 to 20 carbon atoms, and particularly preferably 1 to 12 carbon atoms, and examples thereof include a methanesulfonylamino group and a benzenesulfonylamino group), sulfamoyl groups (preferably having 0 to 30 carbon atoms, more preferably 0 to 20 carbon atoms, and particularly preferably 0 to 12 carbon atoms, and examples thereof include a sulfamoyl group, a methylsulfamoyl group, a dimethylsulfamoyl group, and a phenylsulfamoyl group), carbamoyl groups (preferably having 1 to 30 carbon atoms, more preferably 1 to 20 carbon atoms, and particularly preferably 1 to 12 carbon atoms, and examples thereof include a carbamoyl group, a methylcarbamoyl group, a diethylcarbamoyl group, and a phenylcarbamoyl group), alkylthio groups (preferably having 1 to 30 carbon atoms, more preferably 1 to 20 carbon atoms, and particularly preferably 1 to 12 carbon atoms, and examples thereof include a methylthio group and an ethylthio group), arylthio groups (preferably having 6 to 30 carbon atoms, more preferably 6 to 20 carbon atoms, and particularly preferably 6 to 12 carbon atoms, and examples thereof include a phenylthio group), heterocyclic thio groups (preferably having 1 to 30 carbon atoms, more preferably 1 to 20 carbon atoms, and particularly preferably 1 to 12 carbon atoms, and examples thereof include a pyridylthio group, a 2-benzimidazolylthio group, a 2-benzoxazolylthio group, and a 2-benzothiazolylthio group), sulfonyl groups (preferably having 1 to 30 carbon atoms, more preferably 1 to 20 carbon atoms, and particularly preferably 1 to 12 carbon atoms, and examples thereof include a mesyl group and a tosyl group), sulfinyl groups (preferably having 1 to 30 carbon atoms, more preferably 1 to 20 carbon atoms, and particularly preferably 1 to 12 carbon atoms, and examples thereof include a methanesulfinyl group and a benzenesulfinyl group), ureido groups (preferably having 1 to 30 carbon atoms, more preferably 1 to 20 carbon atoms, and particularly preferably 1 to 12 carbon atoms, and examples thereof include a ureido group, a methylureido group, and a phenylureido group), phosphoric amide groups (preferably having 1 to 30 carbon atoms, more preferably 1 to 20 carbon atoms, and particularly preferably 1 to 12 carbon atoms, and examples thereof include a diethylphosphoric amide group and a phenylphosphoric amide group), a hydroxy group, a mercapto group, halogen atoms (such as fluorine, chlorine, bromine, or iodine), a cyano group, a sulfo group, a carboxyl group, a nitro group, a hydroxamic acid group, sulfino groups, hydrazino groups, imino groups, heterocyclic groups (preferably having 1 to 30 carbon atoms and more preferably 1 to 12 carbon atoms; the heteroatom(s) may be selected from nitrogen, oxygen, and sulfur atoms), and examples thereof include an imidazolyl group, a pyridyl group, a quinolyl group, a furyl group, a thienyl group, a piperidyl group, a morpholino group, a benzoxazolyl group, a benzimidazolyl group, a benzothiazolyl group, a carbazolyl group, and an azepinyl group), silyl groups (preferably having 3 to 40 carbon atoms, more preferably 3 to 30 carbon atoms, and particularly preferably 3 to 24 carbon atoms, and examples thereof include a trimethylsilyl group and a triphenylsilyl group), and silyloxy groups (preferably having 3 to 40 carbon atoms, more preferably 3 to 30 carbon atoms, and particularly preferably 3 to 24 carbon atoms, and examples thereof include a trimethylsilyloxy group and a triphenylsilyloxy group). These substituents may have a substitutent(s).

In a preferable embodiment, $R^{21}$, $R^{22}$, $R^{23}$, and $R^{24}$ are each independently selected from alkyl groups or aryl groups.

In another preferable embodiment, $R^{21}$ and $R^{22}$ are groups that bind to each other to form a ring structure (e.g., a benzo-condensed ring or a pyridine-condensed ring), and/or $R^{23}$ and $R^{24}$ are groups that bind to each other to form a ring structure or ring structures (e.g., a benzo-condensed ring or a pyridine-condensed ring). In a more preferable embodiment, $R^{21}$ and $R^{22}$ are groups that bind to each other to form a ring structure (e.g., a benzo-condensed ring or a pyridine-condensed ring), and/or $R^{23}$ and $R^{24}$ are groups that bind to each other to form a ring structure or ring structures (e.g., a benzo-condensed ring or a pyridine-condensed ring).

The definition of $L^{25}$ is similar to that of $L^{15}$ in Formula (I), and their preferable ranges are also similar.

The definition of $n^{21}$ is similar to that of $n^{11}$ in Formula (I), and their preferable ranges are also similar.

In Formula (1), examples of preferable embodiments are described below:

(1) the rings formed by $Q^{21}$ and $Q^{22}$ are pyridine rings, and $Y^{21}$ is a connecting group;

(2) the rings formed by $Q^{21}$ and $Q^{22}$ are pyridine rings, $Y^{21}$ is a single or double bond, and $X^{21}$ and $X^{22}$ are selected from sulfur atoms, substituted nitrogen atoms, and unsubstituted nitrogen atom;

(3) the rings formed by $Q^{21}$ and $Q^{22}$ are each a five-membered nitrogen-containing heterocycle, or a nitrogen-containing six-membered ring containing two or more nitrogen atoms.

Preferable examples of compounds represented by Formula (1) are compounds represented by the following Formula (1-A).

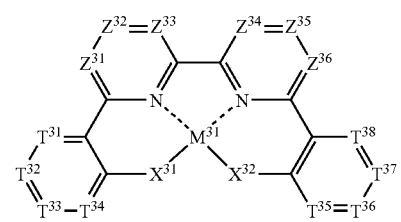

Formula (1-A)

The compound represented by Formula (1-A) will be described below.

In Formula (1-A), the definition of $M^{31}$ is similar to that of $M^{11}$ in Formula (I), and their preferable ranges are also similar.

$Z^{31}$, $Z^{32}$, $Z^{33}$, $Z^{34}$, $Z^{35}$, and $Z^{36}$ each independently represent a substituted or unsubstituted carbon or nitrogen atom, and preferably a substituted or unsubstituted carbon atom. The substituent on the carbon may be selected from the substituents described as examples of $R^{21}$ in Formula (1). $Z^{31}$ and $Z^{32}$ may be bonded to each other via a connecting group to form a condensed ring (e.g., a benzo-condensed ring or a pyridine-condensed ring). $Z^{32}$ and $Z^{33}$ may be bonded to each other via a connecting group to form a condensed ring (e.g., a benzo-condensed ring or a pyridine-condensed ring). $Z^{33}$ and $Z^{34}$ may be bonded to each other via a connecting group to form a condensed ring (e.g., a benzo-condensed ring or a pyridine-condensed ring). $Z^{34}$ and $Z^{35}$ may be bonded to each other via a connecting group to form a condensed ring (e.g., a benzo-condensed ring or a pyridine-condensed ring). $Z^{35}$ and $Z^{36}$ may be bonded to each other via a connecting group to form a condensed Ting (e.g., a benzo-condensed ring or a pyridine-condensed ring). $Z^{31}$ and $T^{31}$ may be bonded to each other via a connecting group to form a condensed ring (e.g., a benzo-condensed ring or a pyridine-condensed ring). $Z^{36}$ and $T^{38}$ may be bonded to each other via a connecting group to form a condensed ring (e.g., a benzo-condensed ring or a pyridine-condensed ring).

The substituent on the carbon is preferably an alkyl group, an alkoxy group, an alkylamino group, an aryl group, a group capable of forming a condensed ring (e.g., a benzo-condensed ring or a pyridine-condensed ring), or a halogen atom, more preferably an alkylamino group, an aryl group, or a group capable of forming a condensed ring (e.g., a benzocondensed ring or a pyridine-condensed ring), still more preferably an aryl group or a group capable of forming a condensed ring (e.g., a benzo-condensed ring or a pyridine-condensed ring), and particularly preferably a group capable of forming a condensed ring (e.g., a benzo-condensed ring or a pyridine-condensed ring).

$T^{31}$, $T^{32}$, $T^{33}$, $T^{34}$, $T^{35}$, $T^{37}$, and $T^{38}$ each independently represent a substituted or unsubstituted carbon or nitrogen atom, and more preferably a substituted or unsubstituted carbon atom. Examples of the substituents on the carbon include the groups described as examples of $R^{21}$ in formula (1); $T^{31}$ and $T^{32}$ may be bonded to each other via a connecting group to form a condensed ring (e.g., a benzo-condensed ring or a pyridine-condensed ring). $T^{32}$ and $T^{33}$ may be bonded to each other via a connecting group to form a condensed ring (e.g., a benzo-condensed ring or a pyridine-condensed ring). $T^{33}$ and $T^{34}$ may be bonded to each other via a connecting group to form a condensed ring (e.g., a benzo-condensed ring or a pyridine-condensed ring). $T^{35}$ and $T^{36}$ may be bonded to each other via a connecting group to form a condensed ring (e.g., a benzo-condensed ring or a pyridine-condensed ring). $T^{36}$ and $T^{37}$ may be bonded to each other via a connecting group to form a condensed zing (e.g., a benzo-condensed ring or a pyridine-condensed ring). $T^{37}$ and $T^{33}$ may be bonded to each other via a connecting group to form a condensed ring (e.g., a benzo-condensed ring or a pyridine-condensed ring).

The substituent on the carbon is preferably an alkyl group, an alkoxy group, an alkylamino group, an aryl group, a group capable of forming a condensed ring (e.g., a benzo-condensed ring or a pyridine-condensed ring), or a halogen atom; more preferably an aryl group, a group capable of forming a condensed ring (e.g., a benzo-condensed ring or pyridine-condensed ring), or a halogen atom; still more preferably an aryl group Or a halogen atom, and particularly preferably an aryl group.

The definitions and preferable ranges of $X^{31}$ and $X^{32}$ are similar to the definitions and preferable ranges of $X^{21}$ and $X^{22}$ in Formula (1), respectively.

The compound represented by Formula (2) will be described below.

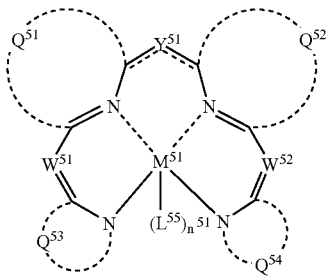

Formula (2)

In Formula (2), the definition of $M^{51}$ is similar to that of $M^{11}$ in Formula (I), and their preferable ranges are also similar.

The definitions of $Q^{51}$ and $Q^{52}$ are similar to the definitions of $Q^{21}$ and $Q^{22}$ in Formula (1), and their preferable ranges are also similar.

$Q^{53}$ and $Q^{54}$ each independently represent a group forming a nitrogen-containing heterocycle (ring containing a nitrogen atom coordinating to $M^{51}$). The nitrogen-containing heterocycles formed by $Q^{53}$ and $Q^{54}$ are not particularly limited, and are preferably selected from tautomers of pyrrole compounds, tautomers of imidazole compounds (e.g., the five-membered heterocyclic ligand contained in the compound (29) shown below as a specific example of the compound represented by Formula (I)), tautomers of thiazole compounds (e.g., the five-membered heterocyclic ligand contained in the compound (30) shown below as a specific example of the compound represented by Formula (I)), and tautomers of oxazole compounds (e.g., the five-membered heterocyclic ligand contained in the compound (31) shown below as a specific example of the compound represented by Formula (I)), more preferably selected from tautomers of pyrrole, imidazole, and thiazole compounds; still more preferably selected from tautomers of pyrrole and imidazole compounds; and particularly preferably selected from tautomers of pyrrole compounds, The definition of $Y^{51}$ is similar to that of $Y^{11}$ in Formula (I), and their preferable range are also the same.

The definition of $L^{55}$ is similar to that of $L^{15}$ in Formula (I), and their preferable ranges are also similar.

The definition of $n^{51}$ is similar to that of $n^{11}$, and their preferable ranges are also similar.

$W^{51}$ and $W^{52}$ each independently represent a substituted or unsubstituted carbon or nitrogen atom, more preferably an unsubstituted carbon or nitrogen atom, and still more preferably an unsubstituted carbon atom.

The compound represented by Formula (3) will be described below.

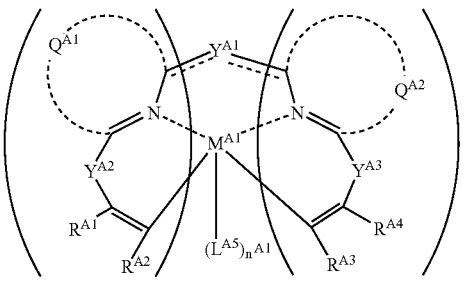

Formula (3)

In Formula (3), the definitions and preferable ranges of $M^{41}$, $Q^{41}$, $Q^{42}$, $Y^{41}$, $Y^{42}$, $Y^{43}$, $R^{41}$, $R^{42}$, $R^{43}$, $R^{44}$, $L^{45}$, and $n^{41}$ are similar to the definitions and preferable ranges of $M^{21}$, $Q^{21}$, $Q^{22}$, $Y^{21}$, $Y^{22}$, $Y^{23}$, $R^{21}$, $R^{22}$, $R^{23}$, $R^{24}$, $L^{25}$, and $n^{21}$ in Formula (1) respectively.

Preferable examples of compounds represented by Formula (3) are compounds represented by the following Formula (3-A) or (3-B).

The compound represented by Formula (3-A) will be described first.

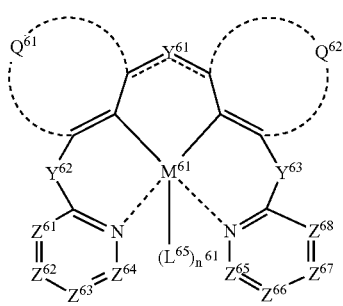

Formula (3-A)

In Formula (3-A), the definitions of $M^{61}$ is the same as that of $M^{11}$ in Formula (I), and their preferable ranges are also similar.

$Q^{61}$ and $Q^{62}$ each independently represent a ring-forming group. The rings formed by $Q^{61}$ and $Q^{62}$ are not particularly limited, and examples thereof include a benzene ring, a pyridine ring, a pyridazine ring, a pyrimidine ring, a thiophene ring, an isothiazole ring, a furan ring, an isoxazole ring, and condensed rings thereof.

Each of the rings formed by $Q^{61}$ and $Q^{62}$ is preferably a benzene ring, a pyridine ring, a thiophene ring, a thiazole ring, or a condensed ring containing one or more of the above rings; more preferably a benzene ring, a pyridine ring, or a condensed ring containing one or more of the above rings; and still more preferably a benzene ring or a condensed ring containing a benzene ring.

The definition of $Y^{61}$ is similar to that of $Y^{11}$ in Formula (I), and their preferable ranges are also similar.

$Y^{62}$ and $Y^{63}$ each independently represent a connecting group or a single bond. The connecting group is not particularly limited, and examples thereof include a carbonyl connecting group, a thiocarbonyl connecting group, alkylene groups, alkenylene groups, arylene groups, heteroarylene groups, a connecting group which connects moieties via an oxygen atom, a nitrogen atom or a silicon atom, and connecting groups comprising combinations of connecting groups selected from the above.

$Y^{62}$ and $Y^{63}$ are each independently selected, preferably from a single bond, a carbonyl connecting group, an alkylene connecting group, and an alkenylene group, more preferably from a single bond and an alkenylene group, and still more preferably from a single bond.

The definition of $L^{65}$ is similar to that of $L^{15}$ in Formula (I), and their preferable ranges are also similar.

The definition of $n^{61}$ is the same as the definition of $n^{11}$ in Formula (I), and their preferable ranges are also similar.

$Z^{61}$, $Z^{62}$, $Z^{63}$, $Z^{64}$, $Z^{65}$, $Z^{66}$, $Z^{67}$, and $Z^{68}$ each independently represent a substituted or unsubstituted carbon or nitrogen atom, and preferably a substituted or unsubstituted carbon atom. Examples of the substituent on the carbon include the groups described as examples of $R^{21}$ in Formula (1). $Z^{61}$ and $Z^{62}$ may be bonded to each other via a connecting group to form a condensed ring (e.g., a benzo-condensed ring or a pyridine-condensed ring) $Z^{62}$ and $Z^{63}$ may be bonded to each other via a connecting group to form a condensed ring (e.g., a benzo-condensed ring or a pyridine-condensed ring). $Z^{63}$ and $Z^{64}$ may be bonded to each other via a connecting group to form a condensed ring (e.g., a benzo-condensed ring or a pyridine-condensed ring). $Z^{65}$ and $Z^{66}$ may be bonded to each other via a connecting group to form a condensed ring (e.g., a benzo-condensed ring or a pyridine-condensed ring). $Z^{66}$ and $Z^{67}$ may be bonded to each other via a connecting group to form a condensed ring (e.g., a benzo-condensed ring or a pyridine-condensed ring). $Z^{67}$ and $Z^{68}$ may be bonded to each other via a connecting group to form a condensed ring (e.g., a benzo-condensed ring or a pyridine-condensed ring). The ring formed by $Q^{61}$ may be bonded to $Z^{61}$ via a connecting group to form a ring. The ring formed by $Q^{62}$ may be bonded to $Z^{68}$ via a connecting group to form a ring.

The substituent on the carbon is preferably an alkyl group, an alkoxy group, an alkylamino group, an aryl group, a group capable of forming a condensed ring (e.g., benzo-condensed ring or pyridine-condensed ring), or a halogen atom, more preferably an alkylamino group, an aryl group, or a group capable of forming a condensed ring (e.g., benzo-condensed ring or pyridine-condensed ring), still more preferably an aryl group or a group capable of forming a condensed ring (e.g., benzo-condensed ring or pyridine-condensed ring), and particularly preferably a group capable of forming a condensed ring (e.g., benzo-condensed ring or pyridine-condensed ring).

The compound represented by Formula (3-B) will be described below.

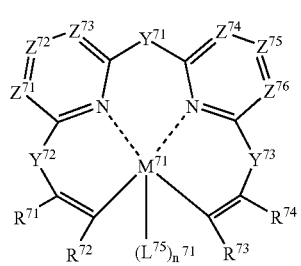

Formula (3-B)

In Formula (3-B), the definition of $M^{71}$ is similar to that of $M^{11}$ in Formula (I), and their preferable ranges are also similar.

The definitions and preferable ranges of $Y^{71}$, $Y^{72}$, and $Y^{73}$ are the same as the definition and preferable range of $Y^{61}$, $Y^{62}$, and $Y^{63}$ in Formula (3-A).

The definition of $L^{75}$ is similar to that of $L^{15}$ in Formula (I), and their preferable ranges are also similar.

The definition of $n^{71}$ is similar to that of $n^{11}$ in Formula (I), and their preferable ranges are also similar.

$Z^{71}$, $Z^{72}$, $Z^{73}$, $Z^{74}$, $Z^{75}$, and $Z^{76}$ each independently represent a substituted or unsubstituted carbon or nitrogen atom, and more preferably a substituted or unsubstituted carbon atom. Examples of the substituent on the carbon include the groups described as examples of $R^{21}$ in Formula (1). In addition, $Z^{71}$ and $Z^{72}$ may be bonded to each other via a connecting group to form a ring (e.g., a benzene ring or a pyridine ring). $Z^{72}$ and $Z^{73}$ may be bonded to each other via a connecting group to form a ring (e.g., a benzene ring or a pyridine ring). $Z^{73}$ and $Z^{74}$ may be bonded to each other via a connecting group to form a ring (e.g., a benzene ring or a pyridine ring). $Z^{74}$ and $Z^{75}$ ma be bonded to each other via a connecting group to form a ring (e.g., a benzene ring or a pyridine ring). $Z^{75}$ and $Z^{76}$ may be bonded to each other via a connecting group to form a ring (e.g., a benzene ring or a pyridine ring). The definitions and preferable ranges of $R^{71}$ to $R^{74}$ are similar to the definitions of $R^{21}$ to $R^{24}$ in Formula (1), respectively.

Preferable examples of compounds represented by Formula (3-B) include compounds represented by the following formula (3-C).

The compound represented by Formula (3-C) will be described below.

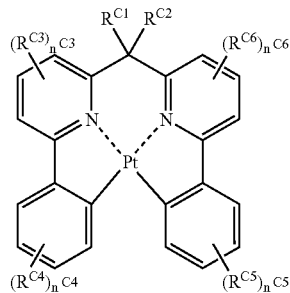

Formula (3-C)

In Formula (3-C), $R^{C1}$ and $R^{C2}$ to each independently represent a hydrogen atom or a substituent, and the substituents may be selected from the alkyl groups and aryl groups described as examples of $R^{21}$ to $R^{24}$ in Formula (1). The definition of $R^{C3}$, $R^{C4}$, $R^{C5}$, and $R^{C6}$ is the same as the definition of $R^{21}$ to $R^{24}$ in Formula (1). Each of $n^{C3}$ and $n^{C6}$ represents an integer of 0 to 3; each of $n^{C4}$ and $n^{C5}$ represents an integer of 0 to 4; when there are plural $R^{C3}$s, $R^{C4}$s, $R^{C5}$s, or $R^{C6}$s, the plural $R^{C3}$s, $R^{C4}$s, $R^{C5}$s, or $R^{C6}$s may be the same as each other or different from each other, and may be bonded to each other to form a ring. $R^{C3}$, $R^{C4}$, $R^{C5}$, and $R^{C6}$ each preferably represent an alkyl group, an aryl group, a heteroaryl group, or a halogen atom.

The compound represented by Formula (4) will be described below.

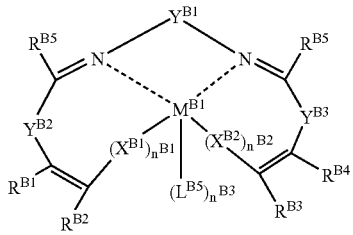

Formula (4)

In Formula (4), the definitions and preferable ranges of $M^{B1}$, $Y^{B2}$, $Y^{B3}$, $R^{B1}$, $R^{B2}$, $R^{B3}$, $R^{B4}$, $L^{B5}$, $n^{B3}$, $X^{B1}$, and $X^{B2}$ are similar to the definitions of $M^{21}$, $Y^{22}$, $Y^{23}$, $R^{21}$, $R^{22}$, $R^{23}$, $R^{24}$, $L^{25}$, $n^{21}$, $X^{21}$, $X^{22}$ in Formula (1), respectively.

$Y^{B1}$ represents a connecting group whose definition is similar to that of $Y^{21}$ in Formula (1). $Y^{B1}$ is preferably a vinyl group substituted at 1- or 2-position, a phenylene ring, a pyridine ring, a pyrazine ring, a pyrimidine ring, or an alkylene group having 2 to 8 carbons.

$R^{B5}$ and $R^{B6}$ each independently represent a hydrogen atom or a substituent, and the substituent may be selected from the alkyl groups, aryl groups, and heterocyclic groups described as examples of $R^{21}$ to $R^{24}$ in Formula (1). However, $Y^{B1}$ is not bonded to $R^{B5}$ or $R^{B6}$. $n^{B1}$ and $n^{B2}$ each independently represent an integer of 0 or 1.

Preferable examples of the compound represented by Formula (4) include compounds represented by the following Formula (4-A).

The compound represented by Formula (4-A) will be described below.

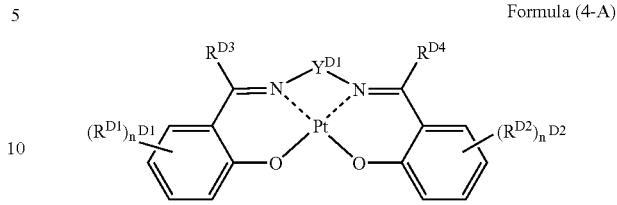

Formula (4-A)

In Formula (4-A), $R^{D3}$ and $R^{D4}$ each independently represent a hydrogen atom or a substituent, and $R^{D1}$ and $R^{D2}$ each represent a substituent. The substituents represented by $R^{D1}$, $R^{D2}$, $R^{D3}$, and $R^{D3}$, and $R^{D4}$ may be selected from the substituents described as examples of $R^{B5}$ and $R^{B6}$ in Formula (4), and have the same preferable range as $R^{B5}$ and $R^{B6}$ in Formula (4). $n^{D1}$ and $n^{D2}$ each represent an integer of 0 to 4. When there are plural $R^{D1}$s, the plural $R^{D1}$s may be the same as or different from each other or may be bonded to each other to form a ring. When there are plural $R^{D2}$'s, the plural $R^{D2}$'s may be the same as or different from each other or may be bonded to each other to form a ring. $Y^{D1}$ represents a vinyl group substituted at 1- or 2-position, a phenylene ring, a pyridine ring, a pyrazine ring, a pyrimidine ring, or an alkylene group having 1 to 8 carbon atoms.

Preferable examples of the metal complex having a tridentate ligand according to the invention include compounds represented by the following Formula (5).

The compound represented by Formula (5) will be described below.

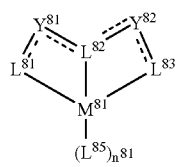

Formula (5)

In Formula (5), the definition of $M^{81}$ is similar to that of $M^{11}$ in Formula (I), and their preferable ranges are also similar.

The definitions and preferable ranges of $L^{81}$, $L^{82}$, and $L^{83}$ are similar to the definitions and preferable ranges of $L^{11}$, $L^{12}$, and $L^{13}$ in Formula (I), respectively.

The definitions and preferable ranges of $Y^{81}$ and $Y^{82}$ are similar to the definitions and preferable ranges of $Y^{11}$ and $Y^{12}$ in Formula (I), respectively.

$L^{85}$ represents a ligand coordinating to $M^{81}$. $L^{85}$ is preferably a mono- to tri-dentate ligand and more preferably a monodentate to tridentate anionic ligand. The mono- to tridentate anionic ligand is not particularly limited, but is preferably a halogen ligand or a tridentate ligand $L^{81}$, $Y^{81}$, $L^{82}$, and $L^{83}$ can form, and more preferably a tridentate ligand $L^{81}$, $Y^{81}$, $L^{82}$, $Y^{82}$, and $L^{83}$ can form. $L^{85}$ is not directly bonded to $L^{81}$ or $L^{83}$. The numbers of coordination sites and ligands do not exceed the valency of the metal.

$n^{81}$ represents an integer of 0 to 5. When $M^{81}$ is a tetravalent metal, $n^{81}$ is 1, and $L^{85}$ represents a monodentate ligand. When $M^{81}$ is a hexavalent metal, $n^{81}$ is preferably 1 to 3, more preferably 1 or 3, and still more preferably 1. When $M^{81}$ is hexavalent and $n^{81}$ is 1, $L^{85}$ represents a tridentate ligand.

When $M^{81}$ is hexavalent and $n^{81}$ is 2, $L^{85}$ represents a monodentate ligand and a bidentate ligand. When $M^{81}$ is hexavalent and $n^{81}$ is 3, $L^{85}$ represents a monodentate ligand. When $M^{81}$ is an octavalent metal, $n^{81}$ is preferably 1 to 5, more preferably 1 or 2, and still more preferably 1. When $M^{81}$ is octavalent and $n^{81}$ is 1, $L^{85}$ represents a pentadentate ligand. When $M^{81}$ is octavalent and $n^{81}$ is 2, $L^{85}$ represents a tridentate ligand and a bidentate ligand. When $M^{81}$ is octavalent and $n^{81}$ is 3, $L^{85}$ represents a tridentate ligand and two monodentate ligands, or represents two bidentate ligands and one monodentate ligand. When $M^{81}$ is octavalent and $n^{81}$ is 4, $L^{85}$ represents one bidentate ligand and three monodentate ligands. When $M^{81}$ is octavalent and $n^{81}$ is 5, $L^{85}$ represents five monodentate ligands. When $n^{81}$ is 2 or larger, there are plural $L^{85}$'s, and the plural $L^{85}$'s may be the same as or different from each other.

In a preferable example of the compound represented by Formula (5), $L^{81}$, $L^{82}$, or $L^{83}$ each represent an aromatic carbon ring containing a carbon atom coordinating to $M^{81}$, a heterocycle containing a carbon atom coordinating to $M^{81}$, or a nitrogen-containing heterocycle containing a nitrogen atom coordinating to $M^{81}$, wherein at least one of $L^{81}$, $L^{82}$, and $L^{83}$ is a nitrogen-containing heterocycle. Examples of the aromatic carbon ring containing a carbon atom coordinating to $M^{81}$, heterocycle containing a carbon atom coordinating to $M^{81}$, or nitrogen-containing heterocycle containing a nitrogen atom coordinating to $M^{81}$ include the examples of ligands (moieties) each containing a nitrogen or carbon atom coordinating to $M^{11}$ in Formula (I) described in the explanation of formula (I). Preferable examples thereof are the same as in the description of ligands (moieties) each containing a nitrogen or carbon atom coordinating to $M^{11}$ in Formula (I). $Y^{81}$ and $Y^{82}$ each preferably represent a single bond or a methylene group.

Other preferable examples of compounds represented by Formula (5) include compounds represented by the following Formulae (5-A) and (5-B).

The compound represented by Formula (5-A) will be described below.

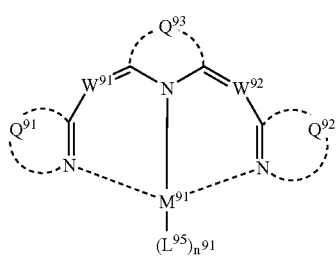

Formula (5-A)

In Formula (5-A), the definition of $M^{91}$ is similar to that of $M^{81}$ in Formula (5), and their preferable ranges are also similar.

$Q^{91}$ and $Q^{92}$ each represent a group forming a nitrogen containing heterocycle (ring containing a nitrogen atom coordinating to $M^{91}$). The nitrogen-containing heterocycles formed by $Q^{91}$ and $Q^{92}$ are not particularly limited, and examples thereof include a pyridine ring, a pyrazine ring, a pyrimidine ring, a pyridazine ring, a triazine ring, a thiazole ring, an oxazole ring, a pyrrole ring, a pyrazole ring, a imidazole, a triazole ring, and condensed rings containing one or more of the above rings (e.g., a quinoline ring, a benzoxazole ring, a benzimidazole ring, and an indolenine ring), and tautomers thereof.

Each of the nitrogen-containing heterocycles formed by $Q^{91}$ and $Q^{92}$ is preferably a pyridine ring, a pyrazole ring, a thiazole ring, an imidazole ring, a pyrrole ring, a condensed ring containing one or more of the above ring (e.g., a quinoline ring, a benzothiazole ring, a benzimidazole ring, or an indolenine ring), or a tautomer of any of the above rings; more preferably a pyridine ring, a pyrrole ring, a condensed ring containing one or more of these rings (e.g., a quinoline ring), or a tautomer of any of the above rings; more preferably a pyridine ring or a condensed ring containing a pyridine ring (e.g., a quinoline ring); and particularly preferably a pyridine ring.

$Q^{93}$ represents a group forming a nitrogen-containing heterocycle (ring containing a nitrogen atom coordinating to $M^{91}$). The nitrogen-containing heterocycle formed by $Q^{93}$ is not particularly limited, but is preferably a pyrrole ring, an imidazole ring, a tautomer of a triazole ring, or a condensed ring containing one or more of the above rings (e.g., benzopyrrole), and more preferably a tautomer of a pyrrole ring or a tautomer of a condensed ring containing a pyrrole ring (e.g., benzopyrrole).

The definitions and preferable ranges of $W^{91}$ and $W^{92}$ are similar to the definitions and preferable ranges of $W^{51}$ and $W^{52}$ in Formula (2), respectively.

The definition of $L^{95}$ is similar to that of $L^{85}$ in Formula (5), and their preferable ranges are also similar.

The definition of $n^{91}$ is similar to that of $n^{81}$ in Formula (5), and their preferable ranges are also similar.

The compound represented by Formula (5-B) will be described next.

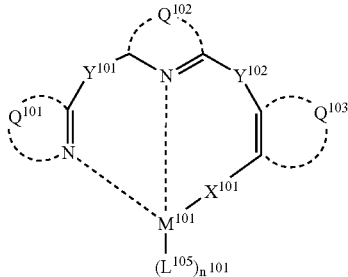

Formula (5-B)

In Formula (5-B), the definition of $M^{101}$ is similar to that of $M^{81}$ in Formula (5), and their preferable ranges are also similar.

The definition of $Q^{102}$ is similar to that of $Q^{21}$ in Formula (1), and their preferable ranges are also similar.

The definition of $Q^{101}$ is similar to that of $Q^{91}$ in Formula (5-A), and their preferable ranges are also similar.

$Q^{103}$ represents a group forming an aromatic ring. The aromatic ring formed by $Q^{103}$ is not particularly limited, but is preferably a benzene ring, a furan ring, a thiophene ring, a pyrrole ring, or a condensed ring containing one or more of the above rings (e.g., a naphthalene ring), more preferably a benzene ring or a condensed ring containing a benzene ring (e.g., naphthalene ring), and particularly preferably a benzene ring.

The definitions and preferable ranges of $Y^{101}$ and $Y^{102}$ are similar to the definition and preferable range of $Y^{22}$ in Formula (1).

The definition of $L^{105}$ is similar to that of $L^{85}$ in Formula (5), and their preferable ranges are also similar.

The definition of $n^{101}$ is similar to that of $n^{81}$ in Formula (5), and their preferable ranges are also similar.

The definition of $X^{101}$ is similar to that of $X^{21}$ in Formula (1), and their preferable ranges are also similar.

The compound represented by Formula (II) will be described below.

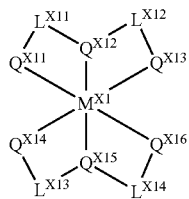

Formula (II)

In Formula (II), $M^{X1}$ represents a metal ion. $Q^{X11}$ to $Q^{X16}$ each independently represent an atom coordinating to $M^{X1}$ or an atomic group containing an atom coordinating to $M^{X1}$. $L^{X11}$ to $L^{X14}$ each independently represent a single bond, a double bond or a connecting group.

Namely, in Formula (II), the atomic group comprising $Q^{X11}$-$L^{X11}$-$Q^{X12}$-$L^{X12}$-$Q^{X13}$ and the atomic group comprising $Q^{X14}$-$L^{X13}$-$Q^{X15}$-$L^{X14}$-$Q^{X16}$ each form a tridentate ligand.

In addition, each of the bond between $M^{X1}$ and each of $Q^{X11}$ to $Q^{X16}$ may be a coordination bond or a covalent bond.

The compound represented by Formula (II) will be described in detail below.

In Formula (II), $M^{X1}$ represents a metal ion. The metal ion is not particularly limited, but is preferably a monovalent to trivalent metal ion, more preferably a divalent or trivalent metal ion, and still more preferably a trivalent metal ion. Specifically, a platinum ion, an iridium ion, a rhenium ion, a palladium ion, a rhodium ion, a ruthenium ion, a copper ion, a europium ion, a gadolinium, and a terbium ion are preferable. Among these, an iridium ion and a europium ion are more preferable, and an iridium ion is still more preferable.

$Q^{X11}$ to $Q^{X16}$ each represent an atom coordinating to $M^{X1}$ or an atomic group containing an atom coordinating to $M^{X1}$.

When any of $Q^{X11}$ to $Q^{X16}$ is an atom coordinating to $M^{X1}$, specific examples of the atom include a carbon atom, a nitrogen atom, an oxygen atom, a silicon atom, a phosphorus atom, and a sulfur atom. Preferable specific examples of the atom include a nitrogen atom, an oxygen atom, a sulfur atom, and a phosphorus atom. More preferable specific examples of the atom include a nitrogen atom and an oxygen atom.

When any of $Q^{X11}$ to $Q^{X16}$ is an atomic group containing a carbon atom coordinating to $M^{X1}$, examples of the atomic group coordinating to $M^{X1}$ via a carbon atom include imino groups, aromatic hydrocarbon ring groups (such as a benzene ring group or a naphthalene ring group), heterocyclic groups (such as a thiophene group, a pyridine group, a pyrazine group, a pyrimidine group, a pyridazine group, a triazine group, a thiazole group, an oxazole group, a pyrrole group, an imidazole group, a pyrazole group, or a triazole group), condensed rings containing one or more of the above rings, and tautomers thereof.

When any of $Q^{X11}$ to $Q^{X16}$ is an atomic group containing a nitrogen atom coordinating to $M^{X1}$, examples of the atomic group coordinating to $M^{X1}$ via a nitrogen atom include nitrogen-containing heterocyclic groups, amino groups, and imino groups. Examples of the nitrogen-containing heterocyclic groups include pyridine, pyrazine, pyrimidine, pyridazine, triazine, thiazole, oxazole, pyrrole, imidazole, pyrazole, or triazole. Examples of the amino groups include alkylamino groups (preferably having 2 to 30 carbon atoms, more preferably 2 to 20 carbon atoms, and particularly preferably 2 to 10 carbon atoms, and examples thereof include a methylamino group), arylamino groups (e.g., a phenylamino group)], acylamino groups (preferably having 2 to 30 carbon atoms, more preferably 2 to 20 carbon atoms, and particularly preferably 2 to 10 carbon atoms, and examples thereof include an acetylamino group and a benzoylamino group), alkoxycarbonylamino groups (preferably having 2 to 30 carbon atoms, more preferably 2 to 20 carbon atoms, and particularly preferably 2 to 12 carbon atoms, and examples thereof include a methoxycarbonylamino group), aryloxycarbonylamino groups (preferably having 7 to 30 carbon atoms, more preferably 7 to 20 carbon atoms, and particularly preferably 7 to 12 carbon atoms, and examples thereof include a phenyloxycarbonylamino group), and sulfonylamino groups (preferably having 1 to 30 carbon atoms, more preferably 1 to 20 carbon atoms, and particularly preferably 1 to 12 carbon atoms, and examples thereof include a methanesulfonylamino and benzenesulfonylamino group). These groups may have a substitutent(s).

When any of $Q^{X11}$ to $Q^{X16}$ is an atomic group containing an oxygen atom coordinating to $M^{X1}$, examples of the atomic groups coordinating to $M^{X1}$ via an oxygen atom include alkoxy groups (preferably having 1 to 30 carbon atoms, more preferably 1 to 20 carbon atoms, and particularly preferably 1 to 10 carbon atoms, and examples thereof include a methoxy group, an ethoxy group, a butoxy group, and a 2-ethylhexyloxygroup), aryloxy groups (preferably having 6 to 30 carbon atoms, more preferably 6 to 20 carbon atoms, and particularly preferably 6 to 12 carbon atoms, and examples thereof include a phenyloxy group, a 1-naphthyloxygroup, and a 2-naphthyloxy group), heterocyclic oxy groups (preferably having 1 to 30 carbon atoms, more preferably 1 to 20 carbon atoms, and particularly preferably 1 to 12 carbon atoms, and examples thereof include a pyridyloxy group, a pyrazyloxy group, a pyrimidyloxy group, and a quinolyloxy group), acyloxy groups (preferably having 2 to 30 carbon atoms, more preferably 2 to 20 carbon atoms, and particularly preferably 2 to 10 carbon atoms, and examples thereof include an acetoxy group and a benzoyloxy group), silyloxy groups (preferably having 3 to 40 carbon atoms, more preferably 3 to 30 carbon atoms, and particularly preferably 3 to 24 carbon atoms, and examples thereof include a trimethylsilyloxy group and a triphenylsilyloxy), carbonyl groups (e.g., ketone groups, ester groups, and amido groups), and ether groups (e.g., dialkylether groups, diarylether groups, and furyl groups).

When any of $Q^{X11}$ to $Q^{X16}$ is an atomic group containing a silicon atom coordinating to $M^{X1}$, examples of the atomic group coordinating to $M^{X1}$ via a silicon atom include alkylsilyl groups (preferably having 3 to 30 carbon atoms, and examples thereof include a trimethylsilyl group), and arylsilyl groups (preferably, having 18 to 30 carbon atoms, and examples thereof include a triphenylsilyl group). These groups may have a substituent(s).

When any of $Q^{X11}$ to $Q^{X16}$ is an atomic group containing a sulfur atom coordinating to $M^{X1}$, examples of the atomic group coordinating to $M_{X1}$ via a sulfur atom include alkylthio groups (preferably having 1 to 30 carbon atoms, more preferably 1 to 20 carbon atoms, and particularly preferably 1 to 12 carbon atoms, and examples thereof include a methylthio group and an ethylthio group), arylthio groups (preferably having 6 to 30 carbon atoms, more preferably 6 to 20 carbon atoms, and particularly preferably 6 to 12 carbon atoms, and examples thereof include a phenylthio group), heterocyclic thio groups (preferably having 1 to 30 carbon atoms, more preferably 1 to 20 carbon atoms, and particularly preferably 1 to 12 carbon atoms, and examples thereof include a pyridylthio group, a 2-benzimidazolylthio group, a 2-benzoxazolylthio group, and a 2-benzothiazolylthio group), thiocarbonyl groups (e.g., a thioketone group and a thioester group), and thioether groups (e.g., a dialkylthioether group, a diarylthioether group, and a thiofuryl group).

When any of $Q^{X11}$ to $Q^{X16}$ is an atomic group containing a phosphorus atom coordinating to $M^{X1}$, examples of the atomic group coordinating to $M^{X1}$ via a phosphorus atom include dialkylphosphino groups, diarylphosphino groups, trialkyl phosphines, triaryl phosphines, and phosphinine groups. These groups may have a substituent(s).

The atomic groups represented by $Q^{X11}$ to $Q^{X16}$ are each preferably an aromatic hydrocarbon ring group containing a carbon atom coordinating to $M^{X1}$, an aromatic heterocyclic group containing a carbon atom coordinating to $M^{X1}$, a nitrogen-containing aromatic heterocyclic group containing a nitrogen atom coordinating to $M_{X1}$, an alkyloxy group, an aryloxy group, an alkylthio group, an arylthio group, or an dialkylphosphino group, and more preferably an aromatic hydrocarbon ring group containing a carbon atom coordinating to $M^{X1}$, an aromatic heterocyclic group containing a carbon atom coordinating to $M^{X1}$, or a nitrogen-containing aromatic heterocyclic group containing a nitrogen atom coordinating to $M_{X1}$.

The bond between $M^{X1}$ and each of $Q^{X11}$ to $Q^{X16}$ may be a coordination bond or a covalent bond.

In Formula (II), $L^{X11}$ to $L^{X14}$ each represent a single or double bond or a connecting group. The connecting group is not particularly limited, but preferably a connecting group containing one or more atoms selected from carbon, nitrogen, oxygen, sulfur, and silicon. Examples of the connecting group are shown below, however, the scope of thereof is not limited by these.

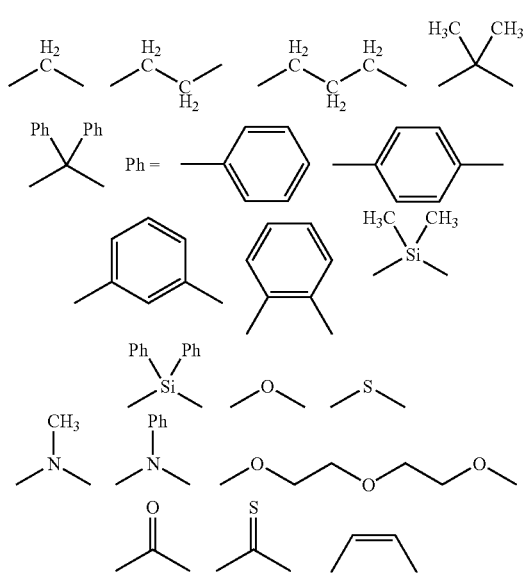

These connecting groups may have a substituent(s), and the substituent may be selected from the examples of the substituents represented by $R^{21}$ to $R^{24}$ in Formula (1), and the preferable range thereof is also the same as in Formula (1). $L^{X11}$ to $L^{X14}$ are each preferably a single bond, a dimethylmethylene group, or a dimethylsilylene group.

Among compounds represented by Formula (II), compounds represented by the following Formula (X2) are more preferable, and compounds represented by the following Formula (X3) are still more preferable.

The compound represented by Formula (X2) is described first.

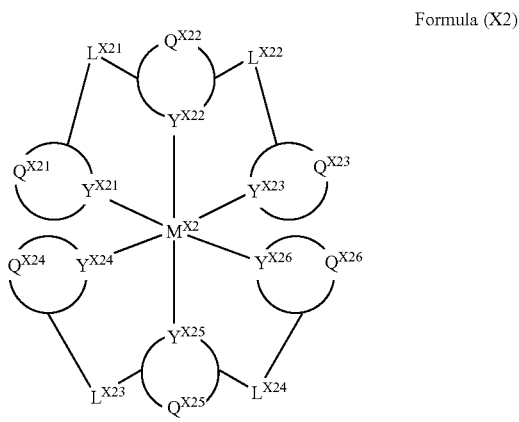

Formula (X2)

In Formula (X2), $M^{X2}$ represents a metal ion $Y^{X21}$ to $Y^{X26}$ each represent an atom coordinating to $M^{X2}$; and $Q^{X21}$ to $Q^{X26}$ each represent an atomic group forming an aromatic ring or an aromatic heterocycle respectively with $Y^{X21}$ to $Y^{X26}$. $L^{X21}$ to $L^{X24}$ each represent a single or double bond or a connecting group. The bond between $M^{X2}$ and each of $Y^{X21}$ to $Y^{X26}$ may be a coordination bond, an ionic bond or a covalent bond.

The compound represented by Formula (X2) will be described below in detail.

In Formula (X2), the definition of $M^{X2}$ is similar to that of $M^{X1}$ in Formula (II), and their preferable ranges are also similar. $Y^{X21}$ to $Y^{X26}$ each represent an atom coordinating to $M^{X2}$. The bond between $M^{X2}$ and each of $Y^{X21}$ to $Y^{X26}$ may be a coordination bond, an ionic bond or a covalent bond. Each of $Y^{X21}$ to $Y^{X26}$ is a carbon atom, a nitrogen atom, an oxygen atom, a sulfur atom, a phosphorus atom, or a silicon atom, and preferably a carbon atom or a nitrogen atom. $Q^{X21}$ to $Q^{X26}$ represent atomic groups forming rings containing $Y^{X21}$ to $Y^{X26}$, respectively, and the rings are each independently selected from aromatic hydrocarbon rings and aromatic heterocycles. The aromatic hydrocarbon rings and aromatic heterocycles may be selected from a benzene ring, a pyridine ring, a pyrazine ring, a pyrimidine ring, a pyridazine ring, a triazine ring, a pyrrole ring, a pyrazole ring, an imidazole ring, a triazole ring, an oxazole ring, a thiazole ring, an oxadiazole ring, a thiadiazole ring, a thiophene ring, and a furan ring; preferably selected from a benzene ring, a pyridine ring, a pyrazine ring, a pyrimidine ring, a pyrazole ring, an imidazole ring, and a triazole ring; more preferably selected from a benzene ring, a pyridine ring, a pyrazine ring, a pyrazole ring, and a triazole ring; and particularly preferably selected from a benzene ring and a pyridine ring. The aromatic rings may have a condensed ring or a substituent.

The definitions and preferable ranges of $L^{X21}$ to $L^{X24}$ are similar to the definitions and preferable ranges of $L^{X11}$ to $L^{X14}$ in Formula (II), respectively.

Compounds represented by the following Formula (X3) are more preferable examples of the compounds represented by Formula (II).

The compound represented by Formula (X3) will be described below.

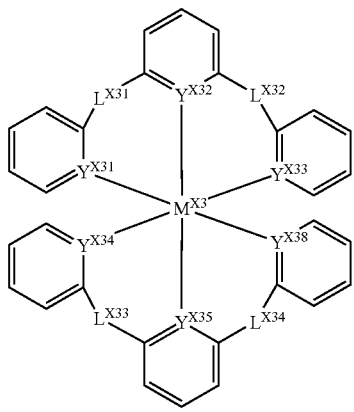

Formula (X3)

In Formula (X3), $M^{X3}$ represents a metal ion. $Y^{X31}$ to $Y^{X36}$ each represent a carbon atom, a nitrogen atom, or a phosphorus atom. $L^{X31}$ to $L^{X34}$ each represent a single bond, a double bond or a connecting group. The bond between $M^{X3}$ and each of $Y^{X31}$ to $Y^{X36}$ may be a coordination bond, an ionic bond or a covalent bond.

The definition of $M^{X3}$ is similar to that of $M_{X1}$ in Formula (II) above, and their preferable ranges are also similar. $Y^{X31}$ to $Y^{X36}$ each represent an atom coordinating to $M^{X3}$. The bond between $M^{X3}$ and each of $Y^{X31}$ to $Y^{X36}$ may be a coordination bond or a covalent bond. $Y^{X31}$ to $Y^{X36}$ each represent a carbon atom, a nitrogen atom or a phosphorus atom, and preferably a carbon atom or a nitrogen atom. The definitions and preferable ranges of $L^{X31}$ to $L^{X34}$ are similar to the definitions and preferable ranges of $L^{X11}$ to $L^{X14}$ in Formula (II), respectively.

Specific examples of compounds represented by the Formula (I), (II) or (5) include the compounds (1) to (242) described in Japanese Patent Application No. 2004-162849 and compounds (243) to (245) (their structures being shown below). The invention is not limited thereto.

Compound (1)

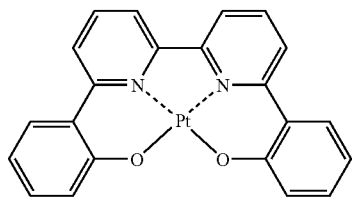

Compound (2)

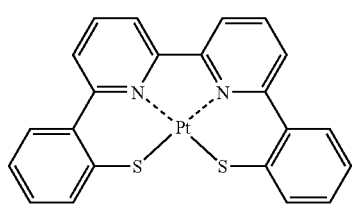

-continued

Compound (3)

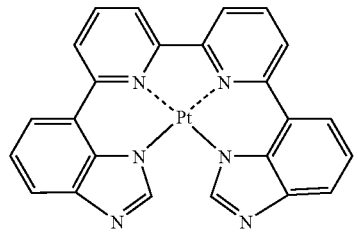

Compound (4)

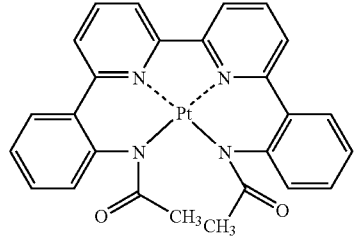

Compound (5)

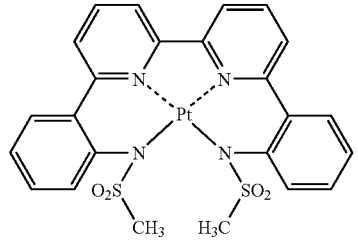

Compound (6)

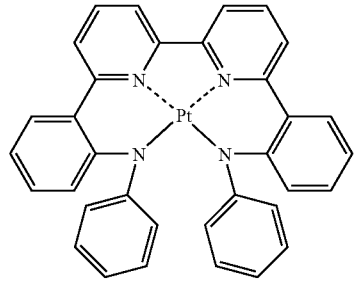

Compound (7)

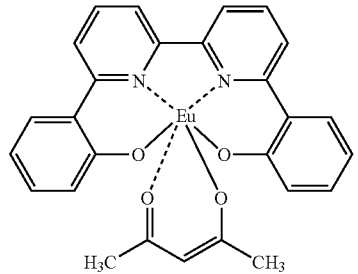

Compound (8)

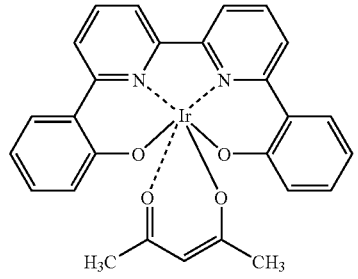

-continued
Compound (9)
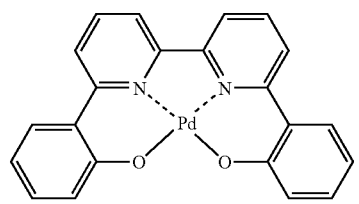
Compound (10)
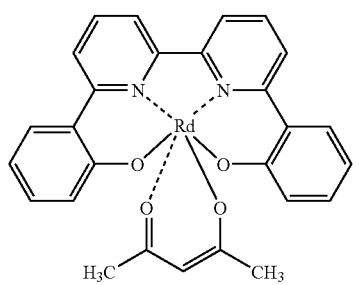
Compound (11)
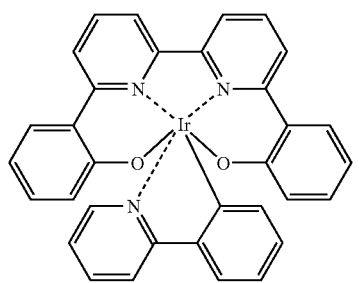
Compound (12)
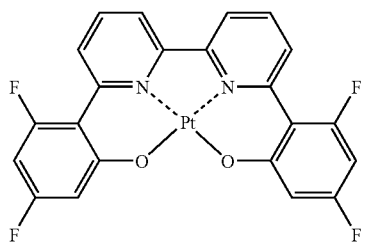
Compound (13)
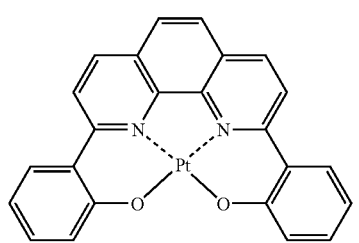
Compound (14)
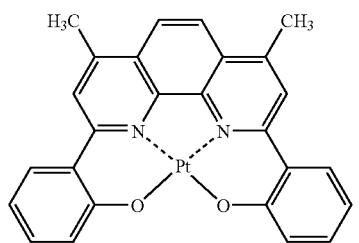
Compound (15)
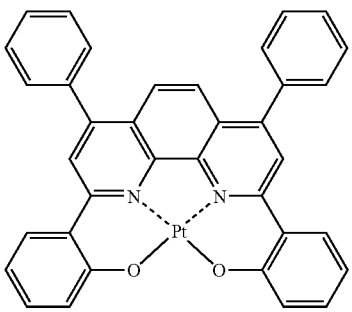
Compound (16)
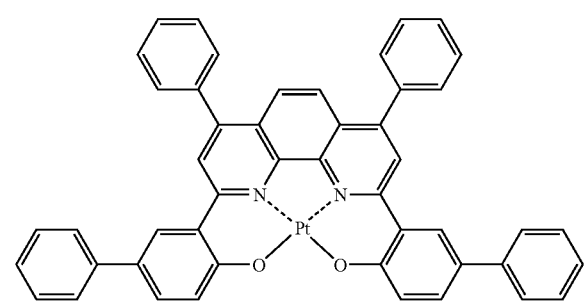
Compound (17)
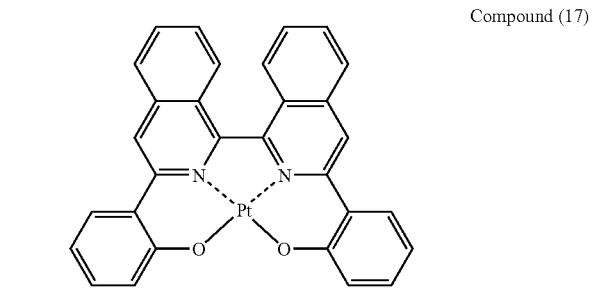
Compound (18)
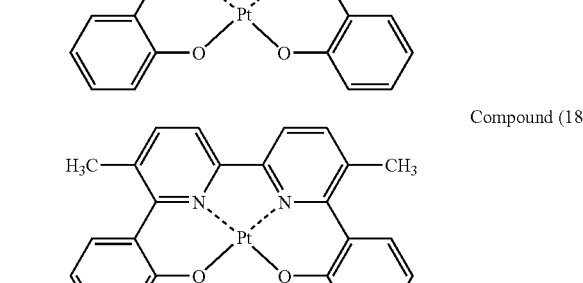
Compound (19)
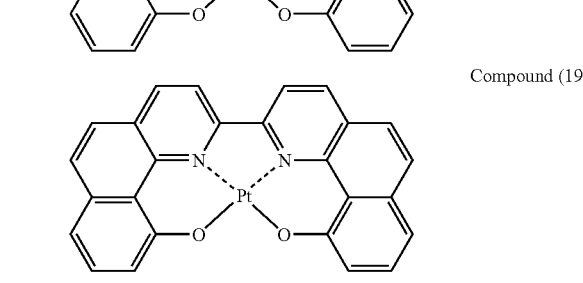
Compound (20)
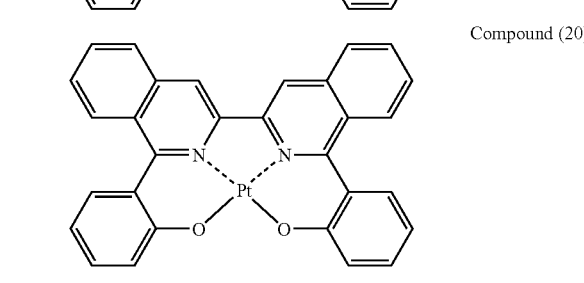

Compound (21)
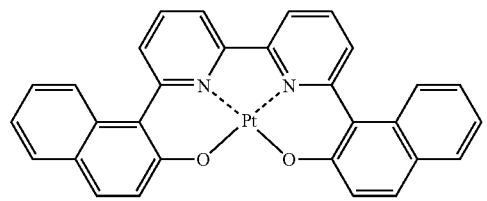
Compound (22)
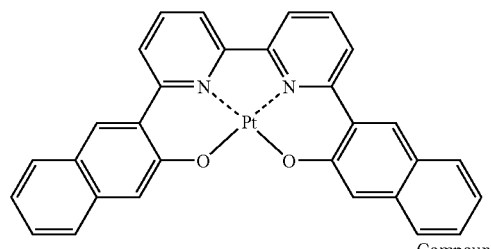
Compound (23)
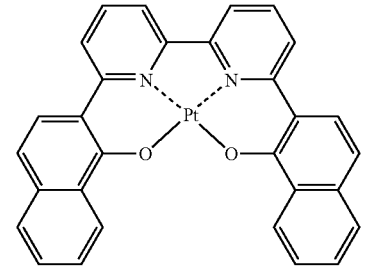
Compound (24)
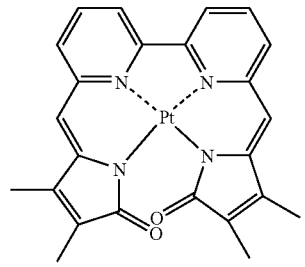
Compound (25)
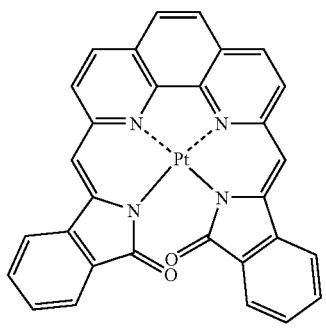
Compound (26)
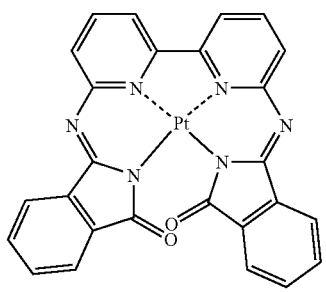
Compound (27)
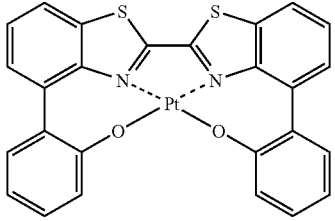
Compound (28)
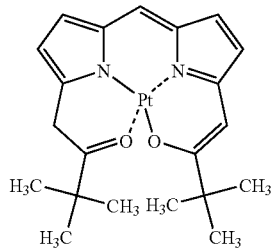
Compound (29)
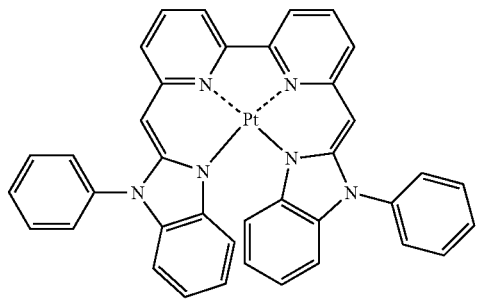
Compound (30)
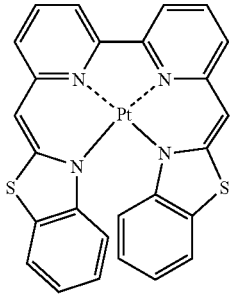
Compound (31)

Compound (32)
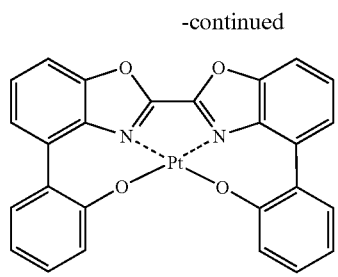
Compound (33)
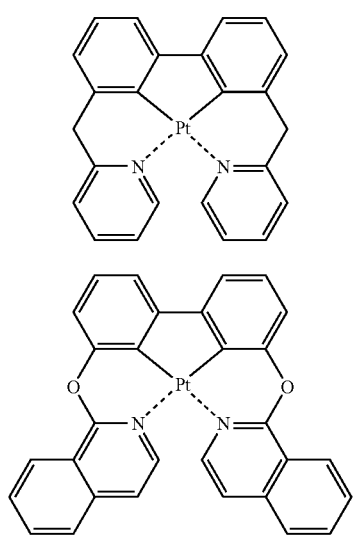
Compound (34)
Compound (35)
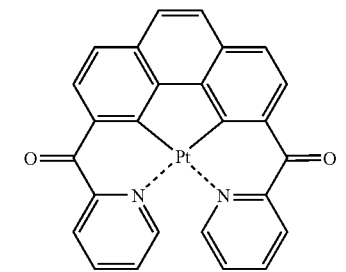
Compound (36)
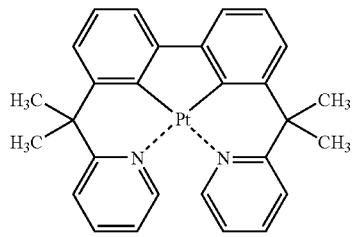
Compound (37)
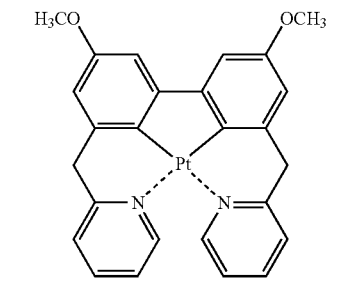
Compound (38)
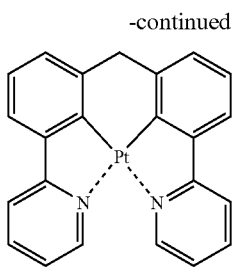
Compound (39)
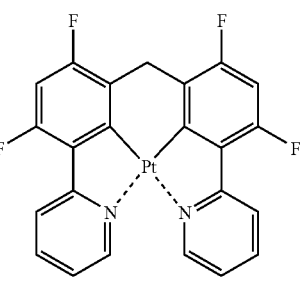
Compound (40)
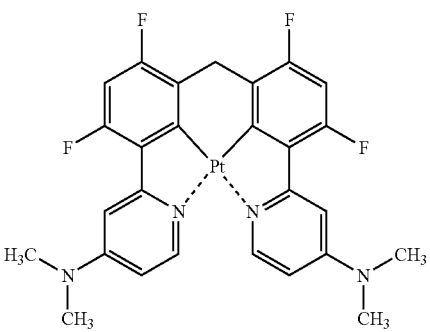
Compound (41)
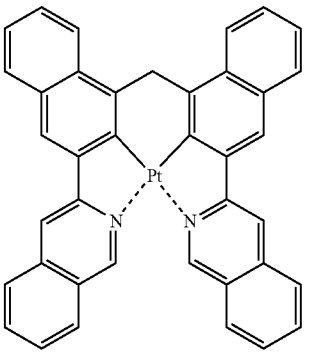
Compound (42)

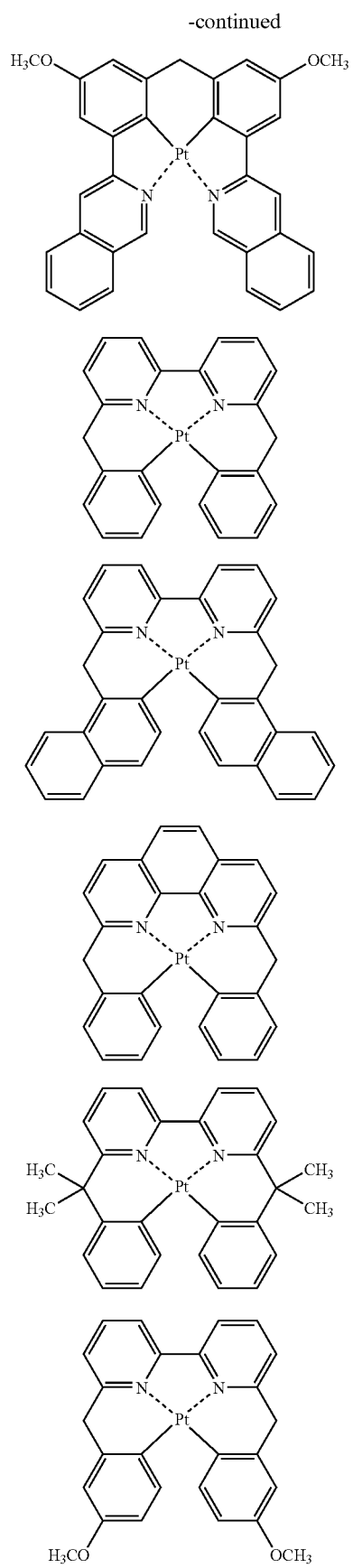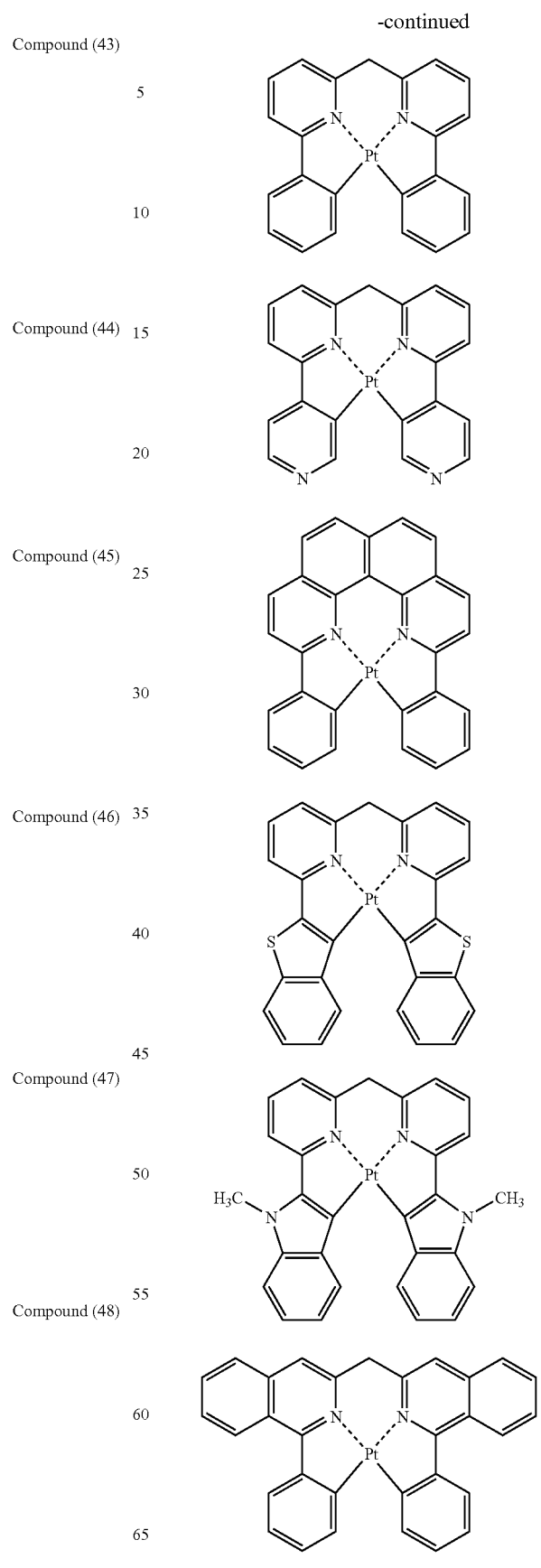

-continued
Compound (55)
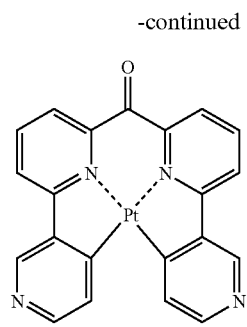
Compound (60)
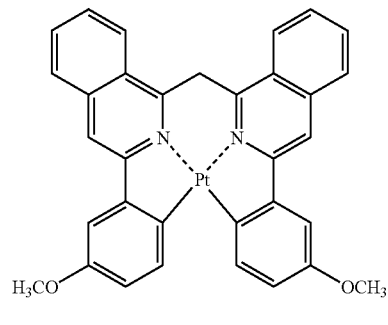
Compound (56)
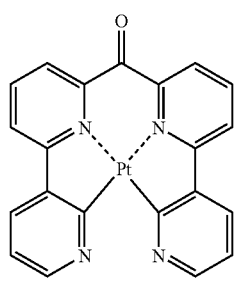
Compound (61)
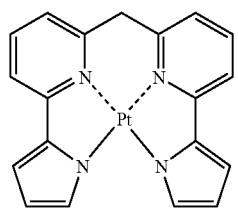
Compound (57)
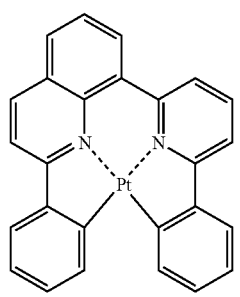
Compound (62)
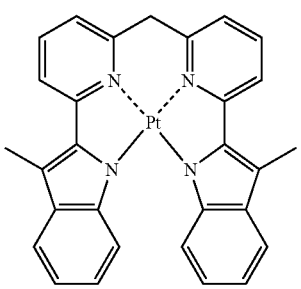
Compound (58)
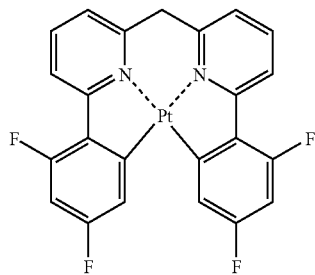
Compound (63)
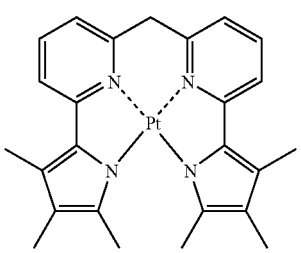
Compound (59)
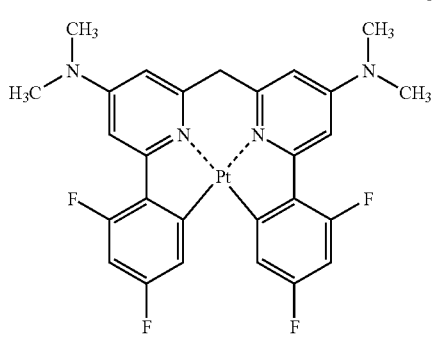
Compound (64)
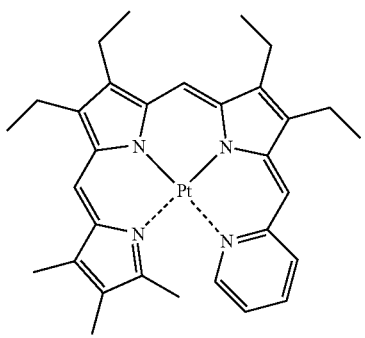

-continued
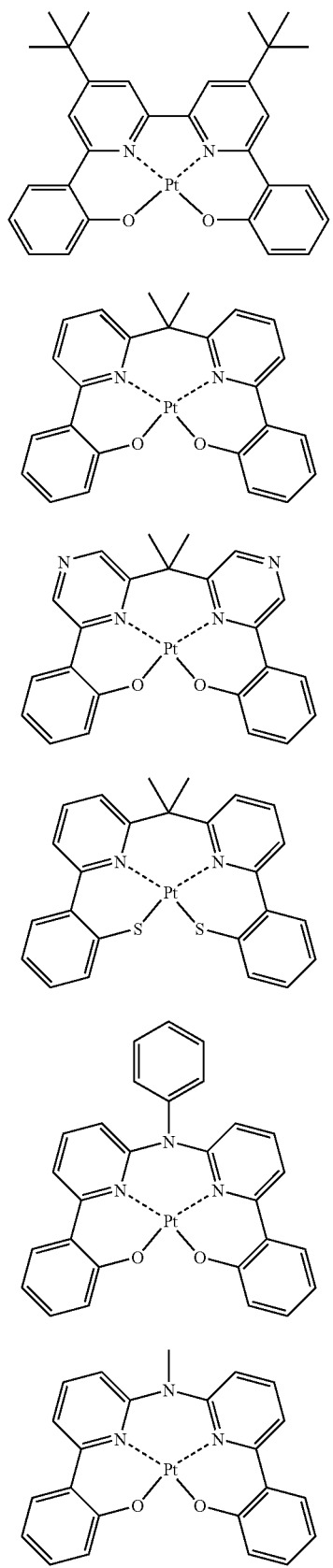
Compound (65)
Compound (66)
Compound (67)
Compound (68)
Compound (69)
Compound (70)
-continued
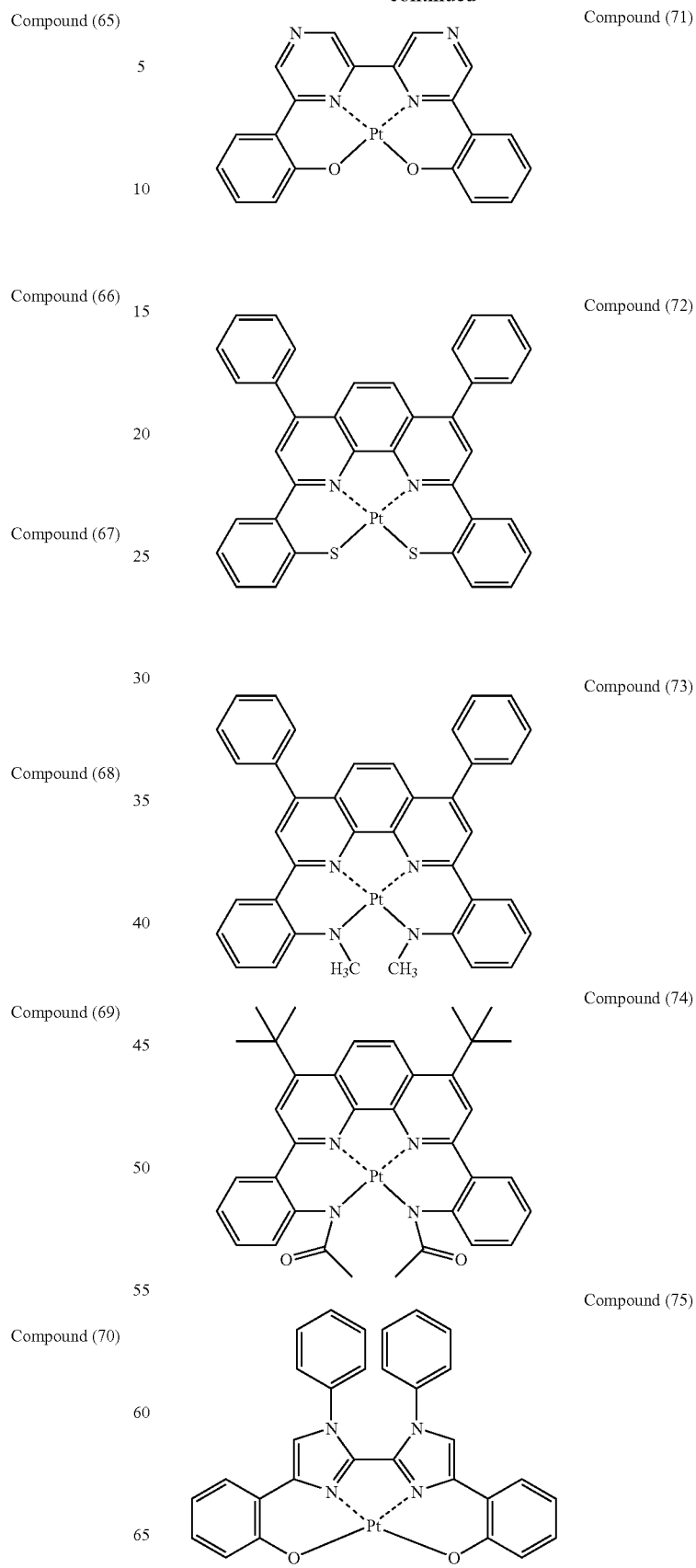
Compound (71)
Compound (72)
Compound (73)
Compound (74)
Compound (75)

-continued
Compound (76)
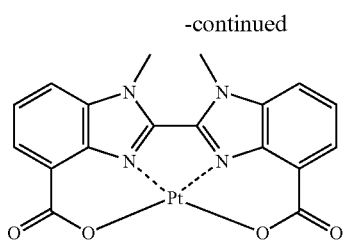
Compound (77)
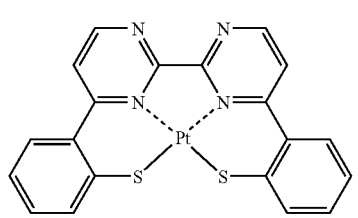
Compound (78)
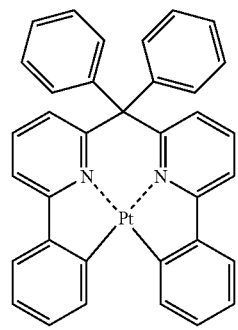
Compound (79)
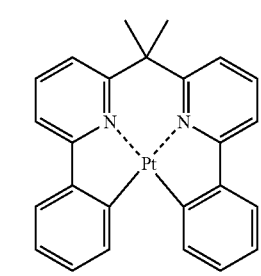
Compound (80)
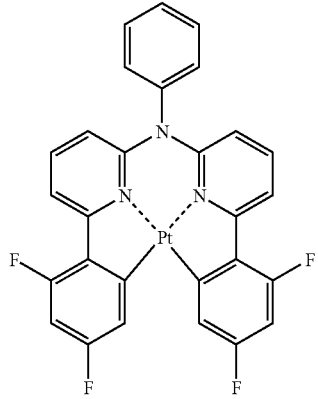
-continued
Compound (81)
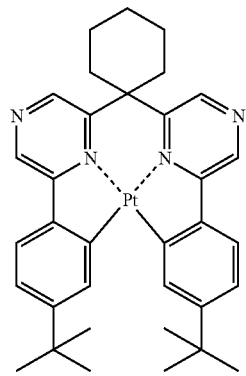
Compound (82)
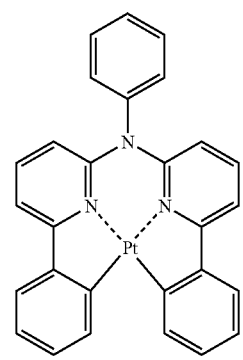
Compound (83)
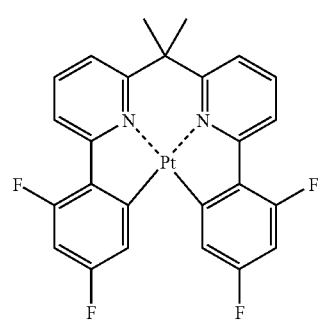
Compound (84)
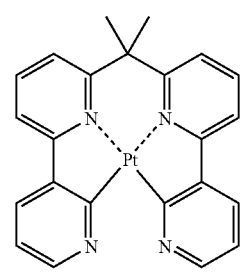
Compound (85)
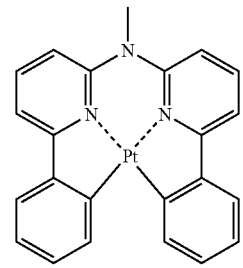

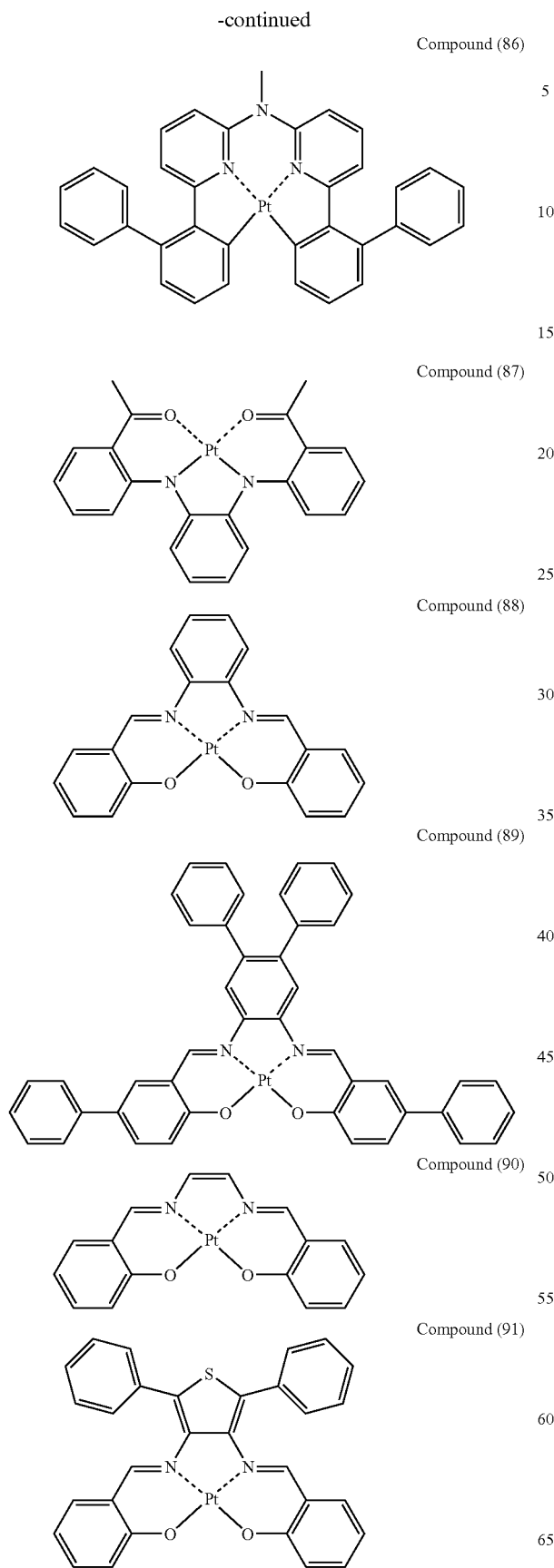
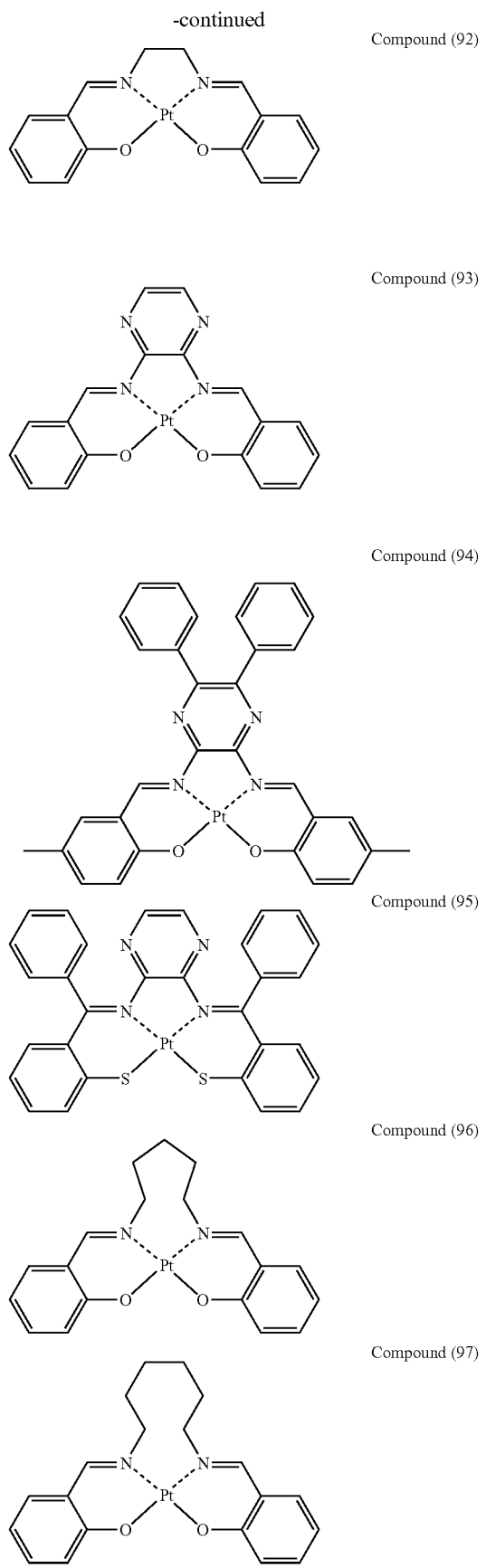

-continued
Compound (98)
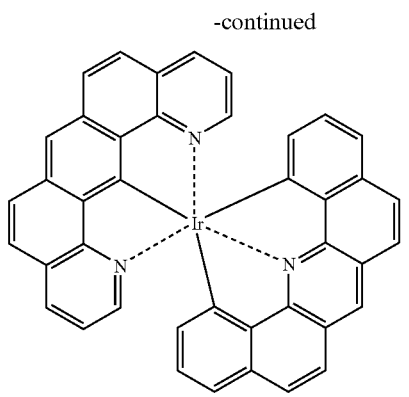
Compound (99)
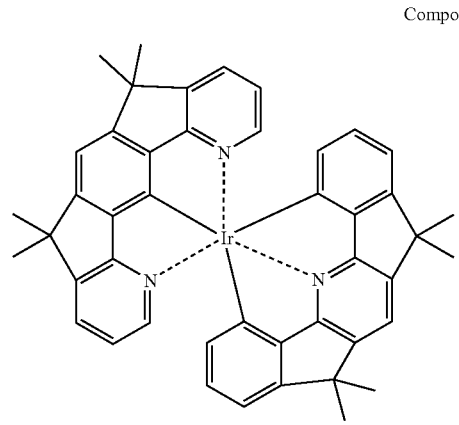
Compound (100)
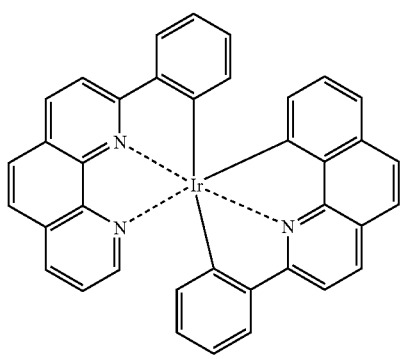
Compound (101)
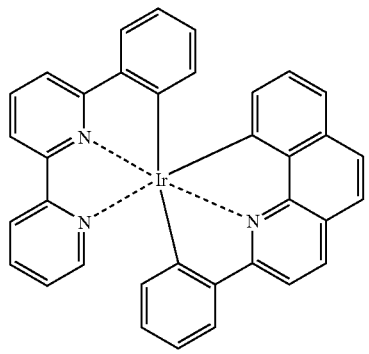
-continued
Compound (102)
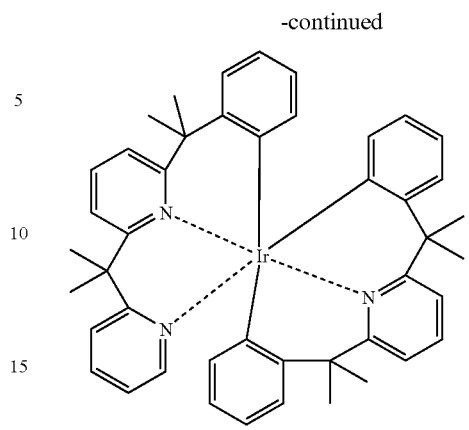
Compound (103)
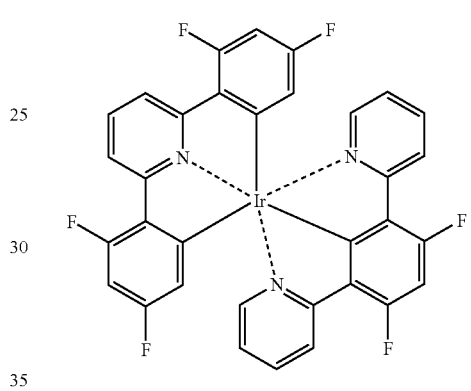
Compound (104)
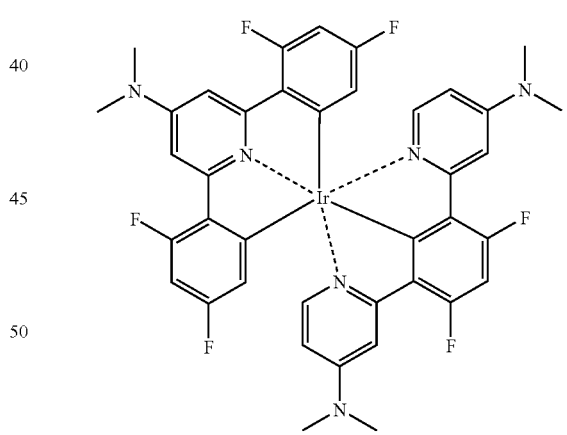
Compound (105)
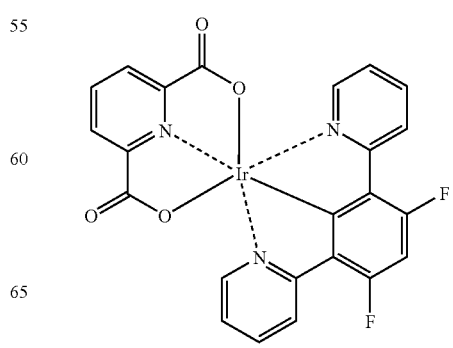

-continued
Compound (106)
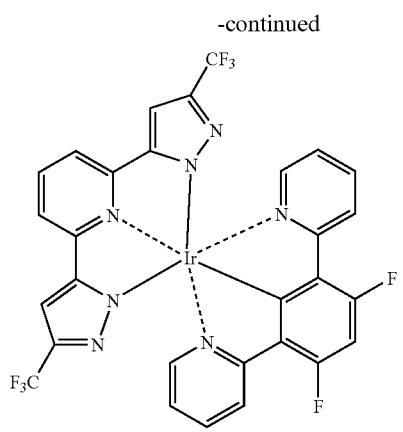
Compound (110)
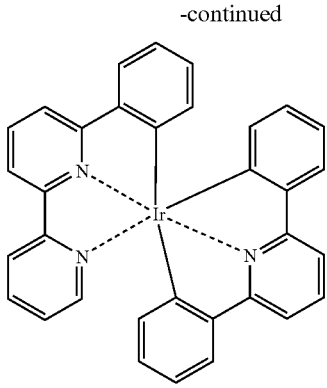
Compound (107)
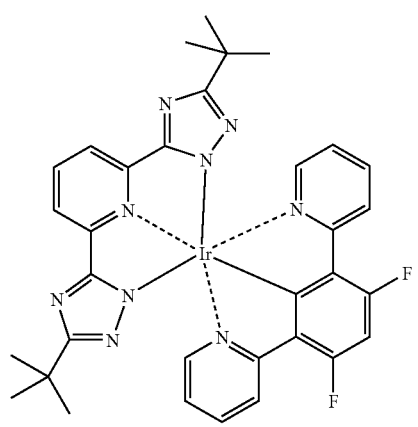
Compound (111)
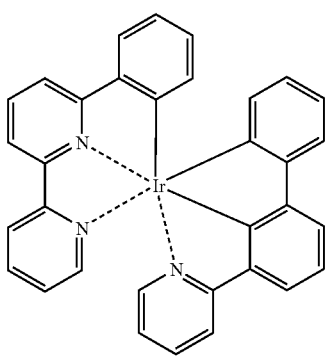
Compound (108)
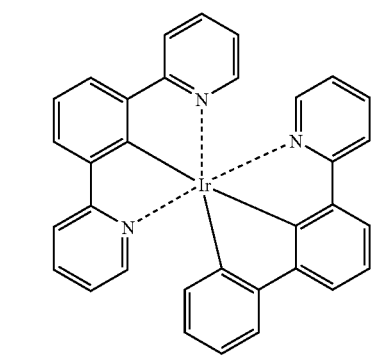
Compound (112)
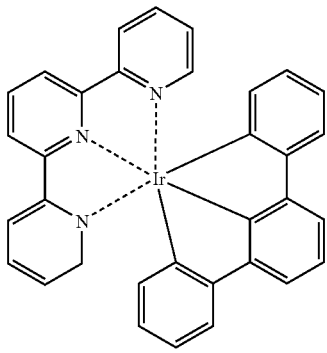
Compound (109)
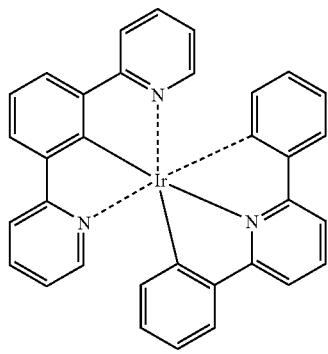
Compound (113)
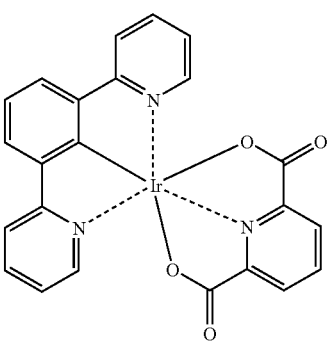

Compound (114)
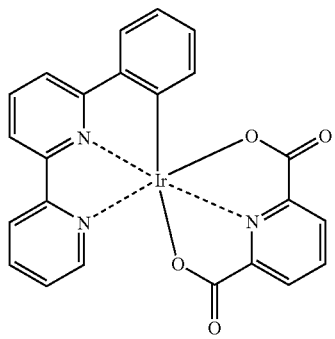
Compound (115)
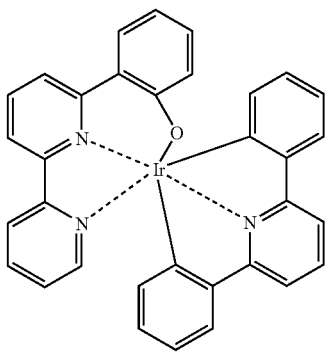
Compound (116)
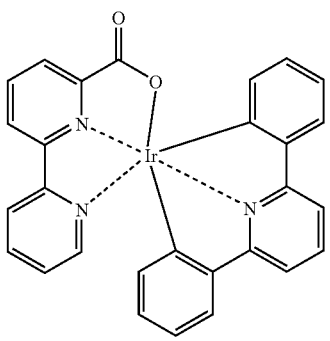
Compound (117)
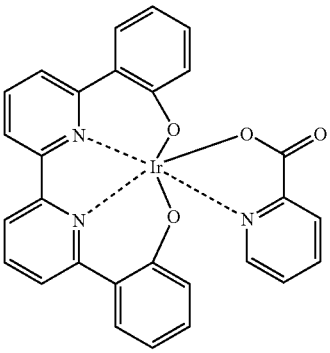
Compound (118)
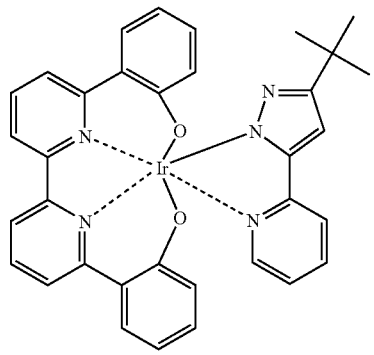
Compound (119)
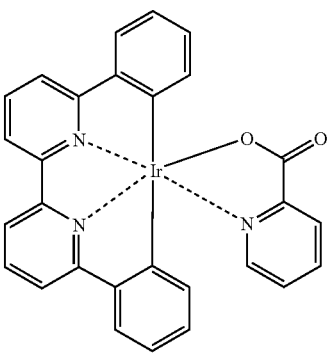
Compound (120)
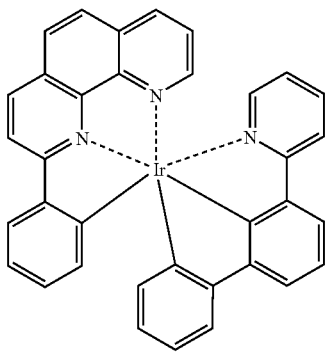
Compound (121)
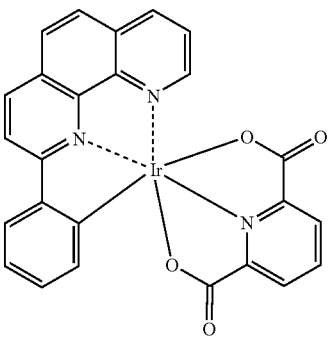

-continued
Compound (122)
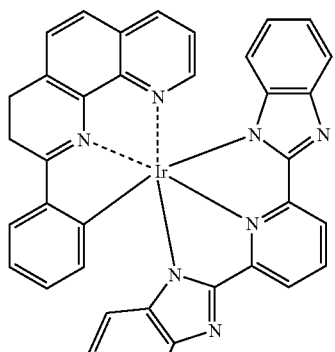
Compound (123)
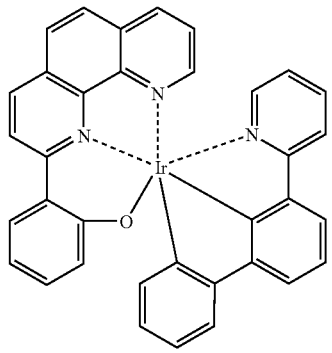
Compound (124)
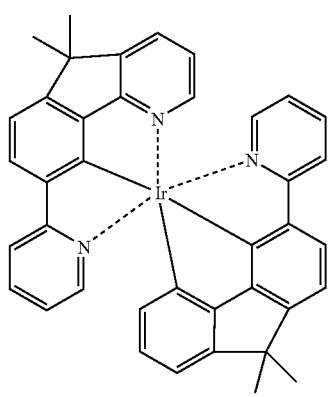
Compound (125)
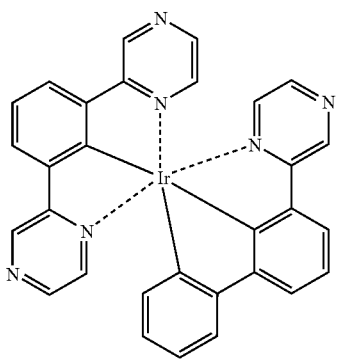
-continued
Compound (126)
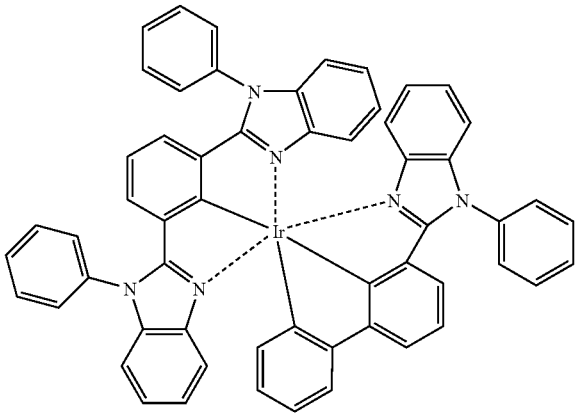
Compound (127)
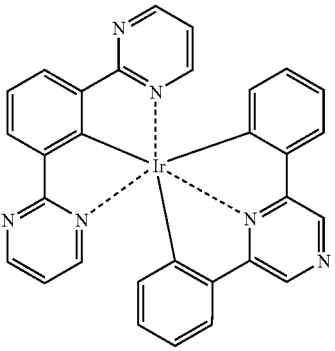
Compound (128)
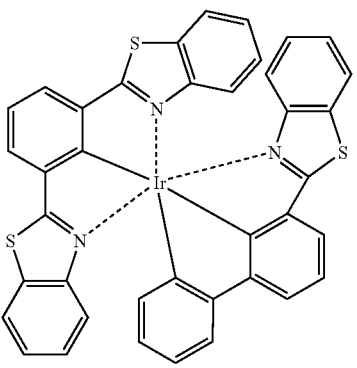
Compound (129)

-continued
Compound (130)
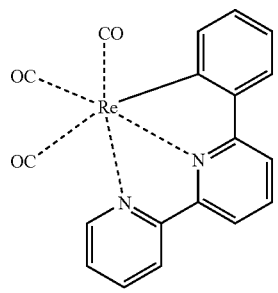
Compound (131)
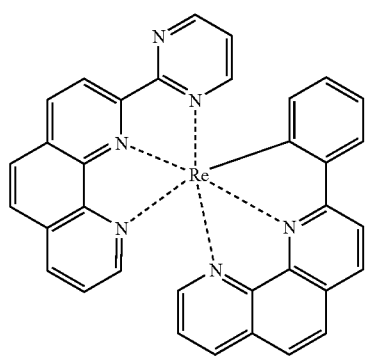
Compound (132)
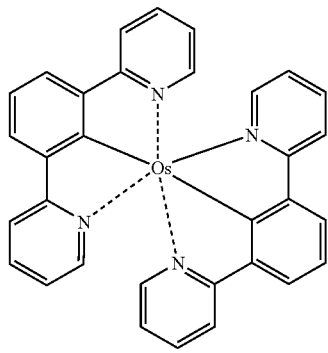
Compound (133)
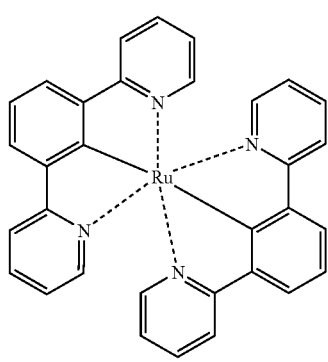
-continued
Compound (134)
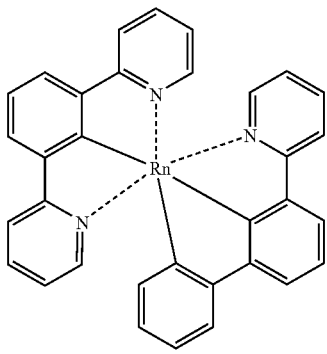
Compound (135)
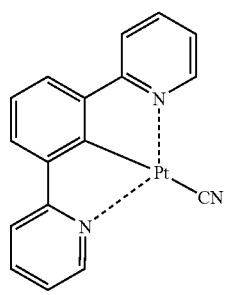
Compound (136)
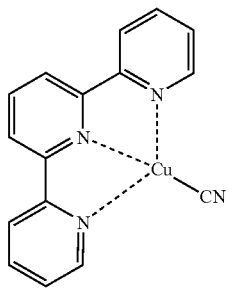
Compound (137)
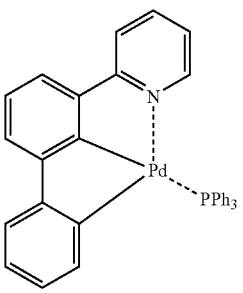
Compound (138)
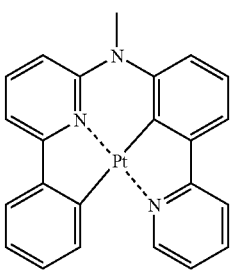

-continued
Compound (139)
Compound (140)
Compound (141)
Compound (142)
Compound (143)
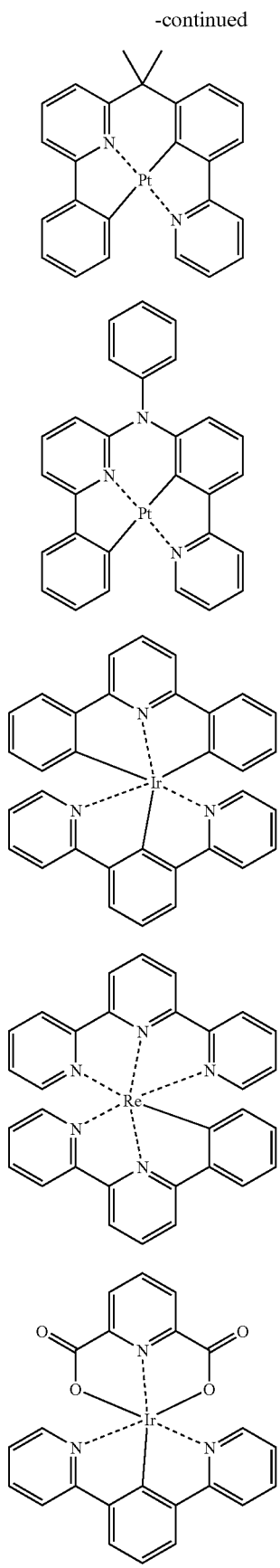
-continued
Compound (144)
Compound (145)
Compound (146)
Compound (147)
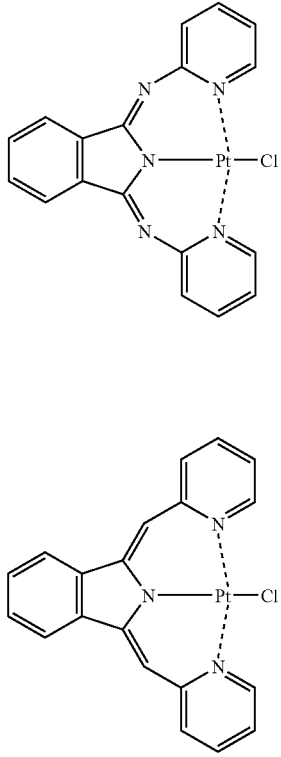
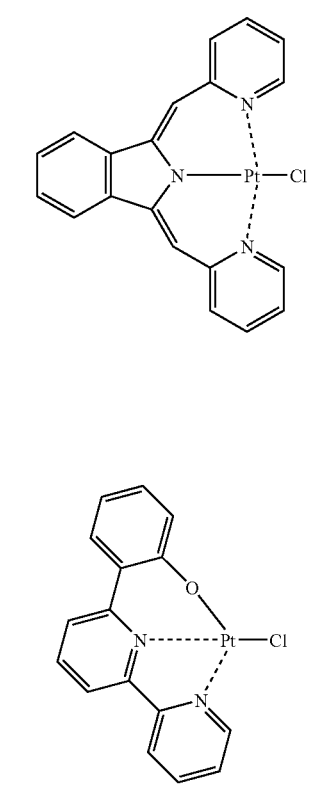
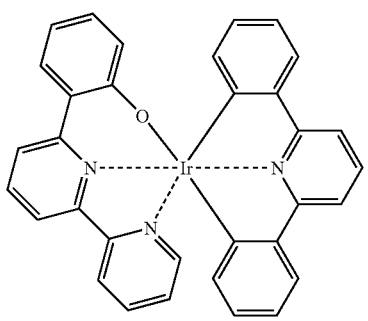

Compound (148)
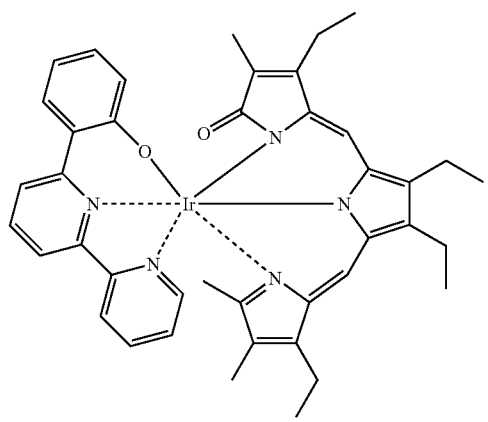
Compound (152)
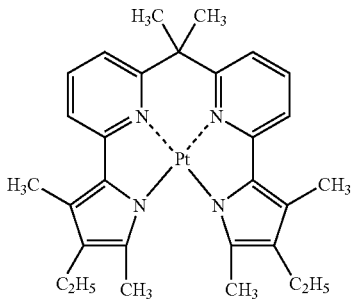
Compound (149)
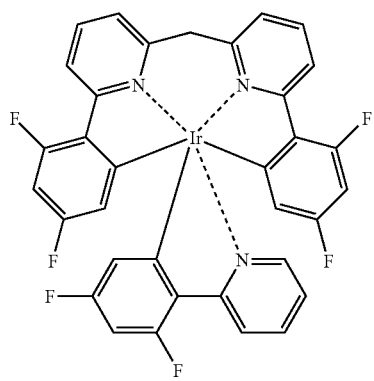
Compound (153)
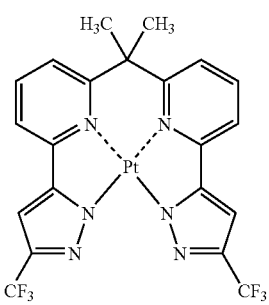
Compound (150)
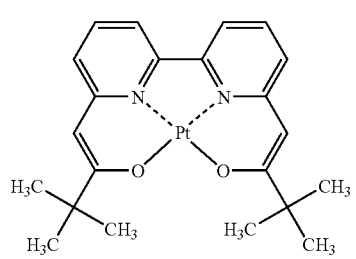
Compound (154)
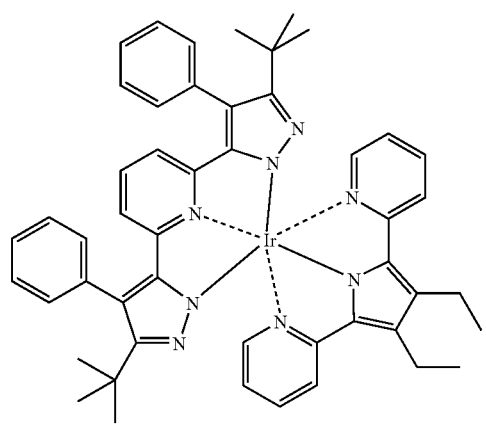
Compound (151)
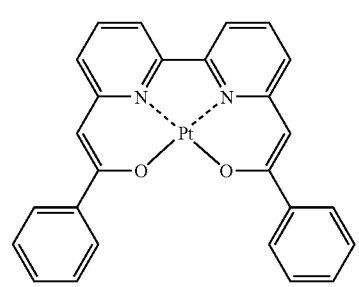
Compound (155)
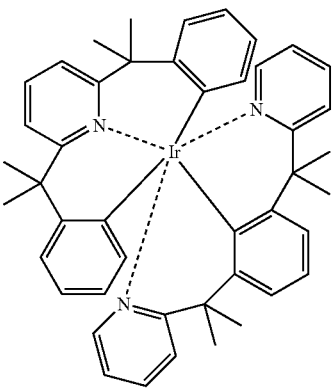

Compound (156)
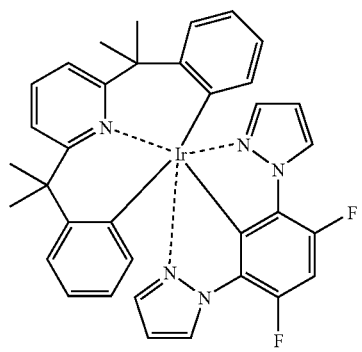
Compound (157)
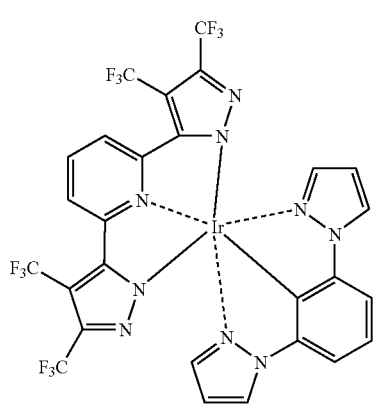
Compound (158)
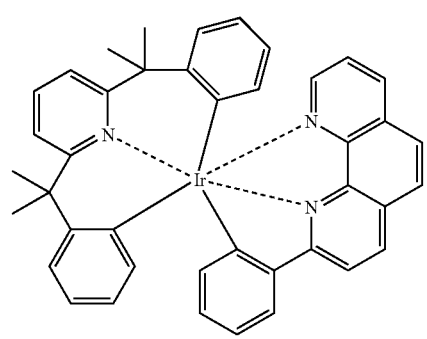
Compound (159)
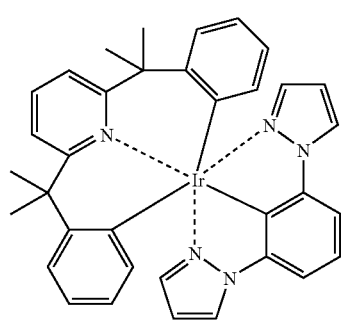
Compound (160)
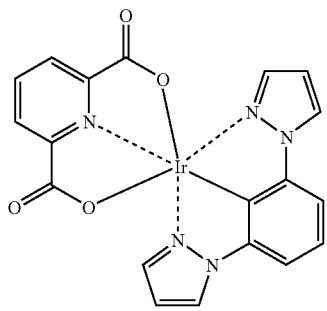
Compound (161)
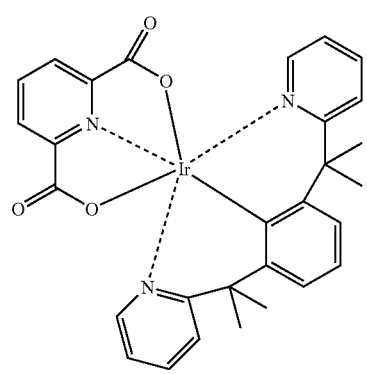
Compound (162)
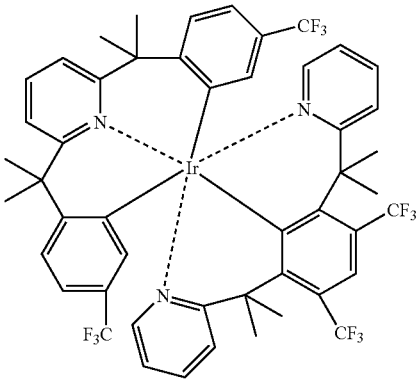
Compound (163)
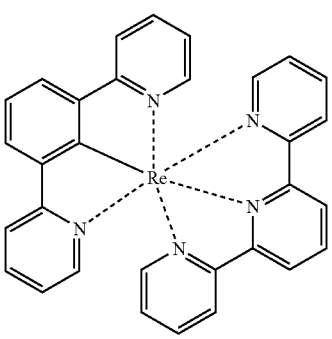

-continued
Compound (164)
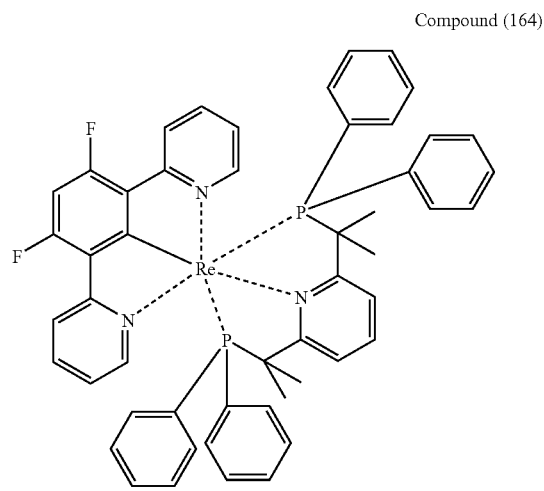
Compound (165)
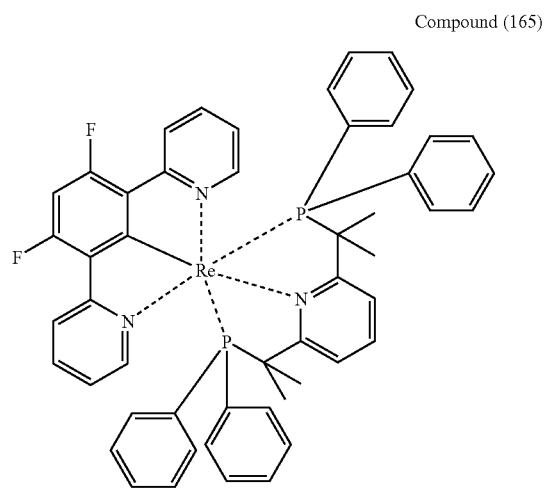
Compound (166)
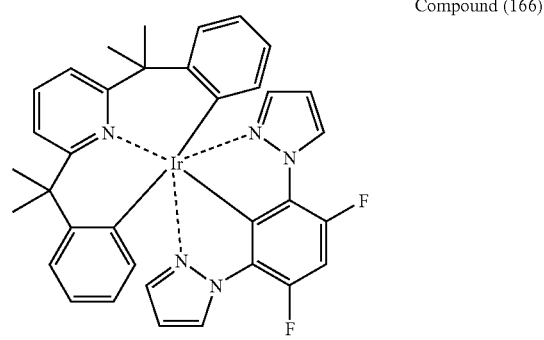
Compound (167)
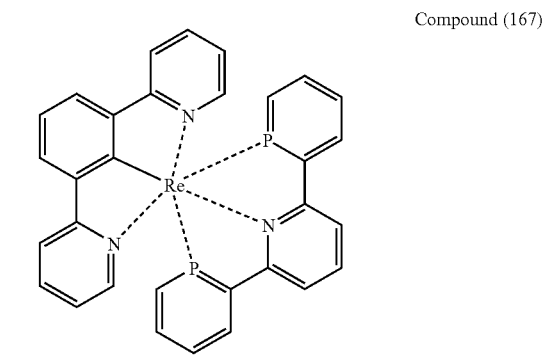
-continued
Compound (168)
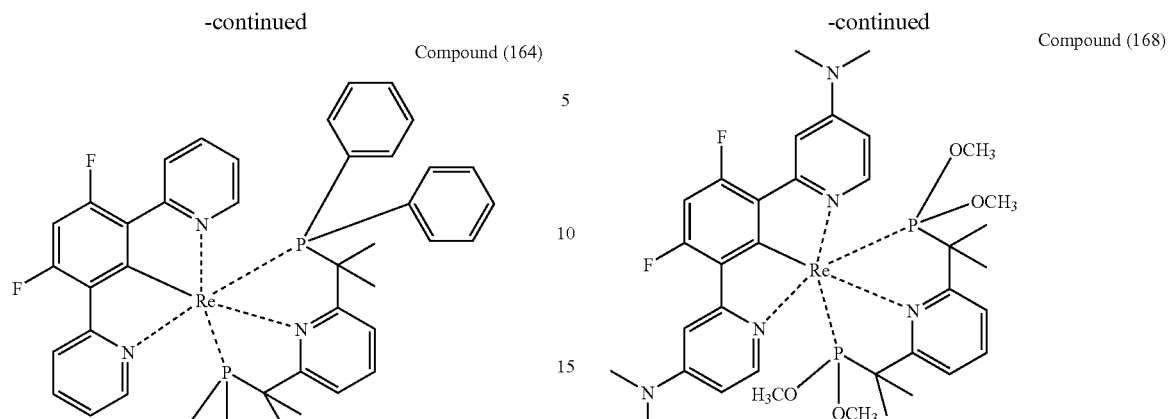
Compound (169)
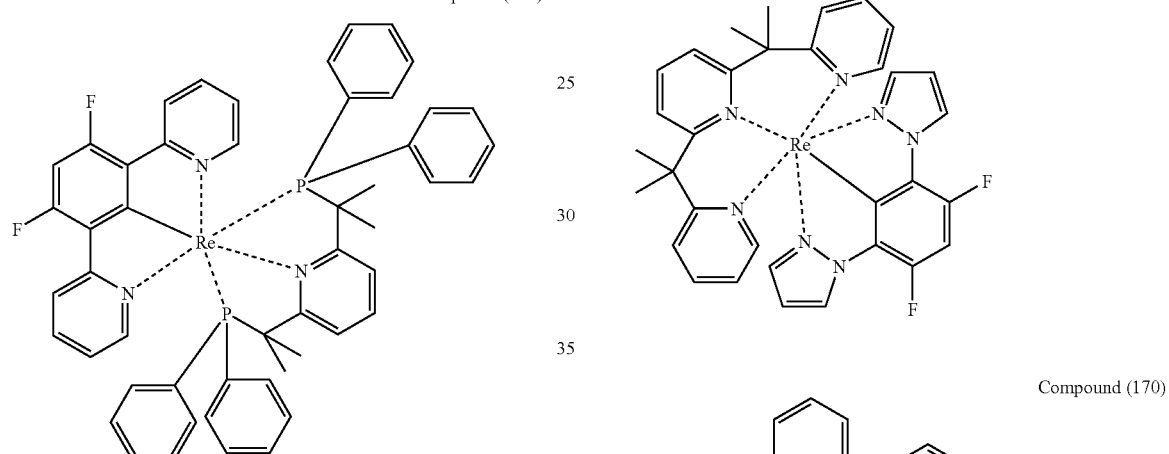
Compound (170)
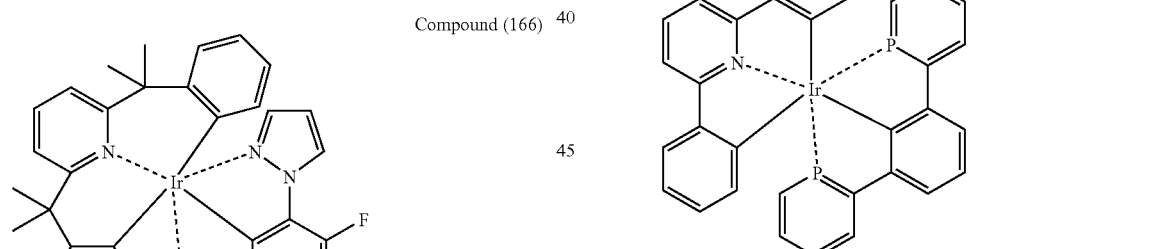
Compound (171)
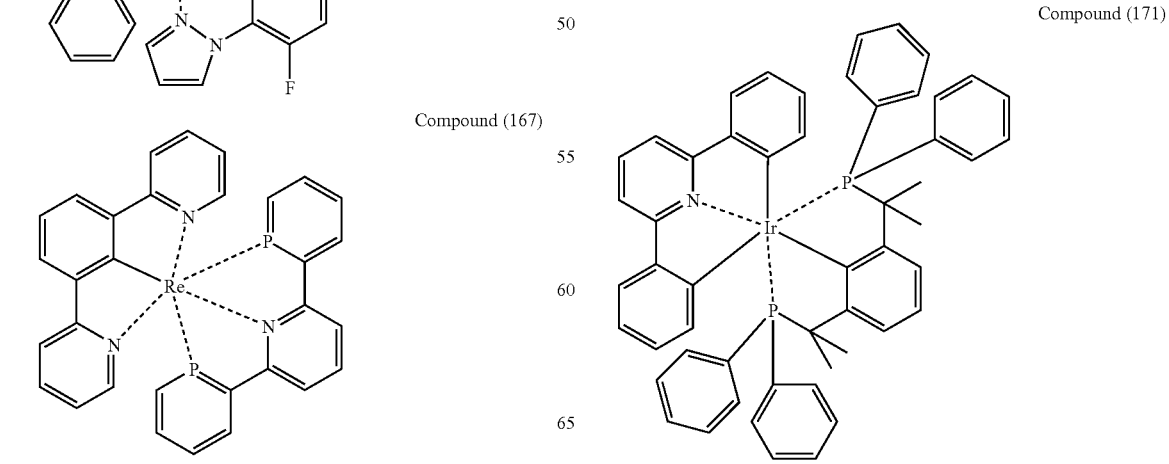

-continued
Compound (172)
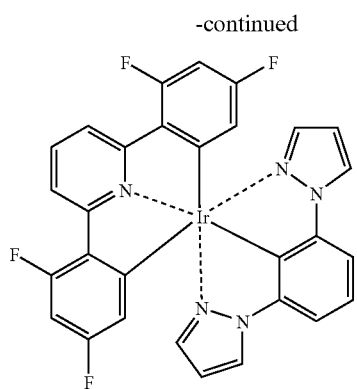
Compound (173)
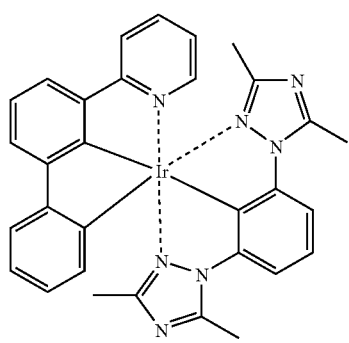
Compound (174)
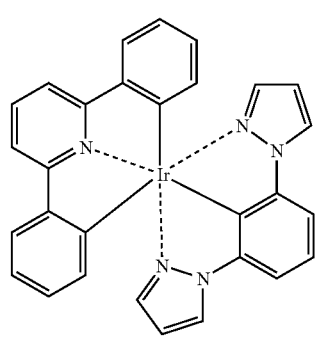
Compound (175)
-continued
Compound (176)
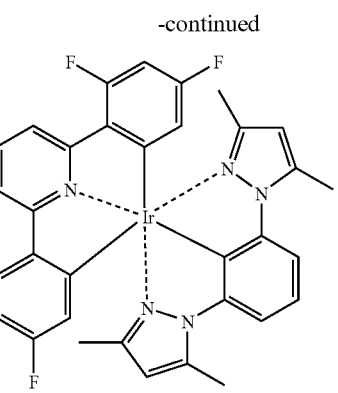
Compound (177)
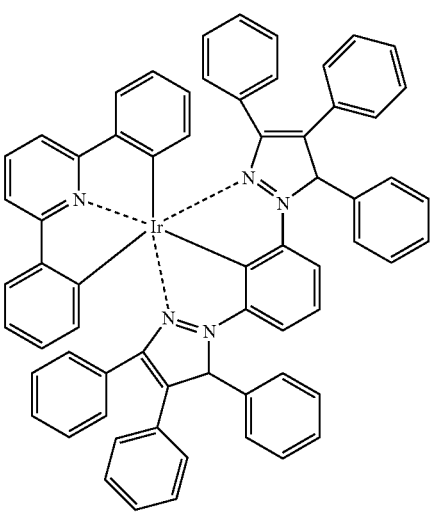
Compound (178)
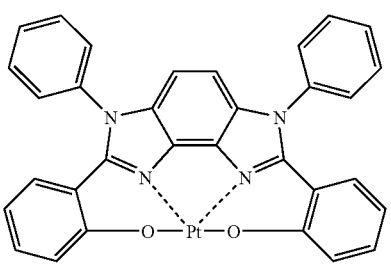
Compound (179)
Compound (180)
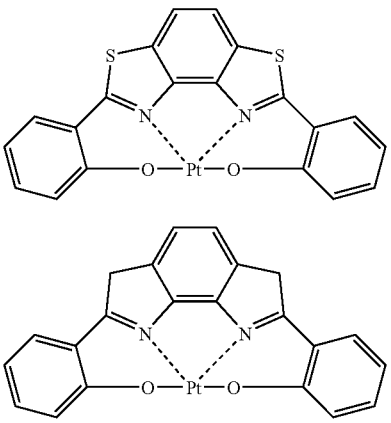

-continued
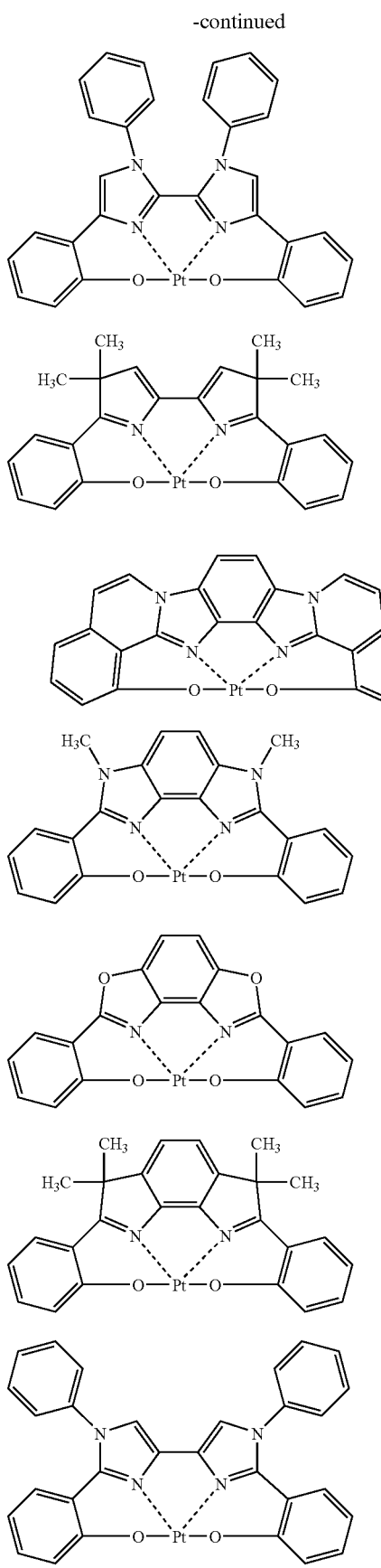
Compound (181)
Compound (182)
Compound (183)
Compound (184)
Compound (185)
Compound (186)
Compound (187)
-continued
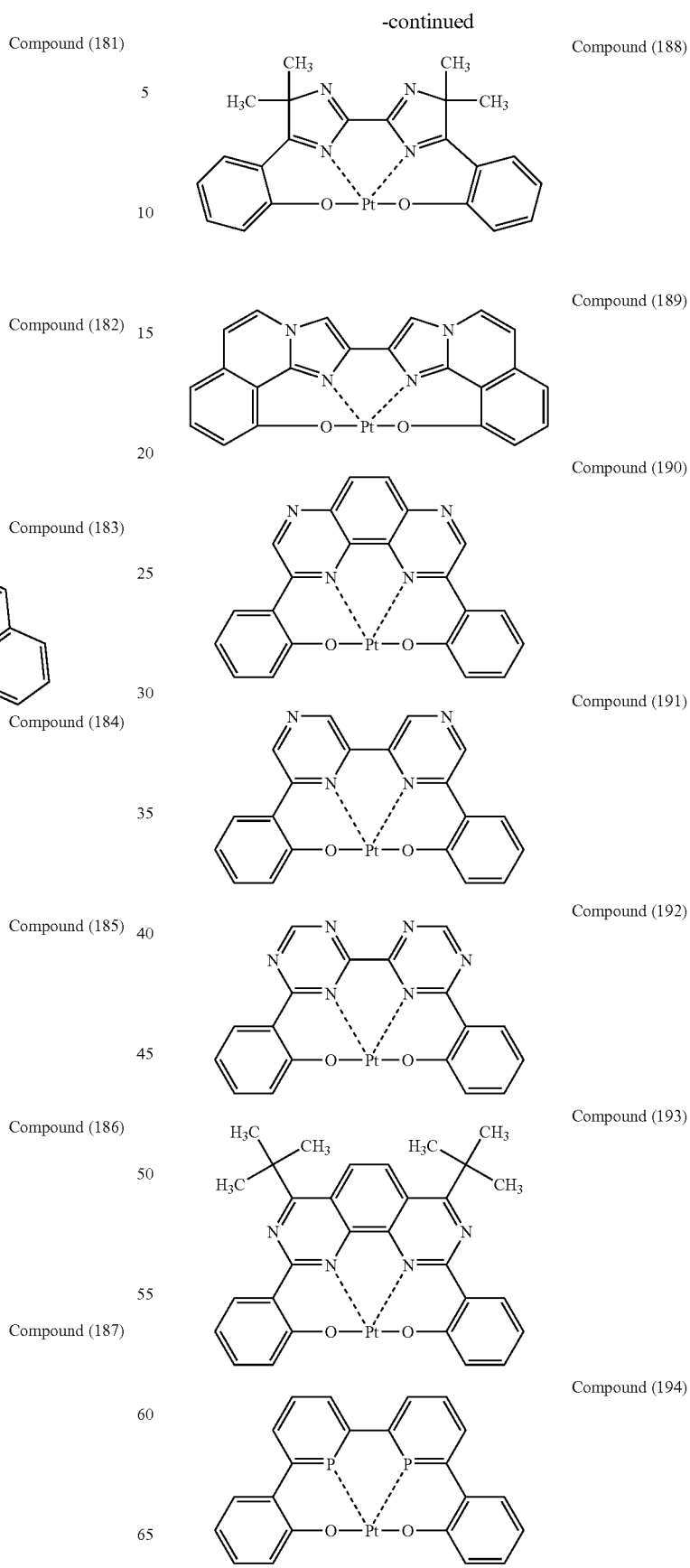
Compound (188)
Compound (189)
Compound (190)
Compound (191)
Compound (192)
Compound (193)
Compound (194)

Compound (195)
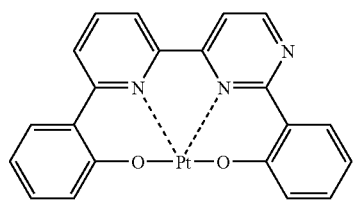
Compound (196)
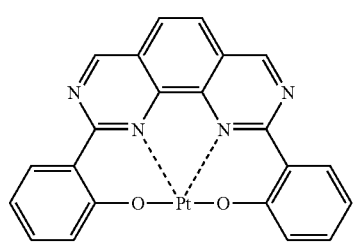
Compound (197)
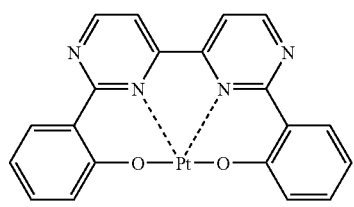
Compound (198)
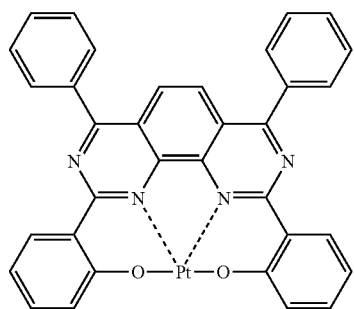
Compound (199)
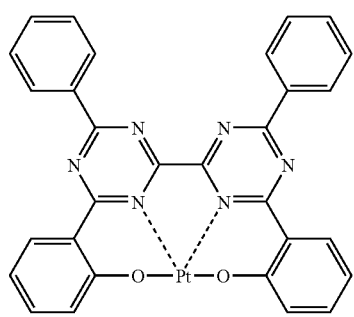
Compound (200)
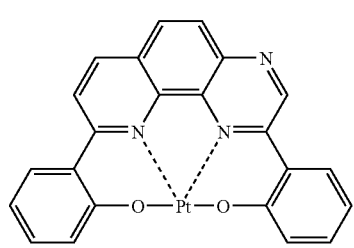
Compound (201)
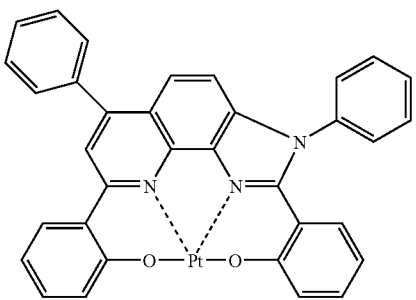
Compound (202)
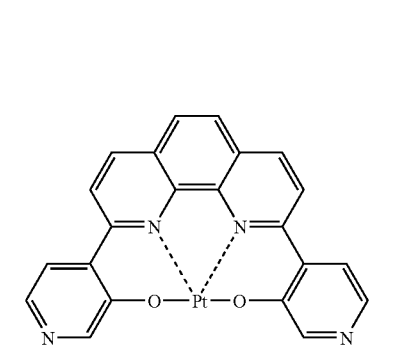
Compound (203)
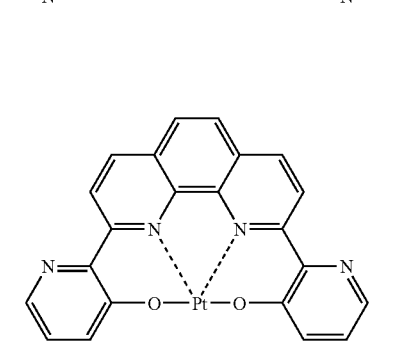
Compound (204)
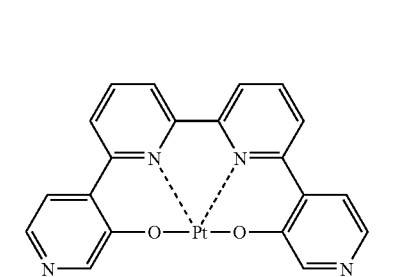
Compound (205)
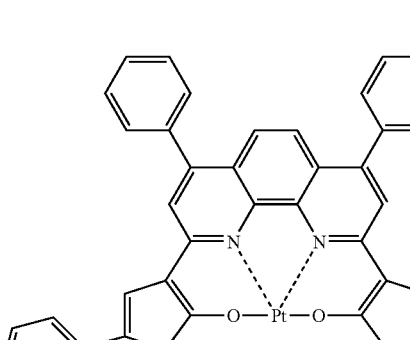

Compound (206)
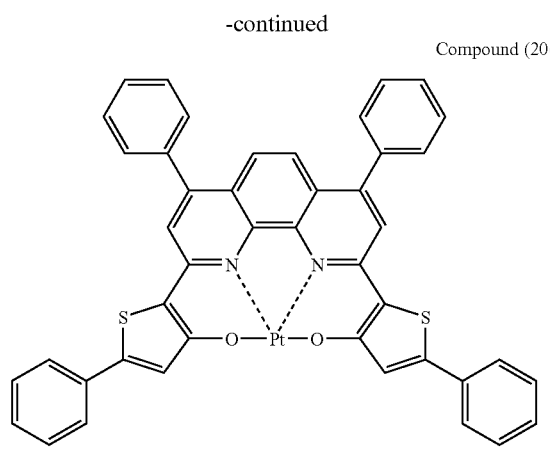
Compound (207)
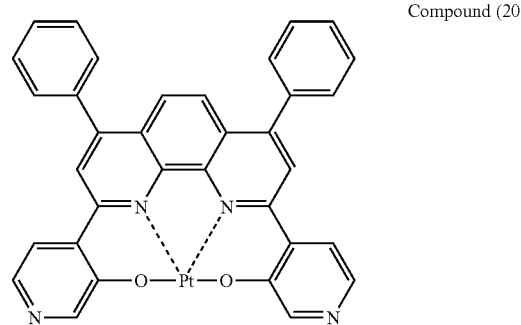
Compound (208)
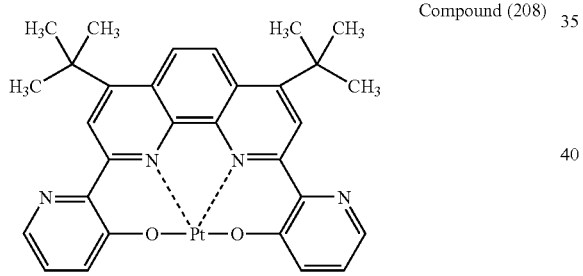
Compound (209)
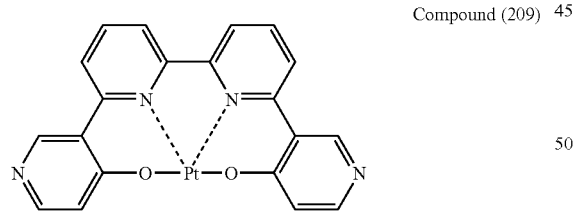
Compound (210)
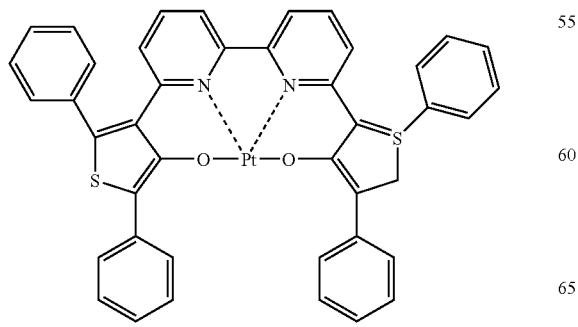
Compound (211)
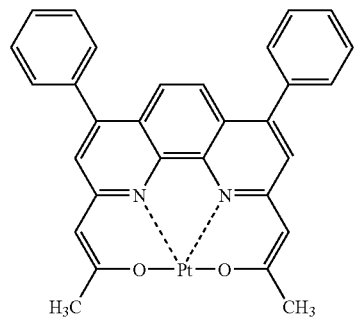
Compound (212)
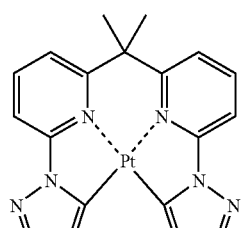
Compound (213)
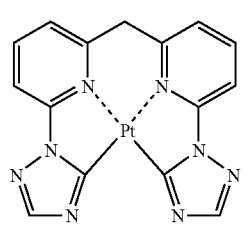
Compound (214)
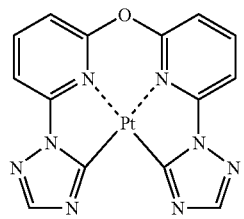
Compound (215)
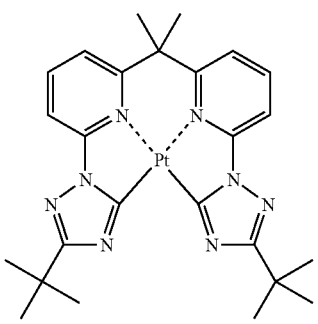
Compound (216)
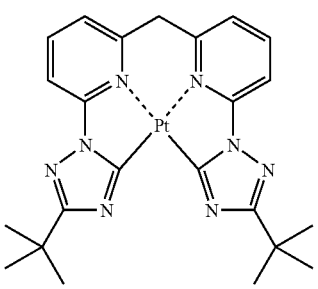

-continued
Compound (217)
Compound (218)
Compound (219)
Compound (220)
Compound (221)
Compound (222)
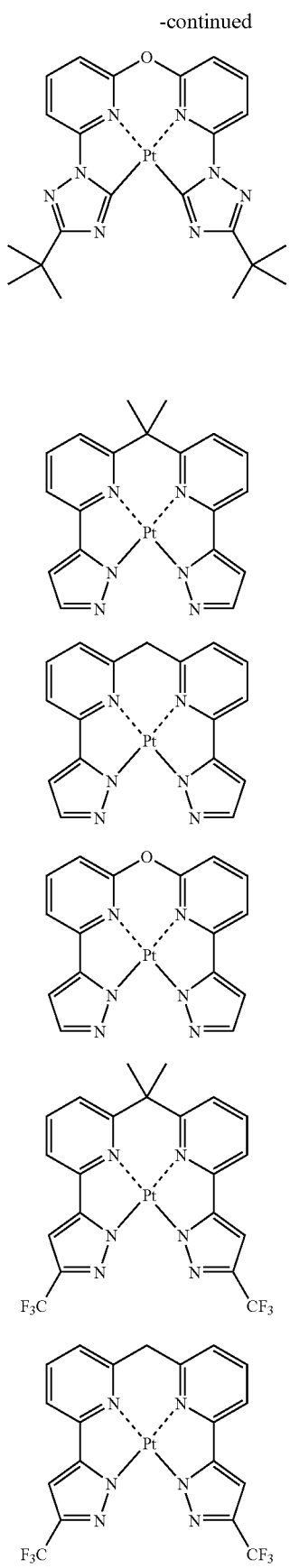
-continued
Compound (223)
Compound (224)
Compound (225)
Compound (226)
Compound (227)
Compound (228)
Compound (229)
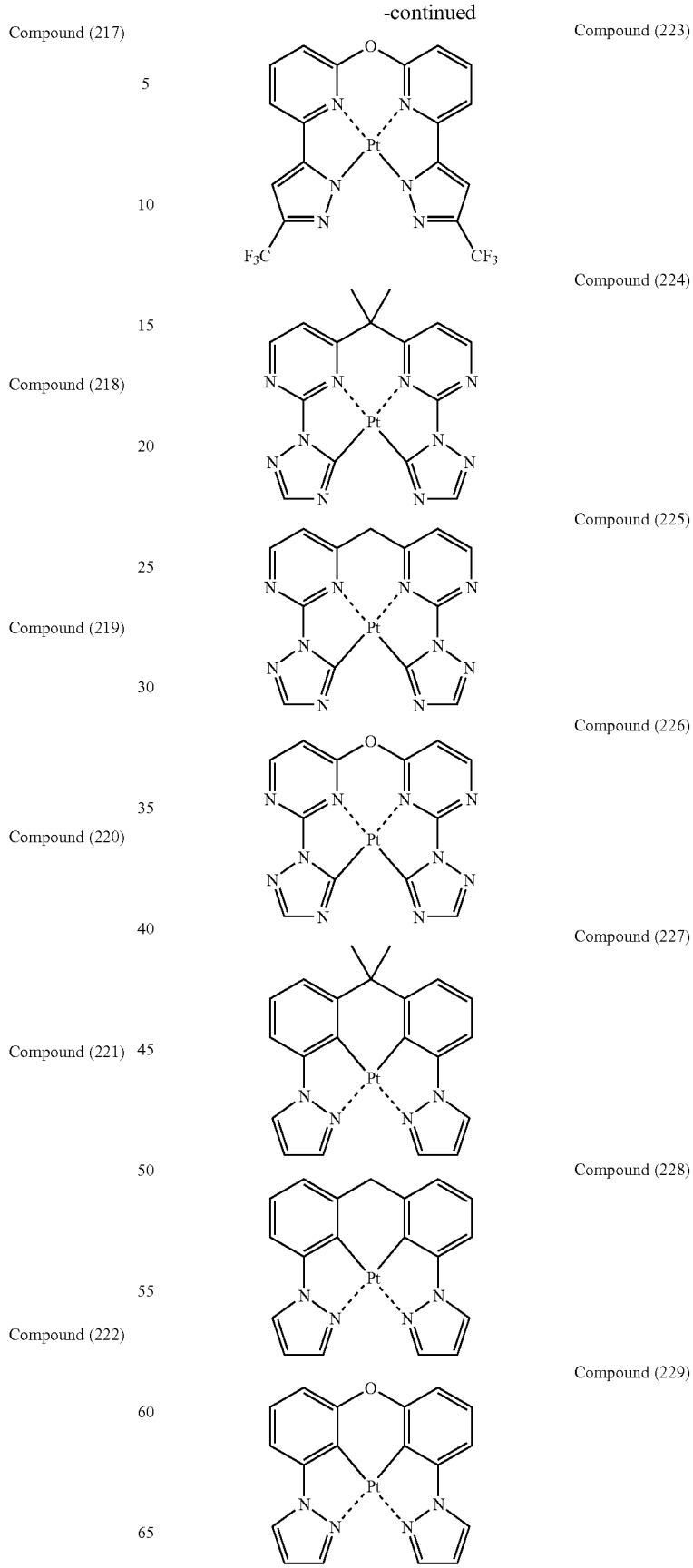

-continued
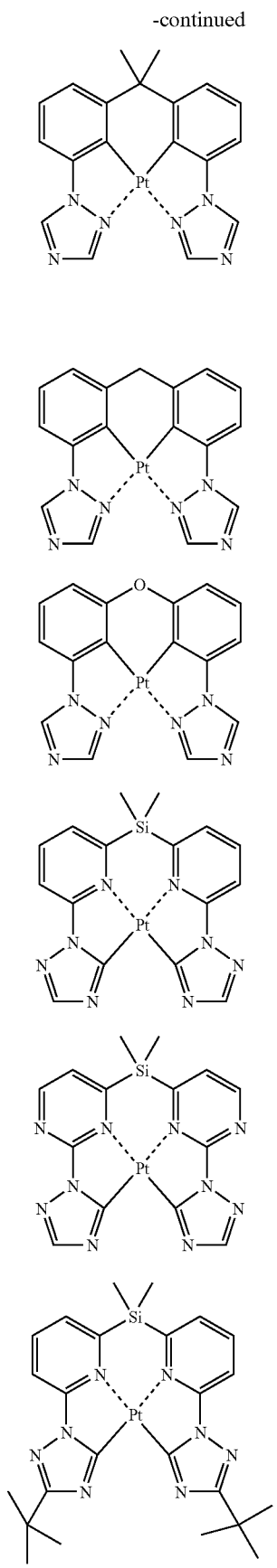
Compound (230)
Compound (231)
Compound (232)
Compound (233)
Compound (234)
Compound (235)
-continued
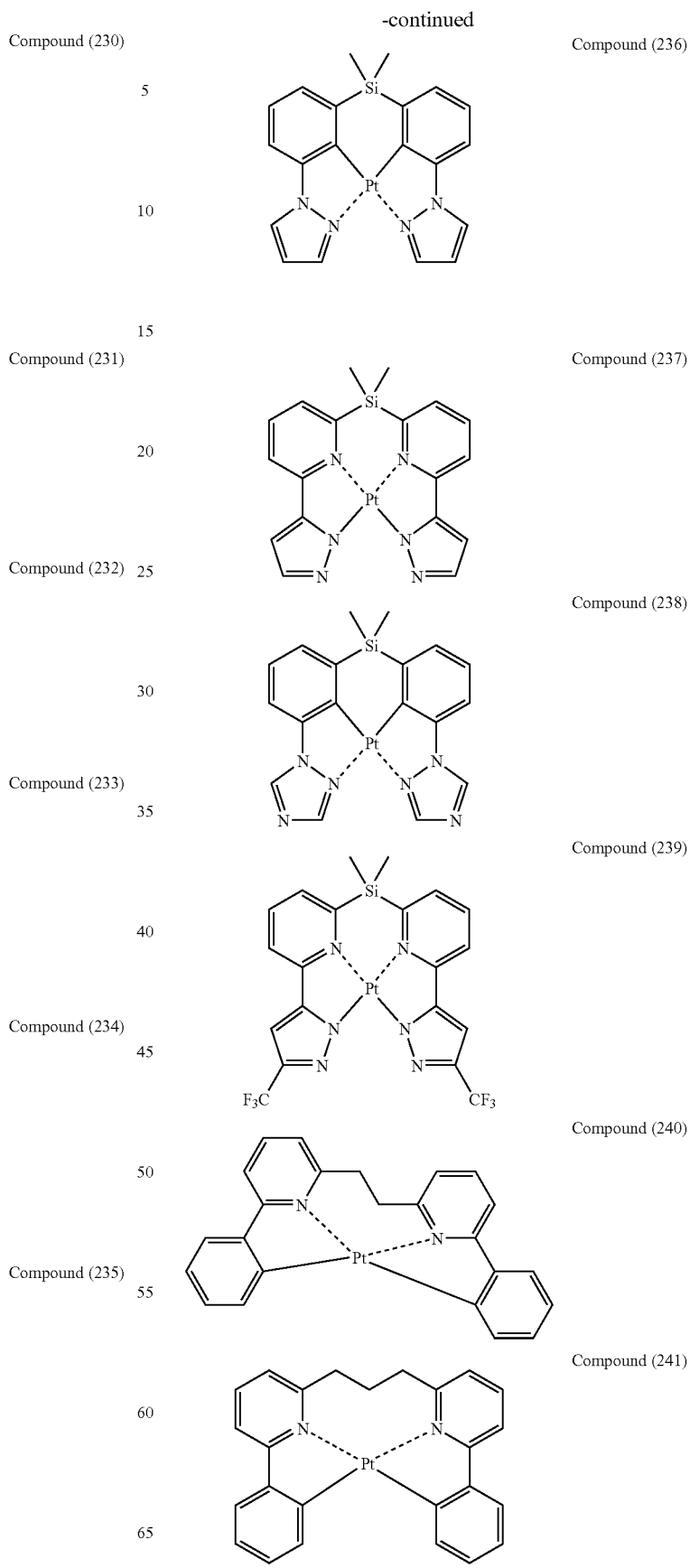
Compound (236)
Compound (237)
Compound (238)
Compound (239)
Compound (240)
Compound (241)

Compound (242)
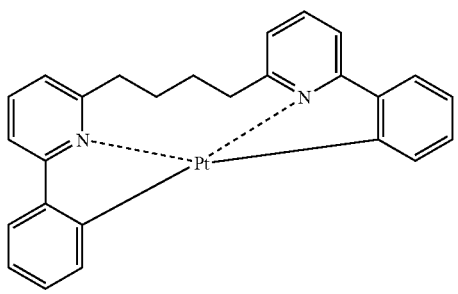

Compound (243)
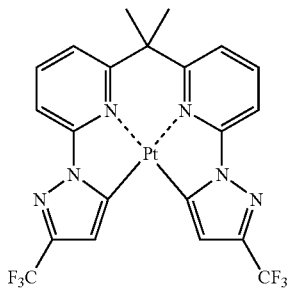

Compound (244)
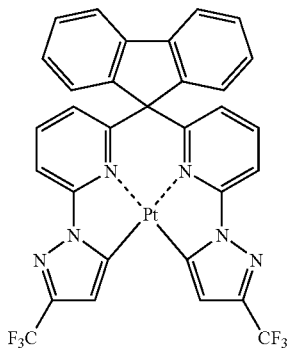

Compound (245)
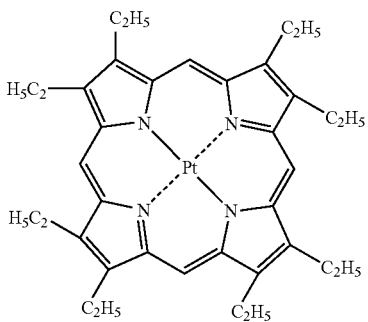

Method of Preparing the Metal Complex According to the Invention

The metal complexes according to the invention [compounds represented by Formula (I), (1), (1-A), (2), (3), (3-A), (3-B), (3-C), (4), (4-A), (5), (5-A), (5-B) and Formula (II), (X2), or (X3)] can be prepared by various methods.

For example, a metal complex within the scope of the invention can be prepared by allowing a ligand or a dissociated form of the ligand to react with a metal compound under heating or at a temperature which is not higher than room temperature, 1) in the presence of a solvent (such as a halogenated solvent, an alcohol solvent, an ether solvent, an ester solvent, a ketone solvent, a nitrile solvent, an amide solvent, a sulfone solvent, a sulfoxide solvent, or water), 2) in the absence of a solvent but in the presence of a base (an inorganic or organic base such as sodium methoxide, potassium t-butoxide, triethylamine, or potassium carbonate), or 3) in the absence of a base. The heating may be conducted efficiently by a normal method or by using a microwave.

The reaction period at the preparation of the metal complex according to the invention may be changed according to the activity of the raw materials and is not particularly limited. It is preferably in a range of 1 minute to 5 days, more preferably in a range of 5 minutes to 3 days, and still more preferably in a range of 10 minutes to 1 day.

The reaction temperature for the preparation of the metal complex according to the invention may be changed according to the reaction activity, and is not particularly limited. The reaction temperature is preferably 0° C. to 300° C., more preferably 5° C. to 250° C., and still more preferably 1020 C. to 200° C.

Each of the metal complexes according to the invention, i.e., the compounds represented by Formula (I), (1), (1-A), (2), (3), (3-A), (3-B3), (3-C), (4), (4-A), (5), (5-A), or (5-B) and the compound represented by Formulae (II), (X2), or (X3), can be prepared by properly selecting a ligand that forms the partial structure of the desirable complex. For example, a compound represented by Formula (1-A) can be prepared by adding 6,6'-bis(2-hydroxyphenyl)-2,2'-bipyridyl ligand or a modified compound thereof (e.g., 2,9-bis(2-hydroxyphenyl)-1,10-phenanthroline ligand, 2,9-bis(2-hydroxyphenyl)-4,7-diphenyl-1,10-phenanthroline ligand, 6,6'-bis(2-hydroxy-5-tert-butylphenyl)-2,2'-bipyridyl ligand) to a metal compound in an amount of preferably 0.1 to 10 equivalences, more preferably 0.3 to 6 equivalences, and still more preferably 0.5 to 4 equivalences, with respect to the quantity of metal compound. The reaction solvent, reaction time, and reaction temperature at the preparation of the compound represented by Formula (1-A) are the same as in the method for preparing the metal complexes according to the invention described above.

The modified compounds of 6,6'-bis(2-hydroxyphenyl)-2,2'-bipyridyl ligand can be prepared by any one of known preparative methods.

In an embodiment, a modified compound is prepared by allowing a 2,2'-bipyridyl compound (e.g., 1,10-phenanthroline) to react with an anisole compound (e.g., 4-fluoroanisole) according to the method described in Journal of Organic Chemistry, 741, 11, (1946), the disclosure of which is incorporated herein by reference. In another embodiment, a modified compound is prepared by performing Suzuki coupling reaction using a halogenated 2,2'-bipyridyl compound (e.g., 2,9-dibromo-1,10-phenanthroline) and a 2-methoxyphenylboronic acid compound (e.g., 2-methoxy-5-fluorophenylboronic acid) as starting materials and then deprotecting the methyl group (according to the method described in Journal of Organic Chemistry, 741, 11, (1946) or under heating in pyridine hydrochloride salt). In another embodiment, a modified compound can be prepared by performing Suzuki coupling reaction using a 2,2'-bipyridylboronic acid compound [e.g., 6,6'-bis(4,4,5,5-tetramethyl-1,3,2-dioxaboronyl)-2,2'-bipyridyl] and a halogenated anisole compound (e.g., 2-bromoanisole) as starting materials and then deprotecting the methyl group (according to the method described in Journal of Organic Chemistry, 741, 11, (1946) or under heating in pyridine hydrochloride salt).

When the above-mentioned ligand for the metal complex according to the invention is a cyclic ligand, the metal complex is preferably a compound represented by the following Formula (III).

Hereinafter, the compound represented by the following Formula (III) will be described.

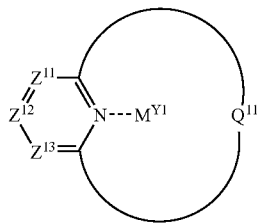

Formula (III)

In Formula (III), $Q^{11}$ represents an atomic group forming a nitrogen-containing heterocycle. $Z^{11}$, $Z^{12}$, and $Z^{13}$ each independently represent a substituted carbon atom, an unsubstituted carbon atom, a substituted nitrogen atom, or an unsubstituted nitrogen atom. $M^{Y1}$ represents a metal ion that may have an additional ligand.

In Formula (III), $Q^{11}$ represents an atomic group forming a nitrogen-containing heterocycle together with the two carbon atoms bonded to $Q^{11}$ and the nitrogen atom directly bonded to these carbon atoms. The number of the atoms constituting the nitrogen-containing heterocycle containing $Q^{11}$ is not particularly limited. It is preferably 12 to 20, more preferably 14 to 16, and still more preferably 16.

$Z^{11}$, $Z^{12}$, and $Z^{13}$ each independently represent a substituted or unsubstituted carbon or nitrogen atom. At least one of $Z^{11}$, $Z^{12}$, and $Z^{13}$ is preferably a nitrogen atom.

Examples of the substituent on the carbon atom include alkyl groups (preferably having 1 to 30 carbon atoms, more preferably 1 to 20 carbon atoms, and particularly preferably 1 to 10 carbon atoms, and examples thereof include a methyl group, an ethylgroup, an iso-propyl group, a tert-butyl group, a n-octyl group, a n-decyl group, a n-hexadecyl group, a cyclopropyl group, a cyclopentyl group, and a cyclohexyl group), alkenyl groups (preferably having 2 to 30 carbon atoms, more preferably 2 to 20 carbon atoms, and particularly preferably 2 to 10 carbon atoms, and examples thereof include a vinyl group, an allyl group, a 2-butenyl group, and a 3-pentenyl group), alkynyl groups (preferably having 2 to 30 carbon atoms, more preferably 2 to 20 carbon atoms, and particularly preferably 2 to 10 carbon atoms, and examples thereof include a propargyl group and a 3-pentynyl group), aryl groups (preferably having 6 to 30 carbon atoms, more preferably 6 to 20 carbon atoms, and particularly preferably 6 to 12 carbon atoms, and examples thereof include a phenyl group, a p-methylphenyl group, a naphthyl group, and a anthranyl group), amino groups (preferably having 0 to 30 carbon atoms, more preferably 0 to 20 carbon atoms, and particularly preferably 0 to 10 carbon atoms, and examples thereof include an amino group, a methylamino group, a dimethylamino group, a diethylamino group, a dibenzylamino group, a diphenylamino group, and a ditolylamino group), alkoxy groups (preferably having 1 to 30 carbon atoms, more preferably 1 to 20 carbon atoms, and particularly preferably 1 to 10 carbon atoms, and examples thereof include a methoxy group, an ethoxy group, a butoxy group, and a 2-ethylhexyloxy group), aryloxy groups (preferably having 6 to 30 carbon atoms, more preferably 6 to 20 carbon atoms, and particularly preferably 6 to 12 carbon atoms, and examples thereof include a phenyloxy group, a 1-naphthyloxy group, and a 2-naphthyloxy group), heterocyclic oxy groups (preferably having 1 to 30 carbon atoms, more preferably 1 to 20 carbon atoms, and particularly preferably 1 to 12 carbon atoms, and examples thereof include a pyridyloxy group, a pyrazyloxy group, a pyrimidyloxy group, and a quinolyloxy group), acyl groups (preferably having 1 to 30 carbon atoms, more preferably 1 to 20 carbon atoms, and particularly preferably 1 to 12 carbon atoms, and examples thereof include an acetyl group, a benzoyl group, a formyl group, and a pivaloyl group), alkoxycarbonyl groups (preferably having 2 to 30 carbon atoms, more preferably 2 to 20 carbon atoms, and particularly preferably 2 to 12 carbon atoms, and examples thereof include a methoxycarbonyl group and a ethoxycarbonyl group), aryloxycarbonyl groups (preferably having 7 to 30 carbon atoms, more preferably 7 to 20 carbon atoms, and particularly preferably 7 to 12 carbon atoms, and examples thereof include a phenyloxycarbonyl group), acyloxy groups (preferably having 2 to 30 carbon atoms, more preferably 2 to 20 carbon atoms, and particularly preferably 2 to 10 carbon atoms, and examples thereof include an acetoxy group and a benzoyloxy group), acylamino groups (preferably having 2 to 30 carbon atoms, more preferably 2 to 20 carbon atoms and particularly preferably 2 to 10 carbon atoms, and examples thereof include an acetylamino group and a benzoylamino group), alkoxycarbonylamino groups (preferably having 2 to 30 carbon atoms, more preferably 2 to 20 carbon atoms, and particularly preferably 2 to 12 carbon atoms, and examples thereof include a methoxycarbonylamino group), aryloxycarbonylamino groups (preferably having 7 to 30 carbon atoms, more preferably 7 to 20 carbon atoms, and particularly preferably 7 to 12 carbon atoms, and examples thereof include a phenyloxycarbonylamino group), sulfonylamino groups (preferably having 1 to 30 carbon atoms, more preferably 1 to 20 carbon atoms, and particularly preferably 1 to 12 carbon atoms, and examples thereof include a methanesulfonylamino group and a benzene sulfonylamino group), sulfamoyl groups (preferably having 0 to 30 carbon atoms, more preferably 0 to 20 carbon atoms, and particularly preferably 0 to 12 carbon atoms, and examples thereof include a sulfamoyl group, a methylsulfamoyl group, a dimethylsulfamoyl group, and a phenylsulfamoyl group), carbamoyl groups preferably having 1 to 30 carbon atoms, more preferably 1 to 20 carbon atoms, and particularly preferably 1 to 12 carbon atoms, and examples thereof include a carbamoyl group, a methylcarbamoyl group, a diethylcarbamoyl group, and a phenylcarbamoyl group), alkylthio groups (preferably having 1 to 30 carbon atoms, more preferably 1 to 20 carbon atoms, and particularly preferably 1 to 12 carbon atoms, and examples thereof include a methylthio group and a ethylthio group), arylthio groups (preferably having 6 to 30 carbon atoms, more preferably 6 to 20 carbon atoms, and particularly preferably 6 to 12 carbon atoms, and examples thereof include a phenylthio group), heterocyclic thio groups (preferably having 1 to 30 carbon atoms, more preferably 1 to 20 carbon atoms, and particularly preferably 1 to 12 carbon atoms, and examples thereof include a pyridylthio group, a 2-benzimidazolylthio group, a 2-benzoxazolylthio group, and a 2-benzothiazolylthio group), sulfonyl groups (preferably having 1 to 30 carbon atoms, more preferably 1 to 20 carbon atoms, and particularly preferably 1 to 12 carbon atoms, and examples thereof include a mesyl group and a tosyl group), sulfinyl groups (preferably having 1 to 30 carbon atoms, more preferably 1 to 20 carbon atoms, and particularly preferably 1 to 12 carbon atoms, and examples thereof include a methanesulfinyl group and a benzenesulfinyl group), ureido groups (preferably having 1 to 30 carbon atoms, more preferably 1 to 20 carbon atoms, and particularly preferably 1 to 12 carbon atoms, and examples thereof include a ureido group, a methylureido group, and a phenylureido group), phosphoric amide groups (preferably having 1 to 30 carbon atoms, more preferably 1 to 20 carbon atoms, and particularly preferably 1 to 12 carbon atoms, and examples thereof include a diethylphosphoric amide group and a phenylphosphoric amide group), a hydroxy group, a mercapto group, halogen atoms (e.g., fluorine, chlorine, bromine, and iodine), a cyano group, a sulfo group, a carboxyl group, a nitro group, a hydroxamic acid group, sulfino groups, hydrazino groups, imino groups, heterocyclic groups (preferably having 1 to 30 carbon atoms, and particularly preferably 1 to 12 carbon atoms; the heteroatom(s) may be selected from nitrogen, oxygen and sulfur atoms; examples of the heterocyclic groups include imidazolyl, pyridyl, quinolyl, furyl, thienyl, piperidyl, morpholino, benzoxazolyl, benzimidazolyl, benzothiazolyl, carbazolyl, and azepinyl), silyl groups (preferably having 3 to 40 carbon atoms, more preferably 3 to 30 carbon atoms, and particularly preferably 3 to 24 carbon atoms, and examples thereof include a trimethylsilyl group and a triphenylsilyl group), silyloxy groups (preferably having 3 to 40 carbon atoms, more preferably 3 to 30 carbon atoms, and particularly preferably 3 to 24 carbon atoms, and examples thereof include a trimethylsilyloxy group and a triphenylsilyloxy group), and the like. These substituents may have a substituent(s).

Among these substituents, the substituent on the carbon atom is preferably an alkyl group, an aryl, a heterocyclic group or a halogen atom, more preferably an aryl group or a halogen atom, and still more preferably a phenyl group or a fluorine atom.

The substituent on the nitrogen atom may be selected from the substituents described as examples of the substituent on the carbon atom, and have the same preferable range as in the case of the substituent on the carbon atom.

In Formula (III), $M^{Y1}$ represents a metal ion that may have an additional ligand. $M^{Y1}$ preferably represents a metal ion having no ligand.

The metal ion represented by $M^{Y1}$ is not particularly limited. It is preferably a divalent or trivalent metal ion. The divalent or trivalent metal ion is preferably a cobalt ion, a magnesium ion, a zinc ion, a palladium ion, a nickel ion, a copper ion, a platinum ion, a lead ion, an aluminum ion, an iridium ion, or a europium ion, more preferably a cobalt ion, a magnesium ion, a zinc ion, a palladium ion, a nickel ion, a copper ion, a platinum ion, or a lead ion, still more preferably a copper ion, or a platinum ion, and particularly preferably a platinum ion. $M^{Y1}$ may or may not be bound to an atom contained in $Q^{11}$, and is preferably bound to an atom contained in $Q^{11}$.

The additional ligand that $M^{Y1}$ may have is not particularly limited, but is preferably a monodentate or bidentate ligand, and more preferably a bidentate ligand. The coordinating atom is not particularly limited, but preferably an oxygen atom, a sulfur atom, a nitrogen atom, a carbon atom, or a phosphorus atom, more preferably an oxygen atom, a nitrogen atom, or a carbon atom, and still more preferably an oxygen atom or a nitrogen atom.

Preferable examples of compounds represented by Formula (III) include compounds represented by the following Formulae (a) to (j) and the tautomers thereof.

Compounds represented by Formula (III) are more preferably selected from compounds represented by Formula (a) or (b) and tautomers thereof, and still more preferably selected from compounds represented by Formula (b).

Compounds represented by Formula (c) or (g) are also preferable as the compounds represented by Formula (III).

A compound represented by Formula (c) is preferably a compound represented by Formula (d), a tautomer of a compound represented by Formula (d), a compound represented by Formula (e), a tautomer of a compound represented by Formula (e), a compound represented by Formula (f) or a tautomer of a compound represented by Formula (f); more preferably a compound represented by Formula (d), a tautomer of a compound represented by Formula (d), a compound represented by Formula (e), or a tautomer of a compound represented by Formula (e); and still more preferably a compound represented by Formula (d) or a tautomer of a compound represented by Formula (d).

A compound represented by Formula (g) is preferably a compound represented by Formula (h), a tautomers of a compound represented by Formula (h), a compound represented by Formula (i), a tautomer of a compound represented by Formula (i), a compounds represented by Formula (j) or a tautomer of a compounds represented by Formula (j); more preferably a compound represented by Formula (h), a tautomers of a compound represented by Formula (j), a compound represented by Formula (i), or a tautomer of a compound represented by Formula (i); and still more preferably a compound represented by Formula (h) or a tautomer of a compound represented by Formula (h).

Hereinafter, the compounds represented by Formulae (a) to (j) will be described in detail.

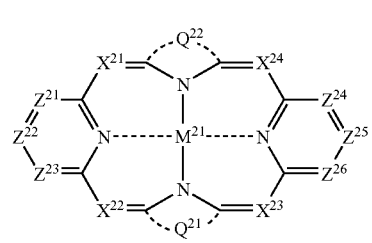

Formula (a)

The compound represented by Formula (a) will be described below.

In Formula (a), the definitions and preferable ranges of $Z^{21}$, $Z^{22}$, $Z^{23}$, $Z^{24}$, $Z^{25}$, $Z^{26}$, and $M^{21}$ are similar to the definitions and preferable ranges of corresponding $Z^{11}$, $Z^{12}$, $Z^{13}$, $Z^{11}$, $Z^{12}$, $Z^{13}$, and $M^{Y1}$ in Formula (III), respectively.

$Q^{21}$ and $Q^{22}$ each represent a group forming a nitrogen-containing heterocycle. Each of the nitrogen-containing heterocycles formed by $Q^{21}$ and $Q^{22}$ is not particularly limited, but is preferably a pyrrole ring, an imidazole ring, a triazole ring, a condensed ring containing one or more of the above rings (e.g., benzopyrrole), or a tautomer of any of the above rings (e.g., in Formula (b) below, the nitrogen containing five-membered ring substituted by $R^{43}$ and $R^{44}$, or by $R^{45}$ and $R^{46}$ is defined as a tautomer of pyrrole), and more preferably a pyrrole ring or a condensed ring containing a pyrrole ring (e.g., benzopyrrole).

$X^{21}$, $X^{22}$, $X^{23}$, and $X^{24}$ each independently represent a substituted or unsubstituted carbon atom or a nitrogen atom, preferably an unsubstituted carbon or a nitrogen atom, and more preferably a nitrogen atom.

The compound represented by Formula (b) will be described below.

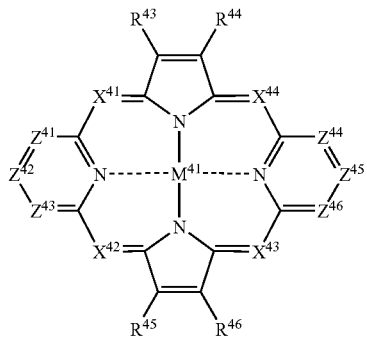

Formula (b)

In Formula (b), the definitions and preferable ranges of $Z^{41}$, $Z^{42}$, $Z^{43}$, $Z^{44}$, $Z^{45}$, $Z^{46}$, $X^{41}$, $X^{42}$, $X^{43}$, $X^{44}$, and $M^{41}$ are similar to the definitions and preferable ranges of $Z^{21}$, $Z^{22}$, $Z^{23}$, $Z^{24}$, $Z^{25}$, $Z^{26}$, $X^{21}$, $X^{22}$, $X^{23}$, $X^{24}$, and $M^{21}$ in Formula (a), respectively.

$R^{43}$, $R^{44}$, $R^{45}$, and $R^{46}$ are each preferably selected from a hydrogen atom, the alkyl groups and the aryl groups described as examples of the substituent on $Z^{11}$ or $Z^{12}$ in Formula (III), a group in which $R^{43}$ and $R^{44}$ are bonded to each other to form a ring structure (e.g., a benzo-condensed ring or a pyridine-condensed ring) and a group in which $R^{45}$ and $R^{46}$ are bonded to each other to form a ring structure (e.g., a benzo-condensed ring or a pyridine-condensed ring). $R^{43}$, $R^{44}$, $R^{45}$, and $R^{46}$ are each more preferably selected from an alkyl group, an aryl group, a group in which $R^{43}$ and $R^{44}$ are bonded to each other to form a ring structure (e.g., a benzo-condensed ring or a pyridine-condensed ring) and a group in which $R^{45}$ and $R^{46}$ are bonded to each other to form a ring structure (e.g., a benzo-condensed ring or a pyridine-condensed ring). It is still more preferable that $R^{43}$ and $R^{44}$ are bonded to each other to form a ring structure (e.g., a benzo-condensed ring or a pyridine-condensed ring) and/or $R^{45}$ and $R^{46}$ are bonded to each other to form a ring structure (e.g., a benzo-condensed ring or a pyridine-condensed ring).

$R^{43}$, $R^{44}$, $R^{45}$, and $R^{46}$ each independently represent a hydrogen atom or a substituent. Examples of the substituent include the groups described as examples of the substituent on the carbon atom represented by $Z^{11}$ or $Z^{12}$ in Formula (III).

The compound represented by Formula (c) will be described below.

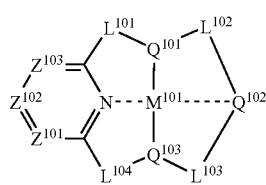

Formula (c)

In Formula (c), $Z^{101}$, $Z^{102}$, and $Z^{103}$ each independently represent a substituted or unsubstituted carbon or nitrogen atom. At least one of $Z^{101}$, $Z^{102}$, and $Z^{103}$ is preferably a nitrogen atom.

$L^{101}$, $L^{102}$, $L^{103}$, and $L^{104}$ each independently represent a single bond or a connecting group. The connecting group is not particularly limited, and examples thereof include a carbonyl connecting group, an alkylene group, an alkenylene group, an arylene group, a heteroarylene group, a nitrogen-containing heterocycle connecting group, a connecting group which connects moieties via an oxygen atom, a sulfur atom or a silicon atom, an amino connecting group, an imino connecting group, a carbonyl connecting group, and connecting groups comprising combinations thereof.

$L^{101}$, $L^{102}$, $L^{103}$, and $L^{104}$ are each preferably a single bond, an alkylene group, an alkenylene group, an amino connecting group, or an imino connecting group, more preferably a single bond, an alkylene connecting group, an alkenylene connecting group, or an imino connecting group, and still more preferably a single bond or an alkylene connecting group.

$Q^{101}$ and $Q^{103}$ each independently represent a group containing a carbon atom coordinating to $M^{101}$, a group containing a nitrogen atom coordinating to $M^{101}$, a group containing a phosphorus atom coordinating to $M^{101}$, a group containing an oxygen atom coordinating to $M^{101}$, or a group containing a sulfur atom coordinating to $M^{101}$.

The group containing a carbon atom coordinating to $M^{101}$ is preferably an aryl group containing a coordinating carbon atom, a five-membered ring heteroaryl group containing a coordinating carbon atom, or a six-membered ring heteroaryl group containing a coordinating carbon atom; more preferably, an aryl group containing a coordinating carbon atom, a nitrogen-containing five-membered ring heteroaryl group containing a coordinating carbon atom, or a nitrogen-containing six-membered ring heteroaryl group containing a coordinating carbon atom; and still more preferably, an aryl group containing a coordinating carbon atom.

The group containing a nitrogen atom coordinating to $M^{101}$ is preferably a nitrogen-containing five-membered ring heteroaryl group containing a coordinating nitrogen atom or a nitrogen-containing six-membered ring heteroaryl group containing a coordinating nitrogen atom, and more preferably a nitrogen-containing six-membered ring heteroaryl group containing a coordinating nitrogen atom.

The group containing a phosphorus atom coordinating to $M^{101}$ is preferably an alkyl phosphine group containing a coordinating phosphorus atom, an aryl phosphine group containing a coordinating phosphorus atom, an alkoxyphosphine group containing a coordinating phosphorus atom, an aryloxyphosphine group containing a coordinating phosphorus atom, a heteroaryloxyphosphine group containing a coordinating phosphorus atom, a phosphinine group containing a coordinating phosphorus atom, or a phosphor group containing a coordinating phosphorus atom; more preferably, an alkyl phosphine group containing a coordinating phosphorus atom or an aryl phosphine group containing a coordinating phosphorus atom.

The group containing an oxygen atom coordinating to $M^{101}$ is preferably an oxy group or a carbonyl group containing a coordinating oxygen atom, and more preferably an oxy group.

The group containing a sulfur atom coordinating to $M^{101}$ is preferably a sulfide group, a thiophene group, or a thiazole group, and more preferably a thiophene group.

Each of $Q^{101}$ and $Q^{103}$ is preferably a group containing a carbon atom coordinating to $M^{101}$, a group containing a nitrogen atom coordinating to $M^{101}$, or a group containing a an oxygen atom coordinating to $M^{101}$; more preferably a group containing a carbon atom or a group containing a nitrogen atom coordinating to $M^{101}$; and still more preferably a group containing a carbon atom coordinating to $M^{101}$.

$Q^{102}$ represents a group containing a nitrogen atom coordinating to $M^{101}$, a group containing a phosphorus atom coordinating to $M^{101}$, a group containing an oxygen atom coordinating to $M^{101}$ or a group containing a sulfur atom coordinating to $M^{101}$, and preferably a group containing a nitrogen atom coordinating to $M^{101}$.

The definition of $M^{101}$ is similar to that of $M^{11}$ in Formula (I), and their preferable ranges are also similar.

The compound represented by Formula (d) will be described below.

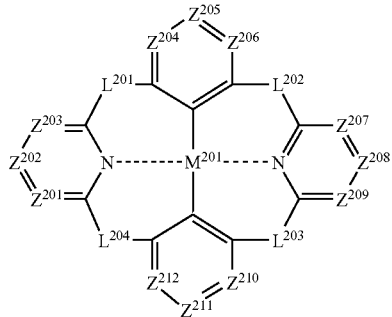

Formula (d)

In Formula (d), the definitions and preferable ranges of $Z^{201}, Z^{202}, Z^{203}, Z^{207}, Z^{208}, Z^{209}, L^{201}, L^{202}, L^{203}, L^{204}$, and $M^{201}$ are similar to the definitions and preferable ranges $Z^{101}$, $Z^{102}, Z^{103}, Z^{101}, Z^{102}, Z^{103}, L^{101}, L^{102}, L^{103}, L^{104}$, and $M^{101}$ in Formula (c), respectively. $Z^{204}, Z^{205}, Z^{206}, Z^{210}, Z^{211}$ and $Z^{212}$ each represent a substituted or unsubstituted carbon or a substituted or unsubstituted nitrogen atom, and preferably a substitute or unsubstituted carbon atom.

The compound represented by Formula (e) will be described below.

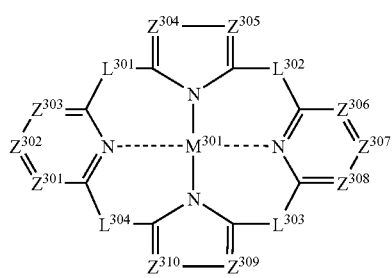

Formula (e)

In Formula (e), the definitions and preferable ranges of $Z^{301}, Z^{302}, Z^{303}, Z^{304}, Z^{305}, Z^{306}, Z^{307}, Z^{308}, Z^{309}, Z^{310}, L^{301}$, $L^{302}, L^{303}, L^{304}$, and $M^{301}$ are similar to the definitions and preferably ranges of corresponding $Z^{201}, Z^{202}, Z^{203}, Z^{204}$, $Z^{206}, Z^{207}, Z^{208}, Z^{209}, Z^{210}, Z^{212}, L^{101}, L^{102}, L^{103}, L^{104}$, and $M^{101}$ in formulae (d) and (c), respectively.

The compound represented by Formula (f) will be described below.

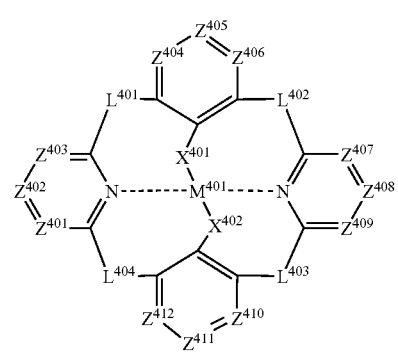

Formula (f)

In Formula (f), the definitions and preferable ranges of $Z^{401}, Z^{402}, Z^{403}, Z^{404}, Z^{405}, Z^{406}, Z^{407}, Z^{408}, Z^{409}, Z^{410}, Z^{411}$, $Z^{412}, L^{401}, L^{402}, L^{403}, L^{404}$, and $M^{401}$ are similar to the definitions and preferable ranges of corresponding $Z^{201}, Z^{202}$, $Z^{203}, Z^{204}, Z^{205}, Z^{206}, Z^{207}, Z^{208}, Z^{209}, Z^{210}, Z^{211}, Z^{212}, L^{101}$, $L^{102}, L^{103}, L^{104}$, and $M^{101}$ in formulae (d) and (c), respectively. $X^{401}$ and $X^{402}$ each represent an oxygen atom or a substituted or unsubstituted nitrogen or a sulfur atom, preferably an oxygen atom or a substituted nitrogen atom, and more preferably an oxygen atom.

The compound represented by Formula (g) will be described below.

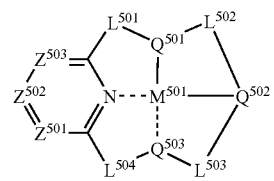

Formula (g)

In Formula (g), the definitions and preferable ranges of $Z^{501}, Z^{502}, Z^{503}, L^{501}, L^{502}, L^{503}, L^{504}, Q^{501}, Q^{502}, Q^{503}$, and $M^{501}$ are similar to the definitions and preferable ranges of corresponding $Z^{101}, Z^{102}, Z^{103}, L^{101}, L^{102}, L^{103}, L^{104}, Q^{101}$, $Q^{103}, Q^{102}$, and $M^{101}$ in Formula (c), respectively.

The compound represented by Formula (h) will be described below.

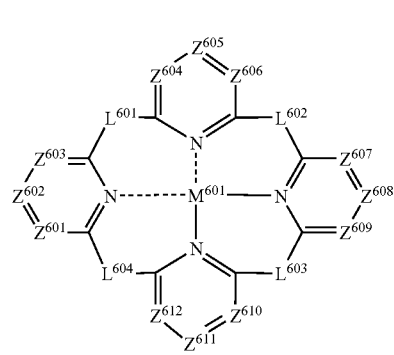

Formula (h)

In Formula (h), the definitions and preferable ranges of $Z^{601}, Z^{602}, Z^{603}, Z^{604}, Z^{605}, Z^{606}, Z^{607}, Z^{608}, Z^{609}, Z^{610}, Z^{611}$, $Z^{612}, L^{601}, L^{602}, L^{603}, L^{604}$, and $M^{601}$ are similar to the definitions and preferable ranges of corresponding $Z^{201}, Z^{202}$, $Z^{203}, Z^{207}, Z^{208}, Z^{209}, Z^{204}, Z^{205}, Z^{206}, Z^{210}, Z^{211}, Z^{212}, L^{101}, L^{102}, L^{103}, L^{104}$ and $M^{101}$ in Formulae (d) and (c), respectively.

The compound represented by Formula (i) will be described below.

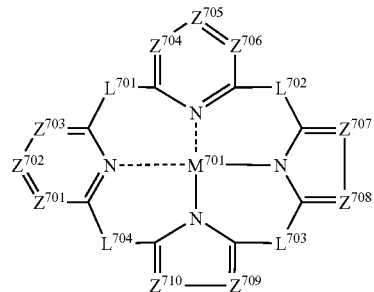

Formula (i)

In Formula (i), the definitions and preferable ranges of $Z^{701}, Z^{702}, Z^{703}, Z^{704}, Z^{705}, Z^{706}, Z^{707}, Z^{708}, Z^{709}, Z^{710}, L^{701}, L^{702}, L^{703}, L^{704}$, and $M^{701}$ are similar to the definitions and preferable ranges of corresponding $Z^{201}, Z^{202}, Z^{203}, Z^{207}, Z^{208}, Z^{209}, Z^{204}, Z^{206}, Z^{210}, Z^{212}, L^{101}, L^{102}, L^{103}, L^{104}$, and $M^{101}$ in Formulae (d) and (c), respectively.

The compound represented by Formula (j) will be described below.

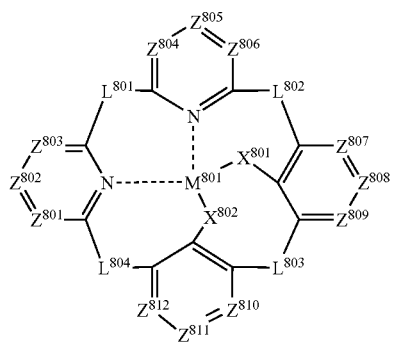

Formula (j)

In Formula (j), the definitions and preferable ranges of $Z^{801}, Z^{802}, Z^{803}, Z^{804}, Z^{805}, Z^{806}, Z^{807}, Z^{808}, Z^{809}, Z^{810}, Z^{811}, Z^{812}, L^{801}, L^{802}, L^{803}, L^{804}, M^{801}, X^{801}$, and $X^{802}$ are similar to the definitions and preferable ranges of corresponding $Z^{201}, Z^{202}, Z^{203}, Z^{207}, Z^{208}, Z^{209}, Z^{204}, Z^{205}, Z^{206}, Z^{210}, Z^{211}, Z^{212}, L^{101}, L^{102}, L^{103}, L^{104}, M^{101}, X^{401}$, and $X^{402}$ in Formulae (d), (c), and (f), respectively.

Specific examples of compounds represented by Formula (III) include compounds (2) to (8), compounds (15) to (20), compound (27) to (32), compounds (36) to (38), compounds (42) to (44), compounds (50) to (52), and compounds (57) to (154) described in Japanese Patent Application No. 2004-88575, the disclosure of which is incorporated herein by reference. The structures of the above compounds are shown below, however, the scope of the invention is not limited thereto.

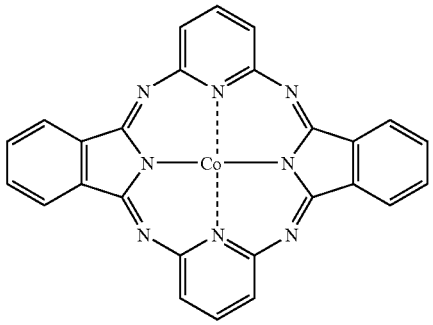

Compound (2)

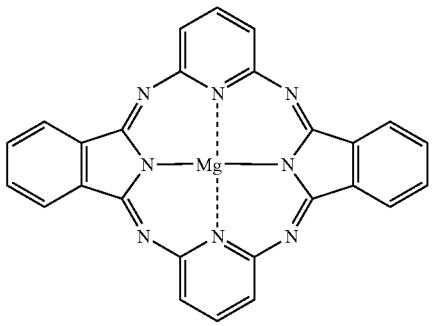

Compound (3)

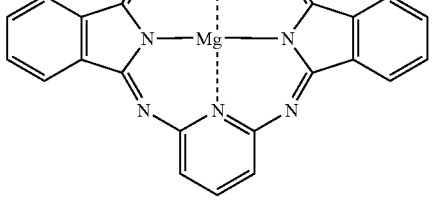

Compound (4)

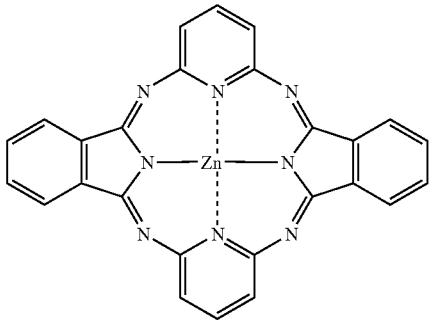

Compound (5)

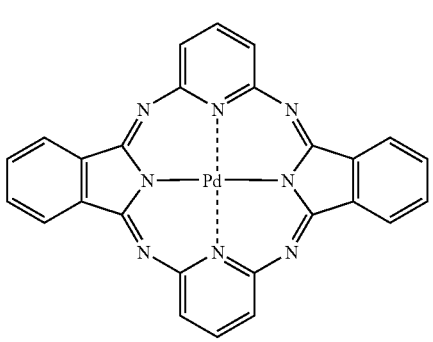

Compound (6)

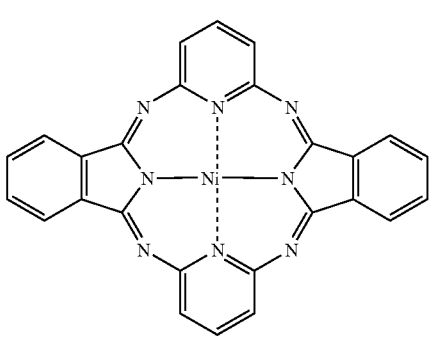

-continued
Compound (7)
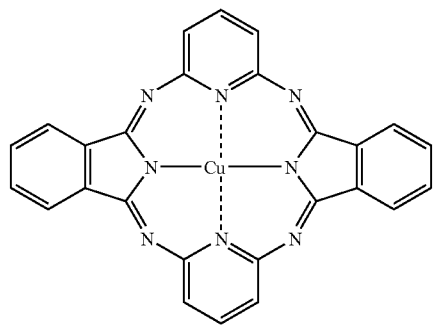
Compound (8)
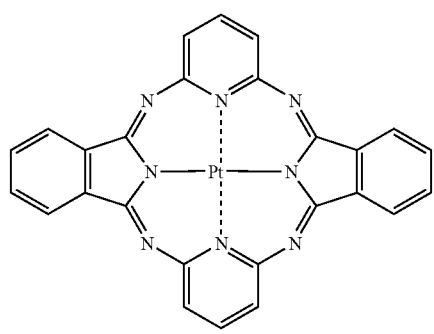
Compound (15)
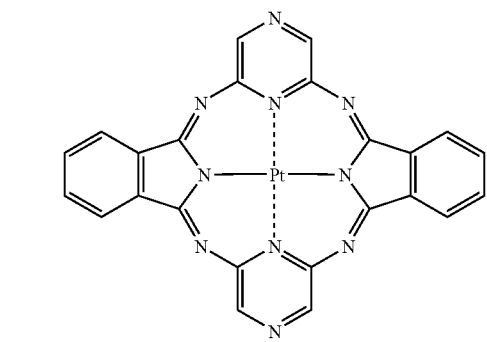
Compound (16)
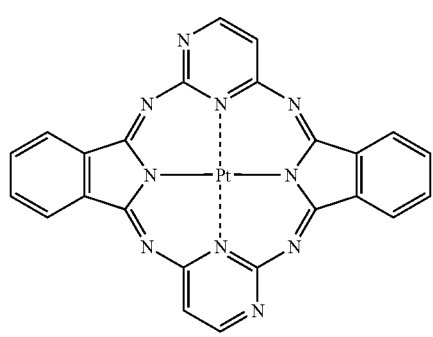
-continued
Compound (17)
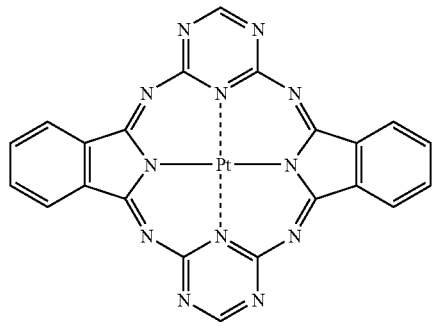
Compound (18)
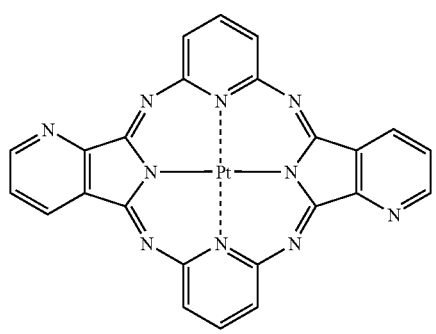
Compound (19)
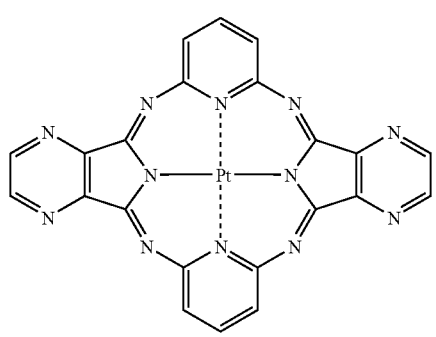
Compound (20)
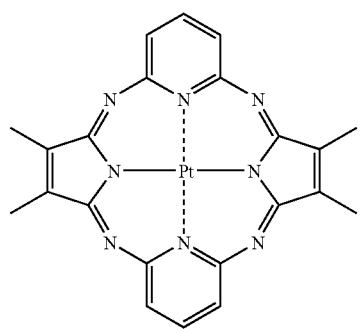

-continued
Compound (27)
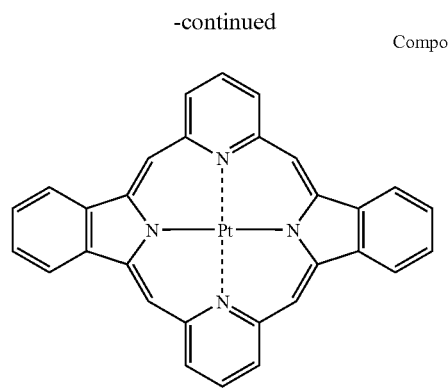
Compound (28)
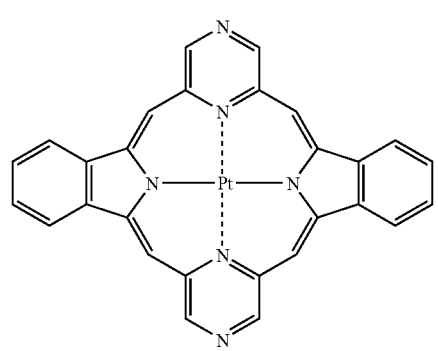
Compound (29)
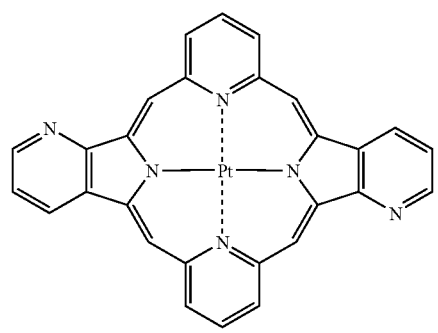
Compound (30)
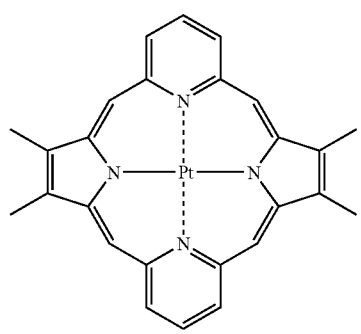
-continued
Compound (31)
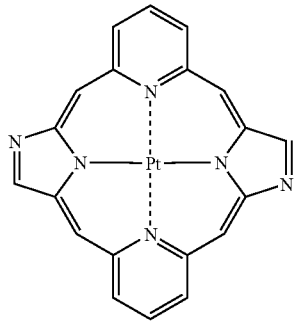
Compound (32)
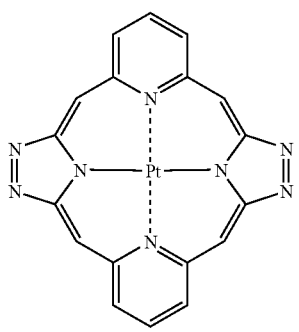
Compound (36)
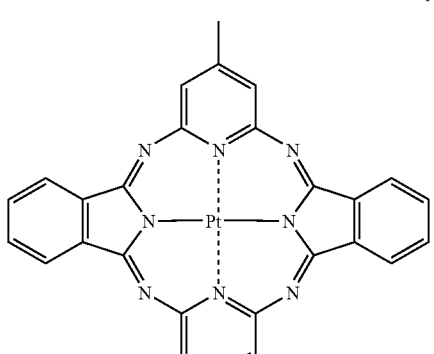
Compound (37)
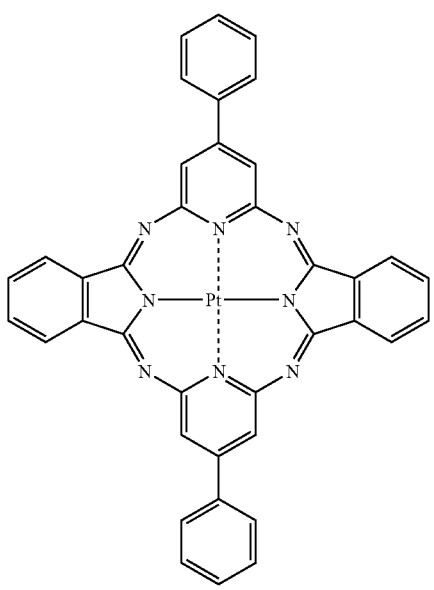

-continued
Compound (38)
Compound (42)
Compound (43)
Compound (44)
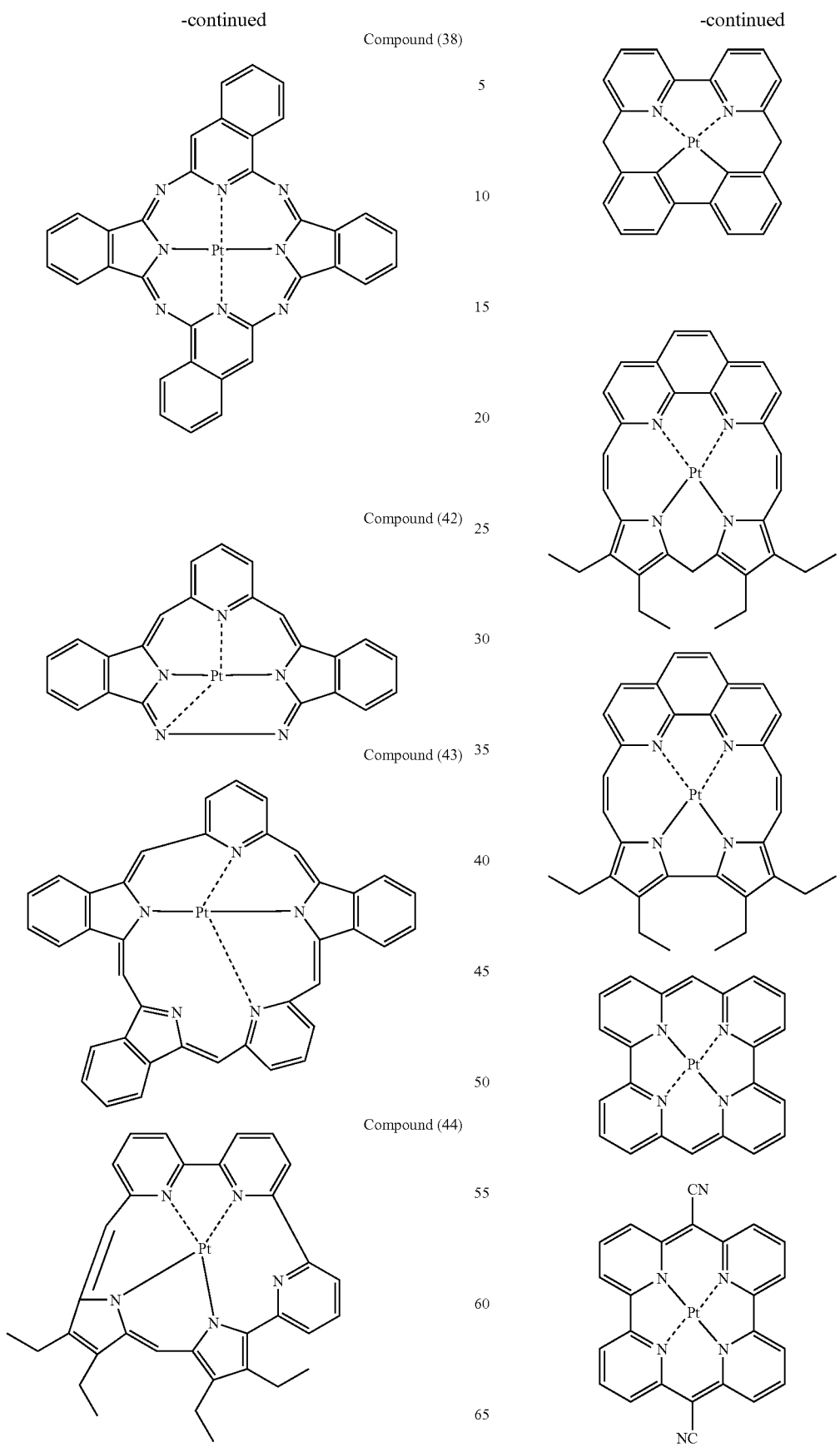
-continued
Compound (50)
Compound (51)
Compound (52)
Compound (57)
Compound (58)
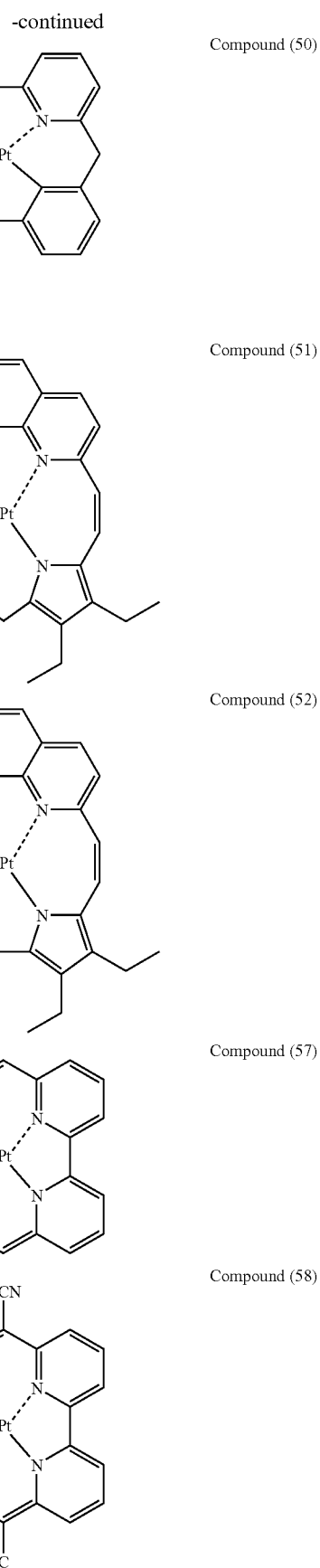

-continued
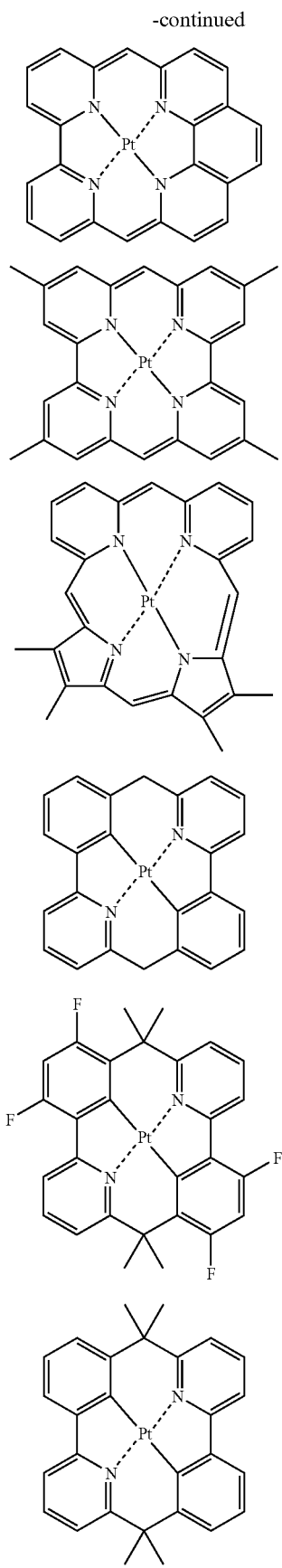
Compound (59)
Compound (60)
Compound (61)
Compound (62)
Compound (63)
Compound (64)
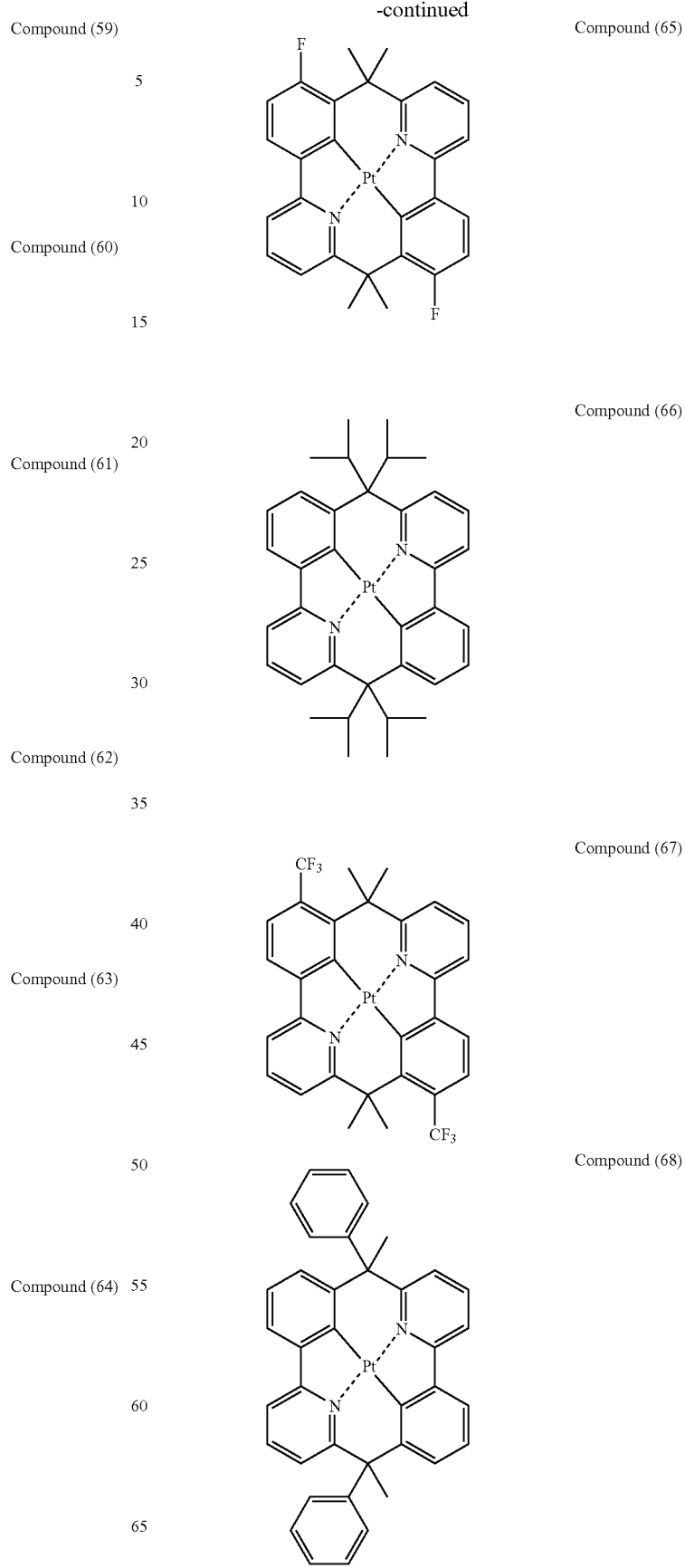
Compound (65)
Compound (66)
Compound (67)
Compound (68)

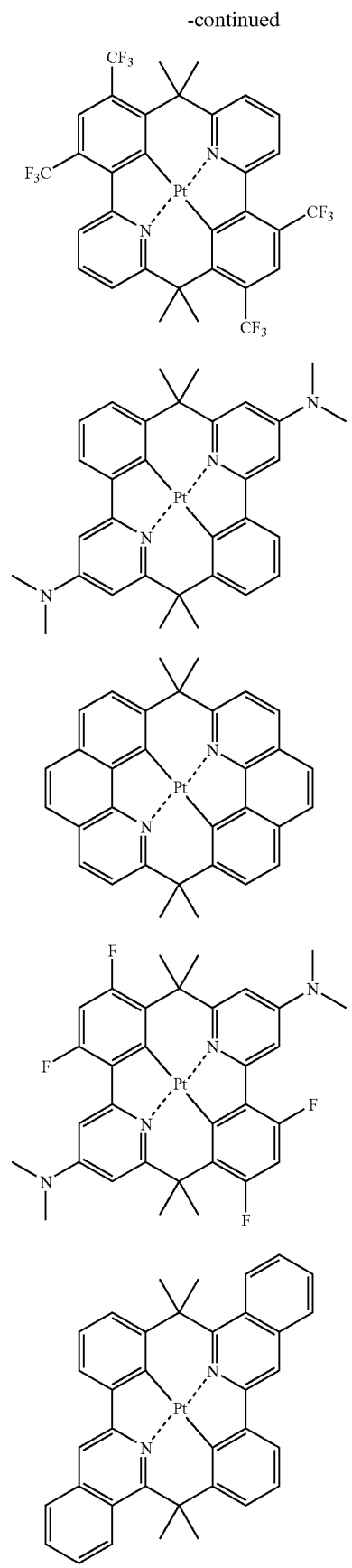

-continued
Compound (79)
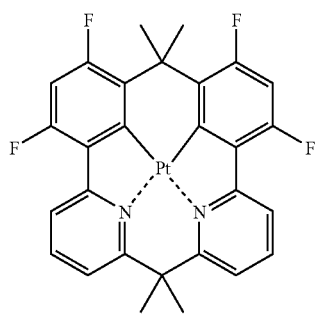
Compound (80)
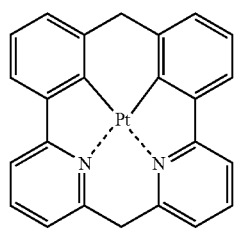
Compound (81)
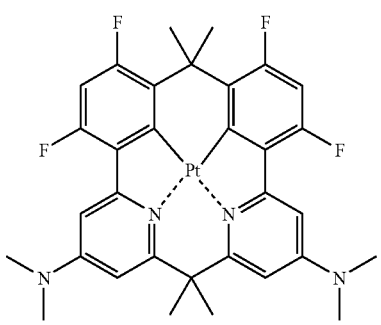
Compound (82)
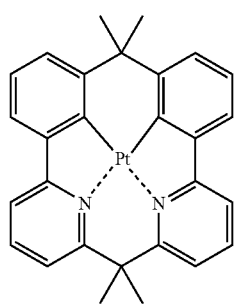
Compound (83)
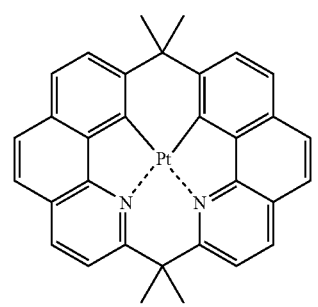
-continued
Compound (84)
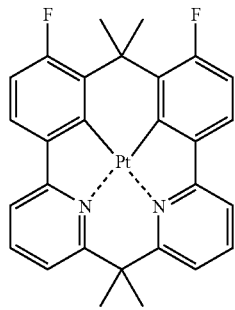
Compound (85)
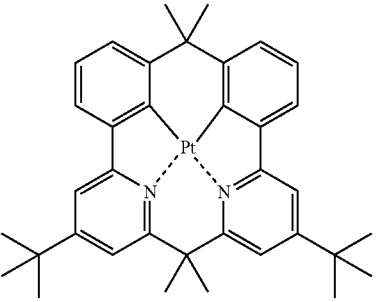
Compound (86)
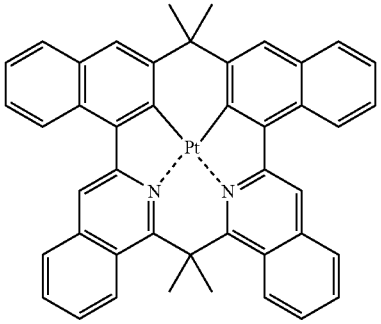
Compound (87)
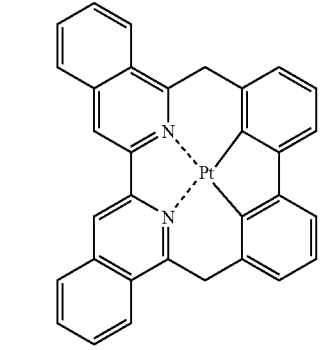
Compound (88)
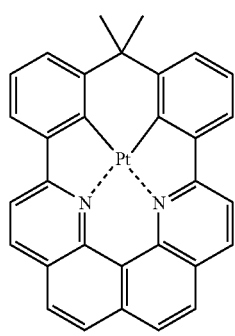

-continued
Compound (89)
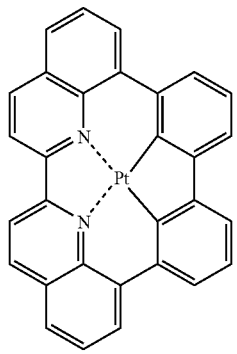
Compound (90)
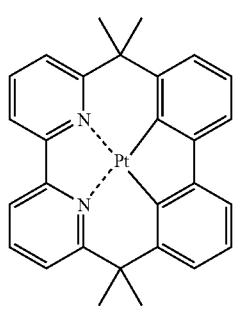
Compound (91)
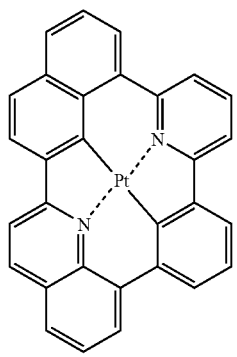
Compound (92)
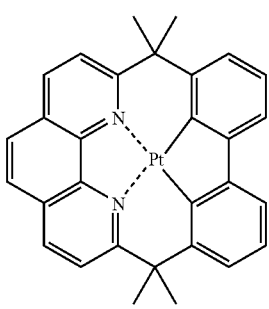
Compound (93)
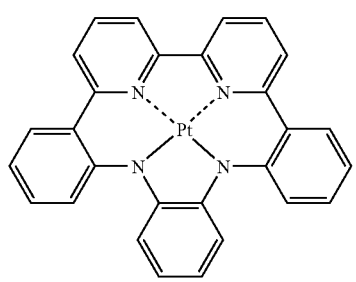
-continued
Compound (94)
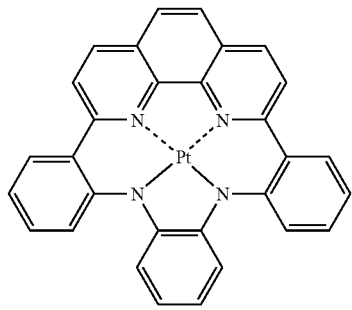
Compound (95)
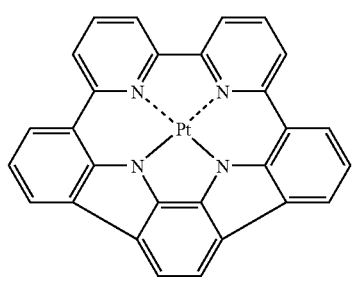
Compound (96)
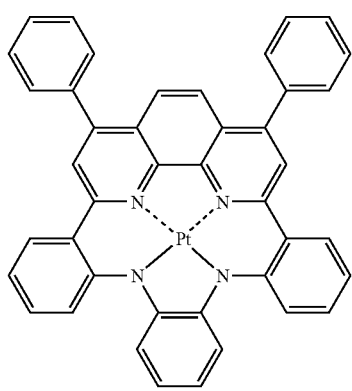
Compound (97)
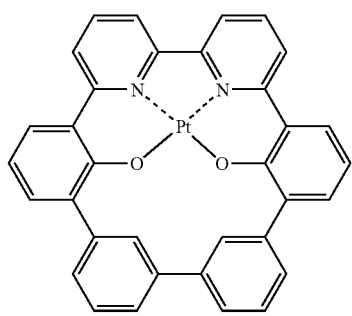
Compound (98)
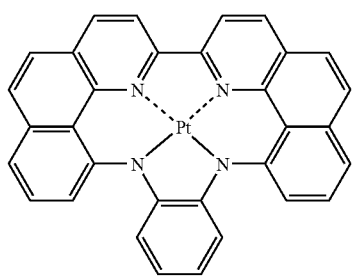

-continued
Compound (99)
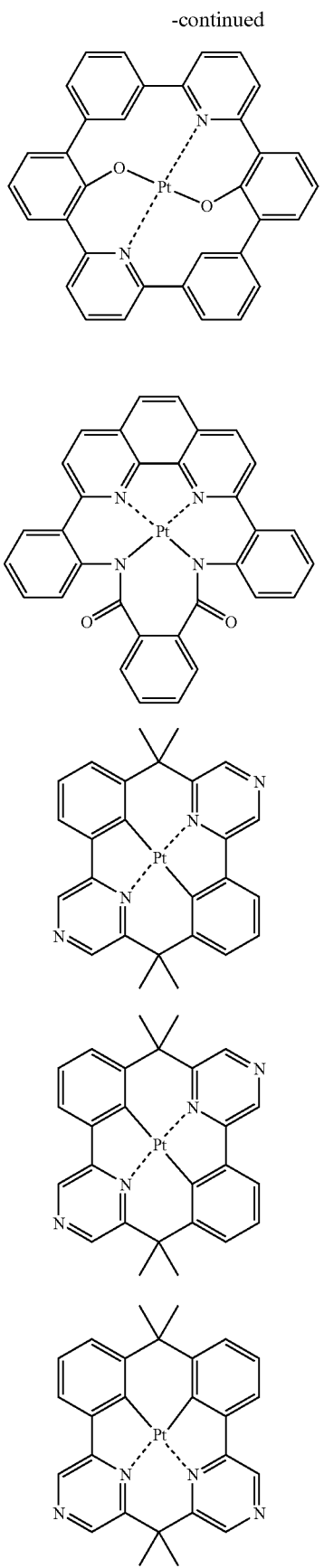
Compound (100)
Compound (101)
Compound (102)
Compound (103)
-continued
Compound (104)
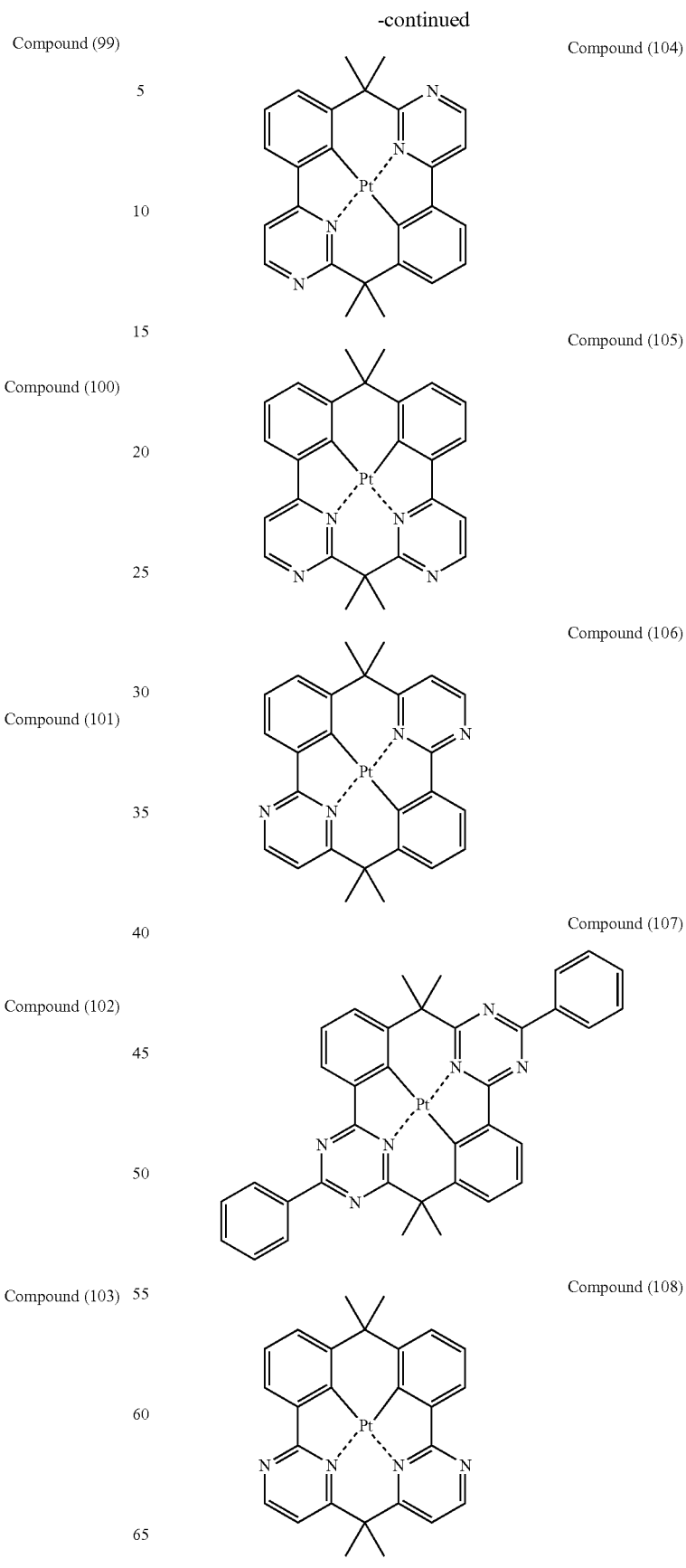
Compound (105)
Compound (106)
Compound (107)
Compound (108)

Compound (109)
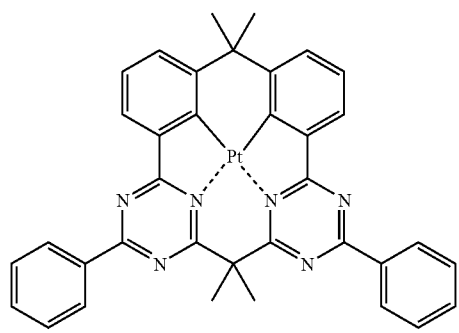
Compound (110)
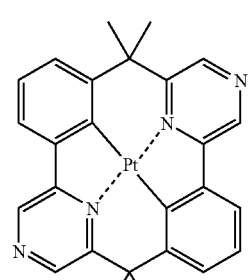
Compound (111)
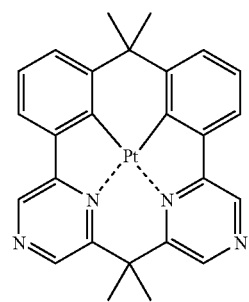
Compound (112)
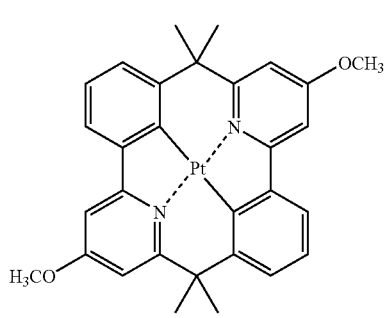
Compound (113)
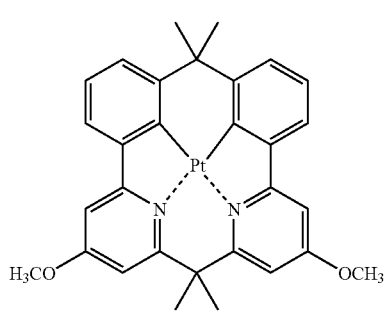
Compound (114)
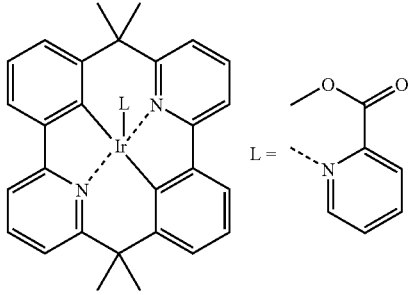
Compound (115)
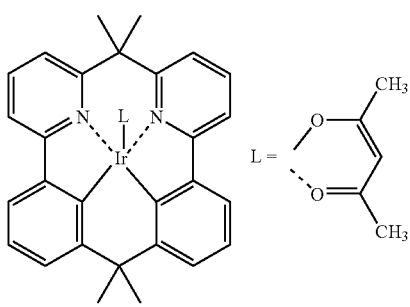
Compound (116)
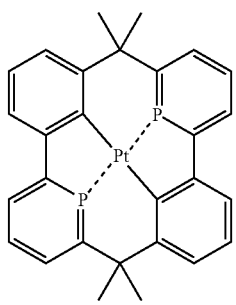
Compound (117)
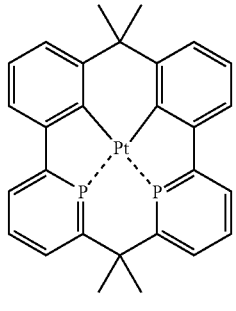
Compound (118)
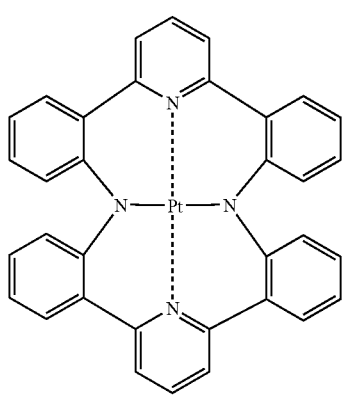

-continued
Compound (119)
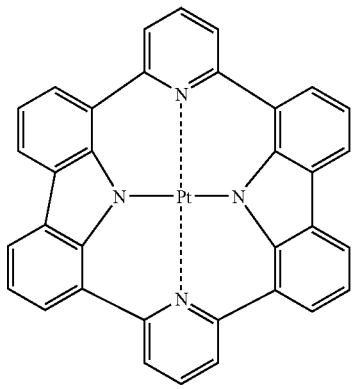
Compound (120)
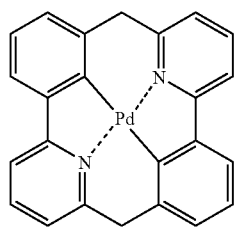
Compound (121)
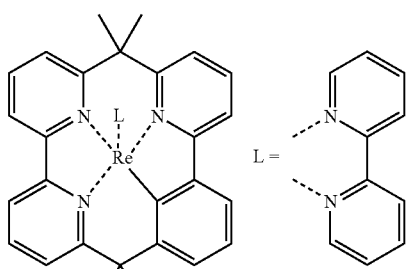
Compound (122)
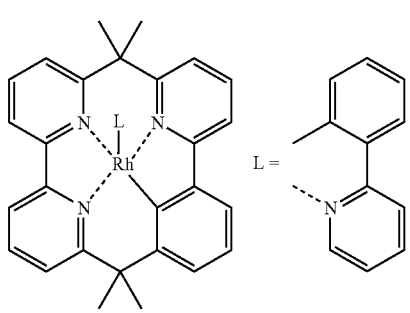
Compound (123)
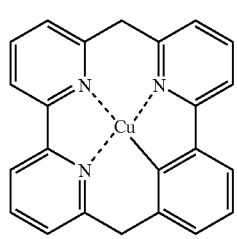
-continued
Compound (124)
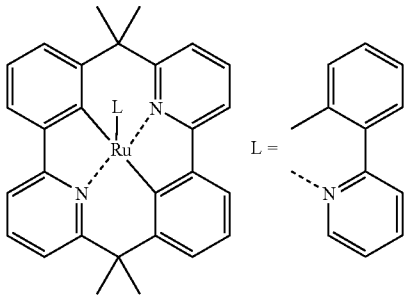
(Compound 125)
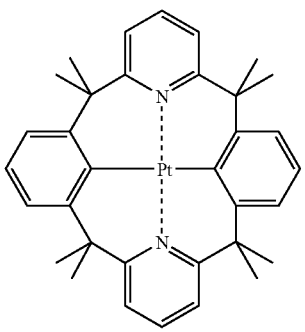
Compound (126)
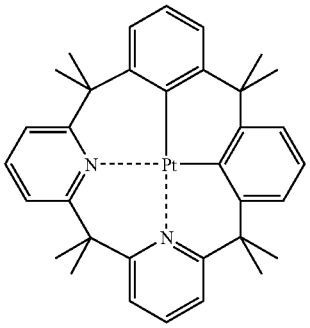
Compound (127)
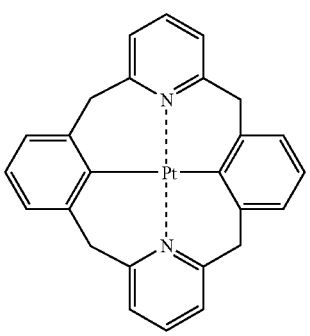
Compound (128)
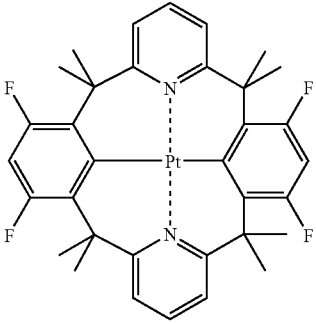

-continued
Compound (129)
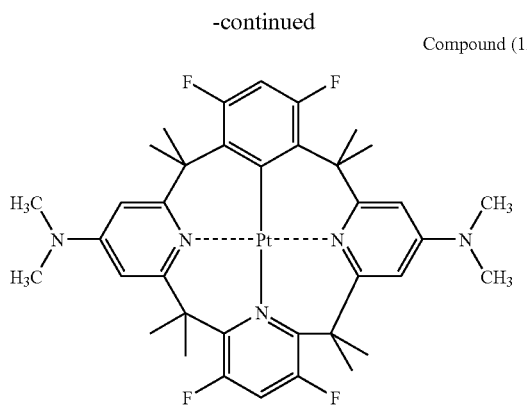
Compound (130)
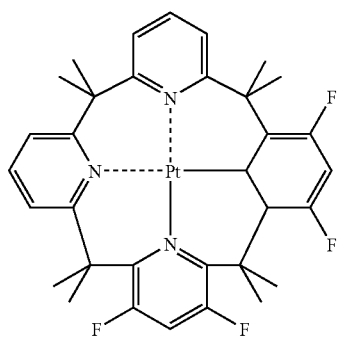
Compound (131)
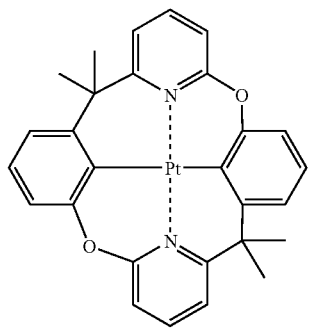
Compound (132)
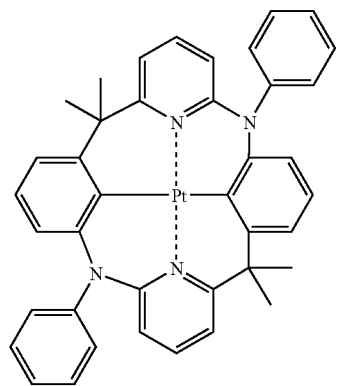
-continued
Compound (133)
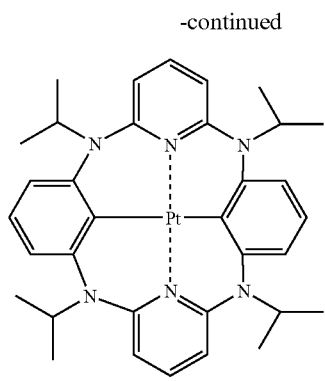
Compound (134)
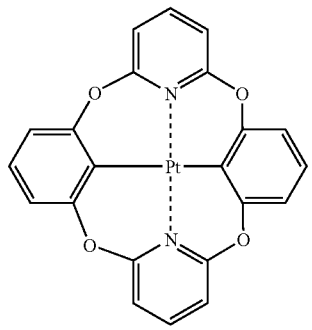
Compound (135)
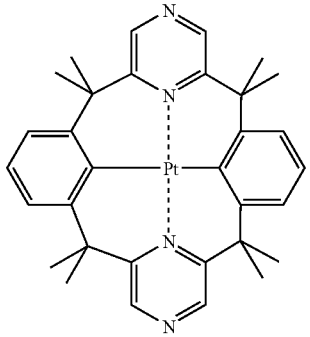
Compound (136)
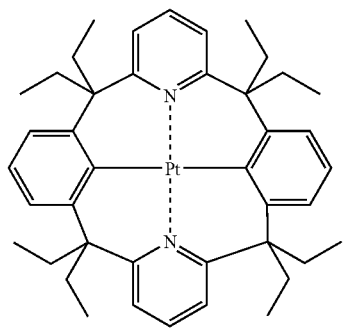

-continued
Compound (137)
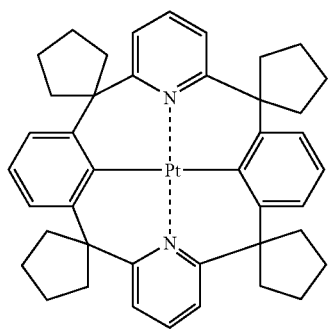
Compound (141)
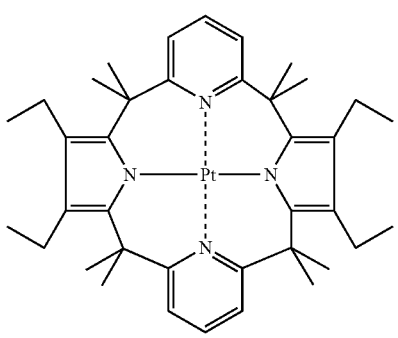
Compound (138)
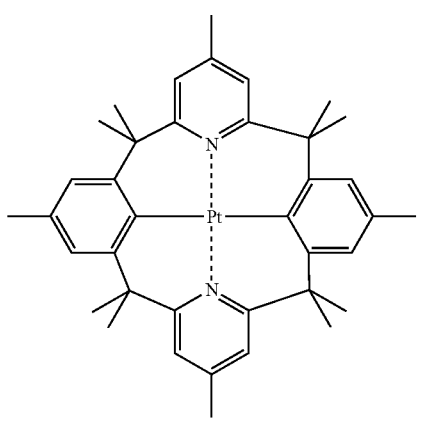
Compound (142)
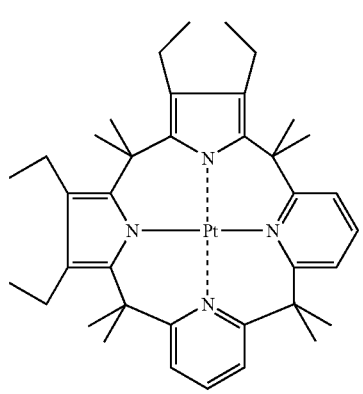
Compound (139)
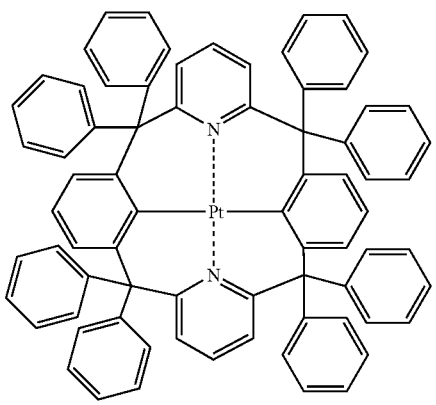
Compound (143)
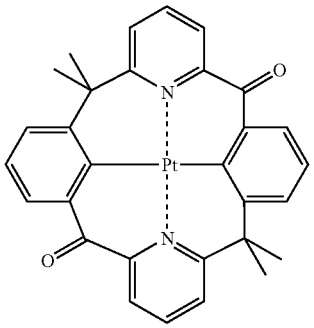
Compound (140)
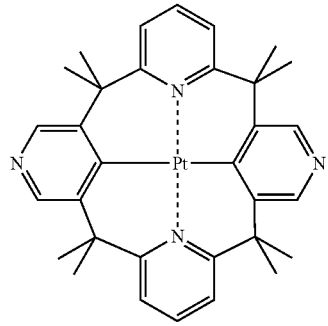
Compound (144)
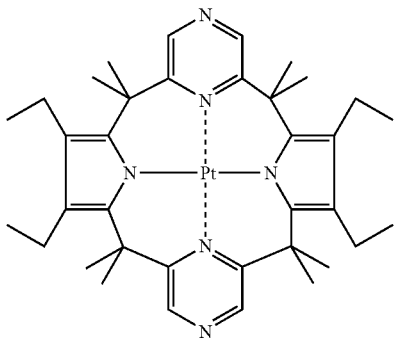

Compound (145)
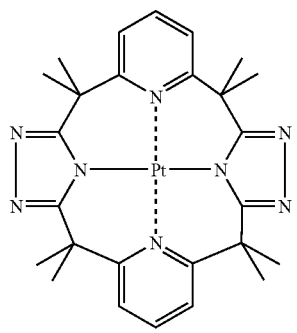
Compound (146)
Compound (147)
Compound (148)
Compound (149)
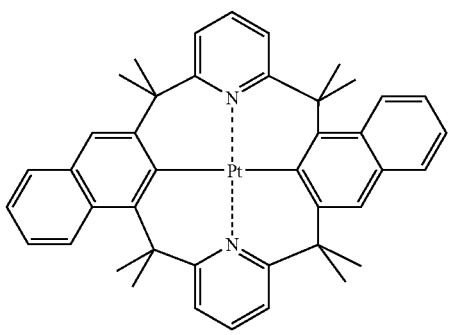
Compound (150)
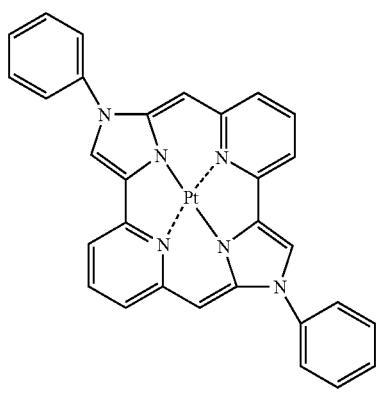
Compound (151)
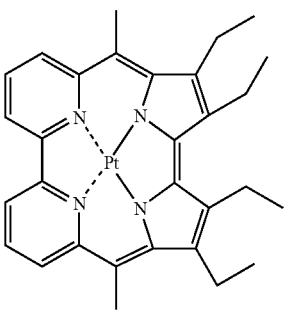
Compound (152)
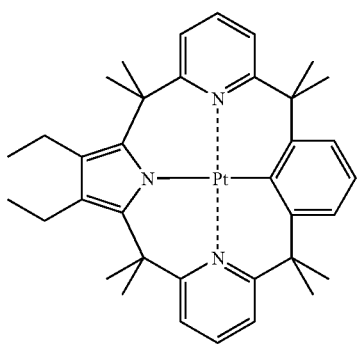

-continued

Compound (153)

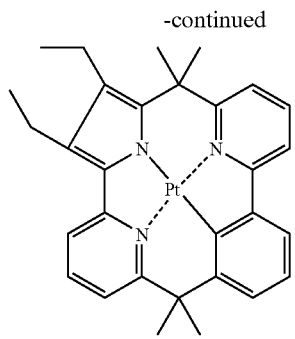

Compound (154)

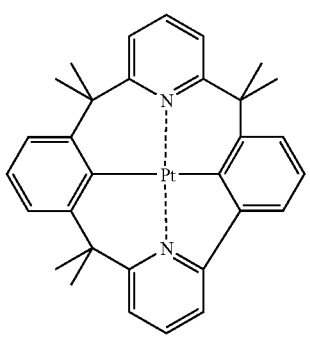

Preferable examples of the metal complex usable in the invention further include compounds represented by Formulae (A-1), (B-1), (C-1), (D-1), (E-1), or (F-1) described below.

Formula (A-1) is described below.

Formula (A-1)

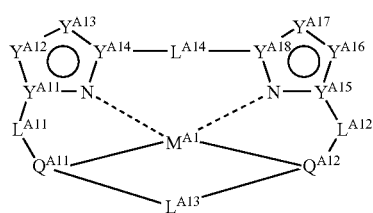

In Formula (A-1), $M^{41}$ represents a metal ion. $Y^{411}$, $Y^{414}$, $Y^{415}$ and $Y^{418}$ each independently represent a carbon atom or a nitrogen atom. $Y^{412}$, $Y^{413}$, $Y^{416}$ and $Y^{417}$ each independently represent a substituted or unsubstituted carbon atom, a substituted or unsubstituted nitrogen atom, an oxygen atom or a sulfur atom. $L^{A11}$, $L^{A12}$, $L^{A13}$ and $L^{A14}$ each represent a connecting group, and may be the same as each other or different from each other. $Q^{A11}$ and $Q^{A12}$ each independently represent a partial structure containing an atom covalently bonded to $M^{41}$.

The compound represented by Formula (A-1) will be described in detail.

$M^{41}$ represents a metal ion. The metal ion is not particularly limited. It is preferably a divalent metal ion, more preferably $Pt^{2+}$, $Pd^{2+}$, $Cu^{2+}$, $Ni^{2+}$, $Co^{2+}$, $Zn^{2+}$, $Mg^{2+}$ or $Pb^{2+}$, still more preferably $Pt^{2+}$ or $Cu^{2+}$, and further more preferably $Pt^{2+}$.

$Y^{411}$, $Y^{414}$, $Y^{415}$ and $Y^{418}$ each independently represent a carbon atom or a nitrogen atom. Each of $Y^{411}$, $Y^{414}$, $Y^{415}$ and $Y^{418}$ is preferably a carbon atom.

$Y^{412}$, $Y^{413}$, $Y^{416}$ and $Y^{417}$ each independently represent a substituted or unsubstituted carbon atom, a substituted or unsubstituted nitrogen atom, an oxygen atom or a sulfur atom. Each of $Y^{412}$, $Y^{413}$, $Y^{416}$ and $Y^{417}$ is preferably a substituted or unsubstituted carbon atom or a substituted or unsubstituted nitrogen atom.

$L^{A11}$, $L^{A12}$, $L^{A13}$ and $L^{A14}$ each independently represent a divalent connecting group. The divalent connecting group represented by $L^{A11}$, $L^{A12}$, $L^{A13}$ or $L^{A14}$ may be, for example, a single bond or a connecting group formed of atoms selected from carbon, nitrogen silicon, sulfur, oxygen, germanium, phosphorus and the like, more preferably a single bond, a substituted or unsubstituted carbon atom, a substituted or unsubstituted nitrogen atom, a substituted silicon atom, an oxygen atom, a sulfur atom, a divalent aromatic hydrocarbon cyclic group or a divalent aromatic heterocyclic group, still more preferably a single bond, a substituted or unsubstituted carbon atom, a substituted or unsubstituted nitrogen atom, a substituted silicon atom, a divalent aromatic hydrocarbon cyclic group or a divalent aromatic heterocyclic group, and further more preferably a single bond or a substituted or unsubstituted methylene group. Examples of the divalent connecting group represented by $L^{A11}$, $L^{A12}$, $L^{A13}$ or $L^{A14}$ include the following groups:

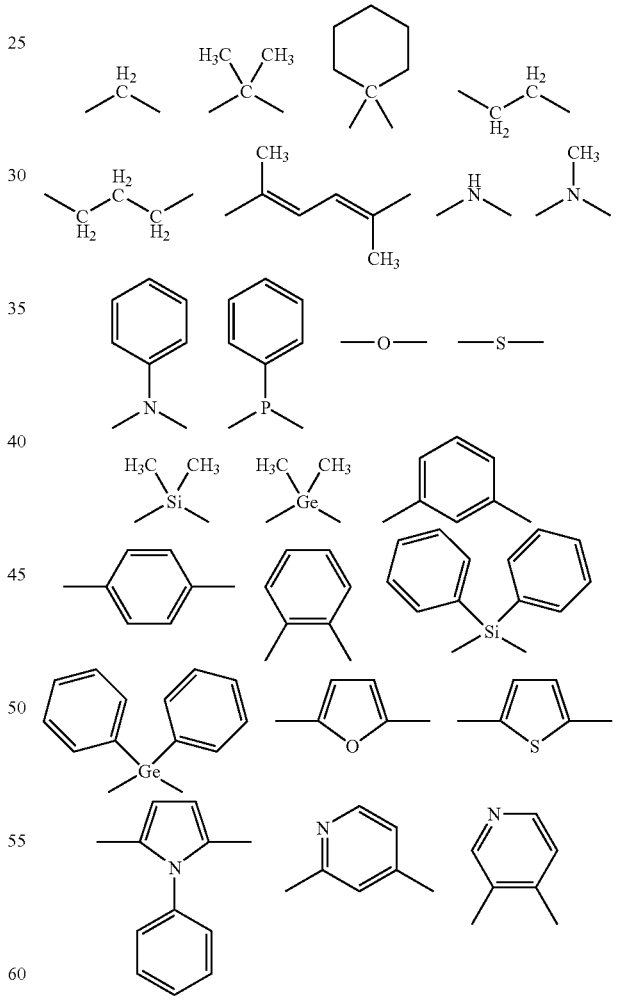

The divalent connecting group represented by $L^{A11}$, $L^{A12}$, $L^{A13}$ or $L^{A14}$ may further have a substituent. The substituent which can be introduced into the divalent connecting group may be, and examples thereof include, an alkyl group (preferably those having 1 to 30 carbon atoms, more preferably those having 1 to 20 carbon atoms, particularly preferably those having 1 to 10 carbon atoms, and examples thereof include a methyl group, an ethyl group, an iso-propyl group, a tert-butyl group, a n-octyl group, a n-decyl group, a n-hexadecyl group, a cyclopropyl group, a cyclopentyl group, a cyclohexyl group, and the like), an alkenyl group (preferably those having 2 to 30 carbon atoms, more preferably those having 2 to 20 carbon atoms, particularly preferably those having 2 to 10 carbon atoms, and examples thereof include a vinyl group, an allyl group, a 2-butenyl group, a 3-pentenyl group, and the like), an alkynyl group (preferably those having 2 to 30 carbon atoms, more preferably those having 2 to 20 carbon atoms, particularly preferably those having 2 to 10 carbon atoms, and examples thereof include a propargyl group, a 3-pentynyl group, and the like), an aryl group (preferably those having 6 to 30 carbon atoms, more preferably those having 6 to 20 carbon atoms, particularly preferably those having 6 to 12 carbon atoms, and examples thereof include a phenyl group, a p-methylphenyl group, a naphthyl group, an anthranyl group, and the like), an amino group preferably those having 0 to 30 carbon atoms, more preferably those having 0 to 20 carbon atoms, particularly preferably those having 0 to 10 carbon atoms, and examples thereof include an amino group, a methylamino group, a dimethylamino group, a diethylamino group, a dibenzylamino group, a diphenylamino group, a ditolylamino group, and the like), an alkoxy group (preferably those having 1 to 30 carbon atoms, more preferably those having 1 to 20 carbon atoms, particularly preferably those having 1 to 10 carbon atoms, and examples thereof include a methoxy group, an ethoxy group, a butoxy group, a 2-ethylhexyloxy group, and the like), an aryloxy group (preferably those having 6 to 30 carbon atoms, more preferably those having 6 to 20 carbon atoms, particularly preferably those having 6 to 12 carbon atoms, and examples thereof include a phenyloxy group, a 1-naphthyloxy group, a 2-naphthyloxy group, and the like), a heterocyclic oxy group preferably those having 1 to 30 carbon atoms, more preferably those having 1 to 20 carbon atoms, particularly preferably those having 1 to 12 carbon atoms, and examples thereof include a pyridyloxy group, a pyrazyloxy group, a pyrimidyloxy group, a quinolyloxy group, and the like), an acyl group (preferably those having 1 to 30 carbon atoms, more preferably those having 1 to 20 carbon atoms, particularly preferably those having 1 to 12 carbon atoms, and examples thereof include an acetyl group, a benzoyl group, a formyl group, a pivaloyl group, and the like), an alkoxycarbonyl group (preferably those having 2 to 30 carbon atoms, more preferably those having 2 to 20 carbon atoms, particularly preferably those having 2 to 12 carbon atoms, and examples thereof include a methoxycarbonyl group, an ethoxycarbonyl group, and the like), an aryloxycarbonyl group (preferably those having 7 to 30 carbon atoms, more preferably those having 7 to 20 carbon atoms, particularly preferably those having 7 to 12 carbon atoms, and examples thereof include a phenyloxycarbonyl group and the like), an acyloxy group (preferably those having 2 to 30 carbon atoms, more preferably those having 2 to 20 carbon atoms, particularly preferably those having 2 to 10 carbon atoms, and examples thereof include an acetoxy group, a benzoyloxy group, and the like), an acylamino group (preferably those having 2 to 30 carbon atoms, more preferably those having 2 to 20 carbon atoms, particularly preferably those having 2 to 10 carbon atoms, and examples thereof include an acetylamino group, a benzoylamino group and the like), an alkoxycarbonylamino group (preferably those having 2 to 30 carbon atoms, more preferably those having 2 to 20 carbon atoms, particularly preferably those having 2 to 12 carbon atoms, and examples thereof include a methoxycarbonylamino group and the like), an aryloxycarbonylamino group (preferably those having 7 to 30 carbon atoms, more preferably those having 7 to 20 carbon atoms, particularly preferably those having 7 to 12 carbon atoms, and examples thereof include a phenyloxycarbonylamino group and the like), a sulfonylamino group (preferably those having 1 to 30 carbon atoms, more preferably those having 1 to 20 carbon atoms, particularly preferably those having 1 to 12 carbon atoms, and examples thereof include a methanesulfonylamino group, a benzenesulfonylamino group and the like), a sulfamoyl group (preferably those having 0 to 30 carbon atoms, more preferably those having 0 to 20 carbon atoms, particularly preferably those having 0 to 12 carbon atoms, and examples thereof include a sulfamoyl group, a methylsulfamoyl group, a dimethylsulfamoyl group, a phenylsulfamoyl group and the like), a carbamoyl group (preferably those having 1 to 30 carbon atoms, more preferably those having 1 to 20 carbon atoms, particularly preferably those having 1 to 12 carbon atoms, and examples thereof include a carbamoyl group, a methylcarbamoyl group, a diethylcarbamoyl group, a phenylcarbamoyl group and the like), an alkylthio group (preferably those having 1 to 30 carbon atoms, more preferably those having 1 to 20 carbon atoms, particularly preferably those having 1 to 12 carbon atoms, and examples thereof include a methylthio group, an ethylthio group, and the like), an arylthio group (preferably those having 6 to 30 carbon atoms, more preferably those having 6 to 20 carbon atoms, particularly preferably those having 6 to 12 carbon atoms, and examples thereof include a phenylthio group and the like), a heterocyclic thio group (preferably those having 1 to 30 carbon atoms, more preferably those having 1 to 20 carbon atoms, particularly preferably those having 1 to 12 carbon atoms, and examples thereof include a pyridylthio group, a 2-benzimidazolylthio group, a 2-benzoxazolylthio group, a 2-benzthiazolylthio group and the like), a sulfonyl group (preferably those having 1 to 30 carbon atoms, more preferably those having 1 to 20 carbon atoms, particularly preferably those having 1 to 12 carbon atoms, and examples thereof include a mesyl group, a tosyl group and the like), a sulfinyl group preferably those having 1 to 30 carbon atoms, more preferably those having 1 to 20 carbon atoms, particularly preferably those having 1 to 12 carbon atoms, and examples thereof include a methanesulfinyl group, a benzenesulfinyl group and the like), a ureido group (preferably those having 1 to 30 carbon atoms, more preferably those having 1 to 20 carbon atoms, particularly preferably those having 1 to 12 carbon atoms, and examples thereof include a ureido group, a methylureido group, a phenylureido group and the like), a phosphoric amide group (preferably those having 1 to 30 carbon atoms, more preferably those having 1 to 20 carbon atoms, particularly preferably those having 1 to 12 carbon atoms, and examples thereof include a diethylphosphoric amide group, a phenylphosphoric amide group, and the like), a hydroxy group, a mercapto group, a halogen atom (and examples thereof include a fluorine atom, chlorine atom, bromine atom, iodine atom), a cyano group, a sulfo group, a carboxyl group, a nitro group, a hydroxamic acid group, a sulfino group, a hydrazino group, an imino group, a heterocyclic group (preferably those having 1 to 30 carbon atoms, more preferably those having 1 to 12 carbon atoms containing a heteroatom such as a nitrogen atom, an oxygen atom or a sulfur atom, specific examples thereof include an imidazolyl group, a pyridyl group, a quinolyl group, a furyl group, a thienyl group, a piperidyl group, a morpholino group, a benzoxazolyl group, a benzimidazolyl group, a benzthiazolyl group, a carbazolyl group, an azepinyl group, and the like), a silyl group (preferably those having 3 to 40 carbon atoms, more preferably those having 3 to 30 carbon atoms, particularly preferably those having 3 to 24 carbon atoms, and examples thereof include a trimethylsilyl group, a triphenylsilyl group and the like) or a silyloxy group preferably those having 3 to 40 carbon atoms, more preferably those having 3 to 30 carbon atoms, particularly preferably those having 3 to 24 carbon atoms, and examples thereof include a trimethylsilyloxy group, a triphenylsilyloxy group and the like).

These substituents may further have a substituent(s). Substituents which can be introduced to these substituents are each preferably selected from an alkyl group, an aryl group, a heterocyclic group, a halogen atom and a silyl group, more preferably selected from an alkyl group, an aryl group, a heterocyclic group and a halogen atom, and still more preferably selected from an alkyl group, an aryl group, an aromatic heterocyclic group and a fluorine atom.

$Q^{411}$ and $Q^{412}$ each independently represent a partial structure containing an atom covalently bonded to $MA^{41}$. $Q^{411}$ and $Q^{412}$ each independently preferably represent a group having a carbon atom bonded to $M^{41}$, a group having a nitrogen atom bonded to $M^{41}$, a group having a silicon atom bonded to $M^{41}$, a group having a phosphorus atom bonded to $M^{41}$, a group having an oxygen atom bonded to $M^{41}$ or a group having a sulfur atom bonded to $M^{41}$, more preferably a group having a carbon atom, a nitrogen atom, an oxygen atom, or a sulfur atom bonded to $M^{41}$, still more preferably a group having a carbon group or nitrogen atom bonded to $M^{41}$, and further more preferably a group having a carbon atom bonded to $M^{41}$.

The group bonded to $M^{41}$ via a carbon atom is preferably an aryl group having a carbon atom bonded to $M^{41}$, a 5-membered cyclic heteroaryl group having a carbon atom bonded to $M^{41}$ or a 6-membered cyclic heteroaryl group having a carbon atom bonded to $M^{41}$, more preferably an aryl group having a carbon atom bonded to $M^{41}$, a nitrogen-containing 5-membered cyclic heteroaryl group having a carbon atom bonded to $M^{41}$ or a nitrogen-containing 6-membered cyclic heteroaryl group having a carbon atom bonded to $M^{41}$, and still more preferably an aryl group having a carbon atom bonded to $M^{41}$.

The group bonded to $M^{41}$ via a nitrogen atom is preferably a substituted amino group or a nitrogen-containing 5-membered cyclic heteroaryl group having a nitrogen atom bonded to $M^{41}$, more preferably a nitrogen-containing 5-membered cyclic heteroaryl group having a nitrogen atom bonded to $M^{41}$.

The group bonded to $M^{41}$ via a phosphorus atom is preferably a substituted phosphino group. The group having a silicon atom bonded to $M^{41}$ is preferably a substituted silyl group. The group having an oxygen atom bonded to $M^{41}$ is preferably an oxy group, and the group having a sulfur atom bonded to $M^{41}$ is preferably a sulfide group.

The compound represented by Formula (A-1) is more preferably a compound represented by the following Formula (A-2), (A-3) or (A-4).

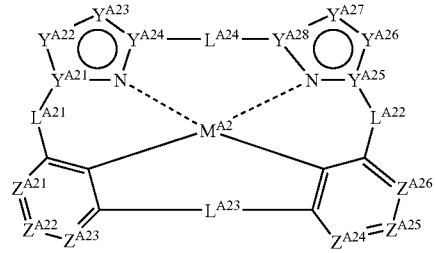

Formula (A-2)

In Formula (A-2), $M^{42}$ represents a metal ion. $Y^{421}$, $Y^{424}$, $Y^{425}$ and $Y^{428}$ each independently represent a carbon atom or a nitrogen atom. $Y^{422}$, $Y^{423}$, $Y^{426}$ and $Y^{427}$ each independently represent a substituted or unsubstituted carbon atom, a substituted or unsubstituted nitrogen atom, an oxygen atom or a sulfur atom. $L^{421}$, $L^{422}$, $L^{423}$ and $L^{424}$ each independently represent a connecting group. $Z^{421}$, $Z^{422}$, $Z^{423}$, $Z^{424}$, $Z^{425}$ and $Z^{426}$ each independently represent a nitrogen atom or a substituted or unsubstituted carbon atom.

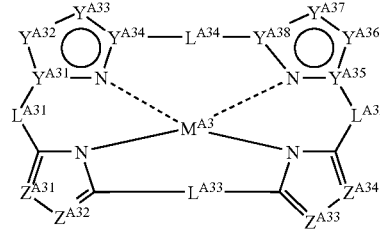

Formula (A-3)

In Formula (A-3), $M^{43}$ represents a metal ion. $Y^{431}$, $Y^{434}$, $Y^{435}$ and $Y^{438}$ each independently represent a carbon atom or a nitrogen atom. $Y^{432}$, $Y^{433}$, $Y^{436}$ and $Y^{437}$ each independently represent a substituted or unsubstituted carbon atom, a substituted or unsubstituted nitrogen atom, an oxygen atom or a sulfur atom. $L^{431}$, $L^{432}$, $L^{433}$ and $L^{434}$ each independently represent a connecting group. $Z^{431}$, $Z^{432}$, $Z^{433}$ and $Z^{434}$ each independently represent a nitrogen atom or a substituted or unsubstituted carbon atom.

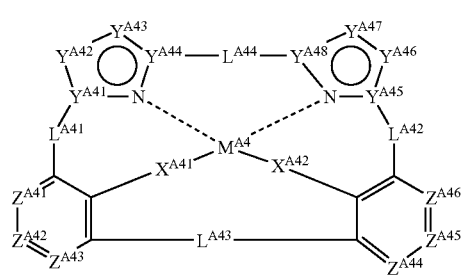

Formula (A-4)

In Formula (A-4), $M^{44}$ represents a metal ion. $Y^{441}$, $Y^{444}$, $Y^{445}$ and $Y^{448}$ each independently represent a carbon atom or a nitrogen atom. $Y^{442}$, $Y^{443}$, $Y^{446}$ and $Y^{447}$ each independently represent a substituted or unsubstituted carbon atom, a substituted or unsubstituted nitrogen atom, an oxygen atom or a sulfur atom. $L^{441}$, $L^{442}$, $L^{443}$ and $L^{444}$ each independently represent a connecting group. $Z^{441}$, $Z^{442}$, $Z^{443}$, $Z^{444}$, $Z^{445}$ and $Z^{446}$ each independently represent a nitrogen atom or a substituted or unsubstituted carbon atom. $X^{441}$ and $X^{442}$ each independently represent an oxygen atom, a sulfur atom or a substituted or unsubstituted nitrogen atom.

The compound represented by Formula (A-2) will be described in detail.

$M^{42}$, $Y^{421}$, $Y^{424}$, $Y^{425}$, $Y^{428}$, $Y^{422}$, $Y^{423}$, $Y^{426}$, $Y^{427}$, $L^{421}$, $L^{422}$, $L^{423}$ and $L^{424}$ have the same definitions as corresponding $M^{41}$, $Y^{411}$, $Y^{414}$, $Y^{415}$, $Y^{418}$, $Y^{412}$, $Y^{413}$, $Y^{416}$, $Y^{417}$, $L^{411}$, $A^{12}$, $L^{413}$ and $L^{414}$ in Formula (A-1) respectively, and their preferable examples are also the same.

$Z^{421}$, $Z^{422}$, $Z^{423}$, $Z^{424}$, $Z^{425}$ and $Z^{426}$ each independently represent a nitrogen atom or a substituted or unsubstituted carbon atom. $Z^{421}$, $Z^{422}$, $Z^{423}$, $Z^{424}$, $Z^{425}$ and $Z^{426}$ each independently represent preferably a substituted or unsubstituted carbon atom, and more preferably an unsubstituted carbon atom. When the carbon atom is substituted, the substituent may be selected from the above-mentioned examples of the substituent on the divalent connecting group represented by $L^{411}$, $L^{412}$, $L^{413}$ or $L^{414}$ in Formula (A-1).

The compound represented by Formula (A-3) will be described in detail, $M^{43}$, $Y^{431}$, $Y^{434}$, $Y^{435}$, $Y^{438}$, $Y^{432}$, $Y^{433}$, $Y^{436}$, $Y^{437}$, $L^{431}$, $L^{432}$, $L^{433}$ and $L^{434}$ have the same definitions as corresponding $M^{41}$, $Y^{411}$, $Y^{414}$, $Y^{415}$, $Y^{418}$, $Y^{412}$, $Y^{413}$, $Y^{416}$, $Y^{417}$, $L^{411}$, $L^{412}$, $L^{413}$ and $L^{414}$ in Formula (A-1) respectively, and their preferable examples are also the same.

$Z^{431}$, $Z^{432}$, $Z^{433}$ and $Z^{434}$ each independently represent a nitrogen atom or a substituted or unsubstituted carbon atom. Each of $Z^{431}$, $Z^{432}$, $Z^{433}$ and $Z^{434}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{411}$, $L^{412}$, $L^{413}$ or $L^{414}$ in Formula (A-1).

The compound represented by Formula (AA) will be described in detail.

$M^{44}$, $Y^{441}$, $Y^{444}$, $Y^{445}$, $Y^{448}$, $Y^{442}$, $Y^{43}$, $Y^{446}$, $Y^{447}$, $L^{441}$, $L^{442}$, $L^{443}$ and $L^{444}$ have the same definitions as corresponding $M^{41}$, $Y^{411}$, $Y^{414}$, $Y^{415}$, $Y^{418}$, $Y^{412}$, $Y^{413}$, $Y^{416}$, $Y^{417}$, $L^{411}$, $L^{412}$, $L^{413}$ and $L^{414}$ in Formula (A-1) respectively, and their preferable examples are also the same.

$Z^{441}$, $Z^{442}$, $Z^{443}$, $Z^{444}$, $Z^{445}$ and $Z^{446}$ each independently represent a nitrogen atom or a substituted or unsubstituted carbon atom. Each of $Z^{441}$, $Z^{442}$, $Z^{443}$, $Z^{444}$, $Z^{445}$ and $Z^{446}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{411}$, $L^{412}$, $L^{413}$ or $L^{414}$ in Formula (A-1).

$X^{441}$ and $X^{442}$ each independently represent an oxygen atom, a sulfur atom or a substituted or unsubstituted nitrogen atom. Each of $X^{441}$ and $X^{442}$ is preferably an oxygen atom or a sulfur atom, and more preferably an oxygen atom.

Specific examples of the compound represented by Formula (A-1) are shown below. However, the specific examples should not be construed as limiting the invention.

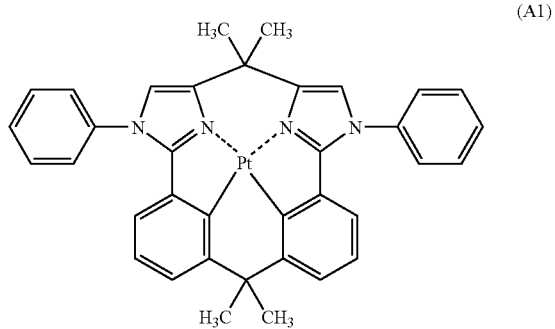

(A1)

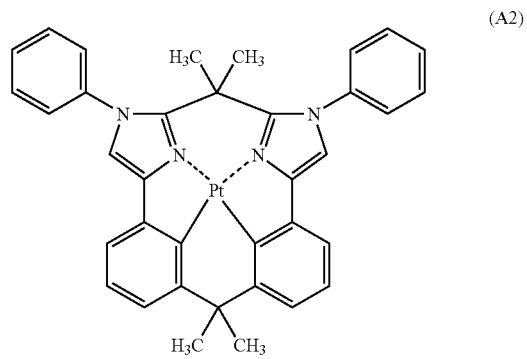

(A2)

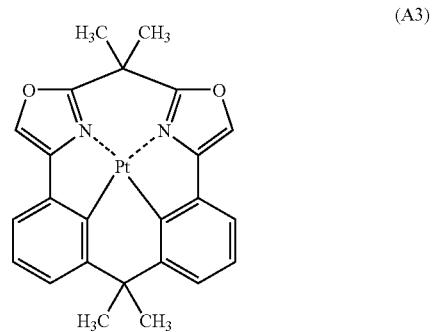

(A3)

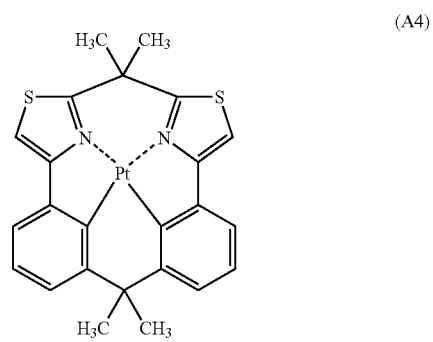

(A4)

-continued
(A5)
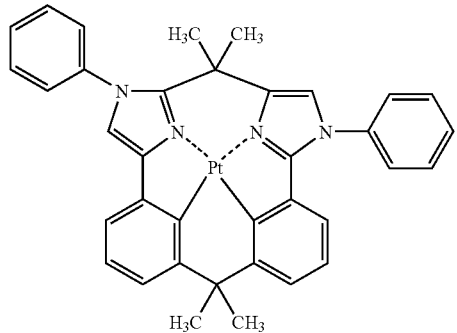
(A6)
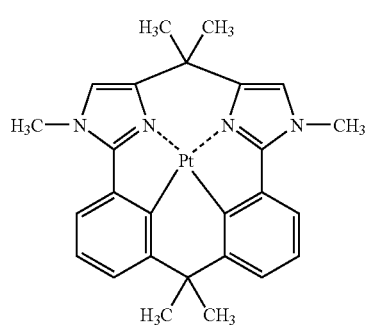
(A7)
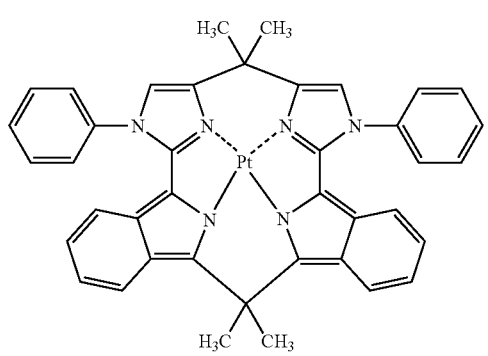
(A8)
-continued
(A9)
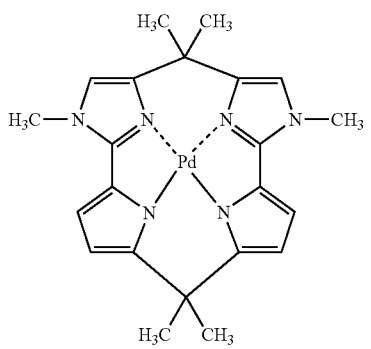
(A10)
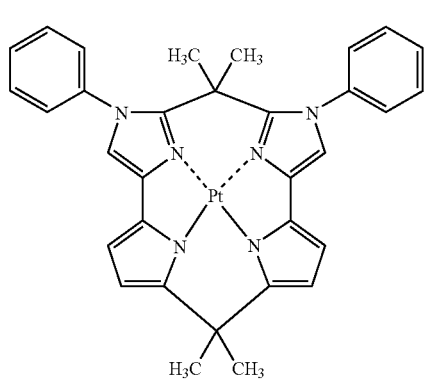
(A11)
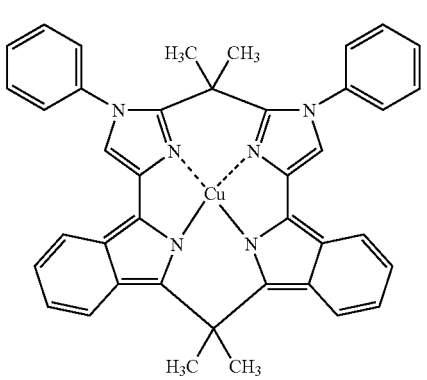
(A12)
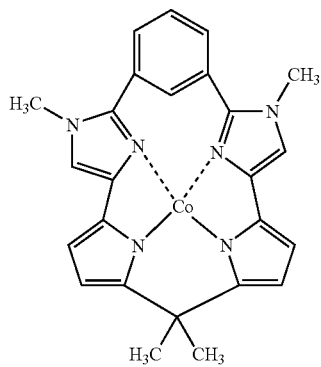

-continued
(A13)
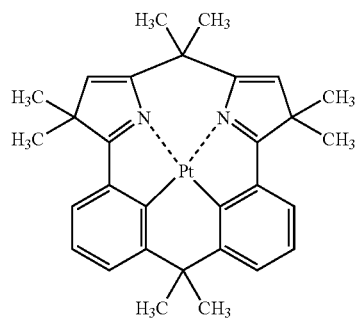
(A14)
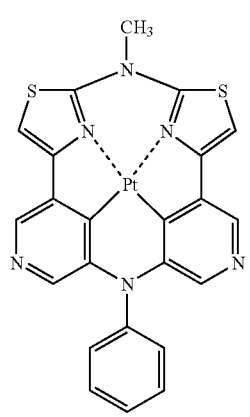
(A15)
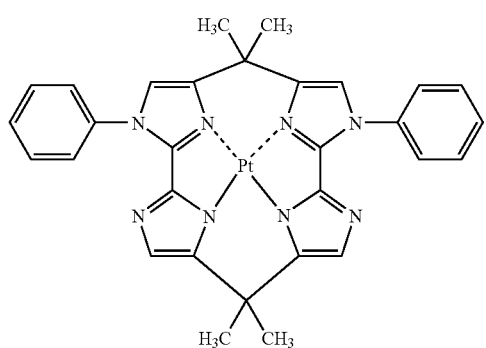
(A16)
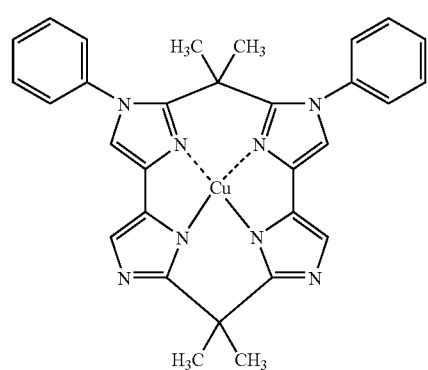
-continued
(A17)
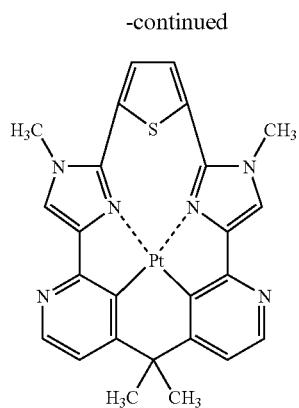
(A18)
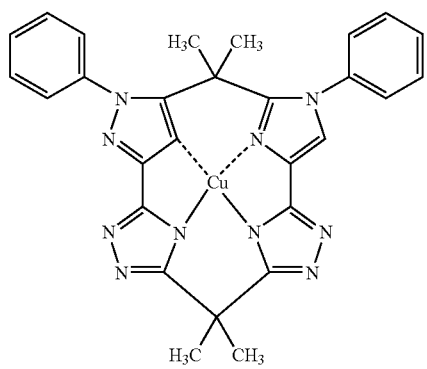
(A19)
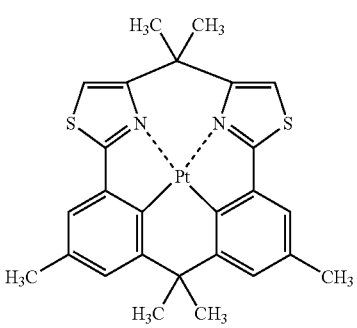
(A20)
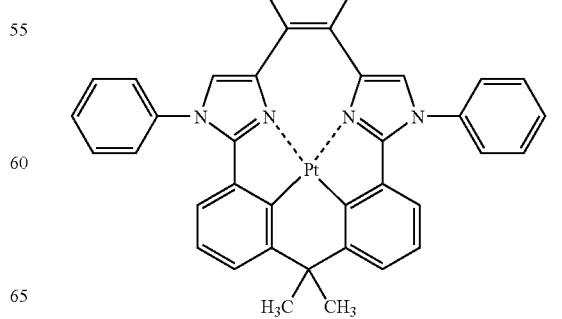

-continued
(A21)
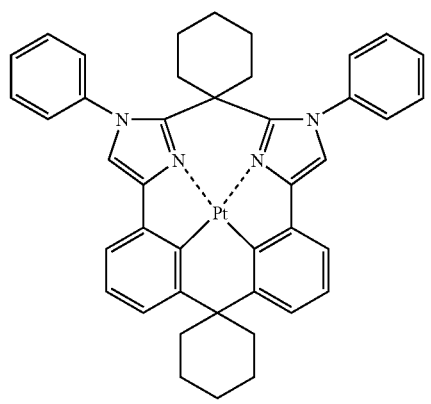
(A22)
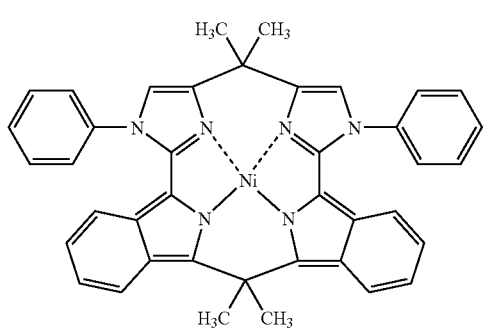
(A23)
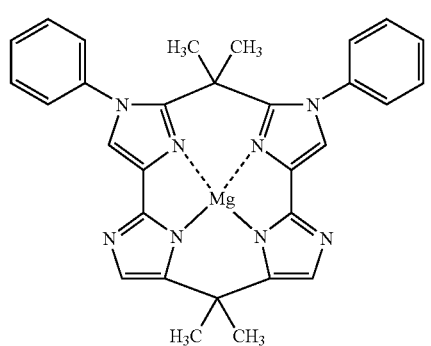
(A24)
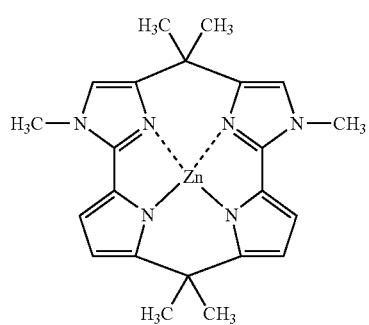
(A25)
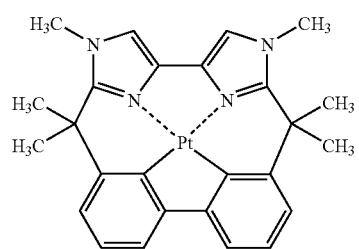
-continued
(A26)
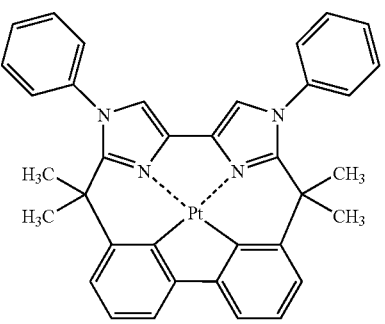
(A27)
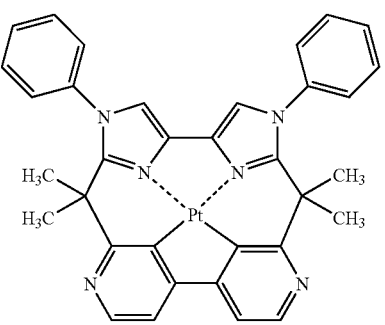
(A28)
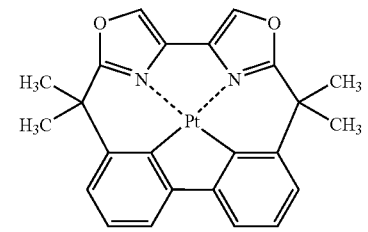
(A29)
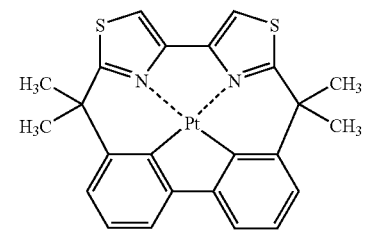
(A30)
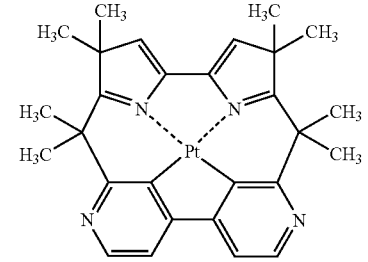

-continued
(A31)
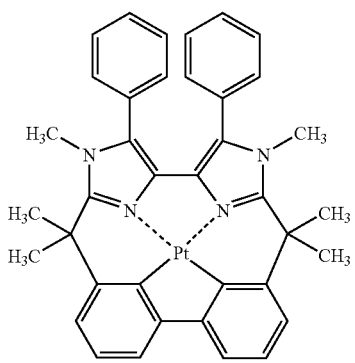
(A32)
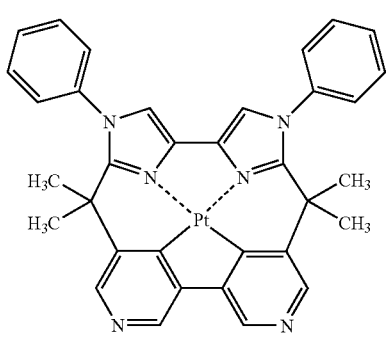
(A33)
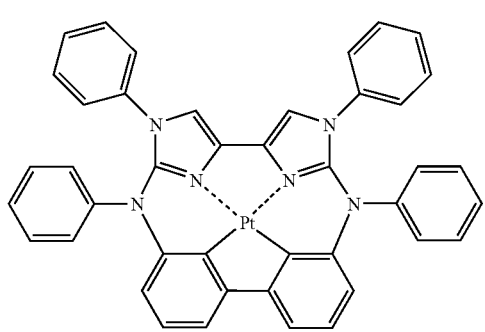
(A34)
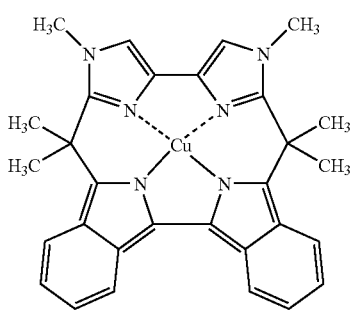
-continued
(A35)
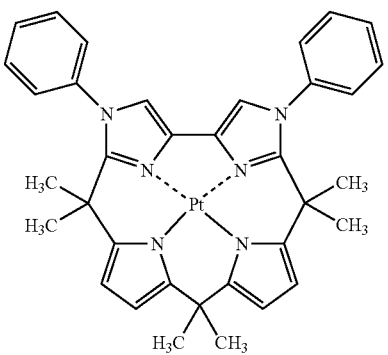
(A36)
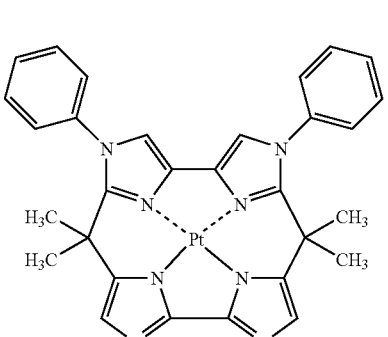
(A37)
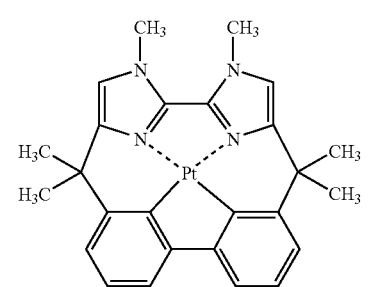
(A38)
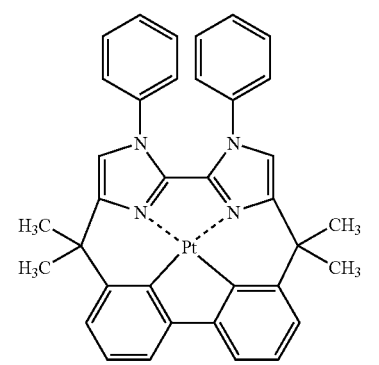

-continued
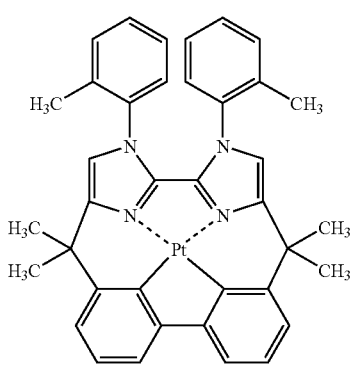
(A39)
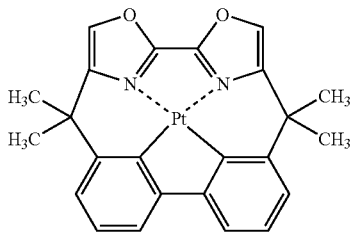
(A40)
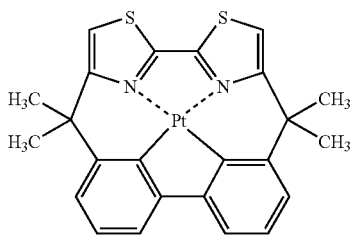
(A41)
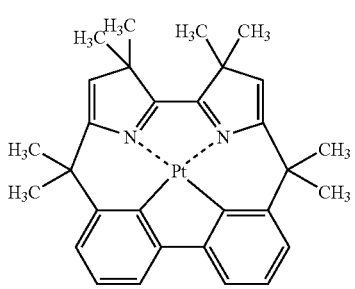
(A42)
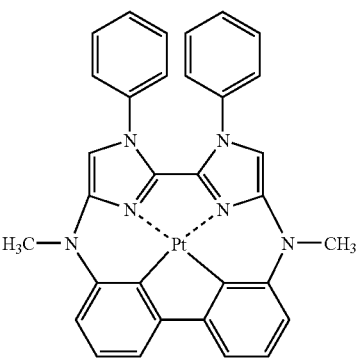
(A43)
-continued
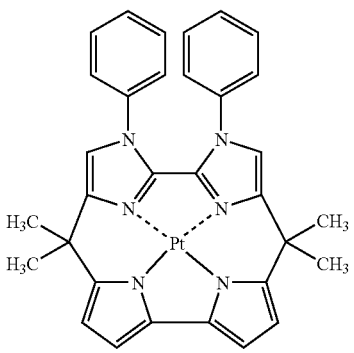
(A44)
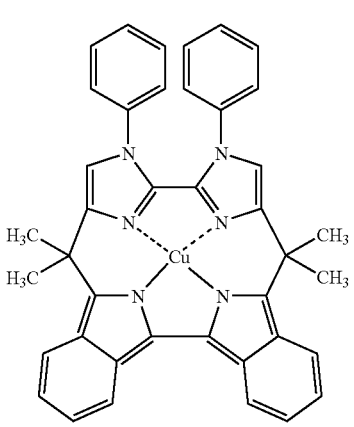
(A45)
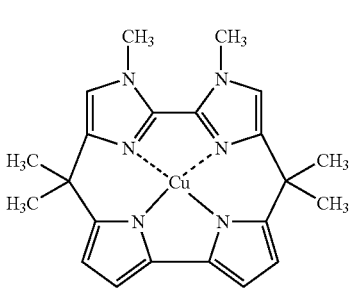
(A46)
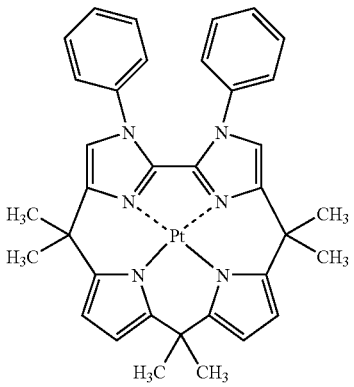
(A47)

-continued
(A48)
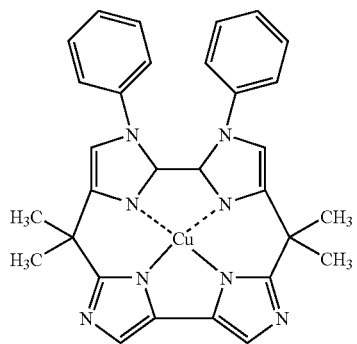
(A49)
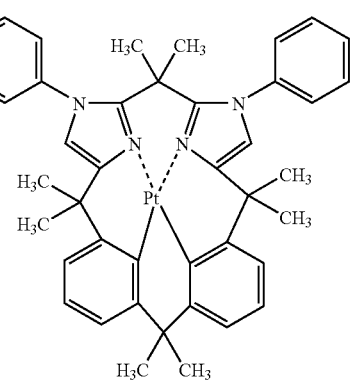
(A50)
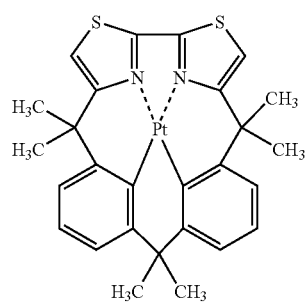
(A51)
-continued
(A52)
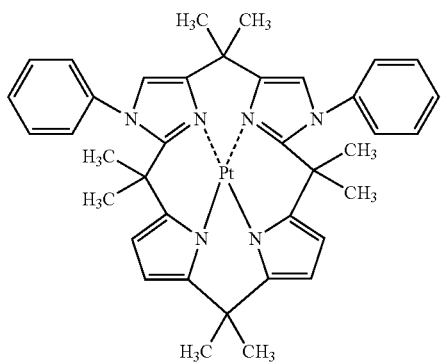
(A53)
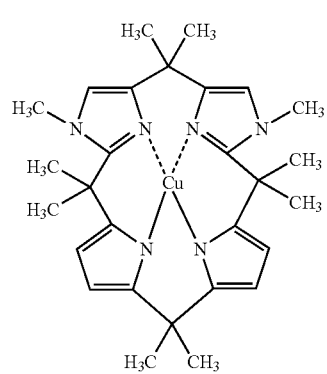
(A54)
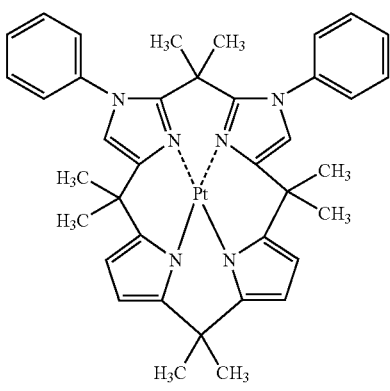
(A55)

-continued
(A56)
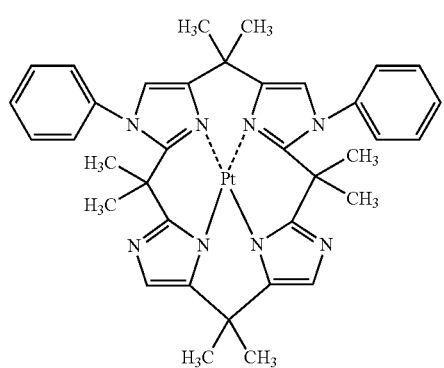
(A57)
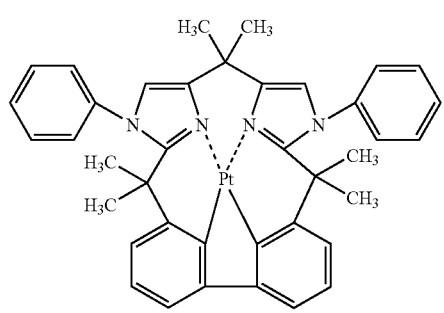
(A58)
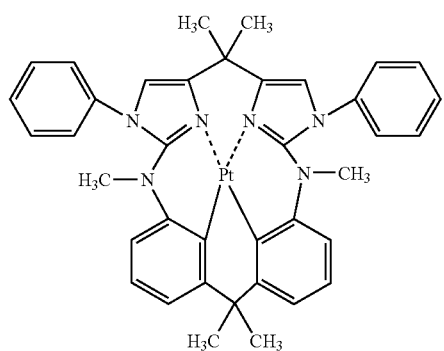
(A59)
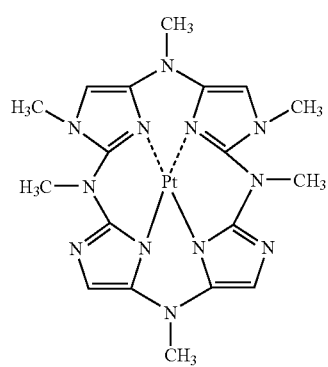
-continued
(A60)
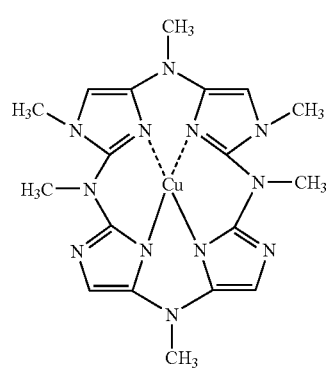
(A61)
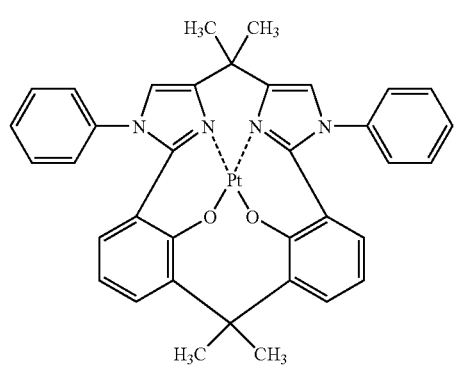
(A62)
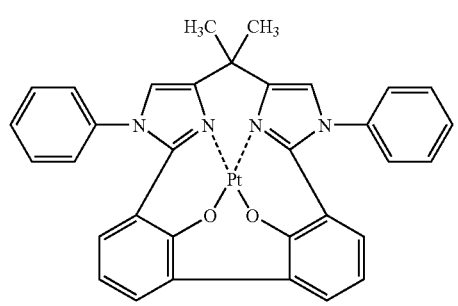
(A63)
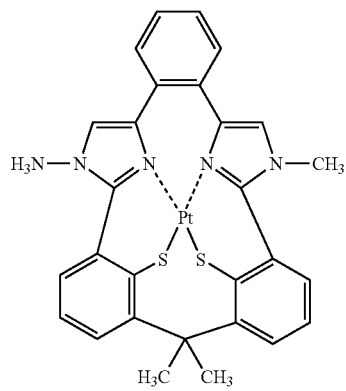

-continued
(A64)
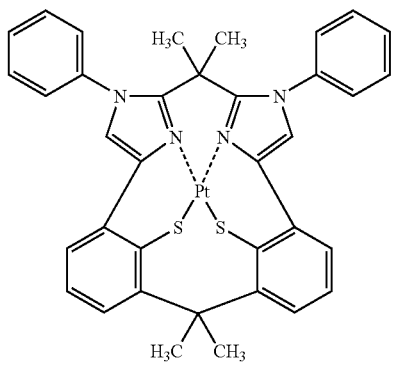
(A65)
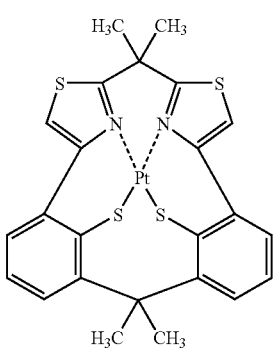
(A66)
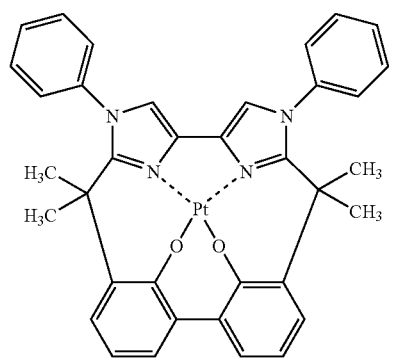
(A67)
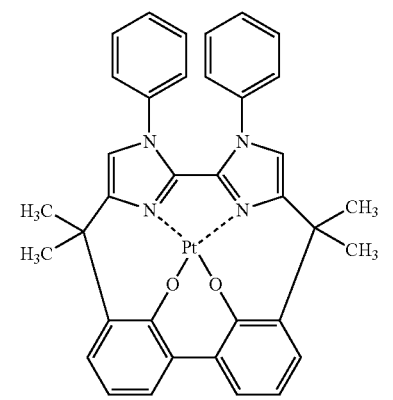
-continued
(A68)
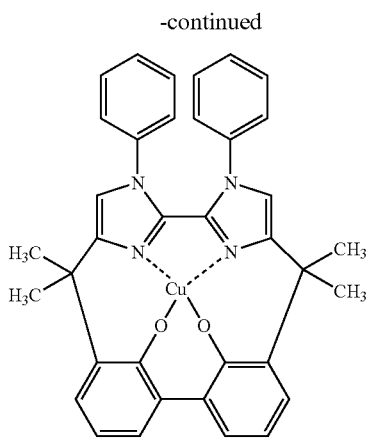
(A69)
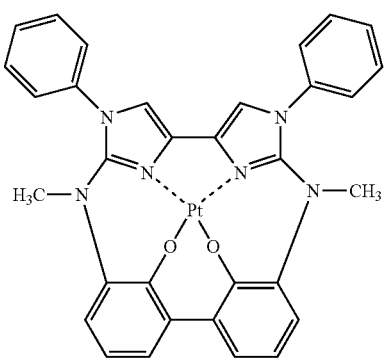
(A70)
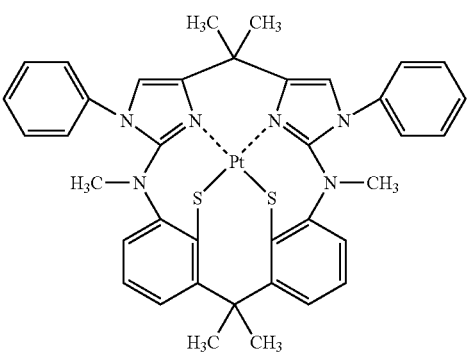
(A71)
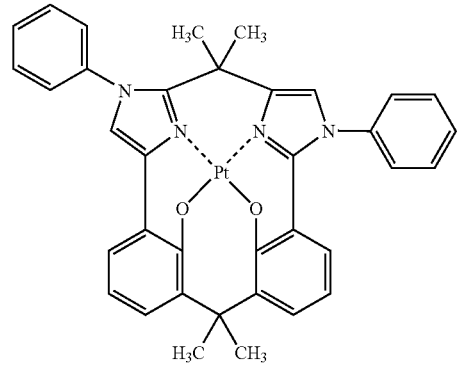

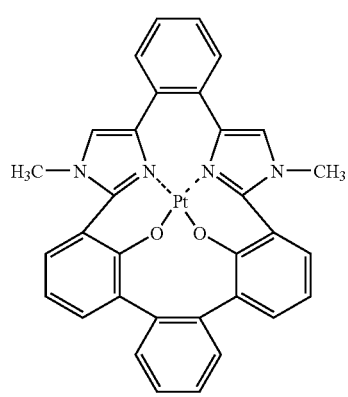
(A72)
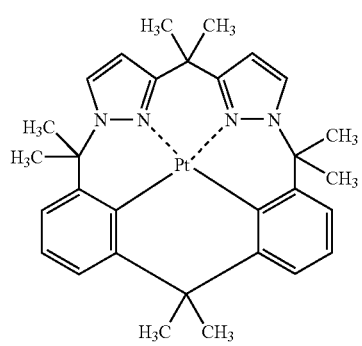
(A73)
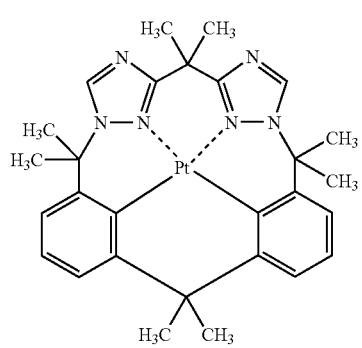
(A74)
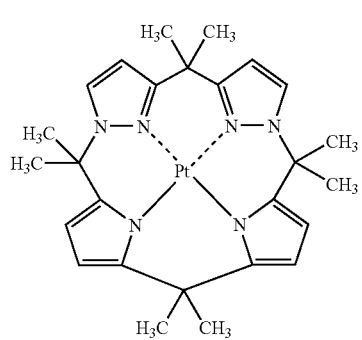
(A75)
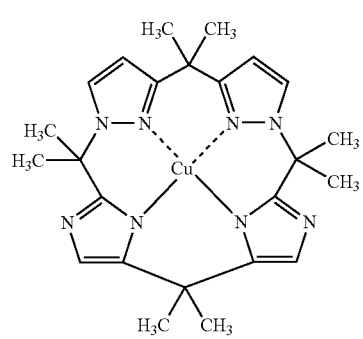
(A76)
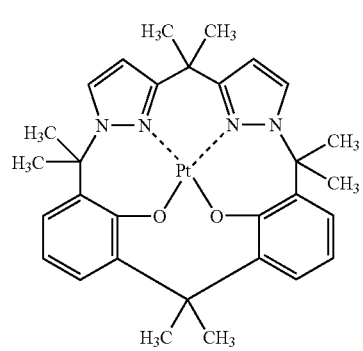
(A77)
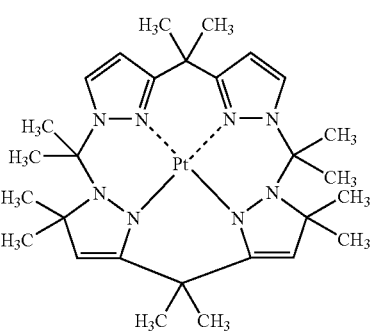
(A78)
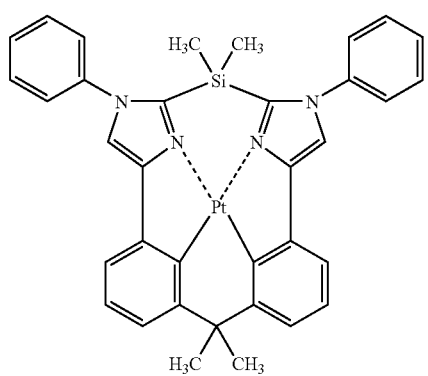
(A79)

-continued

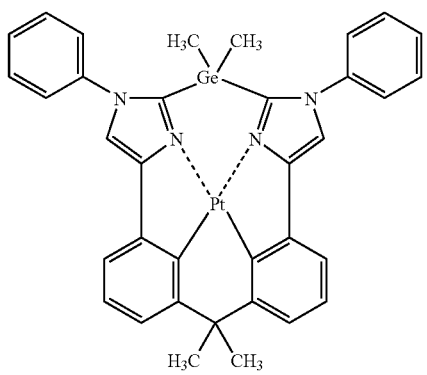

(A80)

Compounds represented by Formula (B-1) shown below are also preferable as metal complexes usable in the invention.

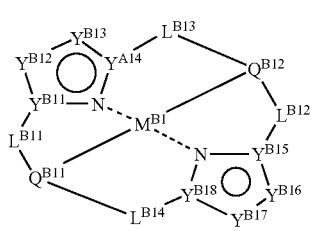

Formula (B-1)

In Formula (B-1), $M^{B1}$ represents a metal ion. $Y^{B11}$, $Y^{B14}$, $Y^{B15}$ and $Y^{B18}$ each independently represent a carbon atom or a nitrogen atom. $Y^{B12}$, $Y^{B13}$, $Y^{B16}$ and $Y^{B17}$ each independently represent a substituted or unsubstituted carbon atom, a substituted or unsubstituted nitrogen atom, an oxygen atom or a sulfur atom. $L^{B11}$, $L^{B12}$, $L^{B13}$ and $L^{B14}$ each independently represent a connecting group. $Q^{B11}$ and $Q^{B12}$ each independently represent a partial structure containing an atom bonded to $M^{B1}$ via a covalent bond.

The compound represented by Formula (B-1) will be described in detail.

In Formula (B-1), $M^{B1}$, $Y^{B11}$, $Y^{B14}$, $Y^{B15}$, $Y^{B18}$, $Y^{B12}$, $Y^{B13}$, $Y^{B16}$, $Y^{B17}$, $L^{B11}$, $L^{B12}$, $L^{B13}$, $L^{B14}$, $Q^{B11}$ and $Q^{B12}$ have the same definitions as corresponding $M^{A1}$, $Y^{A11}$, $Y^{A14}$, $Y^{A15}$, $Y^{A18}$, $Y^{A12}$, $Y^{A13}$, $Y^{A16}$, $Y^{A17}$, $L^{A11}$, $L^{A12}$, $L^{A13}$, $L^{A14}$, $Q^{A11}$ and $Q^{A12}$ in Formula (A-1) respectively, and their preferable examples are also the same.

More preferable examples of the compound represented by Formula (B-1) include compounds represented by the following Formula (B-2), (B-3) or (B-4).

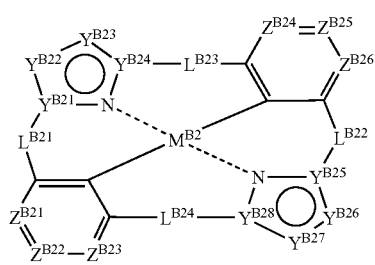

Formula (B-2)

In Formula (B-2), $M^{B2}$ represents a metal ion. $Y^{B21}$, $Y^{B24}$, $Y^{B25}$ and $Y^{B28}$ each independently represent a carbon atom or a nitrogen atom. $Y^{B22}$, $Y^{B23}$, $Y^{B26}$ and $Y^{B27}$ each independently represent a substituted or unsubstituted carbon atom, a substituted or unsubstituted nitrogen atom, an oxygen atom or a sulfur atom. $L^{B21}$, $L^{B22}$, $L^{B23}$ and $L^{B24}$ each independently represent a connecting group. $Z^{B21}$, $Z^{B22}$, $Z^{B23}$, $Z^{B24}$, $Z^{B25}$ and $Z^{B26}$ each independently represent a nitrogen atom or a substituted or unsubstituted carbon atom.

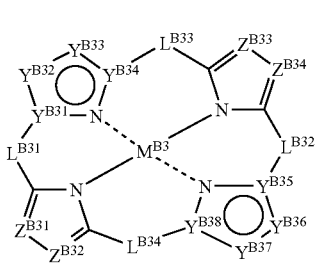

Formula (B-3)

In Formula (B-3), $M^{B3}$ represents a metal ion. $Y^{B31}$, $Y^{B34}$, $Y^{B35}$ and $Y^{B38}$ each independently represent a carbon atom or a nitrogen atom. $Y^{B32}$, $Y^{B33}$, $Y^{B36}$ and $Y^{B37}$ each independently represent a substituted or unsubstituted carbon atom, a substituted or unsubstituted nitrogen atom, an oxygen atom or a sulfur atom $L^{B31}$, $L^{B32}$, $L^{B33}$ and $L^{B34}$ each independently represent a connecting group. $Z^{B31}$, $Z^{B32}$, $Z^{B33}$ and $Z^{B34}$ each independently represent a nitrogen atom or a substituted or unsubstituted carbon atom.

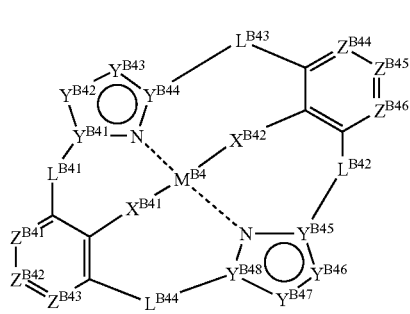

Formula (B-4)

In Formula (B-4), $M^{B4}$ represents a metal ion. $Y^{B41}$, $Y^{B44}$, $Y^{B45}$ and $Y^{B48}$ each independently represent a carbon atom or a nitrogen atom. $Y^{B42}$, $Y^{B43}$, $Y^{B46}$ and $Y^{B47}$ each independently represent a substituted or unsubstituted carbon atom, a substituted or unsubstituted nitrogen atom, an oxygen atom or a sulfur atom. $L^{B41}$, $L^{B42}$, $L^{B43}$ and $L^{B44}$ each independently represent a connecting group. $Z^{B41}$, $Z^{B42}$, $Z^{B43}$, $Z^{B44}$, $Z^{B45}$ and $Z^{B46}$ each independently represent a nitrogen atom or a substituted or unsubstituted carbon atom. $X^{B41}$ and $X^{B42}$ each independently represent an oxygen atom, a sulfur atom or a substituted or unsubstituted nitrogen atom.

The compound represented by Formula (B-2) will be described in detail.

In Formula (B-2), $M^{B2}$, $Y^{B21}$, $Y^{B24}$, $Y^{B25}$, $Y^{B28}$, $Y^{B22}$, $Y^{B23}$, $Y^{B26}$, $Y^{B27}$, $L^{B21}$, $L^{B22}$, $L^{B23}$ and $L^{B24}$ have the same definitions as corresponding $M^{B1}$, $Y^{B11}$, $Y^{B14}$, $Y^{B15}$, $Y^{B18}$, $Y^{B12}$, $Y^{B13}$, $Y^{B16}$, $Y^{B17}$, $L^{B11}$, $L^{B12}$, $L^{B13}$ and $L^{B14}$ in Formula (B-1) respectively, and their preferable examples are also the same.

$Z^{B21}$, $Z^{B22}$, $Z^{B23}$, $Z^{B24}$, $Z^{B25}$ and $Z^{B26}$ each independently represent a nitrogen atom or a substituted or unsubstituted carbon atom. Each of $Z^{B21}$, $Z^{B22}$, $Z^{B23}$, $Z^{B24}$, $Z^{B25}$ and $Z^{B26}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}$, $L^{A12}$, $L^{A13}$ or $L^{A14}$ in Formula (A-1).

The compound represented by Formula (B-3) will be described in detail.

In Formula (B-3), $M^{B3}$, $Y^{B31}$, $Y^{B34}$, $Y^{B35}$, $Y^{38}$, $Y^{B32}$, $Y^{B33}$, $Y^{B36}$, $Y^{B37}$, $L^{B31}$, $L^{B32}$, $L^{B33}$ and $L^{B34}$ have the same definitions as corresponding $M^{B1}$, $Y^{B11}$, $Y^{B14}$, $Y^{B15}$, $Y^{B18}$, $Y^{B12}$, $Y^{B13}$, $Y^{B16}$, $Y^{B17}$, $L^{B11}$, $L^{B12}$, $L^{B13}$ and $L^{B14}$ in Formula (B-1) respectively, and their preferable examples are also the same.

$Z^{B31}$, $Z^{B32}$, $Z^{B33}$ and $Z^{B34}$ each independently represent a nitrogen atom or a substituted or unsubstituted carbon atom. Each of $Z^{B31}$, $Z^{B32}$, $Z^{B33}$ and $Z^{B34}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}$, $L^{A12}$, $L^{A13}$ or $L^{A14}$ in Formula (A-1).

The compound represented by Formula (B-4) will be described in detail.

In Formula (B-4), $M^{B4}$, $Y^{B41}$, $Y^{B44}$, $Y^{B45}$, $Y^{B48}$, $Y^{B42}$, $Y^{B43}$, $Y^{B46}$, $Y^{B47}$, $L^{B41}$, $L^{B42}$, $L^{B43}$ and $L^{B44}$ have the same definitions as corresponding $M^{B1}$, $Y^{B11}$, $Y^{B14}$, $Y^{B15}$, $Y^{B18}$, $Y^{B12}$, $Y^{B13}$, $Y^{B16}$, $Y^{B17}$, $L^{B11}$, $L^{B12}$, $L^{B13}$ and $L^{B14}$ in Formula (B-1) respectively, and their preferable examples are also the same.

$Z^{B41}$, $Z^{B42}$, $Z^{B43}$, $Z^{B44}$, $Z^{B45}$ and $Z^{B46}$ each independently represent a nitrogen atom or a substituted or unsubstituted carbon atom. Each of $Z^{B41}$, $Z^{B42}$, $Z^{B43}$, $Z^{B44}$, $Z^{B45}$ and $Z^{B46}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}$, $L^{A12}$, $L^{A13}$ or $L^{A14}$ in Formula (A-1).

$X^{B41}$ and $X^{B42}$ each independently represent an oxygen atom, a sulfur atom or a substituted or unsubstituted nitrogen atom. Each of $X^{B41}$ and $X^{B42}$ is preferably an oxygen atom or a sulfur atom, and more preferably an oxygen atom.

Specific examples of the compounds represented by Formula (B-1) are illustrated below, but the invention is not limited thereto.

(B1)

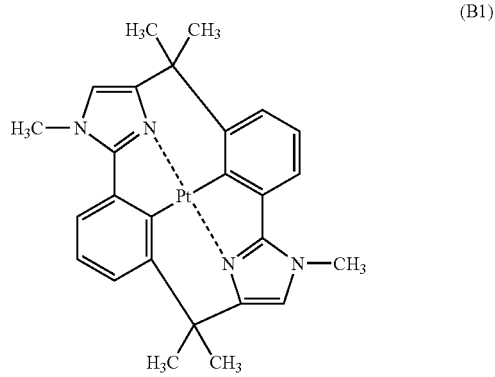

(B2)

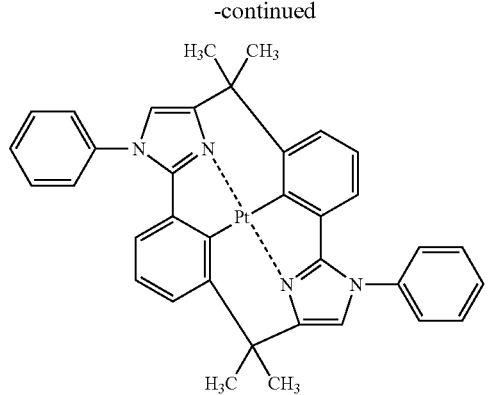

(B3)

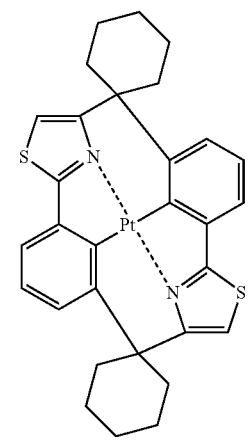

(B4)

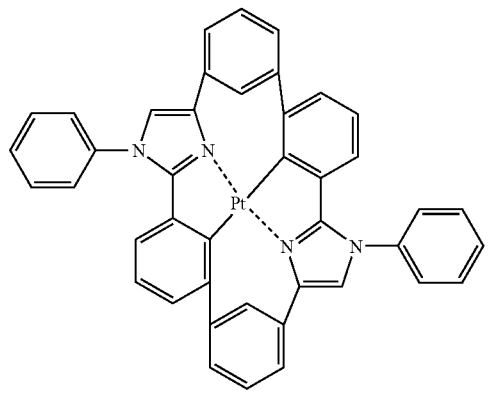

(B5)

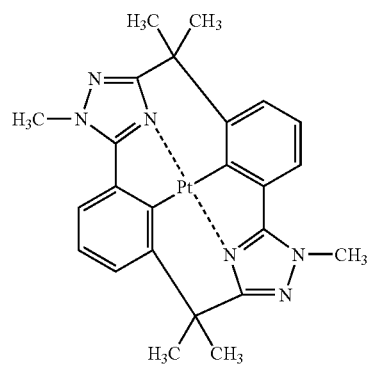

-continued
(B6) 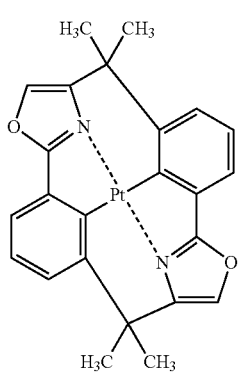
(B10) 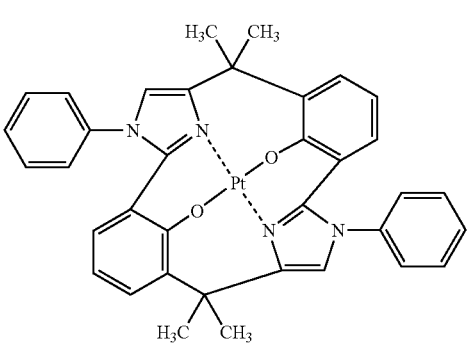
(B7) 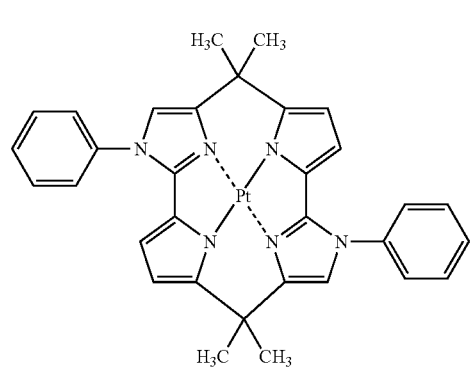
(B11) 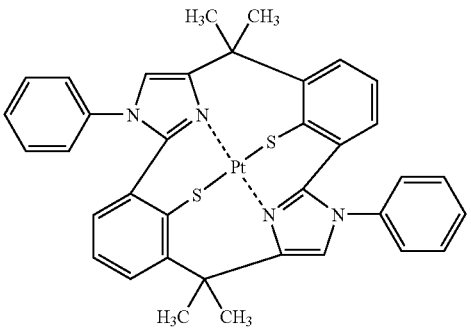
(B8) 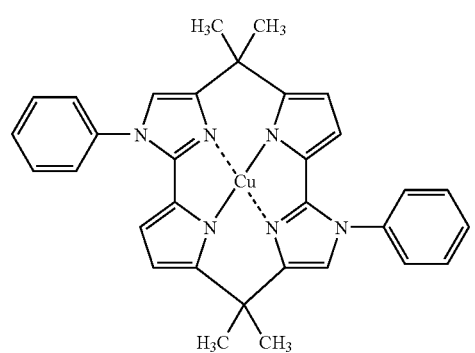
(B12) 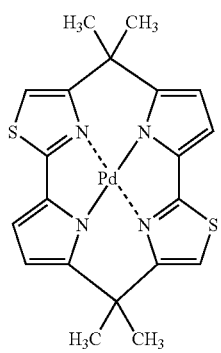
(B9) 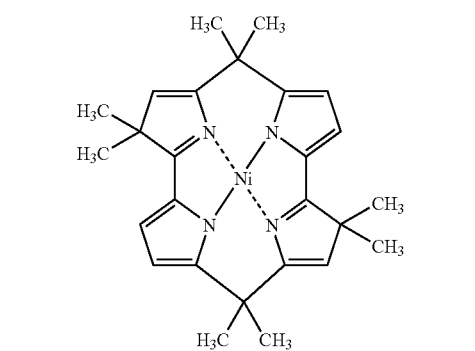
(B13)

-continued
(B14)
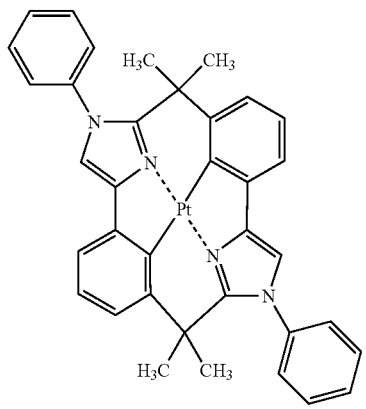
(B15)
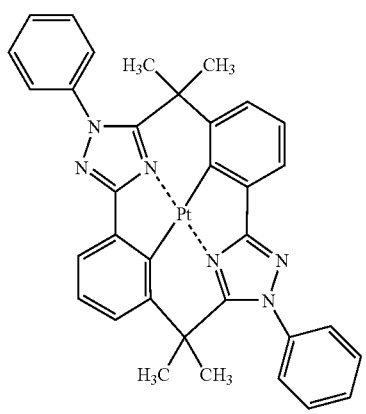
(B16)
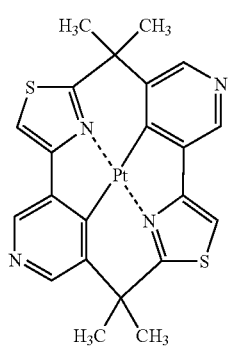
(B17)
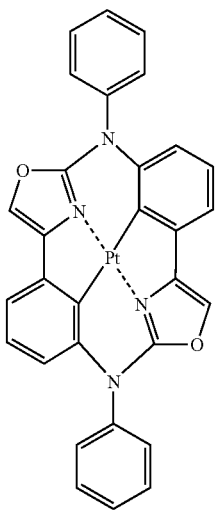
(B18)
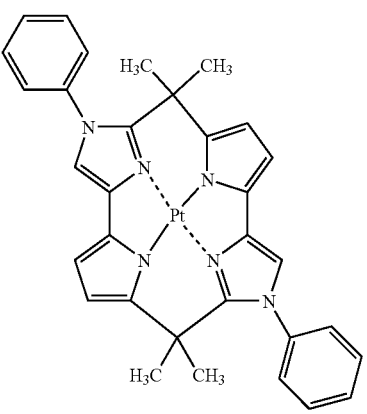
(B19)
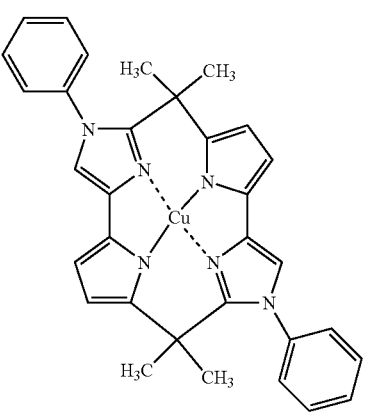

(B20) 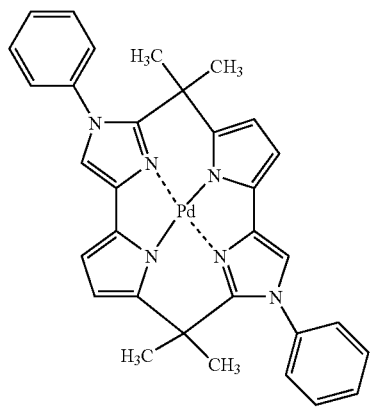
(B21) 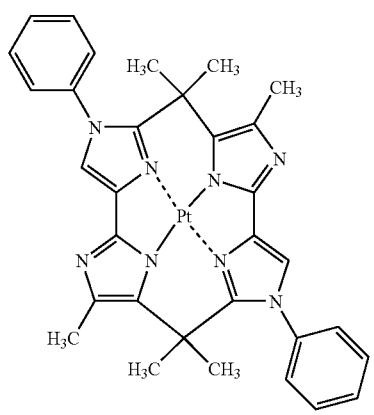
(B22) 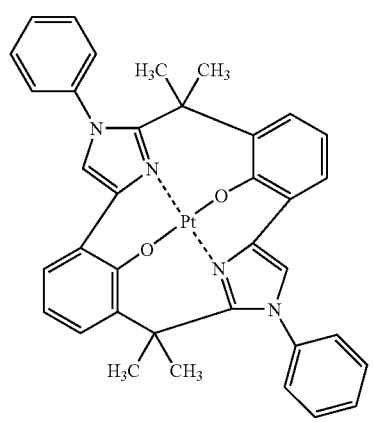
(B23) 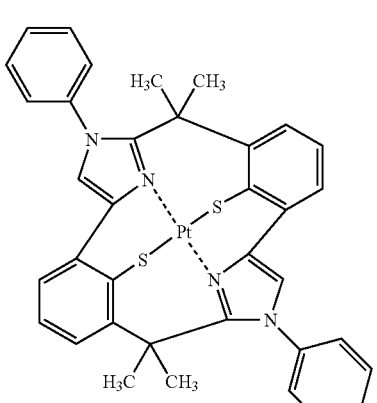
(B24) 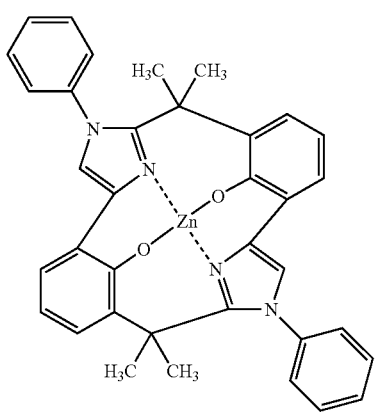
(B25) 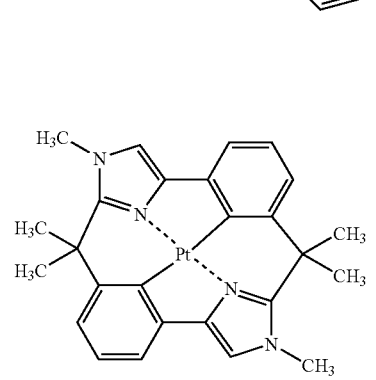
(B26) 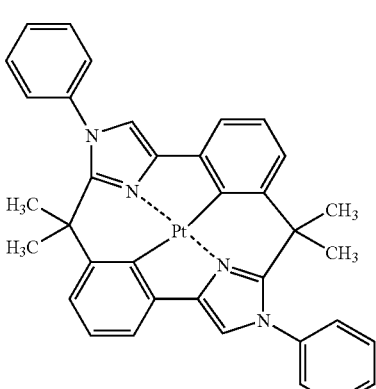
(B27) 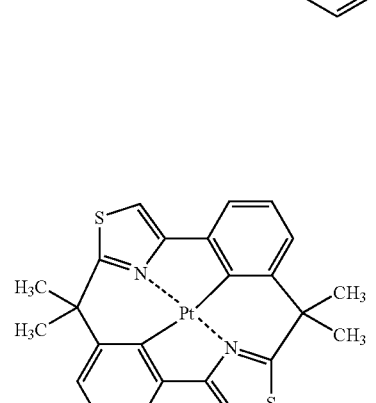

-continued
(B28)
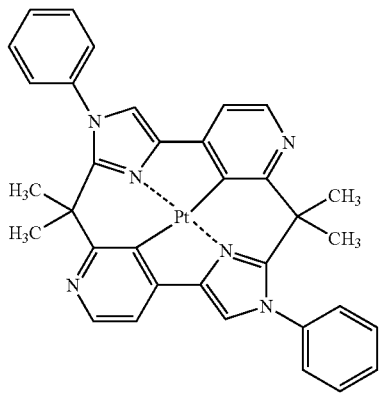
(B29)
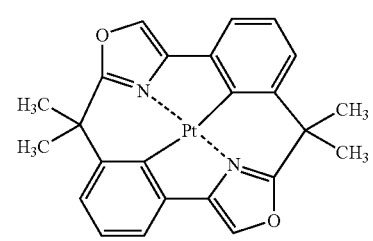
(B30)
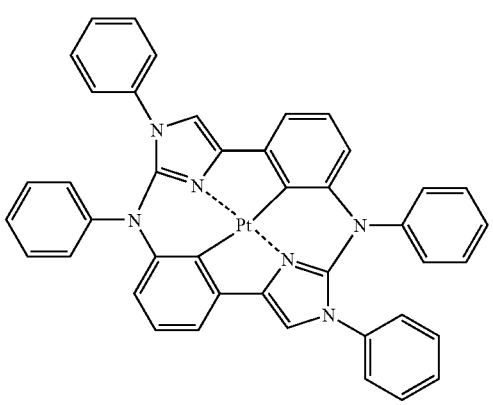
(B31)
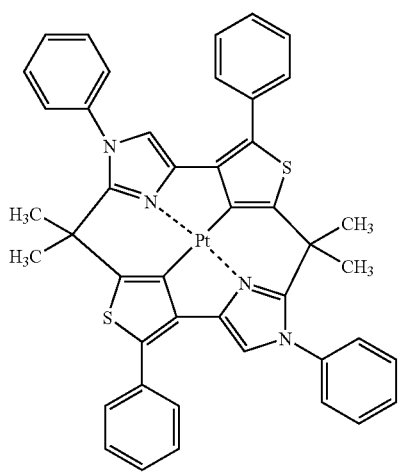
-continued
(B32)
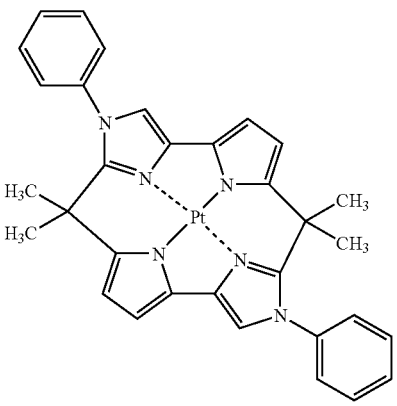
(B33)
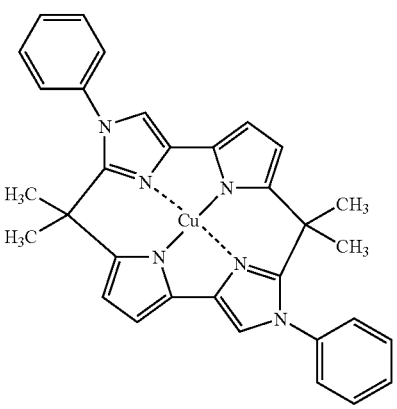
(B34)
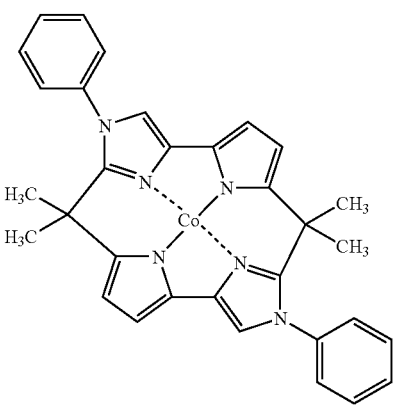
(B35)
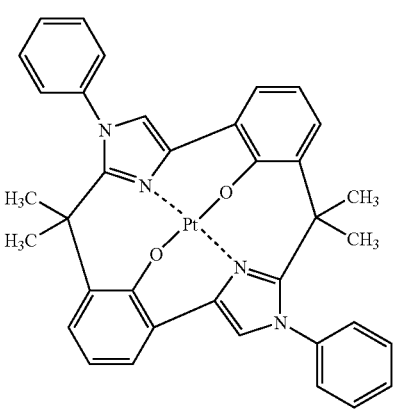

-continued
(B36)
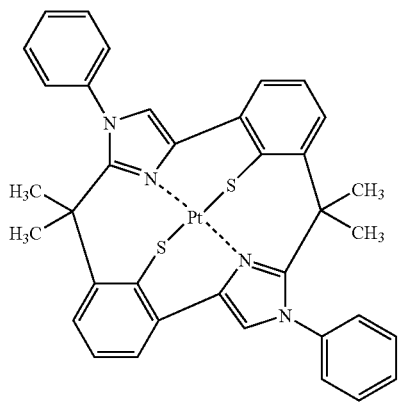
(B37)
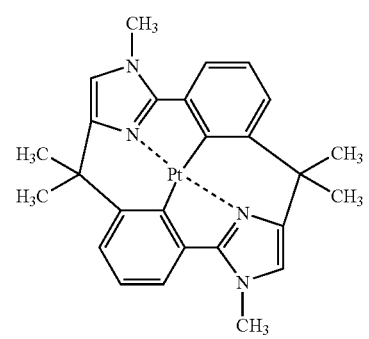
(B38)
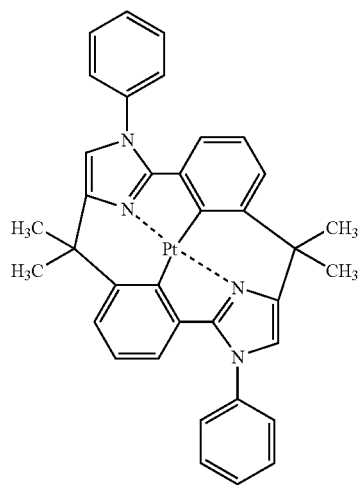
(B39)
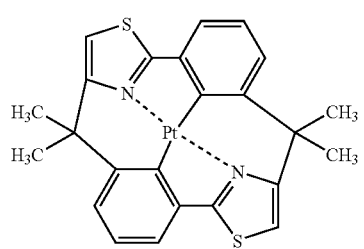
-continued
(B40)
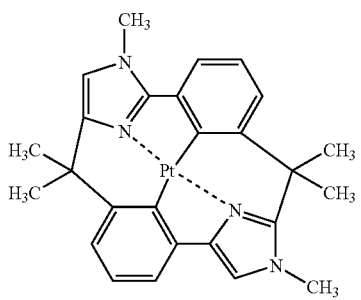
(B41)
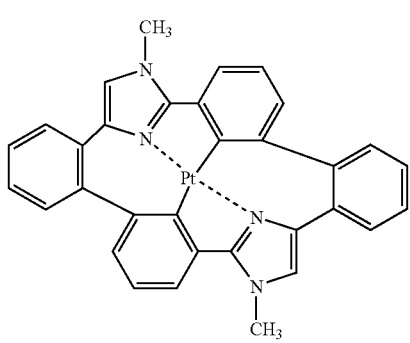
(B42)
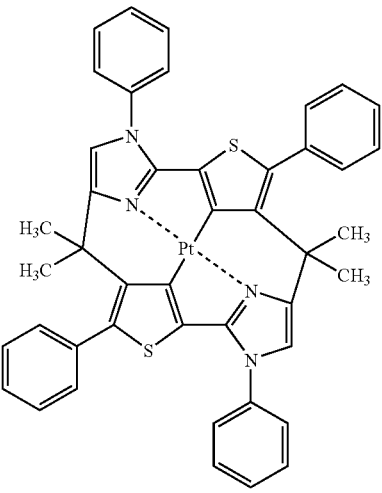
(B43)
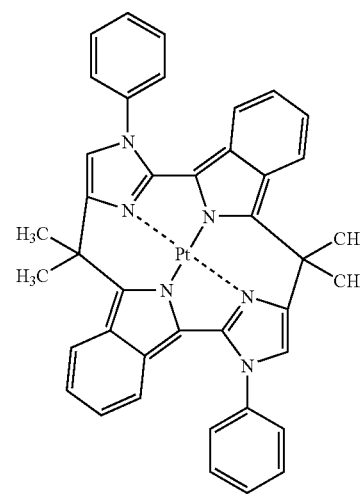

-continued
(B44)
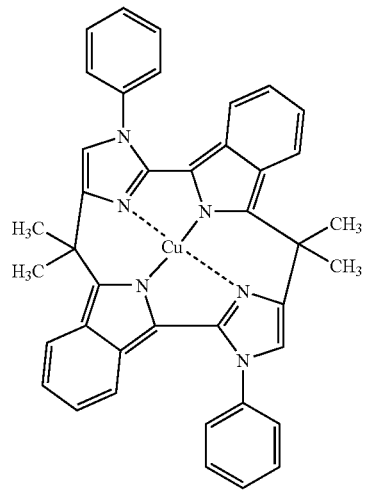
(B45)
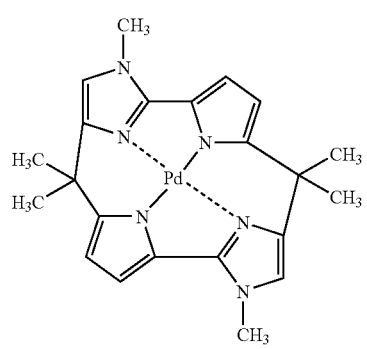
(B46)
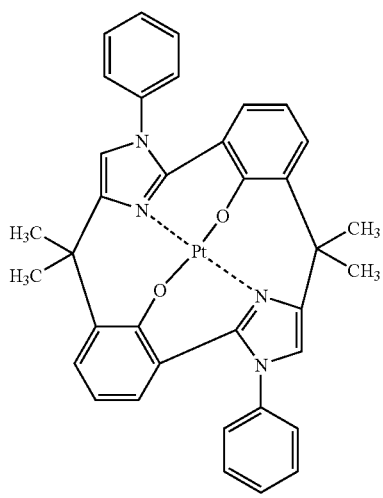
-continued
(B47)
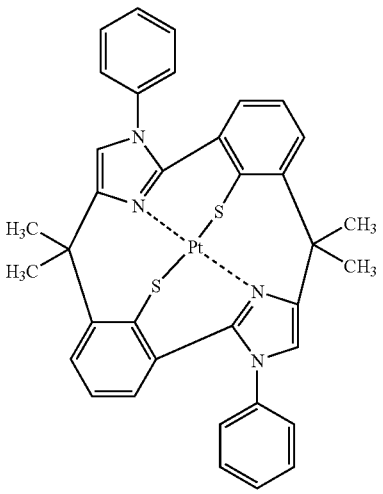
(B48)
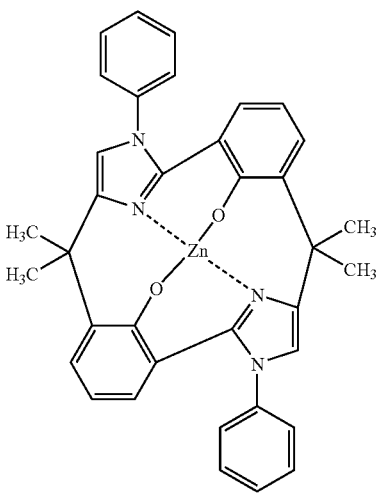
(B49)
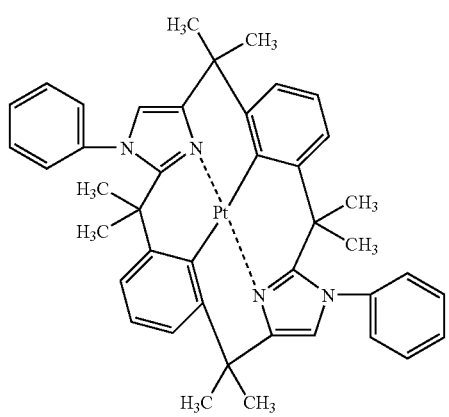

-continued (B50) 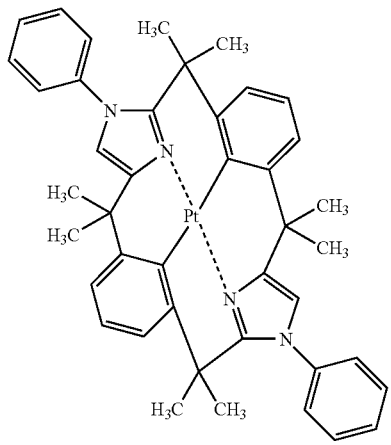

(B51) 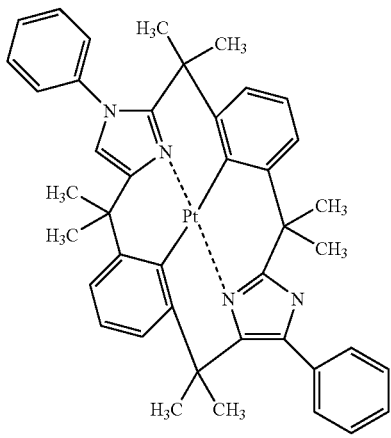

(B52) 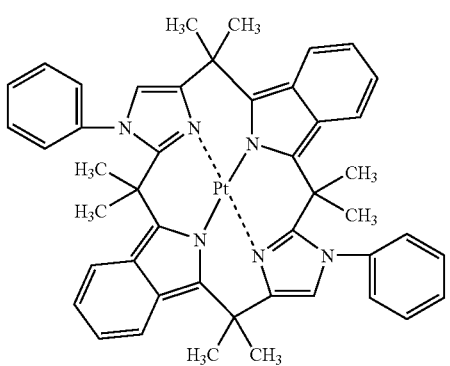

(B53) 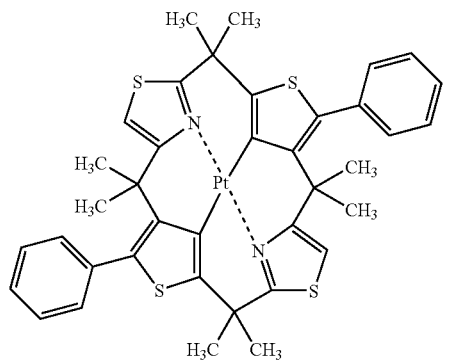

-continued (B54) 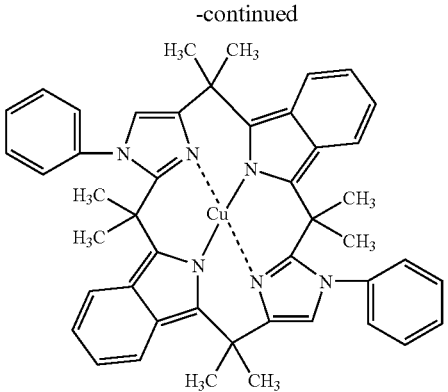

(B55) 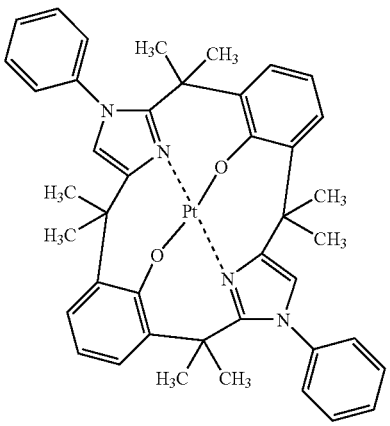

An example of preferable metal complexes usable in the invention is a compound represented by the following Formula (C-1).

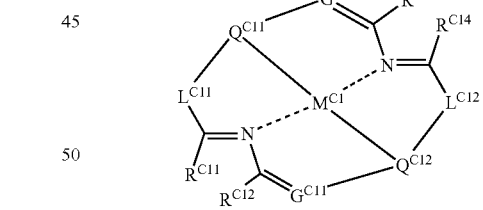

Formula (C-1)

In Formula (C-1), $M^{C1}$ represents a metal ion. $R^{C11}$ and $R^{C12}$ each independently represent a hydrogen atom or a substituent. When $R^{C11}$ and $R^{C12}$ represent substituents, the substituents may be bonded to each other to form a 5-membered ring. $R^{C13}$ and $R^{C14}$ each independently represent a hydrogen atom or a substituent. When $R^{C13}$ and $R^{C14}$ represent substituents, the substituents may be bonded to each other to form a 5-membered ring. $G^{C11}$ and $G^{C12}$ each independently represent a nitrogen atom or a substituted or unsubstituted carbon atom. $L^{C11}$ and $L^{C12}$ each independently represent a connecting group. $Q^{C11}$ and $Q^{C12}$ each independently represent a partial structure containing an atom covalently bonded to $M^{C1}$.

Formula (C-1) will be described in detail.

In Formula (C-1), $M^{C1}$, $L^{C11}$, $L^{C12}$, $Q^{C11}$ and $Q^{C12}$ have the same definitions as corresponding $M^{A1}$, $L^{A11}$, $L^{A12}$, $Q^{A11}$ and $Q^{A12}$ in Formula (A-1) respectively, and their preferable examples are also the same.

$G^{C11}$ and $G^{C12}$ each independently represent a nitrogen atom or a substituted or unsubstituted carbon atom, preferably a nitrogen atom or an unsubstituted carbon atom, and more preferably a nitrogen atom.

$R^{C11}$ and $R^{C12}$ each independently represent a hydrogen atom or a substituent. $R^{C11}$ and $R^{C12}$ may be bonded to each other to form a 5-membered ring. $R^{C13}$ and $R^{C14}$ each independently represent a hydrogen atom or a substituent. $R^{C13}$ and $R^{C14}$ may be bonded to each other to form a 5-membered ring.

The substituent represented by $R^{C11}$, $R^{C12}$, $R^{C13}$ or $R^{C14}$ may be, for example, an alkyl group (preferably having 1 to 30 carbon atoms, more preferably having 1 to 20 carbon atoms, particularly preferably having 1 to 10 carbon atoms; and examples thereof include a methyl group, an ethyl group, an iso-propyl group, a group, a tert-butyl group, a n-octyl group, a n-decyl group, a n-hexadecyl group, a cyclopropyl group, a cyclopentyl group, a cyclohexyl group, etc.), an alkenyl group (preferably having 2 to 30 carbon atoms, more preferably having 2 to 20 carbon atoms, particularly preferably having 2 to 10 carbon atoms; and examples thereof include a vinyl group, an allyl group, a 2-butenyl group, a 3-pentenyl group and the like), an alkynyl group (preferably having 2 to 30 carbon atoms, more preferably having 2 to 20 carbon atoms, particularly preferably having 2 to 10 carbon atoms; and examples thereof include a propargyl group, a 3-pentynyl group and the like), an aryl group (preferably having 6 to 30 carbon atoms, more preferably having 6 to 20 carbon atoms, particularly preferably having 6 to 12 carbon atoms; and examples thereof include phenyl, p-methylphenyl, naphthyl, anthranyl, etc.), an amino group (preferably having 0 to 30 carbon atoms, more preferably having 0 to 20 carbon atoms, particularly preferably having 0 to 10 carbon atoms; and examples thereof include an amino group, a methylamino group, a dimethylamino group, a diethylamino group, a dibenzylamino group, a diphenylamino group, a ditolylamino group and the like), an alkoxy group (preferably having 1 to 30 carbon atoms, more preferably having 1 to 20 carbon atoms, particularly preferably having 1 to 10 carbon atoms; and examples thereof include a methoxy group, an ethoxy group, a butoxy group, a 2-ethylhexyloxy group and the like), an aryloxy group (preferably a having 6 to 30 carbon atoms, more preferably having 6 to 20 carbon atoms, particularly preferably having 6 to 12 carbon atoms; and examples thereof include a phenyloxy group, a 1-naphthyloxy group, a 2-naphthyloxy group and the like), a heterocyclic oxy group (preferably having 1 to 30 carbon atoms, more preferably having 1 to 20 carbon atoms, particularly preferably having 1 to 12 carbon atoms; and examples thereof include a pyridyloxy group, a pyrazyloxy group, a pyrimidyloxy group, a quinolyloxy group and the like), an acyl group (preferably having 1 to 30 carbon atoms, more preferably having 1 to 20 carbon atoms, particularly preferably having 1 to 12 carbon atoms; and examples thereof include an acetyl group, a benzoyl group, a formyl group, a pivaloyl group and the like), an alkoxycarbonyl group (preferably having 2 to 30 carbon atoms, more preferably having 2 to 20 carbon atoms, particularly preferably having 2 to 12 carbon atoms; and examples thereof include a methoxycarbonyl group, an ethoxycarbonyl group and the like), an aryloxycarbonyl group (preferably having 7 to 30 carbon atoms, more preferably having 7 to 20 carbon atoms, particularly preferably having 7 to 12 carbon atoms; and examples thereof include a phenyloxycarbonyl group and the like), an acyloxy group preferably having 2 to 30 carbon atoms, more preferably having 2 to 20 carbon atoms, particularly preferably having 2 to 10 carbon atoms; and examples thereof include an acetoxy group, a benzoyloxy group and the like), an acylamino group (preferably having 2 to 30 carbon atoms, more preferably having 2 to 20 carbon atoms, particularly preferably having 2 to 10 carbon atoms; and examples thereof include an acetylamino group, a benzoylamino group and the like), an alkoxycarbonylamino group preferably having 2 to 30 carbon atoms, more preferably having 2 to 20 carbon atoms, particularly preferably having 2 to 12 carbon atoms; and examples thereof include a methoxycarbonylamino group and the like), an aryloxycarbonylamino group (preferably having 7 to 30 carbon atoms, more preferably having 7 to 20 carbon atoms, particularly preferably having 7 to 12 carbon atoms; and examples thereof include a phenyloxycarbonylamino group and the like), an alkylthio group (preferably having 1 to 30 carbon atoms, more preferably having 1 to 20 carbon atoms, particularly preferably having 1 to 12 carbon atoms; and examples thereof include a methylthio group, an ethylthio group and the like), an arylthio group (preferably having 6 to 30 carbon atoms, more preferably having 6 to 20 carbon atoms, particularly preferably having 6 to 12 carbon atoms; and examples thereof include a phenylthio group and the like), a heterocyclic thio group (preferably having 1 to 30 carbon atoms, more preferably having 1 to 20 carbon atoms, particularly preferably having 1 to 12 carbon atoms; and examples thereof include a pyridylthio group, a 2-benzimidazolylthio group, a 2-benzoxazolylthio group, a 2-benzthiazolylthio group and the like), a halogen atom (such as a fluorine atom, chlorine atom, bromine atom, iodine atom), a cyano group, a heterocyclic group (preferably having 1 to 30 carbon atoms, more preferably having 1 to 12 carbon atoms, and containing a heteroatom such as a nitrogen atom, oxygen atom or a sulfur atom, specifically an imidazolyl group, a pyridyl group, a quinolyl group, a furyl group, a thienyl group, a, piperidyl group, a morpholino group, a benzoxazolyl group, a benzimidazolyl group, a benzthiazolyl group, a carbazolyl group, azepinyl group and the like), a silyl group (preferably having 3 to 40 carbon atoms, more preferably having 3 to 30 carbon atoms, particularly preferably having 3 to 24 carbon atoms; and examples thereof include a trimethylsilyl group, a triphenylsilyl group and the like) or a silyloxy group (preferably having 3 to 40 carbon atoms, more preferably having 3 to 30 carbon atoms, particularly preferably having 3 to 24 carbon atoms; and examples thereof include a trimethylsilyloxy group, a triphenylsilyloxy group and the like).

The substituent represented by $R^{C11}$, $R^{C12}$, $R^{C13}$ or $R^{C14}$ is preferably an alkyl group, a aryl group, or such a group that $R^{C11}$ and $R^{C12}$, or $R^{C13}$ and $R^{C14}$, are bonded to each other to form a 5-membered ring. In a particularly preferable embodiment, $R^{C11}$ and $R^{C12}$, or $R^{C13}$ and $R^{C14}$, are bonded to each other to form a 5-membered ring.

The compound represented by Formula (C-1) is more preferably a compound represented by Formula (C-2).

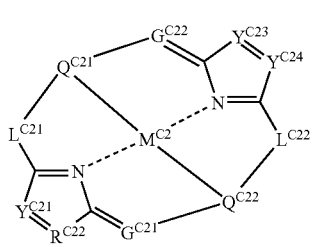

Formula (C-2)

In Formula (C-2), he represents a metal ion.

$Y^{C21}, Y^{C22}, Y^{C23}$ and $Y^{C24}$ each independently represent a nitrogen atom or a substituted or unsubstituted carbon atom. $G^{C21}$ and $G^{C22}$ each independently represent a nitrogen atom or a substituted or unsubstituted carbon atom. $L^{C21}$ and $L^{C22}$ each independently represent a connecting group. $Q^{C21}$ and $Q^{C22}$ each independently represent a partial structure containing an atom bonded to $M^{C2}$.

Formula (C-2) will be described in detail.

In Formula (C-2), $M^{C2}, L^{C21}, L^{C22}, Q^{C21}, Q^{C22}, G^{C21}$ and $G^{C22}$ have the same definitions as corresponding $M^{C1}, L^{C11}, L^{C12}, Q^{C11}, Q^{C12}, G^{C11}$ and $G^{C12}$ in Formula (C-1) respectively, and their preferable examples are also the same.

$Y^{C21}, Y^{C22}, Y^{C23}$ and $Y^{C24}$ each independently represent a nitrogen atom or a substituted or unsubstituted carbon atom, preferably a substituted or unsubstituted carbon atom, and more preferably an unsubstituted carbon atom.

The compound represented by Formula (C-2) is more preferably a compound represented by the following Formula (C-3), (C-4) or (C-5).

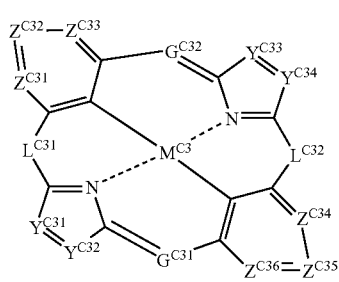

Formula (C-3)

In Formula (C-3), $M^{C3}$ represents a metal ion.

$Y^{C31}, Y^{C32}, Y^{C33}$ and $Y^{C34}$ each independently represent a nitrogen atom or a substituted or unsubstituted carbon atom. $G^{C31}$ and $G^{C32}$ each independently represent a nitrogen atom or a substituted or unsubstituted carbon atom. $L^{C31}$ and $L^{C32}$ each independently represent a connecting group. $Z^{C31}, Z^{C32}, Z^{C33}, Z^{C43}, Z^{C35}$ and $Z^{C36}$ each independently represent a nitrogen atom or a substituted or unsubstituted carbon atom.

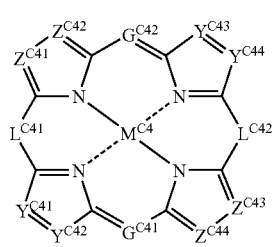

Formula (C-4)

In Formula (C-4), $M^{C4}$ represents a metal ion.

$Y^{C41}, Y^{C42}, Y^{C43}$ and $Y^{C44}$ each independently represent a nitrogen atom Or a substituted or unsubstituted carbon atom. $G^{C44}$ and $G^{C42}$ each independently represent a nitrogen atom or a substituted or unsubstituted carbon atom. $L^{C41}$ and $L^{C42}$ each independently represent a connecting group. $Z^{C41}, Z^{C42}, Z^{C43}$ and $Z^{C44}$ each independently represent a nitrogen atom or a substituted or unsubstituted carbon atom.

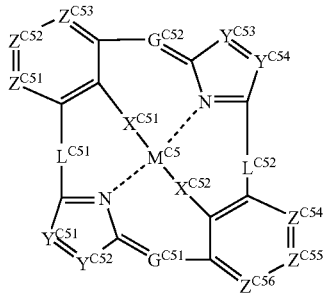

Formula (C-5)

In Formula (C-5), $M^{C5}$ represents a metal ion.

$Y^{C51}, Y^{C52}, Y^{C53}$ and $Y^{C54}$ each independently represent a nitrogen atom or a substituted or unsubstituted carbon atom. $G^{C51}$ and $G^{C52}$ each independently represent a nitrogen atom or a substituted or unsubstituted carbon atom. $L^{C51}$ and $L^{C52}$ each independently represent a connecting group. $Z^{C51}, Z^{C52}, Z^{C53}, Z^{C54}, Z^{C55}$ and $Z^{C56}$ each independently represent a nitrogen atom or a substituted or unsubstituted carbon atom. $X^{C51}$ and $X^{C52}$ each independently represent an oxygen atom, a sulfur atom or a substituted or unsubstituted nitrogen atom.

The compound represented by Formula (C-3) will be described in detail.

In Formula (C-3), $M^{C3}, L^{C31}, L^{C32}, G^{C31}$ and $G^{C32}$ have the same definitions as corresponding $M^{C1}, L^{C11}, L^{C12}, G^{C11}$ and $G^{C12}$ in Formula (C-1) respectively, and their preferable examples are also the same.

$Z^{C31}, Z^{C32}, Z^{C33}, Z^{C34}, Z^{C35}$ and $Z^{C36}$ each independently represent a nitrogen atom or a substituted or unsubstituted carbon atom. Each of $Z^{C31}, Z^{C32}, Z^{C33}, Z^{C34}, Z^{C35}$ and $Z^{C36}$ is preferably a substituted or unsubstituted carbon atom, and more preferably an unsubstituted carbon atom.

The compound represented by Formula (C-4) is described in more detail.

In Formula (C-4), $M^{C4}, L^{C41}, L^{C42}, G^{C41}$ and $G^{C42}$ have the same definitions as corresponding $M^{C1}, L^{C11}, L^{C12}, G^{C11}$ and $G^{C12}$ in Formula (C-1) respectively, and their preferable examples are also the same.

$Z^{C41}, Z^{C42}, Z^{C43}$, and $Z^{C44}$ each independently represent a nitrogen atom or a substituted or unsubstituted carbon atom.

Each of $Z^{C41}$, $Z^{C42}$, $Z^{C43}$ and $Z^{C44}$ is preferably a substituted or unsubstituted carbon atom, and more preferably an unsubstituted carbon atom.

The compound represented by Formula (C-5) is described in more detail.

$M^{C5}$, $L^{C51}$, $L^{C52}$, $L^{C51}$ and $L^{C52}$ have the same definitions as corresponding $M^{C1}$, $L^{C11}$, $L^{C12}$, $G^{C11}$ and $G^{C12}$ in Formula (C-1) respectively, and their preferable examples are also the same.

$Z^{C51}$, $Z^{C52}$, $Z^{C53}$, $Z^{C54}$, $Z^{C55}$ and $Z^{C56}$ each independently represent a nitrogen atom or a substituted or unsubstituted carbon atom. Each of $Z^{C51}$, $Z^{C52}$, $Z^{C53}$, $Z^{C54}$, $Z^{C55}$ and $Z^{C56}$ is preferably a substituted or unsubstituted carbon atom, and more preferably an unsubstituted carbon atom.

$X^{C51}$ and $X^{C52}$ each independently represent an oxygen atom, a sulfur atom or a substituted or unsubstituted nitrogen atom. Each of $X^{C51}$ and $X^{C52}$ is preferably an oxygen atom or a sulfur atom, and more preferably an oxygen atom.

Specific examples of the compounds represented by Formula (C-1) are illustrated below, however, the invention is not limited thereto.

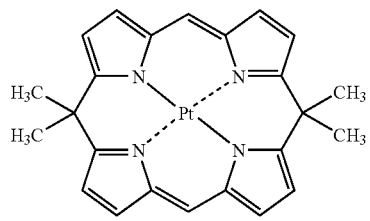
(C1)

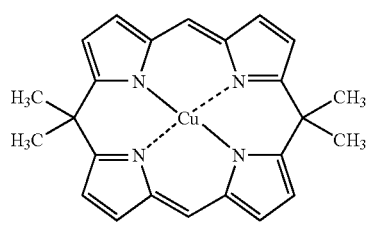
(C2)

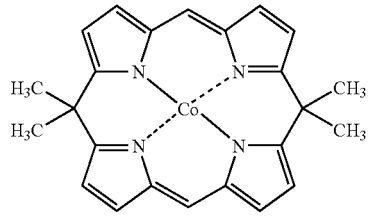
(C3)

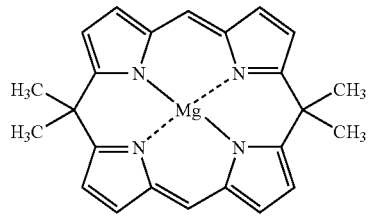
(C4)

-continued

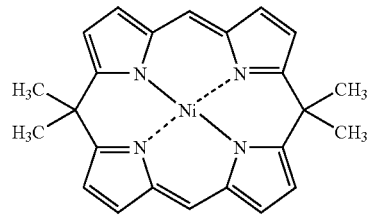
(C5)

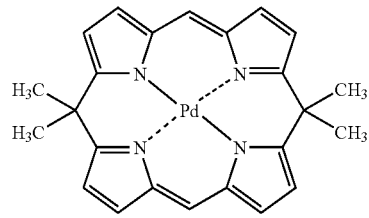
(C6)

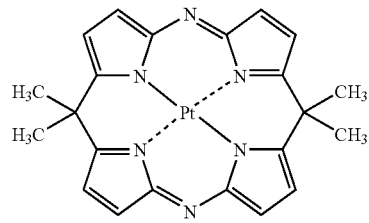
(C7)

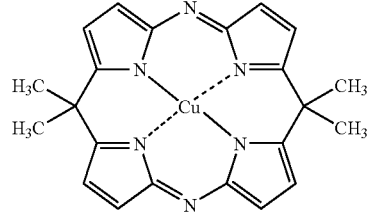
(C8)

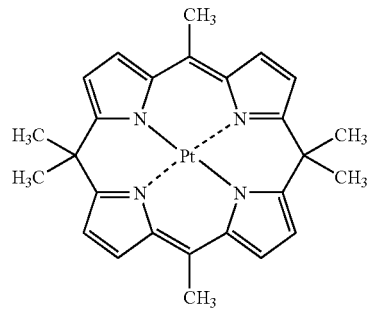
(C9)

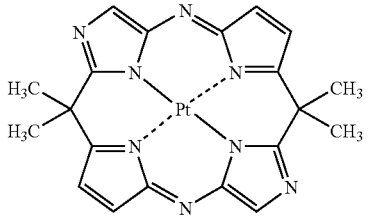
(C10)

-continued
(C11)
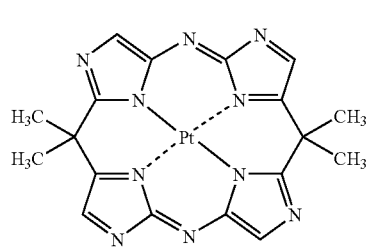
(C12)
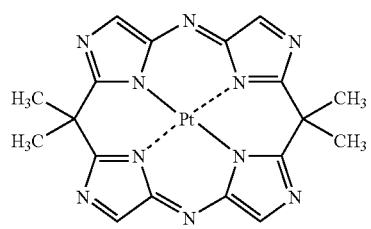
(C13)
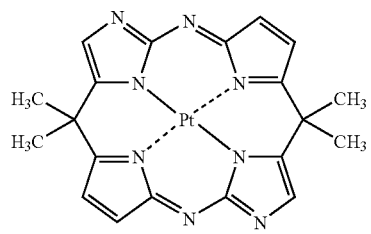
(C14)
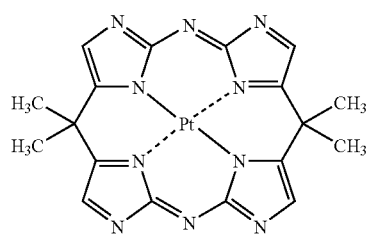
(C15)
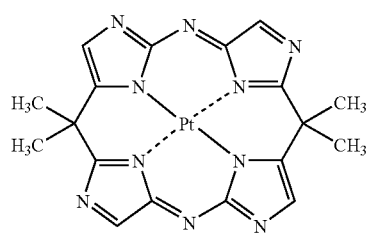
(C16)
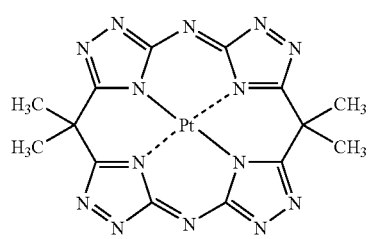
-continued
(C17)
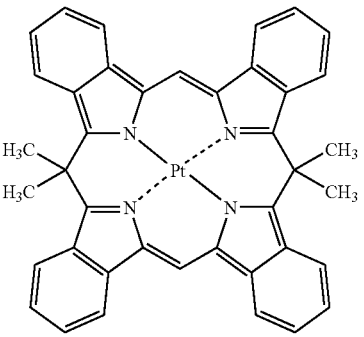
(C18)
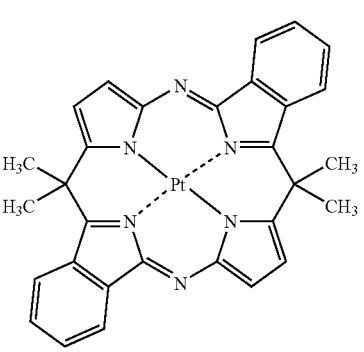
(C19)
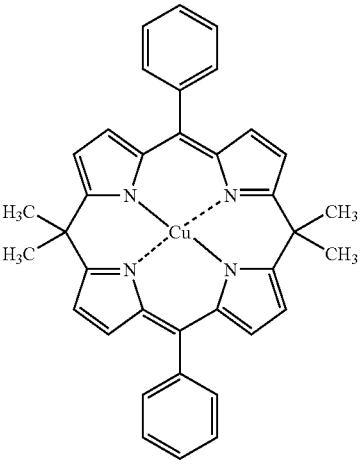
(C20)
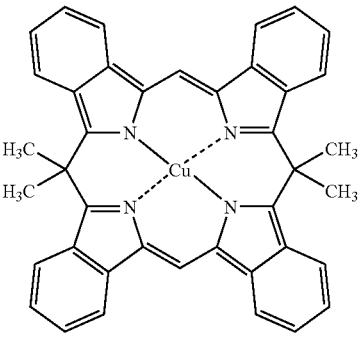

-continued
(C21)
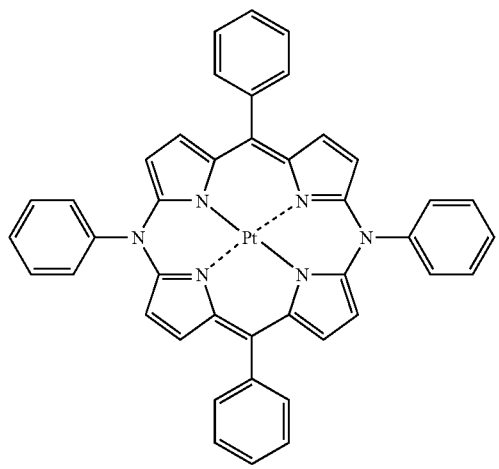
(C22)
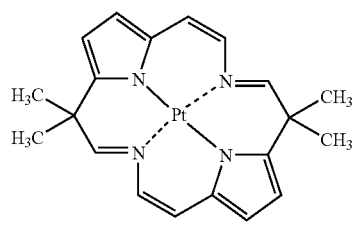
(C23)
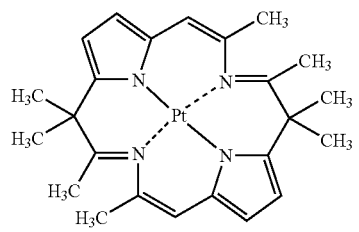
(C24)
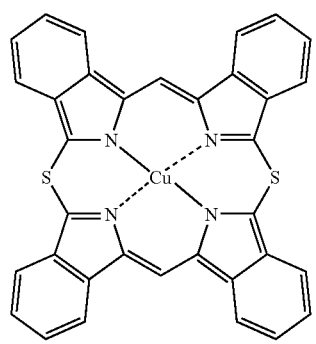
(C25)
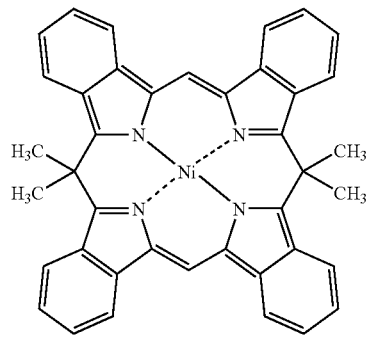
-continued
(C26)
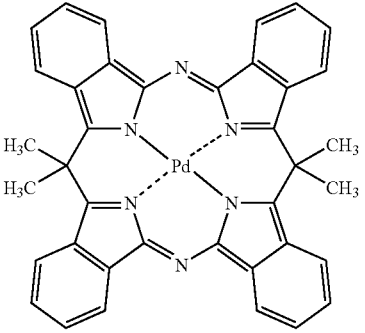
(C27)
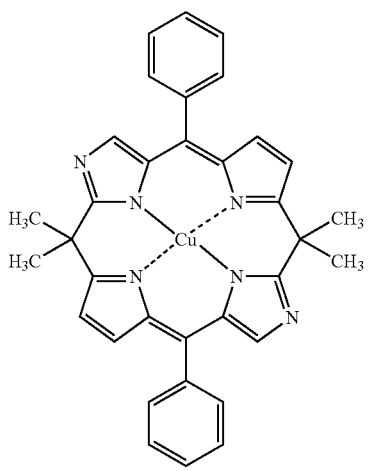
(C28)
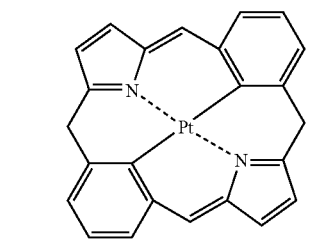
(C29)
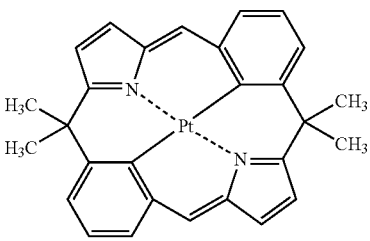
(C30)
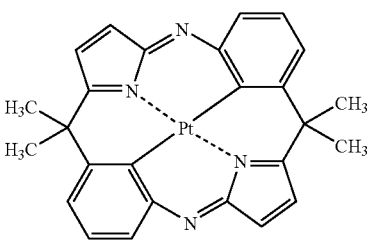

-continued
(C31)
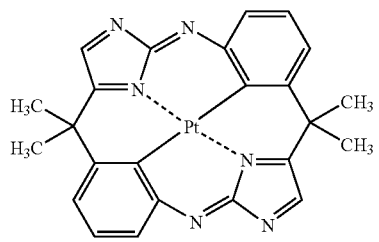
(C32)
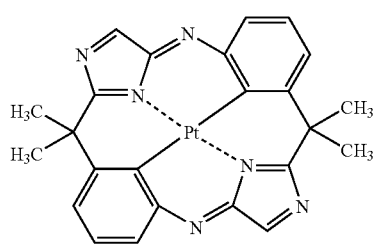
(C33)
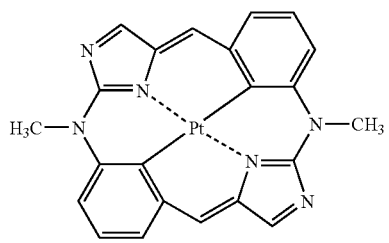
(C34)
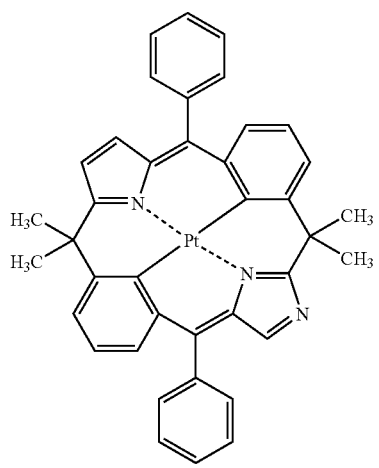
-continued
(C35)
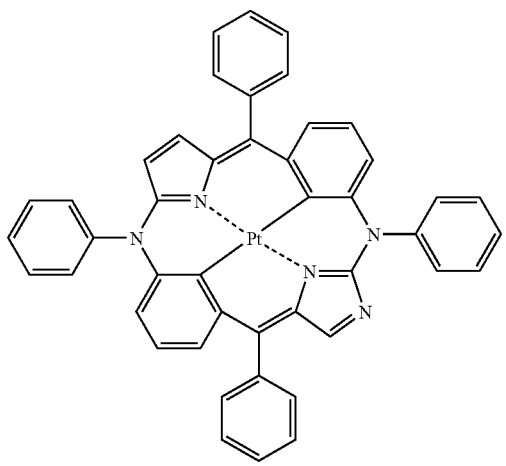
(C36)
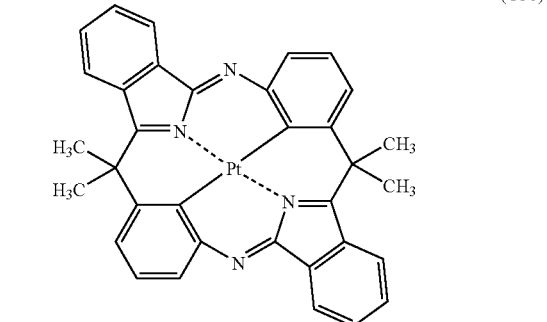
(C37)
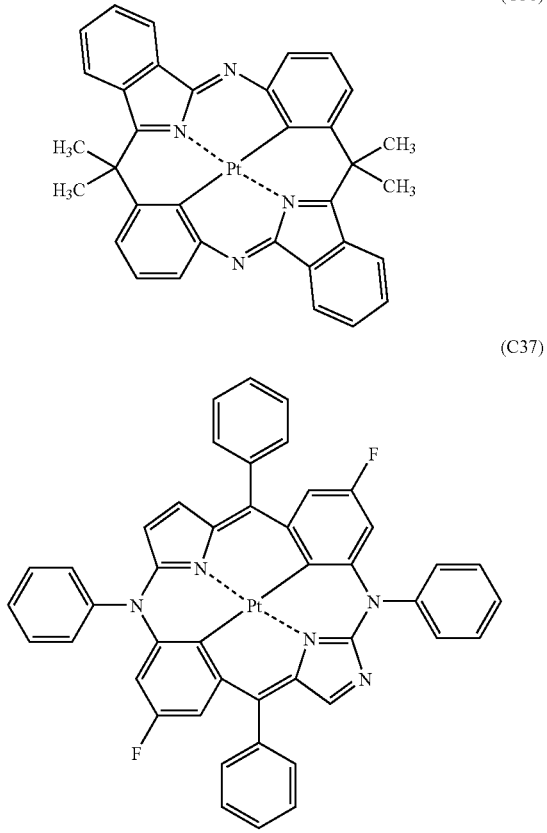
(C38)
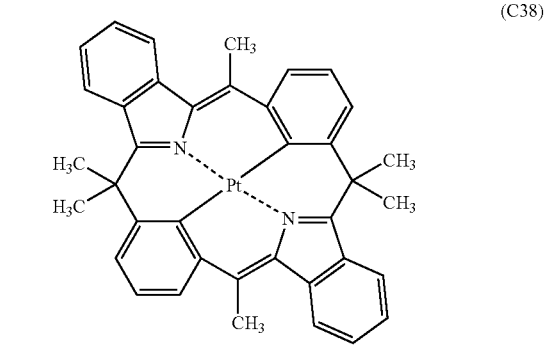

-continued (C39)

(C40)

(C41)

(C42)

(C43)

(C44)

(C45)

(C46)

(C47)

-continued
(C48)
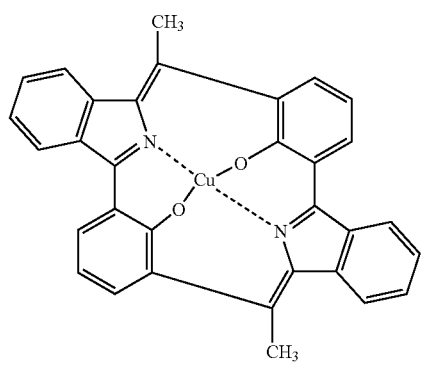
(C49)
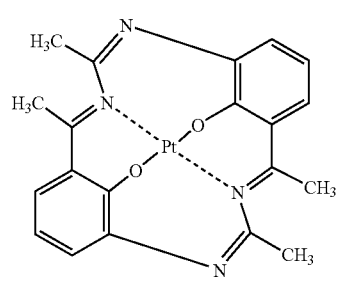
(C50)
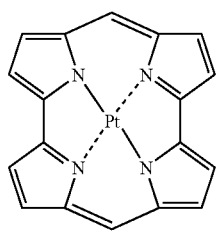
(C51)
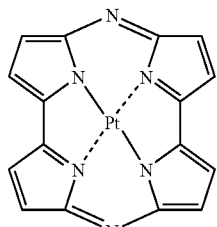
(C52)
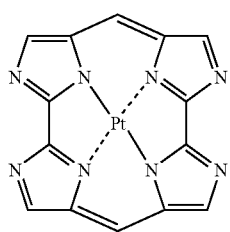
(C53)
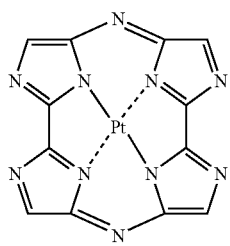
-continued
(C54)
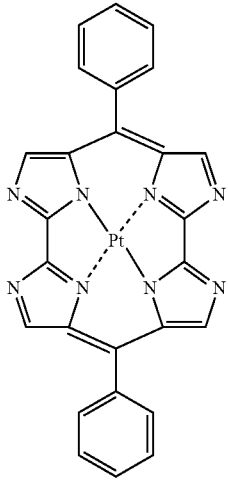
(C55)
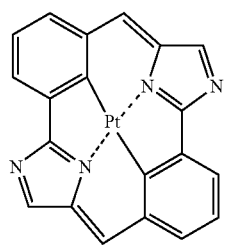
(C56)
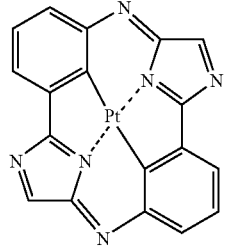
(C57)
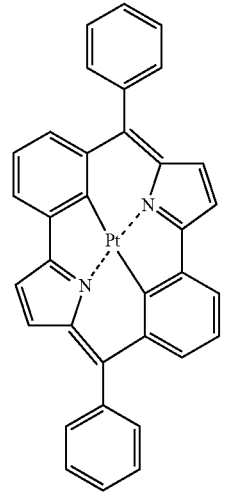

(C58) 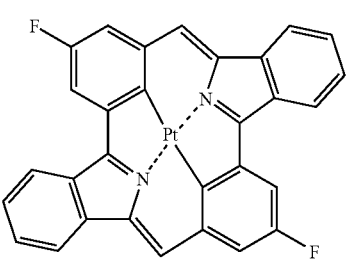

(C59) 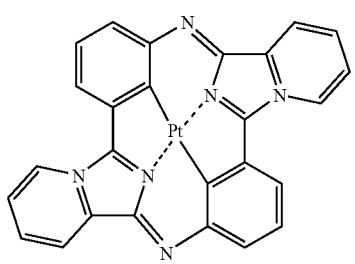

(C60) 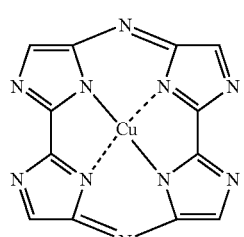

(C61) 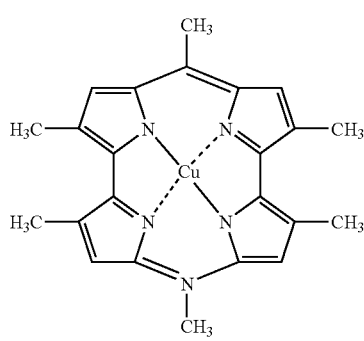

(C62)

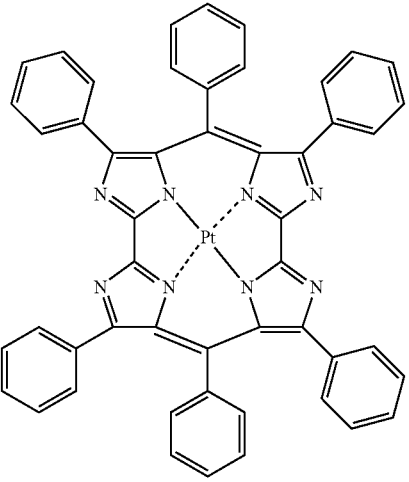

An example of preferable metal complexes usable in the invention is a compound represented by the following Formula (D-1).

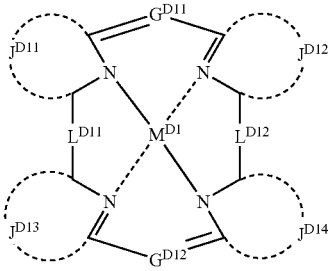

Formula (D-1)

In Formula (D-1), $M^{D1}$ represents a metal ion $G^{D11}$ and $G^{D12}$ each independently represent a nitrogen atom or a substituted or unsubstituted carbon atom. $J^{D11}$, $J^{D12}$, $J^{D13}$ and $J^{D14}$ each independently represent an atomic group necessary for forming a 5-membered ring. $L^{D11}$ and $L^{D12}$ each independently represent a connecting group.

Formula (D-1) will be described in detail.

In Formula (D-1), $M^{D1}$, $L^{D11}$ and $L^{D12}$ have the same definitions as corresponding $M^{A1}$, $L^{A11}$ and $L^{A12}$ in Formula (A-1) respectively, and their preferable examples are also the same.

$G^{D11}$ and $G^{D12}$ have the same definitions as corresponding $G^{C11}$ and $G^{C12}$ in Formula (C-1) respectively, and their preferable examples are also the same.

$J^{D11}$, $J^{D12}$, $J^{D13}$ and $J^{D14}$ each independently represent such an atomic group that a nitrogen containing 5-membered heterocycle containing the atomic group is formed.

The compound represented by Formula (D-1) is more preferably a compound represented by the following Formula (D-2), (D-3) or (D-4).

Formula (D-2)

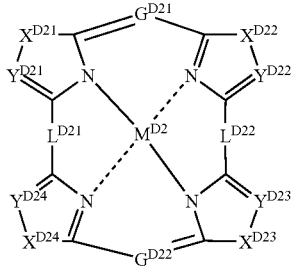

In Formula (D-2), $M^{D2}$ represents a metal ion.

$G^{D21}$ and $G^{D22}$ each independently represent a nitrogen atom or a substituted or unsubstituted carbon atom.

$Y^{D21}$, $Y^{D22}$, $Y^{D23}$ and $Y^{D24}$ each independently represent a nitrogen atom or a substituted or unsubstituted carbon atom.

$X^{D21}$, $X^{D22}$, $X^{D23}$ and $X^{D24}$ each independently represent an oxygen atom, a suffer atom, —$NR^{D21}$— or —$C(R^{D22})R^{D23}$—.

$R^{D21}$, $R^{D22}$ and $R^{D23}$ each independently represent a hydrogen atom or a substituent. $L^{D21}$ and $L^{D22}$ each independently represent a connecting group.

Formula (D-3)

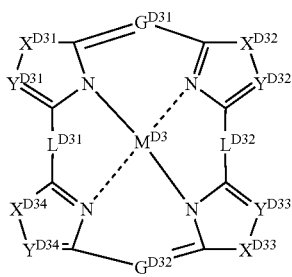

In Formula (D-3), $M^{D3}$ represents a metal ion, $G^{D31}$ and $G^{D32}$ each independently represent a nitrogen atom or a substituted or unsubstituted carbon atom.

$Y^{D31}$, $Y^{D32}$, $Y^{D33}$ and $Y^{D34}$ each independently represent a nitrogen atom or a substituted or unsubstituted carbon atom.

$X^{D31}$, $X^{D32}$, $X^{D33}$ and $X^{D34}$ each independently represent an oxygen atom, a sulfur atom, —$NR^{D31}$— or —$C(R^{D32})R^{D33}$—.

$R^{D31}$, $R^{D32}$ and $R^{D33}$ each independently represent a hydrogen atom or a substituent. $L^{D31}$ and $L^{D32}$ each independently represent a connecting group.

Formula (D-4)

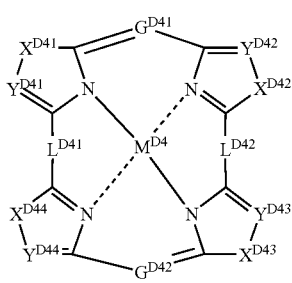

In Formula (D-4), $M^{D4}$ represents a metal ion.

$G^{D41}$ and $G^{D42}$ each independently represent a nitrogen atom or a substituted or unsubstituted carbon atom.

$Y^{D41}$, $Y^{D42}$, $Y^{D43}$ and $Y^{D44}$ each independently represent a nitrogen atom or a substituted or unsubstituted carbon atom.

$X^{D41}$, $X^{D42}$, $X^{D43}$ and $X^{D44}$ each independently represent an oxygen atom, a sulfur atom, —$NR^{D41}$— or —$C(R^{D42})R^{D43}$—. $R^{D41}$, $R^{D42}$ and $R^{D43}$ each independently represent a hydrogen atom or a substituent. $L^{D41}$ and $L^{D42}$ each independently represent a connecting group.

Formula (D-2) will be described in detail.

In Formula (D-2), $M^{D2}$, $L^{D21}$, $L^{D22}$, $G^{D21}$ and $G^{D22}$ have the same definitions as corresponding $M^{D1}$, $L^{D11}$, $L^{D12}$, $G^{D11}$ and $G^{D12}$ in Formula (D-1) respectively, and their preferable examples are also the same.

$Y^{D21}$, $Y^{D22}$, $Y^{D23}$ and $Y^{D24}$ each independently represent a nitrogen atom or a substituted or substituted carbon atom, preferably a substituted or unsubstituted carbon atom, and more preferably an unsubstituted carbon atom.

$X^{D21}$, $X^{D22}$, $X^{D23}$ and $X^{D24}$ each independently represent an oxygen atom, a sulfur atom, —$NR^{D21}$— or —$C(R^{D22})R^{D23}$—, preferably a sulfa atom, —$NR^{D21}$— or —$C(R^{D22})R^{D23}$—, more preferably —$NR^{D21}$— or —$C(R^{D22})R^{D23}$—, and her more preferably —$NR^{D21}$—.

$R^{D21}$, $R^{D22}$ and $R^{D23}$ each independently represent a hydrogen atom or a substituent. The substituent represented by $R^{D21}$, $R^{D22}$ or $R^{D23}$ may be, for example, an alkyl group (preferably those having 1 to 20 carbon atoms, more preferably those having 1 to 12 carbon atoms, particularly preferably those having 1 to 8 carbon atoms, and examples thereof include a methyl group, an ethyl group, an iso-propyl group, a tert-butyl group, a n-octyl group, a n-decyl group, a n-hexadecyl group, a cyclopropyl group, a cyclopentyl group, a cyclohexyl group and the like), an alkenyl group (preferably those having 2 to 20 carbon atoms, more preferably those having 2 to 12 carbon atoms, particularly preferably those having 2 to 8 carbon atoms, and examples thereof include a vinyl group, an allyl group, a 2-butenyl group, a 3-pentenyl group and the like), an alkynyl group (preferably those having 2 to 20 carbon atoms, more preferably those having 2 to 12 carbon atoms, particularly preferably those having 2 to 8 carbon atoms, and examples thereof include a propargyl group, a 3-pentynyl group and the like), an aryl group preferably those having 6 to 30 carbon atoms, more preferably those having 6 to 20 carbon atoms, particularly preferably those having 6 to 12 carbon atoms group, and examples thereof include a phenyl group, a p-methylphenyl group, a naphthyl group, and the like), a substituted carbonyl group (preferably those having 1 to 20 carbon atoms, more preferably those having 1 to 16 carbon atoms, particularly preferably those having 1 to 12 carbon atoms group, and examples thereof include a acetyl group, a benzoyl group, a methoxycarbonyl group, a phenyloxycarbonyl group, a dimethylaminocarbonyl group, a phenylaminocarbonyl group, and the like), a substituted sulfonyl group (preferably those having 1 to 20 carbon atoms, more preferably those having 1 to 16 carbon atoms, particularly preferably those having 1 to 12 carbon atoms group, and examples thereof include a mesyl group, a tosyl group and the like), or a heterocyclic group (including an aliphatic heterocyclic group and aromatic heterocyclic group, preferably those having 1 to 50 carbon atoms, more preferably those having 1 to 30 carbon atoms, more preferably those having 2 to 23 carbon atoms, preferably containing an oxygen atom, a sulfur atom or a nitrogen atom, and examples thereof include an imidazolyl group, a pyridyl group, a furyl group, a piperidyl group, a morpholino group, a benzoxazolyl group, a triazolyl group and the like). Each of $R^{D21}$, $R^{D22}$ and $R^{D23}$ is preferably an alkyl group, aryl group or aromatic heterocyclic group, more preferably an alkyl or aryl group, and still more preferably an aryl group.

Formula (D-3) will be described in detail.

In Formula (D-3), $M^{D3}$, $L^{D31}$, $L^{D32}$, $G^{D31}$ and $G^{D32}$ have the same definitions as corresponding $M^{D1}$, $L^{D11}$, $L^{D12}$, $G^{D11}$ and $G^{D12}$ in Formula D-1) respectively, and their preferable examples are also the same.

$X^{D31}$, $X^{D32}$, $X^{D33}$ and $X^{D34}$ have the same definitions as corresponding $X^{D21}$, $X^{D22}$, $X^{D23}$ and $X^{D24}$ in Formula (D-2) respectively, and their preferable examples are also the same.

$Y^{D31}$, $Y^{D32}$, $Y^{D33}$ and $Y^{D34}$ have the same definitions as corresponding $Y^{D21}$, $Y^{D22}$, $Y^{D23}$ and $Y^{D24}$ in Formula (D-2) respectively, and their preferable examples are also the same.

Formula (D-4) will be described in detail.

In Formula (D-4), $M^{D4}$, $L^{D41}$, $L^{D42}$, $G^{D41}$ and $G^{D42}$ have the same definitions as corresponding $M^{D1}$, $L^{D11}$, $L^{D12}$, $G^{D11}$ and $G^{D12}$ in Formula D-1) respectively, and their preferable examples are also the same.

$X^{D41}$, $X^{D42}$, $X^{D43}$ and $X^{D44}$ have the same definitions as corresponding $X^{D21}$, $X^{D22}$, $X^{D23}$ and $X^{D24}$ in Formula (D-2) respectively, and their preferable examples are also the same. $Y^{D41}$, $Y^{D42}$, $Y^{D43}$ and $Y^{D44}$ have the same definitions as corresponding $Y^{D21}$, $Y^{D22}$, $Y^{D23}$ and $Y^{D24}$ in Formula (D-2) respectively, and their preferable examples are also the same.

Specific examples of the compounds represented by Formula (D-1) are illustrated below, but the invention is not limited thereto.

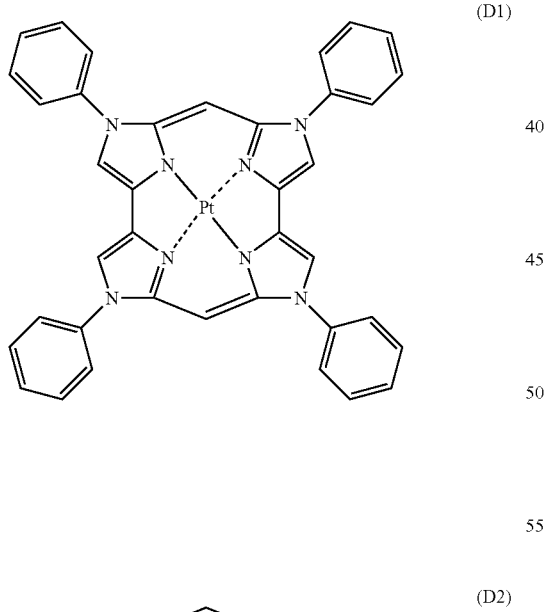
(D1)

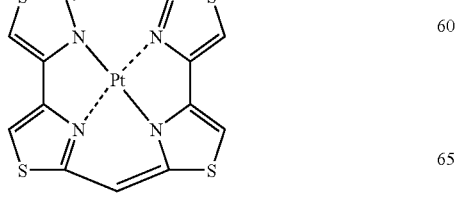
(D2)

-continued

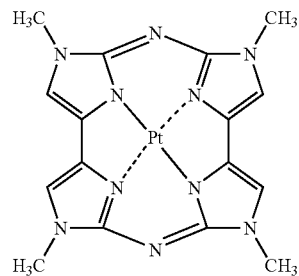
(D3)

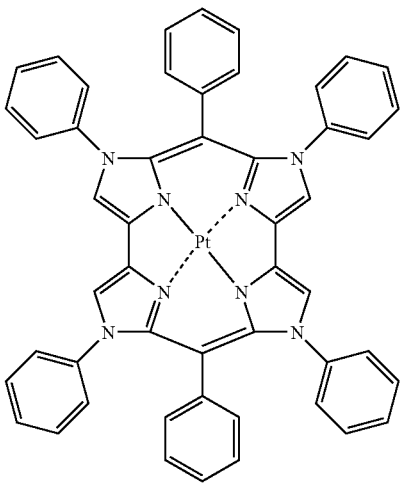
(D4)

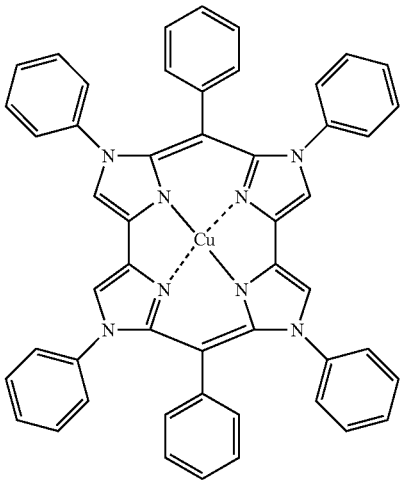
(D5)

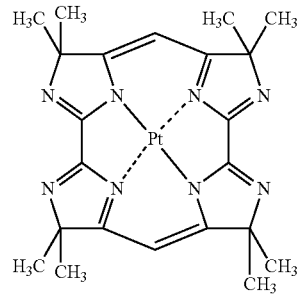
(D6)

-continued
(D7)
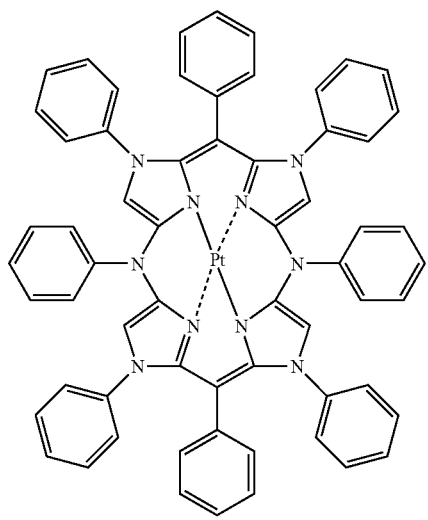
(D8)
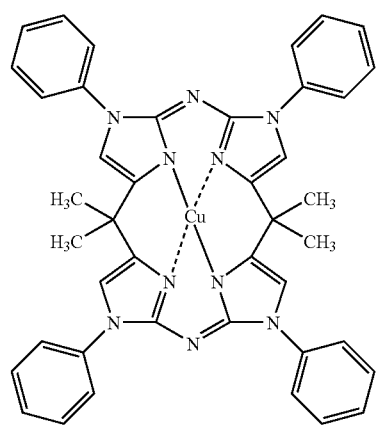
(D9)
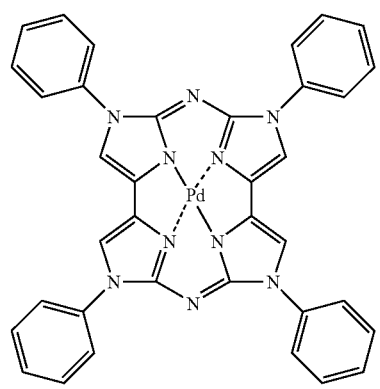
-continued
(D10)
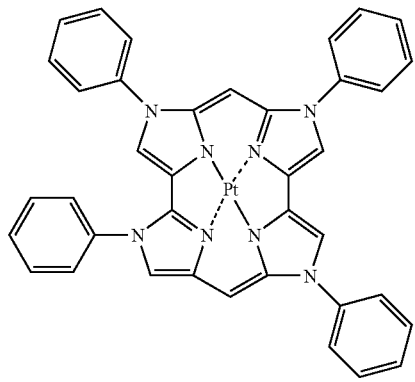
D(11)
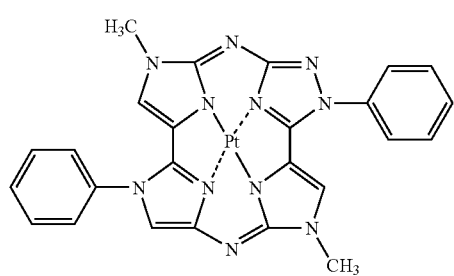
D(12)
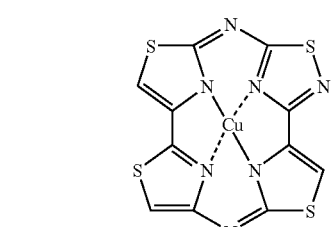
(D13)
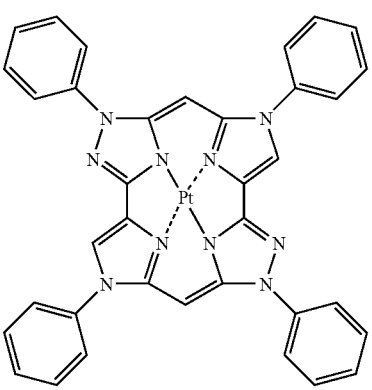
(D14)
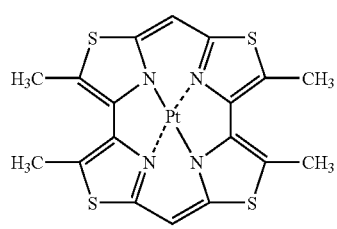

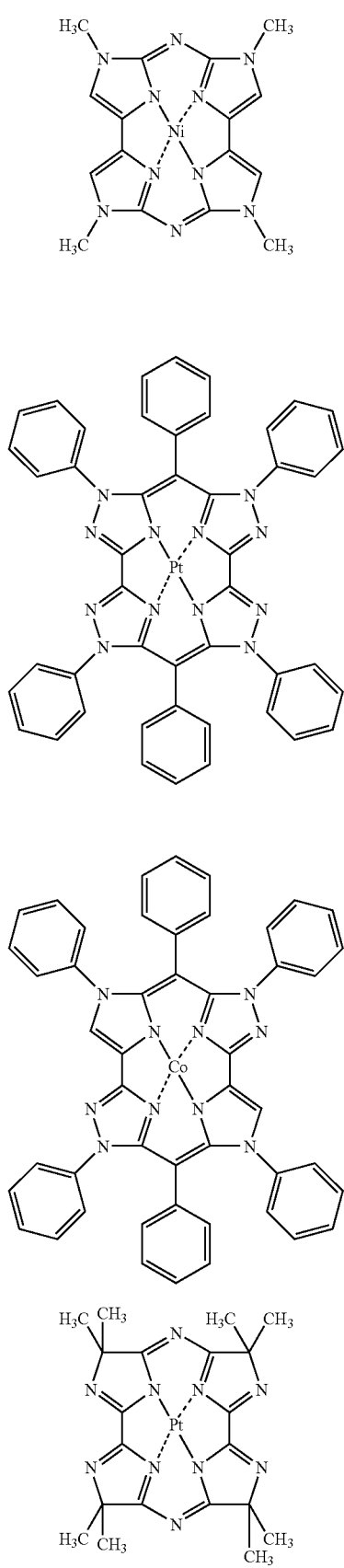

-continued (D22)
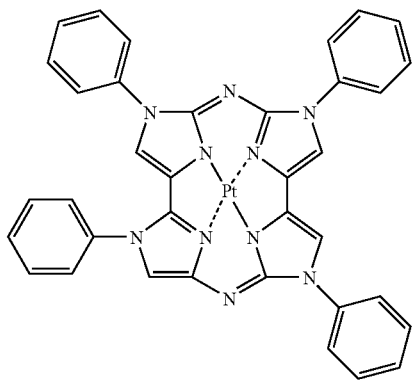

(D23)
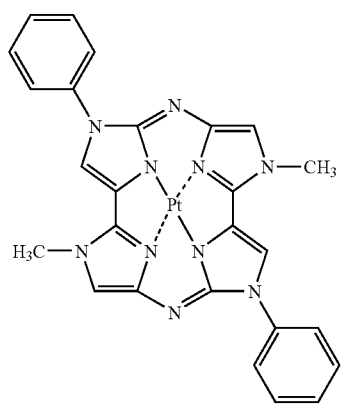

(D24)
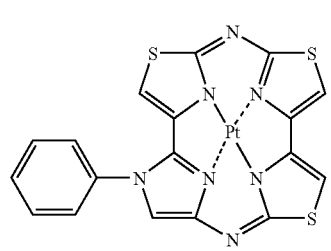

An example of preferable metal complexes usable in the invention is a compound represented by the following Formula (E-1).

Formula (E-1)
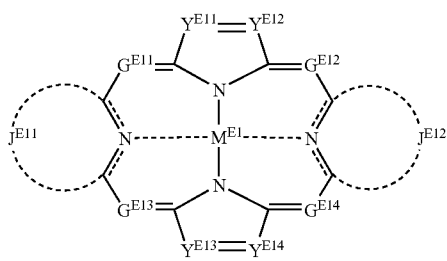

In Formula (E-1), $M^{E1}$ represents a metal ion. $J^{E1}$ and $J^{E2}$ each independently represent an atomic group necessary for forming a 5-membered ring. $G^{E11}$, $G^{E12}$, $G^{13}$ and $G^{E14}$ each independently represent a nitrogen atom or a substituted or unsubstituted carbon atom. $Y^{E11}$, $Y^{E12}$, $Y^{E13}$ and $Y^{E14}$ each independently represent a nitrogen atom or a substituted or unsubstituted carbon atom.

Formula (E-1) will be described in detail.

$M^{E1}$ has the same definition as $M^{A1}$ in Formula (A-1), and its preferable examples are also the same. $G^{E11}$, $G^{E12}$, $E^{E13}$ and $G^{E14}$ have the same definition as $G^{C11}$ and $G^{C12}$ in Formula (C-1), and their preferable examples are also the same.

$J^{E11}$ and $J^{E12}$ have the same definition as $J^{D11}$ to $J^{D14}$ in Formula (D-1), and their preferable examples are also the same. $Y^{E11}$, $Y^{E12}$, $Y^{E13}$ and $Y^{E14}$ have the same definitions as corresponding $Y^{C21}$ to $Y^{C24}$ in Formula (C-2) respectively, and their preferable examples are also the same.

The compound represented by Formula (E-1) is more preferably a compound represented by the following Formula (E-2) or (E-3).

Formula (E-2)
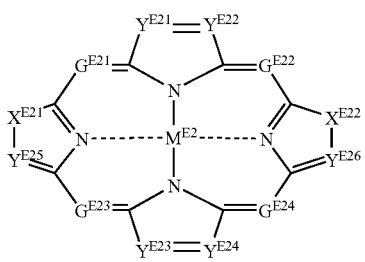

In Formula (E-2), $M^{E2}$ represents a metal ion. $G^{E21}$, $G^{E22}$, $G^{E23}$ and $G^{E24}$ each independently represent a nitrogen atom or a substituted or unsubstituted carbon atom. $Y^{E21}$, $Y^{E22}$, $Y^{E23}$, $Y^{E24}$, $Y^{25}$ and $Y^{E26}$ each independently represent a nitrogen atom or a substituted or unsubstituted carbon atom. $X^{E21}$ and $X^{E22}$ each independently represent an oxygen atom, a sulfur atom, $-NR^{E21}-$ or $-C(R^{E22})R^{E23}-$. $R^{E21}$, $R^{E22}$ and $R^{E23}$ each independently represent a hydrogen atom or a substituent.

Formula (E-3)
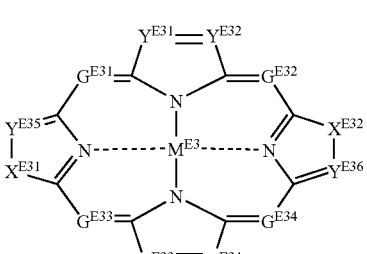

In Formula (E-3), $M^{E3}$ represents a metal ion. $G^{E31}$, $G^{E32}$, $G^{E33}$ and $G^{E34}$ each independently represent a nitrogen atom or a substituted or unsubstituted carbon atom. $Y^{E31}$, $Y^{32}$, $Y^{E33}$, $Y^{B34}$, $Y^{E35}$ and $Y^{E36}$ each independently represent a nitrogen atom or a substituted or unsubstituted carbon atom. $X^{E31}$ and $X^{E32}$ each independently represent an oxygen atom, as or atom, $-NR^{E31}-$ or $-C(R^{32})R^{E33}-$. $R^{E31}$, $R^{E32}$ and $R^{E33}$ each independently represent a hydrogen atom Or a substituent.

Formula (E-2) will be described in detail.

In Formula (E-2), $M^{E2}$, $G^{E21}$, $G^{E22}$, $G^{E23}$, $G^{E24}$, $Y^{E21}$, $Y^{E22}$, $Y^{E23}$ and $Y^{E24}$ have the same definitions as corresponding $M^{E1}$, $G^{E11}$, $G^{E12}$, $G^{E13}$, $G^{E14}$, $Y^{E11}$, $Y^{E12}$, $Y^{E13}$ and $Y^{E14}$ in Formula (E-1) respectively, and their preferable examples are also the same. $X^{E21}$ and $Y^{E22}$ have the same definitions corresponding $X^{D21}$ and $X^{D22}$ in formula (D-2) respectively, and their preferable examples are also the same.

Formula (E-3) will be described in detail.

In Formula (E-3), $M^{E3}$, $G^{E31}$, $G^{E32}$, $G^{E33}$, $G^{E34}$, $G^{E34}$, $Y^{31}$, $Y^{E32}$, $Y^{E33}$ and $Y^{E34}$ have the same definitions as corresponding $M^{E1}$, $G^{E11}$, $G^{E12}$, $G^{E13}$, $G^{E14}$, $Y^{E11}$, $Y^{E12}$, $Y^{E13}$ and $Y^{E14}$ in Formula (E-1) respectively, and their preferable examples are also the same. $X^{E31}$ and $X^{E32}$ have the same definitions as corresponding $X^{E21}$ and $X^{E22}$ in Formula (E-2) respectively, and their preferable examples are also the same.

Specific examples of the compounds represented by Formula (E-1) are illustrated below, but the invention is not limited thereto.

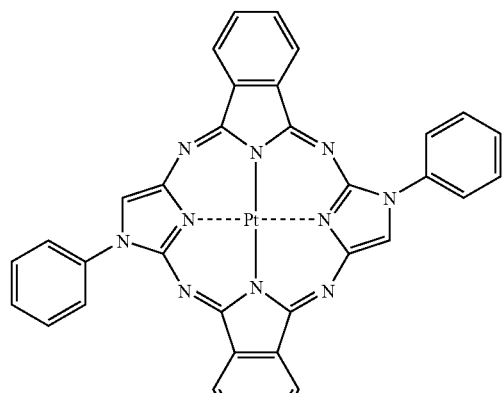

(E1)

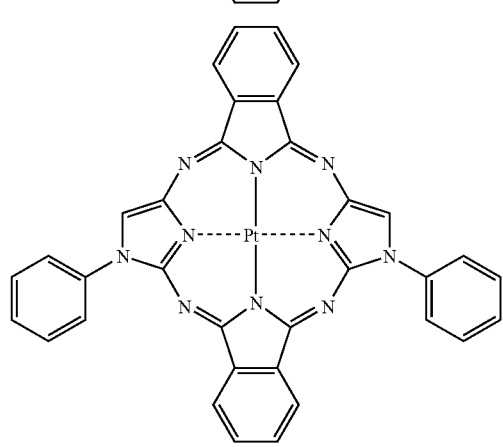

(E2)

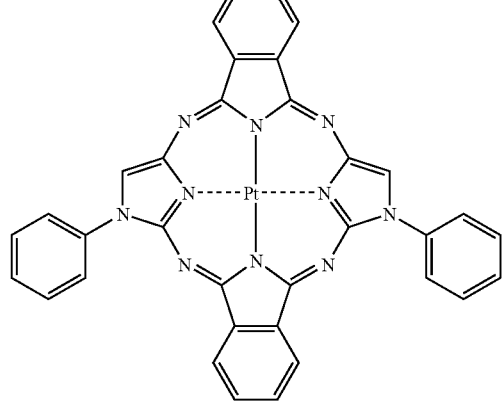

(E3)

-continued

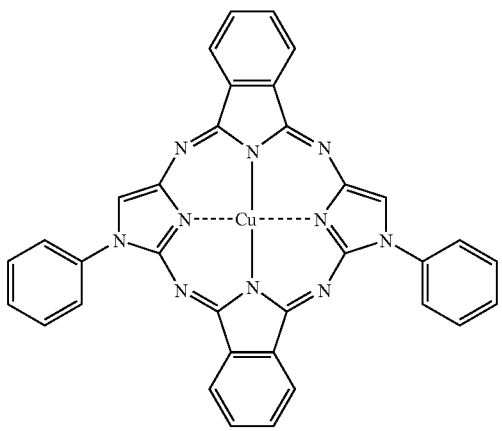

(E4)

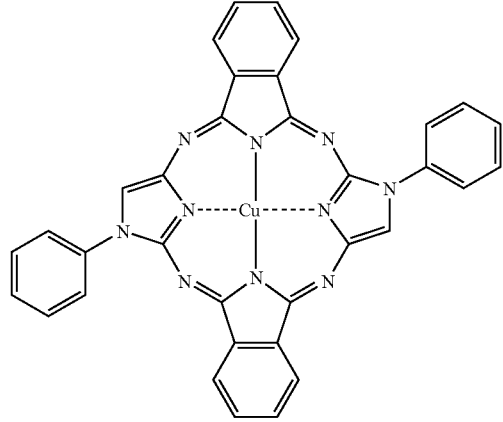

(E5)

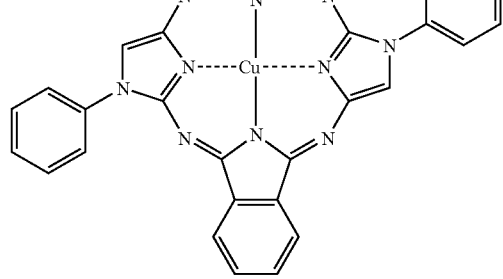

(E6)

-continued
(E7)
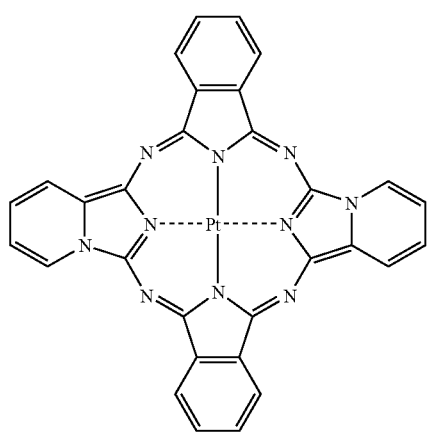
(E8)
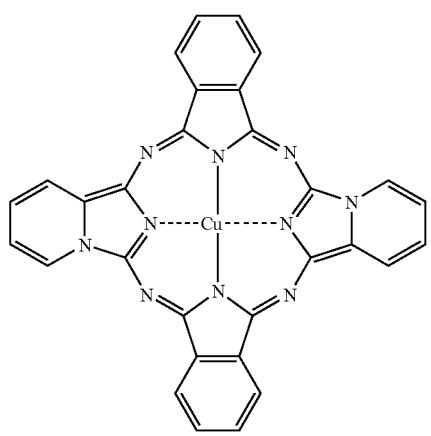
(E9)
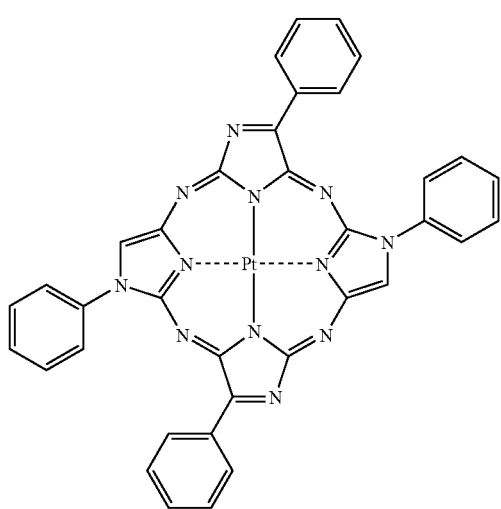
-continued
(E10)
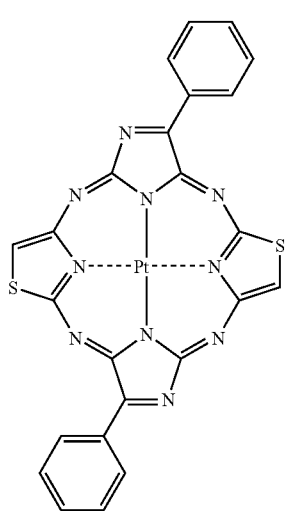
(E11)
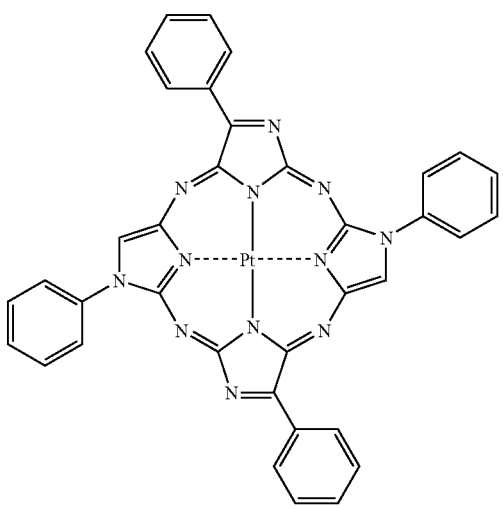
(E12)
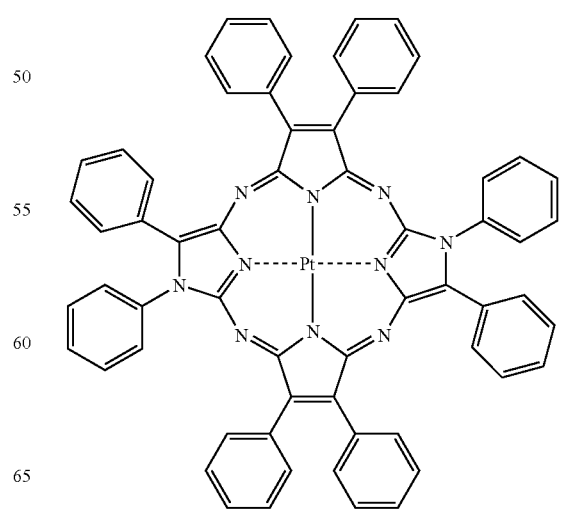

-continued (E13)

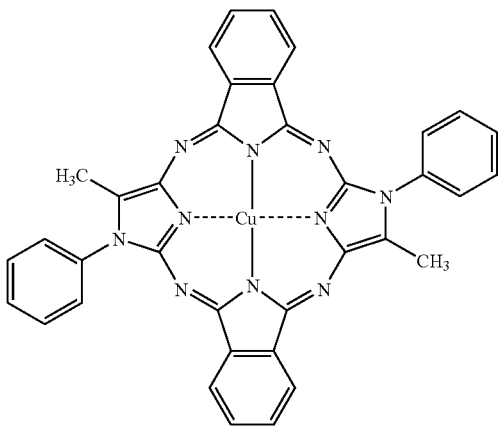

(E14)

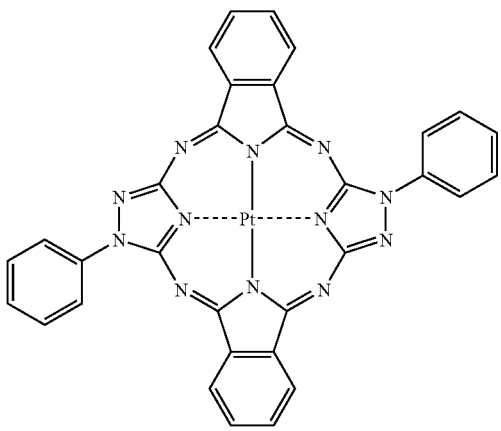

(E15)

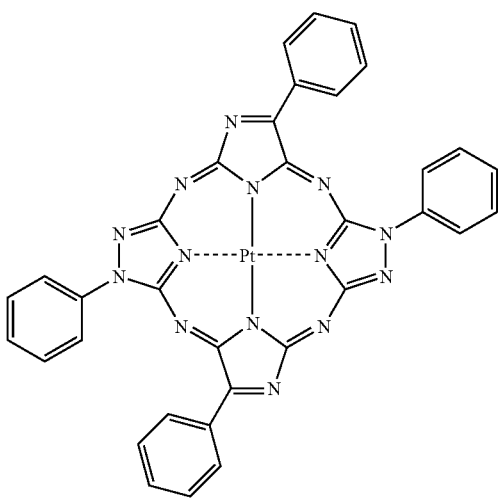

An example of metal complexes usable in the invention is a compound represented by the following Formula (F-1).

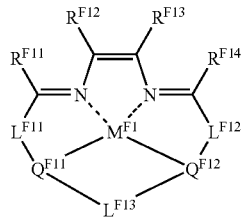

Formula (F-1)

In Formula (F-1), $M^{F1}$ represents a metal ion. $L^{F11}$, $L^{F12}$ and $L^{F13}$ each independently represent a connecting group. $R^{F11}$, $R^{F12}$, $R^{F13}$ and $R^{F14}$ each independently represent a hydrogen atom or a substituent. $R^{F11}$ and $R^{F12}$ may, if possible, be bonded to each other to form a 5-membered ring. $R^{F12}$ and $R^{F13}$ may, if possible, be bonded to each other to form a ring. $R^{F13}$ and $R^{F14}$ may, if possible, be bonded to each other to form a 5-membered ring. $Q^{F11}$ and $Q^{F12}$ each independently represent a partial structure containing an atom covalently bonded to $M^{F1}$.

The compound represented by Formula (F-1) will be described in detail.

In Formula (F-1), $M^{F1}$, $L^{F11}$, $L^{F12}$, $L^{F13}$, $Q^{F11}$ and $Q^{F12}$ have the same definitions as corresponding $M^{A1}$, $L^{A11}$, $L^{A12}$, $L^{A13}$, $Q^{A11}$ and $Q^{A12}$ in Formula (A-1) respectively, and their preferable examples are also the same. $R^{F11}$, $R^{F12}$, $R^{F13}$ and $R^{F14}$ each independently represent a hydrogen atom or a substituent. $R^{F11}$ and $R^{F12}$ may, if possible, be bonded to each other to form a 5-membered ring. $R^{F12}$ and $R^{F13}$ may, if possible, be bonded to each other to form a ring. $R^{F13}$ and $R^{F14}$ may, if possible, be bonded to each other to form a 5-membered ring. The substituent represented by $R^{F11}$, $R^{F12}$, $R^{F13}$ or $R^{F14}$ may be selected from the above-mentioned examples of the substituent represented by $R^{C11}$ to $R^{C14}$ in Formula (C-1). In a preferable embodiment, $R^{F11}$ and $R^{F12}$ are bonded to each other to form a 5-membered ring, and $R^{F13}$ and $R^{F14}$ bonded to each other to form a 5-membered ring. In another preferable embodiment, $R^{F12}$ and $R^{F13}$ are bonded to each other to form an aromatic ring.

The compound represented by Formula (F-1) is more preferably a compound represented by Formula (F-2), (F-3) or (F4).

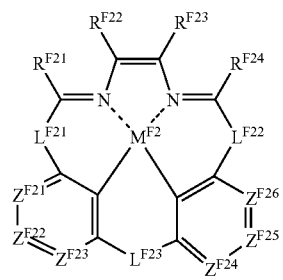

Formula (F-2)

In Formula (F-2), $M^{F2}$ represents a metal ion. $L^{F21}$, $L^{F22}$ and $L^{F23}$ each independently represent a connecting group. $R^{F21}$, $R^{F22}$, $R^{F23}$ and $R^{F24}$ each independently represent a substituent. $R^{F21}$ and $R^{F22}$ may, if possible, be bonded to each other to form a 5-membered ring. $R^{F22}$ and $R^{F23}$ may, if possible, be bonded to each other to form a ring. $R^{F23}$ and $R^{F24}$ may, if possible, be bonded to each other to form a 5-membered ring. $Z^{F21}, Z^{F22}, Z^{F23}, Z^{F24}, Z^{F25}$ and $Z^{F26}$ each independently represent a nitrogen atom or a substituted or unsubstituted carbon atom.

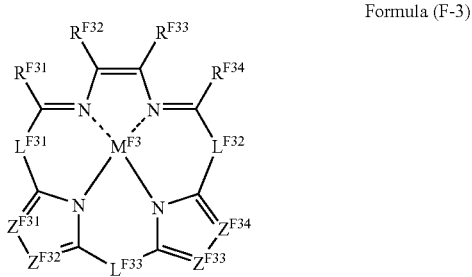

Formula (F-3)

In Formula (F-3), $M^{F3}$ represents a metal ion. $L^{31}, L^{F32}$ and $L^{F33}$ each independently represent a connecting group. $R^{F31}, R^{F32}, R^{F33}$ and $R^{F34}$ each independently represent a substituent. $R^{F32}$ and $R^{F32}$ may, if possible, be bonded to each other to form a 5-membered ring. $R^{F32}$ and $R^{F33}$ may, if possible, be bonded to each other to form a ring. $R^{F33}$ and $R^{F34}$ may, if possible, be bonded to each other to form a 5-membered ring. $Z^{F31}, Z^{F32}, Z^{F33}$ and $Z^{F34}$ each independently represent a nitrogen atom or a substituted or unsubstituted carbon atom.

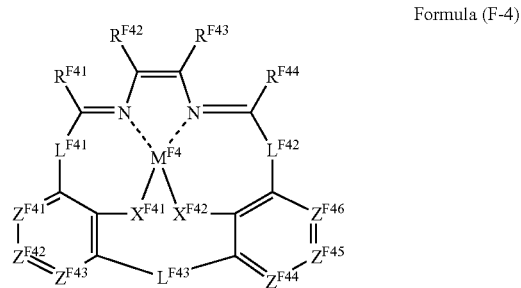

Formula (F-4)

In Formula (F-4), $M^{F4}$ represents a metal ion. $L^{F41}, L^{F42}$ and $L^{F43}$ each independently represent a connecting group. $R^{F41}, R^{F42}, R^{F43}$ and $R^{F44}$ each independently represent a substituent. $R^{F41}$ and $R^{F42}$ may, if possible, be bonded to each other to form a 5-membered ring. $R^{F42}$ and $R^{F43}$ may, if possible, be bonded to each other to form a ring. $R^{F43}$ and $R^{F44}$ may, if possible, be bonded to each other to form a 5-membered ring. $Z^{F41}, Z^{F42}, Z^{F43}, Z^{F44}, Z^{F45}$ and $Z^{F46}$ each independently represent a nitrogen atom or a substituted or unsubstituted carbon atom. $X^{F41}$ and $X^{F42}$ each independently represent an oxygen atom, a sulfur atom or a substituted or unsubstituted nitrogen atom.

The compound represented by Formula (F-2) will be described in detail.

$M^{F2}, L^{F21}, L^{F22}, L^{F23}, R^{F21}, R^{F22}, R^{F23}$ and $R^{F24}$ have the same definitions as corresponding $M^{F1}, L^{F11}, L^{F12}, L^{F13}, R^{F11}, R^{F12}, R^{F13}$ and $R^{F14}$ in Formula (F-1) respectively, and their preferable examples are also the same.

$Z^{F21}, Z^{F22}, F^{F23}, Z^{F24}, Z^{25}$ and $Z^{26}$ each independently represent a nitrogen atom or a substituted or unsubstituted carbon atom. Each of $Z^{F21}, Z^{F22}, Z^{F23}, Z^{F24}, Z^{F25}$ and $Z^{F26}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}, L^{A12}, L^{A13}$ or $L^{A14}$ in Formula (A-1).

The compound represented by Formula (F-3) will be described in detail.

In Formula (F-3), $M^{F3}, L^{F31}, L^{F32}, L^{F33}, R^{F31}, R^{F32}, R^{F33}$ and $F^{F34}$ have the same definitions as corresponding $M^{F1}, L^{F11}, L^{F12}, L^{F13}, R^{F11}, R^{F12}, R^{F13}$ and $R^{F14}$ in Formula (F-1) respectively, and their preferable examples are also the same. $Z^{F31}, Z^{F32}, Z^{F33}$ and $Z^{F34}$ each independently represent a nitrogen atom or a substituted or unsubstituted carbon atom. Each of $Z^{F31}, Z^{F32}, Z^{F33}$ and $Z^{F34}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}, L^{A12}, L^{A13}$ or $L^{A14}$ in Formula (A-1).

The compound represented by Formula (F-4) will be described in detail.

In Formula (F-4), $M^{F4}, L^{F41}, L^{F42}, L^{F43}, R^{F41}, R^{F42}, R^{F43}$ and $R^{F44}$ have the same definitions as corresponding $M^{F1}, L^{F11}, L^{F12}, L^{F13}, R^{F11}, R^{F12}, R^{F13}$ and $R^{F14}$ in Formula (F-1) respectively, and their preferable examples are also the same.

$Z^{F41}, Z^{F42}, Z^{F43}, Z^{F44}, Z^{F45}$ and $Z^{F46}$ each independently represent a nitrogen atom or a substituted or unsubstituted carbon atom. Each of $Z^{F41}, Z^{F42}, Z^{F43}, Z^{F44}, Z^{F45}$ and $Z^{F46}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}, L^{A12}, L^{A13}$ or $L^{A14}$ in Formula (A-1).

$X^{F41}$ and $X^{F42}$ each independently represent an oxygen atom, a sulfur atom or a substituted or unsubstituted nitrogen atom. Each of $X^{F41}$ and $X^{F42}$ is preferably an oxygen atom or a sulfur atom, and more preferably an oxygen atom.

Specific examples of the compounds represented by Formula (F-1) are illustrated below, but the invention is not limited thereto.

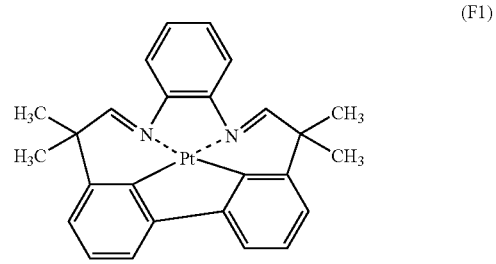

(F1)

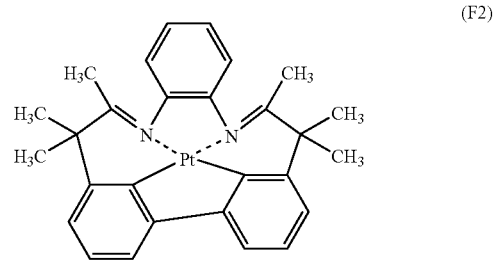

(F2)

-continued
(F3) 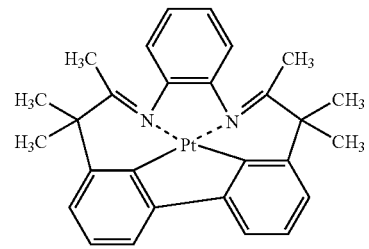
(F4) 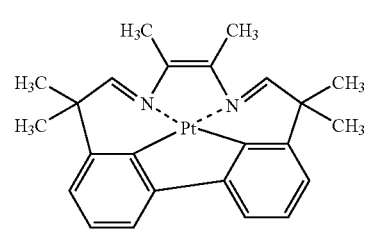
(F5) 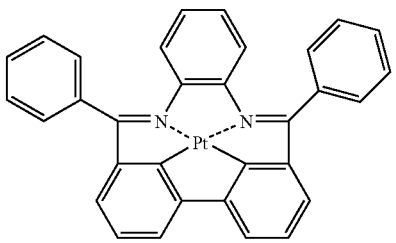
(F6) 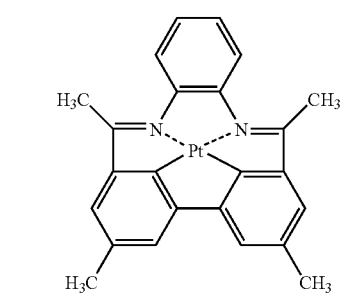
(F7) 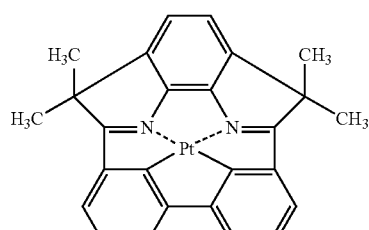
(F8) 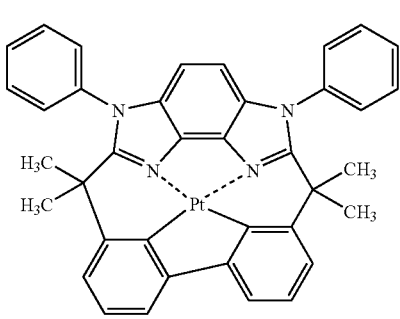
-continued
(F9)
(F10)
(F11)
(F12)
(F13)

-continued
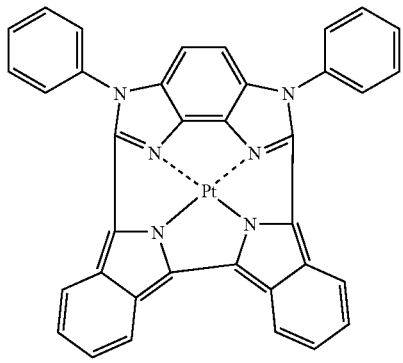
(F14)
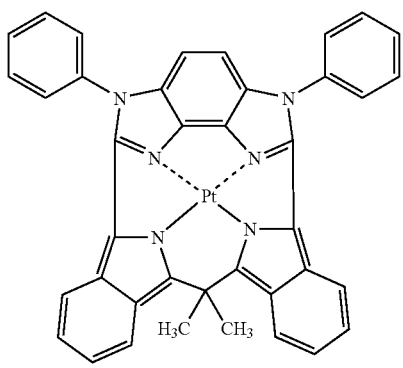
(F15)
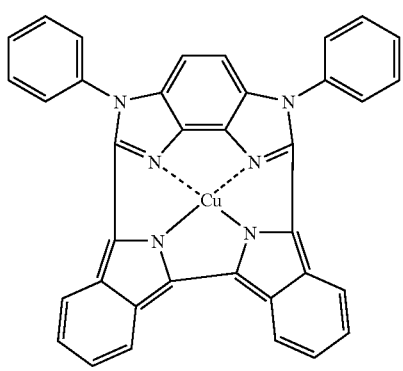
(F16)
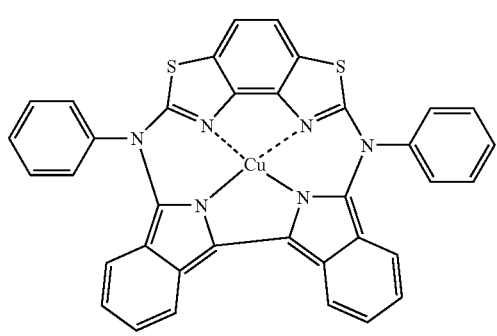
(F17)
-continued
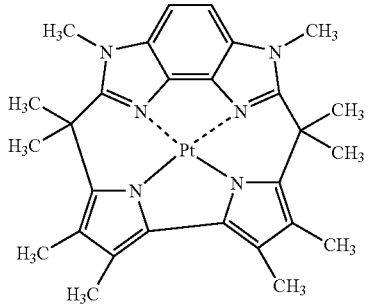
(F18)
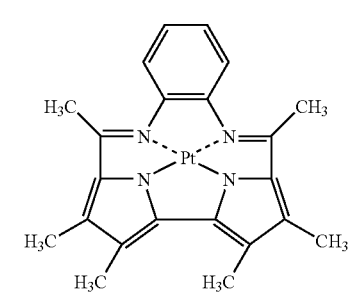
(F19)
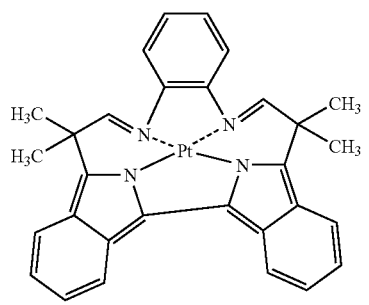
(F20)
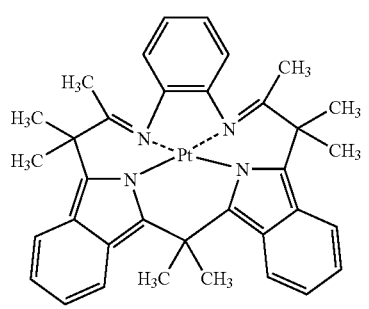
(F21)
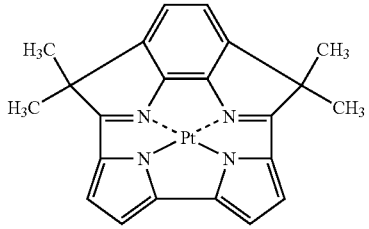
(F22)

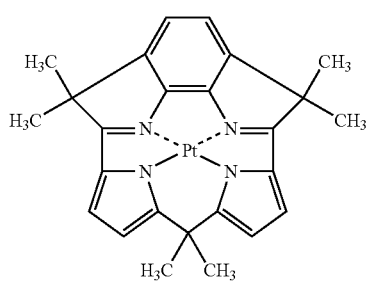
(F23)
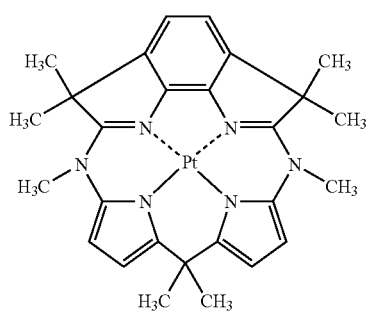
(F24)
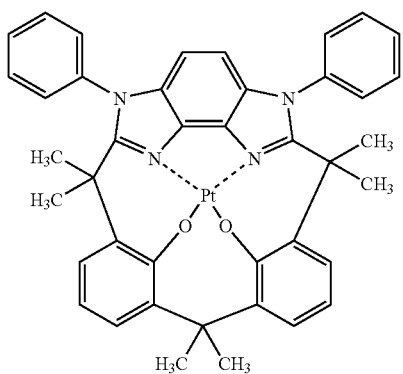
(F25)
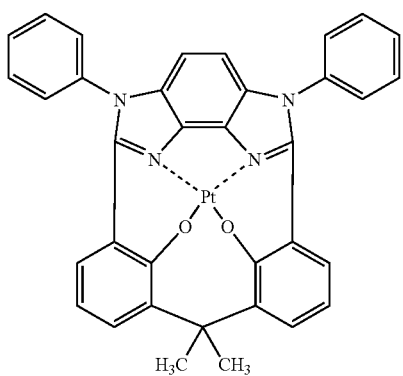
(F26)
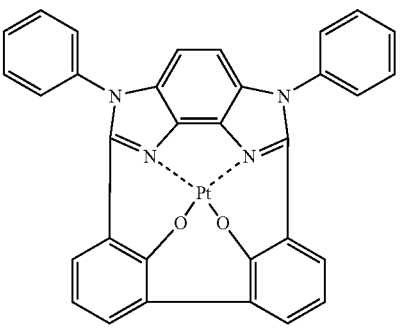
(F27)
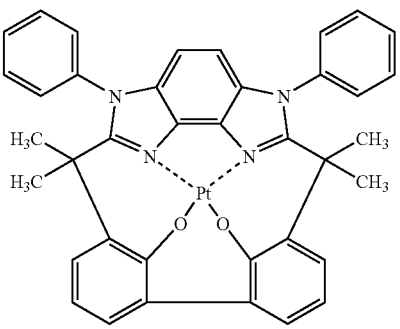
(F28)
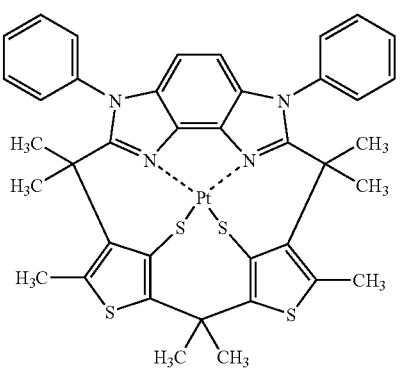
(F29)
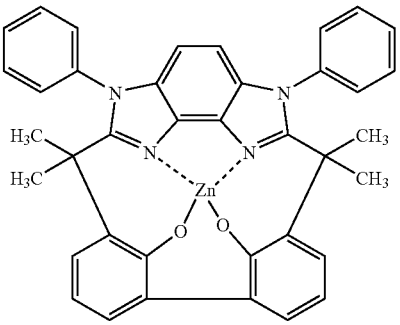
(F30)
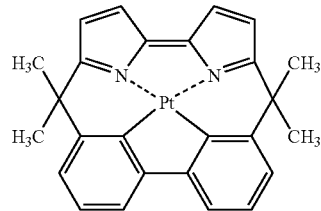
(F31)

-continued
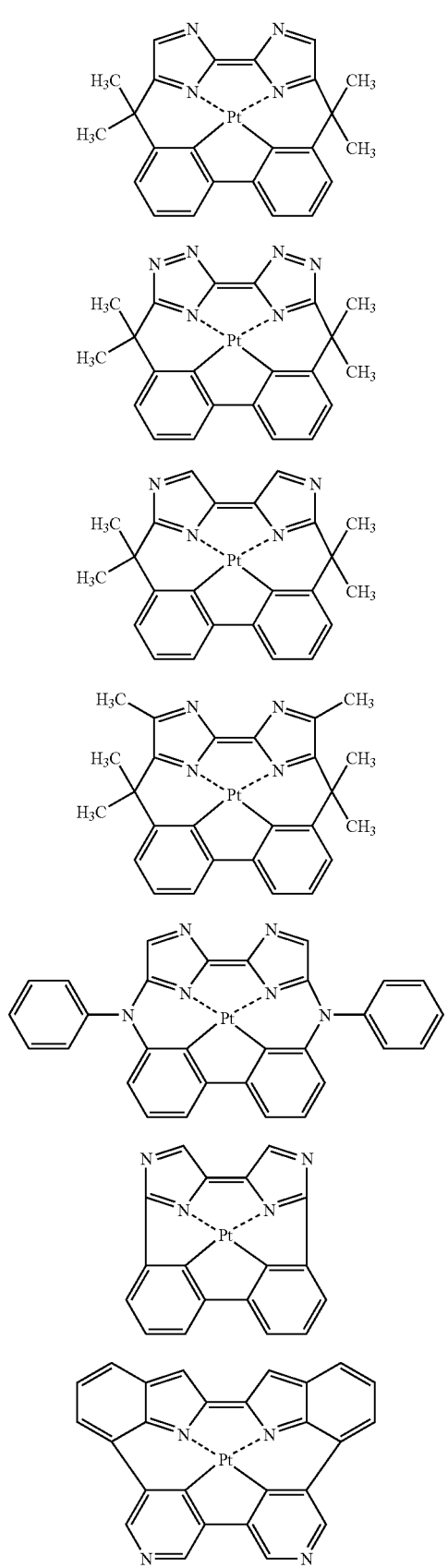
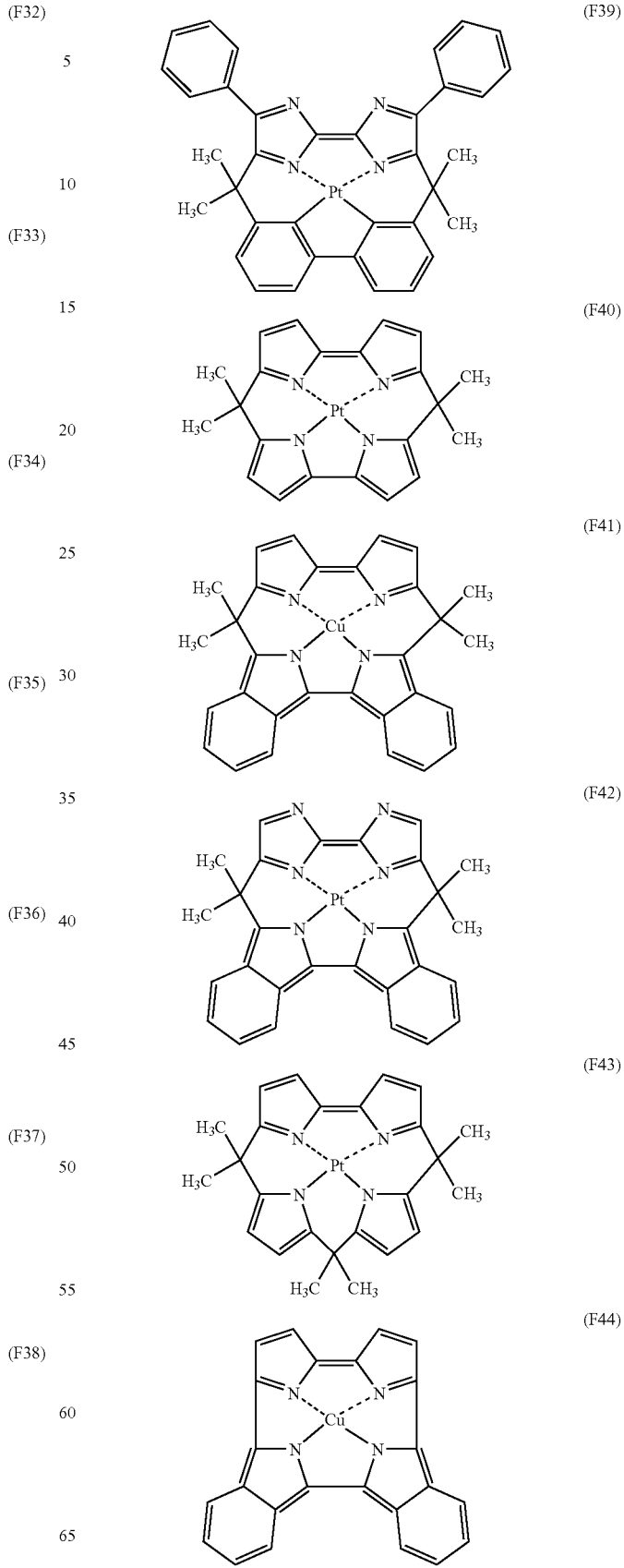

(F45) 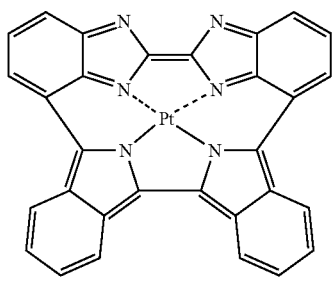

(F46) 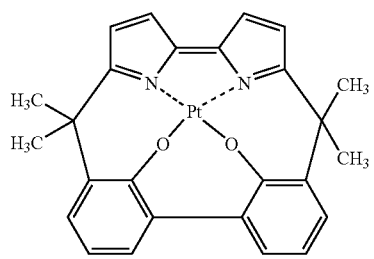

(F47) 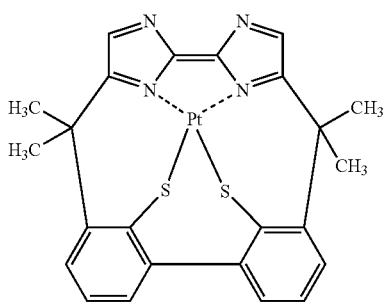

(F48) 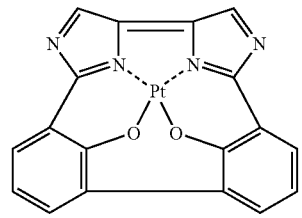

(F49) 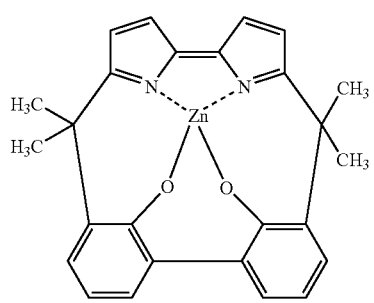

(F50) 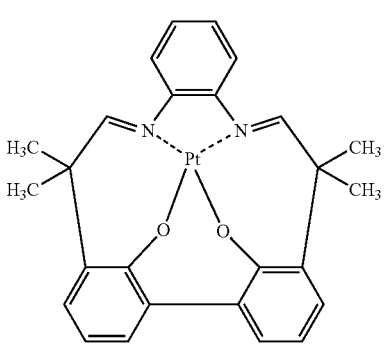

(F51) 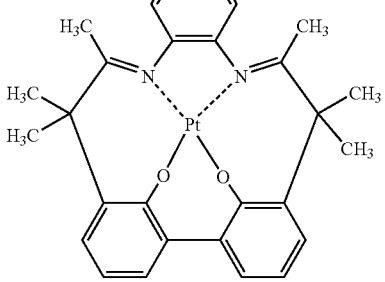

(F52) 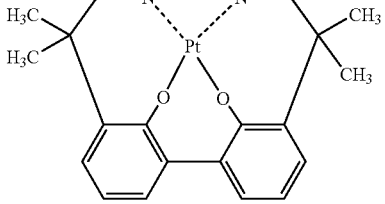

Compounds represented by any one of Formulae (A-1) to (F-1) can be synthesized by known methods.

Further, the host compound used in the invention is described below.

In view of luminescent property and driving durability, the metal complex containing at least one tri- or higher-dentate ligand (hereinafter sometimes simply referred as "the metal complex") as a luminescent dopant and a plurality of host compounds contained in the luminescent layer of the organic electroluminescent device of the invention preferably satisfies a relationship (1): when an ionization potential of the metal complex is Ip(D), a minimum value out of the ionization potentials of the plurality of host compounds is Ip(H)min, and $\Delta$Ip is defined by an equation of $\Delta$Ip=Ip(D)−Ip(H)min, a relationship of $\Delta$Ip>0 eV is satisfied.

Further, in view of luminescent property and driving durability, the invention preferably satisfies a relationship (2): when an electron affinity of the dopant is Ea(D), a maximum value out of the electron affinities of the plurality of host compounds is Ea(H)max, and $\Delta$Ea is defined by an equation of $\Delta$Ea=Ea(H)max−Ea(D), a relationship of $\Delta$Ea>0 eV is satisfied.

Furthermore, in view of luminescent property and driving durability, the invention preferably satisfies the relationships (1) and (2).

Further, in view of driving durability, the invention preferably satisfies at least one of the following relationships of (3) 1.2 eV>ΔIp≧0.2 eV; and (4) 1.2 eV>ΔEa>0.2 eV, since a hole and/or an electron becomes to be hardly entrapped by a dopant when the condition(s) is satisfied. It is specifically preferable that at least one of the relationships of 1.2 eV>ΔIp>0.4 eV and 1.2 eV>ΔEa>0.4 eV is satisfied.

Furthermore, in view of color purity and driving durability, it is preferable that the invention satisfies at least one of the following conditions of (5): Ip(H)min is 5.1 eV or more; and (6): Ea(H)max is 3.0 eV or less. It is more preferable that the invention satisfies at least one of the conditions of: Ip(H)min is 5.4 eV or more; and Ea(H)max is 2.8 eV or less.

When Ip(H)min and/or Ea(H)max are within these ranges, interaction among the plurality of host compounds in the luminescent layer can be controlled. If a charge transfer complex, an exciplex or the like having a lower excitation energy state is formed resulting from interaction among the plurality of host compounds, an excitation state which is normally formed on any host compound is formed on the charge transfer complex or exciplex and this may give rise to insufficient energy transfer to the dopant and failure in obtaining predetermined light emission. In addition, the driving durability may decrease due to decomposition of the charge transfer complex or exciplex from the excitation state.

Whether an interaction is present or not among the plurality of host compounds in the luminescent layer can be judged by a method of forming a single layer film of only the plurality of host compounds contained in the luminescent layer under the same conditions as in the formation of the luminescent layer, measuring the fluorescent-phosphorescent spectrum, and comparing it with the respective light emission spectra of the individual host compounds each as measured alone.

That is, when a long-wavelength light emission spectrum component which is unassignable to the light-emission spectrum of each compound contained in the plurality of host compounds is observed in the fluorescent-phosphorescent spectrum, this implies the occurrence of interaction.

In particular, it is preferable that no light emission spectrum component having a light-emission intensity of equal to or less than one hundredth of, preferably one thousandth of, more preferably one ten thousandth of a maximum light-emission intensity of respective main peaks of the light emission spectrum is observed at wavelengths 15 nm longer than the respective main peaks in the light emission spectra of the plurality of host compounds each as measured alone.

Measurement of the fluorescent-phosphorescent spectrum can be conducted by using apparatuses such as RF-5300PC (trade name, manufactured by Shimadzu Corporation). Light at a wavelength where each host compound has absorption by itself can be used as excitation light.

The ionization potential (Ip), electron affinity (Ea) and triplet level ($T_1$) (which is described later) as used in the invention are described below.

The ionization potential (Ip), election affinity (Ea) and triplet level (T1) are values determined by measuring a single layer film that is formed on quartz by vacuum-depositing (vaccume degree: $10^{-4}$ Pa) each components so as to have a layer thickness of 100 nm.

The ionization potential (Ip) is defined in terns of a value measured at room temperature (approximately 25° C.) in air by using an ultraviolet photoelectric analyzer (trade name: AC-1, manufactured by Riken Keiki Co., Ltd.). The measurement principle of AC-1 is described in "Yuki Hakumaku Sigoto Kansu Data Shu (Work Function Data of Organic Thin Film)" by Chihaya Adachi et al., published by CMC (2004).

Further, a band gap, which is calculated from a long wavelength end of an absorption spectrum of the single layer film, and the above ionization potential are used for calculation to define the electron affinity (Ea).

The minimum triplet excitation energy (triplet level T1) is defined as a value calculated from a short wavelength end of a phosphorescence emission spectrum measured at room temperature. A nitrogen cooled temperature can also be used as a measurement temperature therefor.

The light-emitting element of the invention is excellent in terns of its driving durability and light emission property (external light emission efficiency), which excellence is presumed to be due to the following light emission mechanism, although details of such mechanism has not been clarified.

That is, holes injected from the anode pass through a hole injecting layer and a hole transporting layer and are mostly injected into a hole transporting host (the host compound of the invention) in the luminescent layer. On the other hand, electrons injected from the cathode pass through an electron injecting layer and an electron transporting layer and are mostly injected into an electron transporting host (the host compound of the invention) in the luminescent layer. The hole is injected from the hole transporting host into the highest occupied molecular orbital (HOMO) of the electron transporting host, and an exciton is produced on the electron transporting host. Alternatively, the electron is injected from the electron transporting host into the lowest unoccupied molecular orbital (LUMO) of the hole transporting host, and an exciton is produced on the hole transporting host. This excited state energy of the host moves to the metal complex of the invention (dopant), and light is emitted from the singlet and/or triplet state of the dopant.

At the injection of holes and electrons into the luminescent layer, the hole is injected into the hole transporting host and the electron is injected into the electron transporting host, whereby the hole transporting host can be released from the anion state and the electron transporting host can be released from the cation state, and, as a result, the driving durability is enhanced. Also, at the injection of holes and electrons into the luminescent layer, the HOMO and the LUMO of the metal complex of the invention (dopant) are present at the outer side of the host compound, and therefore, carriers are scarcely injected into the dopant. Therefore a dopant, that has low resistance to the cation or anion state, can have enhanced durability.

The constitution of the organic electroluminescent device of the invention is described below.

The organic electroluminescent device of the invention includes a pair of electrodes having one or more organic compound layers including at least one luminescent layer disposed between the pair of electrodes. The organic compound layers preferably further include a carrier transporting layer adjacent to the luminescent layer. The carrier transporting layer is more preferably an electron transporting layer and/or a hole transporting layer.

In view of the characteristics of the light-emitting device, at least one electrode of the paired electrodes is preferably transparent.

In a preferred embodiment, the layer constitution of the organic compound layer in the invention has a configuration in which a hole transporting layer, a luminescent layer and an electron transporting layer are disposed in this order from the anode side. Furthermore, an electron blocking layer and the like may be provided between the hole transporting layer and the luminescent layer, and a hole blocking layer and the like may be provided between the luminescent layer and the electron transporting layer. Also, a hole injecting layer may be provided between the anode and the hole transporting layer, and an electron injecting layer may be provided between the cathode and the electron transporting layer.

In the organic electroluminescent device of the invention, the organic compound layers preferably include at least a hole injecting layer, a hole transporting layer, a luminescent layer, a hole blocking layer, an electron transporting layer and an electron injecting layer which are disposed in this order from the anode side.

In a case where a hole blocking layer is provided between the luminescent layer and the electron transporting layer, it is preferable that an organic compound layer which is adjacent to the luminescent layer on a side nearer to the anode is a hole transporting layer, and an organic compound layer which is adjacent to the luminescent layer on a side nearer to the cathode is a hole blocking layer.

Each layer of the organic compound layers may be divided into a plurality of secondary layers.

The constituents of the light-emitting element of the invention are described in detail below.

Organic Compound Layer

The organic compound layer of the invention is described below.

The organic electroluminescent device of the invention includes one or more organic compound layers including at least one luminescent layer. Examples of organic compound layers other than the luminescent layer include, as described above, layers such as a carrier transporting layer (hole transporting layer or electron transporting layer) adjacent to the luminescent layer, a hole blocking layer, a hole injecting layer and an electron injecting layer.

From the viewpoint of decreasing a driving voltage, the organic compound layer preferably has a thickness of 500 nm or less, more preferably from 5 to 200 nm, and still more preferably from 10 to 100 nm.

The layer adjacent to the luminescent layer on the anode side thereof may be a hole injecting layer and the layer adjacent to the luminescent layer on the cathode side thereof may be an electron injecting layer or a charge blocking layer. These layers are described in detail below.

Formation of Organic Compound Layer

In the organic electroluminescent device of the invention, each layers constituting the organic compound layer(s) can be appropriately formed by any of a dry film forming method (e.g., vapor-deposition, sputtering), a transfer method, a printing method or the like.

Luminescent Layer

The luminescent layer is a layer having a function of receiving a hole from the anode, hole injecting layer or hole transporting layer when an electric field is applied, and receiving an electron from the cathode, electron injecting layer or electron transporting layer, thereby providing a site for the recombination of a hole and an electron to emit light.

The luminescent layer for use in the invention contains at least one metal complex containing a tri- or higher-dentate ligand and a plurality of host compounds.

The luminescent layer may be a single layer or two or more layers. Each of the two or more layers may emit light with different emission color. When the light-emitting element includes a plurality of luminescent layers, each of the luminescent layers preferably contains at least one metal complex containing a tri- or higher-dentate ligand and a plurality of host compounds.

In the invention, the metal complex and the plurality of host compounds contained in the luminescent layer are not particularly limited as long as at least one of the relationships of (1) $\Delta$Ip (=Ip(D)−Ip(H)min)>0 eV and (2) $\Delta$Ea(=Ea(H)max−Ea(D))>0 eV is satisfied.

That is, either a combination of a metal complex capable of obtaining light emission (fluorescence) from a singlet exciton (hereinafter sometimes referred as a "fluorescent dopant") and a plurality of host compounds or a combination of a metal complex capable of obtaining light emission (phosphorescence) from a triplet exciton (hereinafter sometimes referred as a "phosphorescent dopant") and a plurality of host compounds may be used. In view of light emission efficiency, the combination of the metal complex capable of obtaining light emission (phosphorescence) from a triplet exciton and a plurality of host compounds is preferable.

In the invention, the luminescent layer may contain two or more luminescent dopants so as to enhance light-emitting efficiency and color purity or to broaden a light-emitting wavelength range.

The metal complex (luminescent dopant) and the plurality of host compounds that satisfies the relationships (1) and/or (2) for use in the invention are described below. The present invention is, however, not limited thereto.

When one luminescent dopant and a plurality of host compounds are used, the dopant preferably satisfies the condition that the Ip(D) of the luminescent dopant is larger than the ionization potential Ip(H)min of one host compound, that is, Ip(D)>Ip(H)min, and the Ea(D) is preferably smaller than the electron affinity of another host compound, that is, Ea(H)max>Ea(D). It is more preferable that the metal complex satisfies both of these conditions.

The host compound used for giving Ip(H)min may be a hole transporting host, and the host compound used for giving Ea(H)max may be an electron transporting host.

When a plurality of luminescent dopants are used, the Ip(D) means the ionization potential of a dopant having a smallest Ip and the Ea(D) means the electron affinity of a dopant having a largest Ea.

Luminescent Dopant

Any of a phosphorescent material, a fluorescent material and the like may be used as the luminescent dopant used in the present invention in addition to the metal complex containing a tri- or higher-dentate ligand. It is preferable that a luminescent dopant which satisfies at least one of the relationships of (1) and (2) between the plurality of host compounds and the luminescent dopant is used.

In view of driving durability, the luminescent dopant used in the invention is preferably a dopant satisfying the relationships of (3), that is, 1.2 eV>$\Delta$Ip≦0.2 eV and/or (4) 1.2 eV>$\Delta$Ea>0.2 eV, with the host compounds.

Phosphorescent Dopant

Examples of the phosphorescent dopant in general include complexes containing a transition metal atom or a lanthanoid atom.

The transition metal atom is not particularly limited. Preferable examples thereof include a ruthenium atom, a rhodium atom, a palladium atom, a tungsten atom, a rhenium atom, a osmium atom, an iridium and a platinum atom. Among these, a rhenium atom, an iridium atom and a platinum atom are more preferrable.

Examples of the lanthanoid atom include a lanthanum atom, a cerium atom, a praseodymium atom, a neodymium atom, a samarium atom, a europium atom, a gadolinium atom, a terbium atom, a dysprosium atom, a holmium atom, an erbium atom, a thulium atom, a ytterbium atom and a lutecium atom. Among these a lanthanoid atom, a neodymium atom, an europium and a gadolinium atom are preferable.

Examples of the ligand of the complex include ligands described in G. Wilkinon et al., Comprehensive Coordination Chemistry, Pergamon Press (1987), H. Yersin, Photochemistry and Photophysics of Coordination Compounds, Springer-Verlag (1987), and Akio Yamamoto, Yuki Kinzoku Kagaku-Kiso to Oyo-(Organic Metal Chemistry—Basics and Applications—), Shokabo (1982), the disclosures of which are incorporated by reference herein.

Specific examples of the ligand include a halogen ligand (preferably chlorine ligand), a nitrogen-containing heterocyclic ligand (e.g., phenylpyridine, benzoquinoline, quinolinol, bipyridyl, phenanthroline), a diketone ligand (e.g., acetylacetone), a carboxylic acid ligand (e.g., acetic acid ligand), a carbon monoxide ligand, an isonitrile ligand and a cyano ligand, and more preferable specific examples thereof include a nitrogen-containing heterocyclic ligand.

The complex may contain one transition metal atom in the compound or may be a so-called binuclear complex having two or more transition metal atoms. Also, different metal atoms may be contained therein at the same time.

Among these phosphorescent dopants, specific examples of the luminescent dopant satisfying the relationships of (1) and (2) above include phosphorescent compounds described in U.S. Pat. Nos. 6,303,238 B1, U.S. Pat. No. 6,097,147, WO 00/57676, WO 00/70655, WO 01/08230, WO 01/39234A2, WO 01/41512A1, WO 02/02714A2, WO 02/15645A1, WO 02/44189A1, JP-A Nos. 2001-247859, 2002-117978, 2002-235076, 2002-170684, EP 1211257, JP-A Nos. 2002-226495, 2002-234894, 2001-247859, 2001-298470, 2002-173674, 2002-203678, 2002-203679, the disclosures of which are incorporated by reference herein. Among these, the luminescent dopants satisfying the more preferred relationships of (2) are Ir complexes, Pt complexes, Cu complexes, Re complexes, W complexes, Rh complexes, Ru complexes, Pd complexes, Os complexes, Eu complexes, Th complexes, Gd complexes, Dy complexes and Ce complexes. In particular, Ir complexes, Pt complexes and Re complexes are preferred, and Ir complexes, Pt complexes and Re complexes each containing at least one coordination mode of metal-carbon bond, metal-nitrogen bond, metal-oxygen bond and metal-sulfur bond are more preferred.

Fluorescent Dopant

Examples of the fluorescent dopant in general include benzoxazole, benzimidazole, benzothiazole, styrylbenzene, polyphenyl, diphenylbutadiene, tetraphenylbutadiene, naphthalimide, coumarin, pyran, perynone, oxadiazole, aldazine, pyralidine, cyclopentadiene, bisstyrylanthracene, quinacridone, pyrrolopyridine, thiadiazolopyridine, cyclopentadiene, styrylamine, aromatic dimethylidene compounds, condensed polycyclic aromatic compounds (e.g., anthracene, phenanthroline, pyrene, perylene, rubrene, pentacene), various metal complexes as represented by metal complexes of 8-quinolinol, pyrromethene complexes and rare earth complexes, polymer compounds such as polythiophene, polyphenylene and polyphenylene vinylene, organic silane, and modified compounds thereof.

Among these compounds, specific examples of the luminescent dopant satisfying the relationships of (1) and (2) include the following compounds.

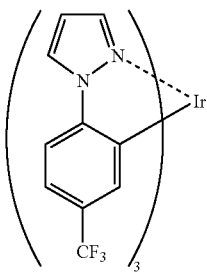

D-1

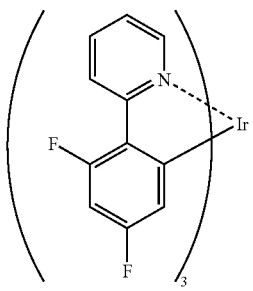

D-2

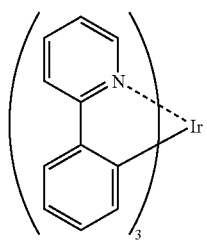

D-3

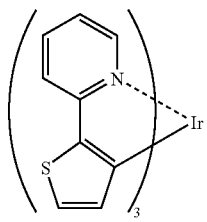

D-4

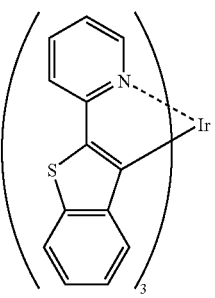

D-5

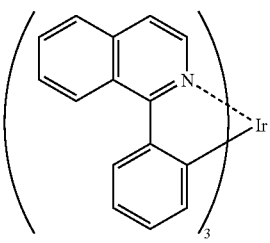

D-6

-continued
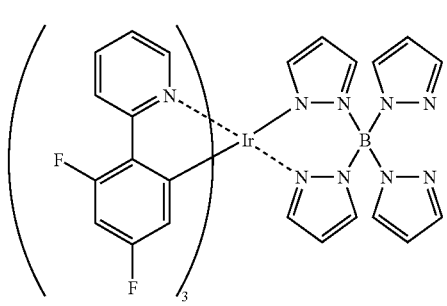
D-9
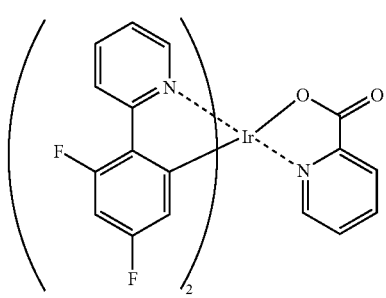
D-10
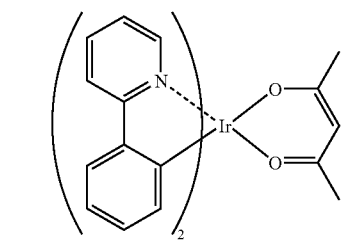
D-11
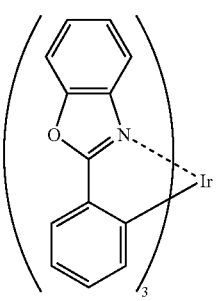
D-12
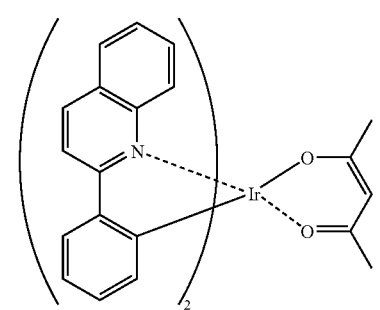
D-13
-continued
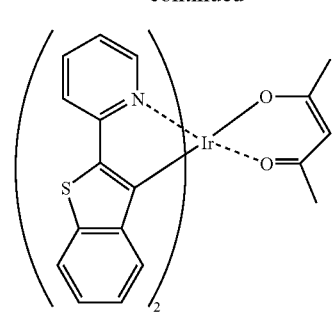
D-14
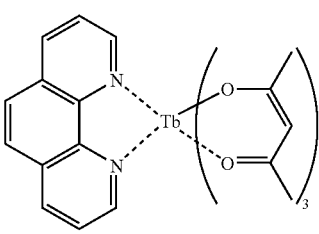
D-19
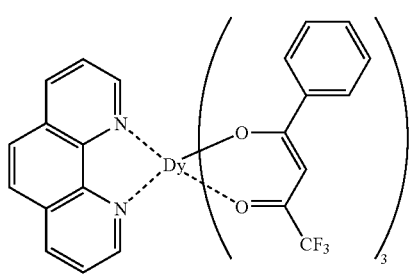
D-20
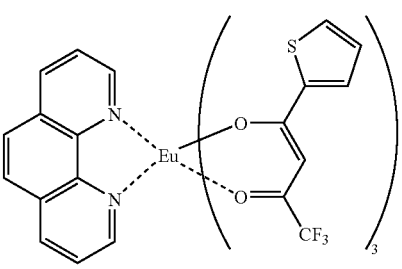
D-21
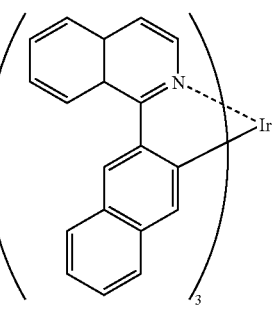
D-23

-continued

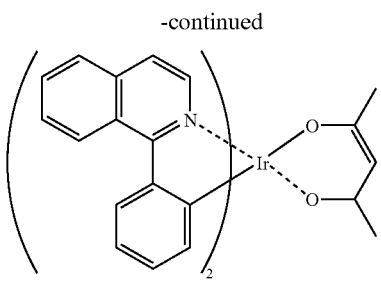

D-24

Among these compounds, the luminescent dopants satisfying the more preferred relationships of (3) and (4) are D-2, D-3, D-4, D-5, D-6, D-9, D-10, D11, D-12, D-13 and D-14.

The luminescent dopant may be contained in the luminescent layer generally in an amount of 0.1 to 20 mass % based on the mass of all compounds constituting the luminescent layer, and in view of durability and light emission efficiency, the luminescent dopant is preferably contained in an amount of 1 to 15 mass %, and more preferably from 2 to 12 mass %.

The luminescent layer of the organic electroluminescent device of the invention contains the metal complex containing a tri- or higher-dentate ligand as the luminescent dopant. When the luminescent layer contains plurality of the luminescent dopants, a total amount of the luminescent dopants is within the above-described ranges.

A thickness of the luminescent layer is not particularly limited. The thickness is generally preferably from 1 nm to 500 nm. In view of light emission efficiency, more the thickness is preferably from 5 nm to 200 nm, and still more preferably from 10 to 100 nm.

Host Compound

The host compound used in the luminescent layer requires to use at least a plurality of host compounds, however, these host compounds are not particularly limited It is preferable that the host compound satisfies at least one of the relationships of (1) $\Delta Ip(=Ip(D)-Ip(H)min)>0$ eV and (2) $\Delta Ea (=Ea)max-Ea(D))>0$ eV are satisfied.

Of these ranges, the host compounds preferably satisfy the relationships of (3) 1.2 eV>$\Delta Ip\geq 0.2$ eV and/or (4) 1.2 eV>$\Delta Ea$>0.2 eV.

The plurality of host compounds may be hole transporting host compounds having excellent hole transporting properties (hole transporting host) or electron transporting host compounds having excellent electron transporting properties (electron transporting host).

Hole Transporting Host

The hole transporting host in the luminescent layer for use in the invention is not particularly limited as long as it is a known hole transporting material. The hole transporting host is selected accounting for the relationship between the luminescent dopant therewith. Preferable examples among those include those satisfying the relationships of (1) $\Delta Ip(=Ip(D)-Ip(H)min)>0$ eV and (2) $\Delta Ea (=Ea(H)max-Ea(D))>0$ eV, and the electron affinity (Ea) thereof is from 1.2 to 4.0 eV, more preferably from 1.2 to 3.4 eV, still more preferably from 1.2 to 3.0 eV, and far more preferably from 1.2 to 2.8 eV in view of durability and color purity.

Similar to the electron affinity (Ea), the ionization potential (Ip) is selected accounting for the relationship between the luminescent dopant therewith. It is preferable that the ionization potential (Ip) is from in a range 5.0 to 6.2 eV, more preferably from 5.1 to 6.1 eV, still more preferably from 5.4 to 6.0 eV, and far more preferably from 5.4 to 5.8 eV in view of durability and color purity.

Specific examples of such a hole transporting host include the following materials:

pyrrole, carbazole, thiazole, oxazole, oxadiazole, imidazole, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidene-based compounds, porphyrin-based compounds, polysilane-based compounds, poly(N-vinylcarbazole), aniline based copolymers, thiophene oligomers, electrically conductive high molecular weight oligomers such as polythiophene, organic silanes, carbon films, and modified compounds thereof.

Among these, preferred as the hole transporting host satisfying the relationships of (3) and (4), and examples thereof include carbazole compounds, aromatic tertiary amine compounds and thiophene compounds, and more preferable examples thereof include those having a plurality of carbazole skeletons and/or aromatic tertary amine skeletons within the molecule.

Specific examples of such a hole transporting host include the following compounds.

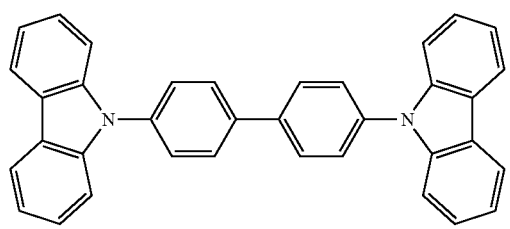

H-1

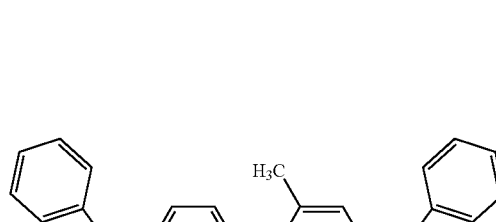

H-2

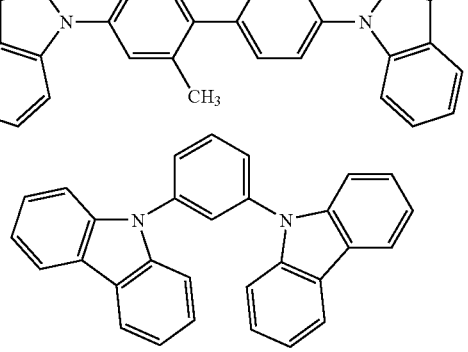

-continued
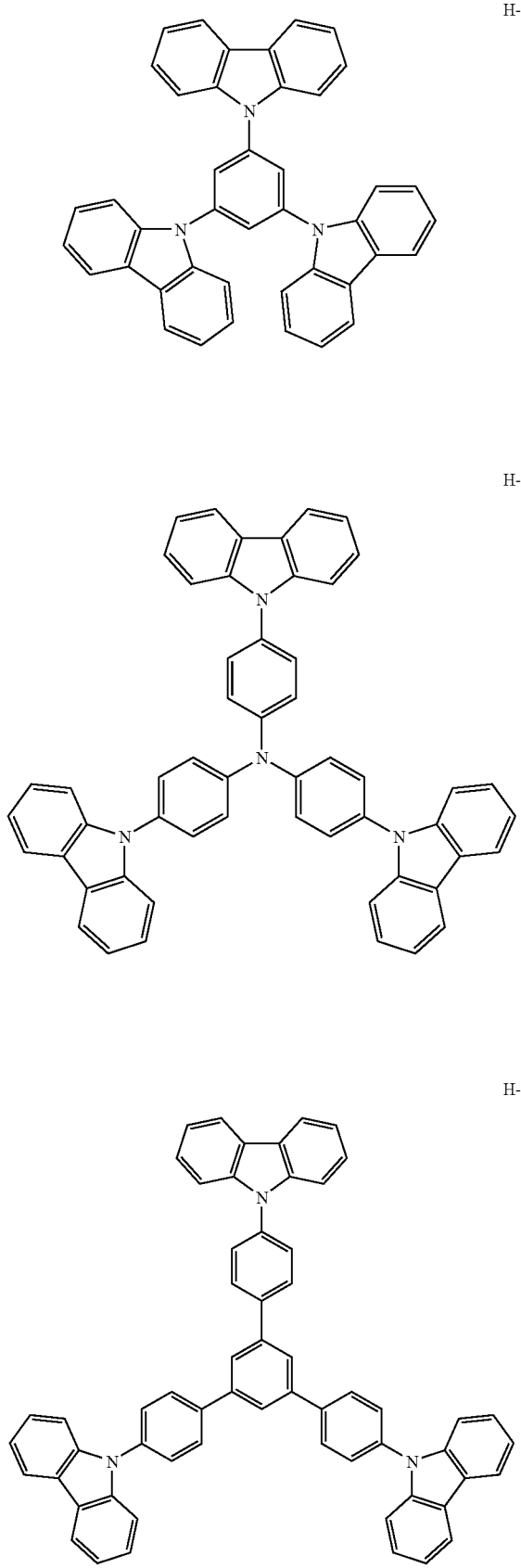
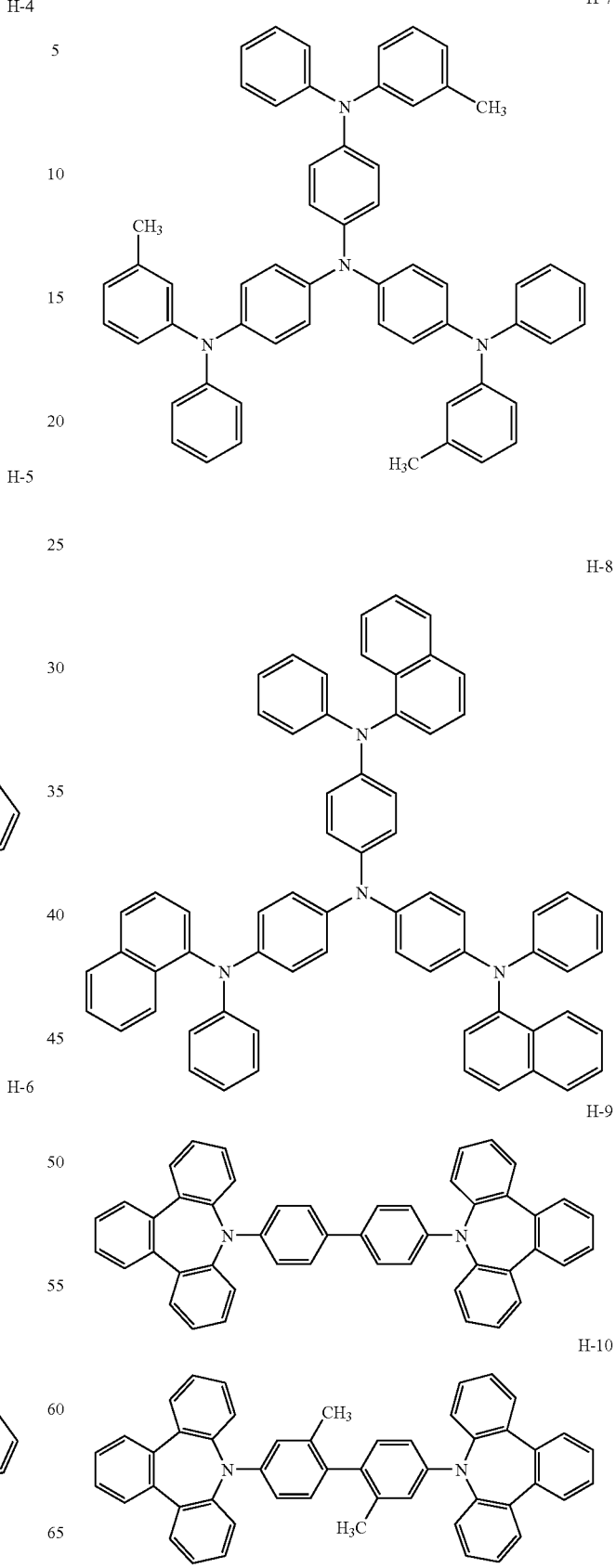

-continued
H-11
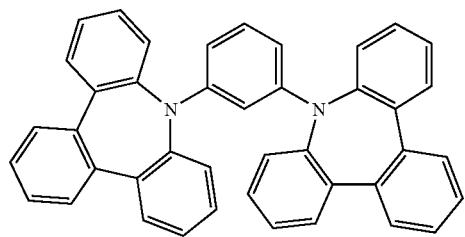
H-12
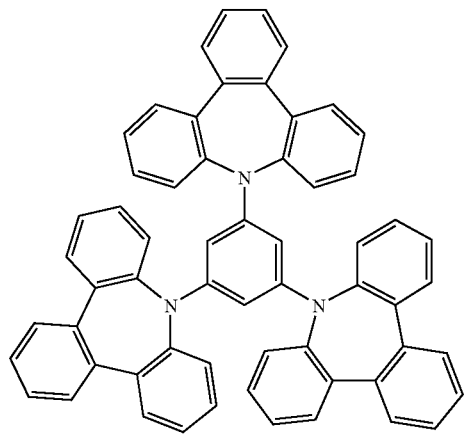
H-13
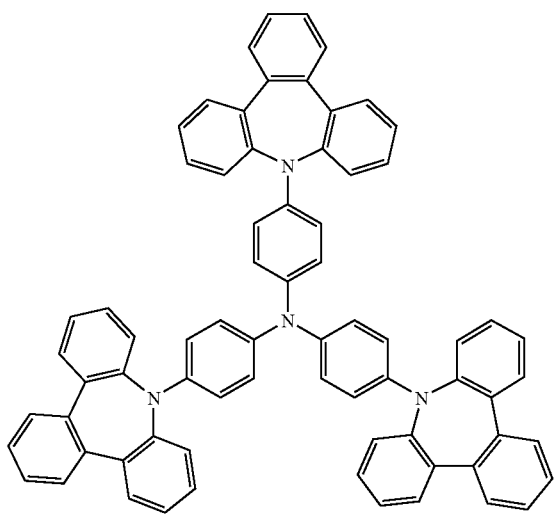
-continued
H-14
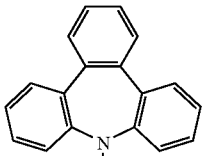
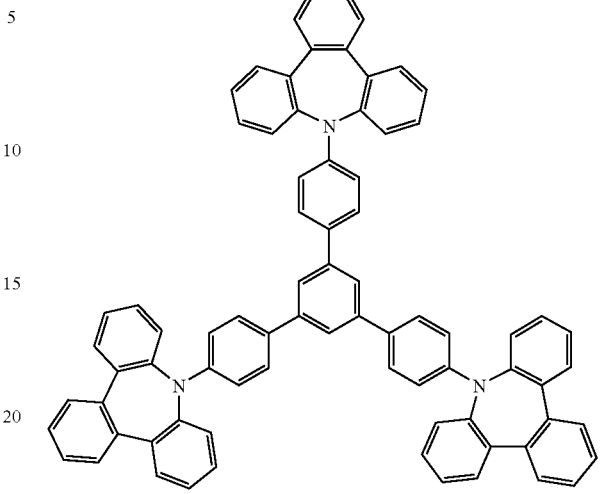
H-15
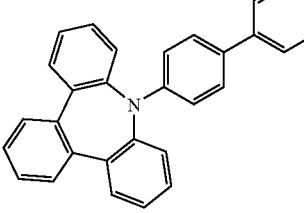
H-16
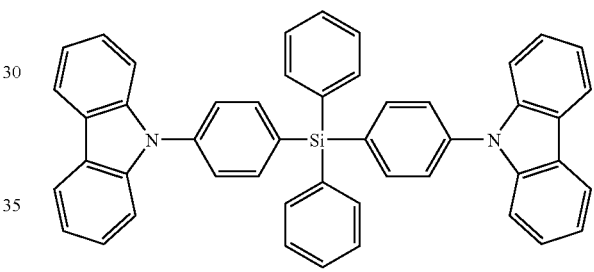
H-17
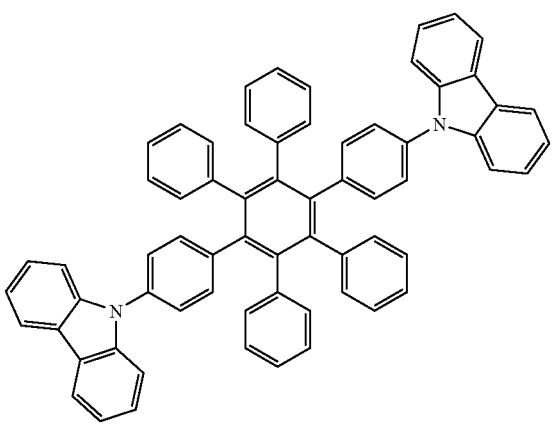

Electron Transporting Host

The electron transporting host in the luminescent layer for use in the invention is not particularly limited insofar as it is a known electron transporting material. The electron transporting host is selected accounting for the relationship between the luminescent dopant therewith. In view of durability and color purity, preferable examples among those include those satisfying at least one of the relationships of (1) and (2). The ionization potential (I) is preferably in a range from 4.6 to 7.5 eV, more preferably in a range from 5.1 to 7.1 eV, further preferably in a range from 5.4 to 7.1 eV.

Similar to the ionization potential (Ip), the electron affinity (Ea) is selected accounting for the relationship between the luminescent dopant therewith. It is preferable that the electron affinity (Ea) is from in a range 2.4 to 3.6 eV, more preferably from 2.6 to 3.4 eV, still more preferably from 2.8 to 3.3 eV, and far more preferably from 2.9 to 3.2 eV in view of durability and color purity.

Specific examples thereof include the following materials: pyridine, pyrimidine, triazine, imidazole, triazole, oxazole, oxadiazole, fluorenone, anthraquinodimethane, anthrone, diphenylquinone, thiopyrandioxide, carbodiimide, fluorenylidenemethane, distyrylpyrazine, fluorine-substituted aromatic compounds, anhydrides or imides of aromatic tetracarboxylic acid (examples of aromatic ring thereof include naphthalene and perylene), anhydrides or imides of aromatic dicarboxylic acid (examples of aromatic ring thereof include benzene and naphthalene), phthalocyanine, modified compounds thereof (which may form a condensed ring with another ring), and various metal complexes as represented by a metal complex of 8-quinolinol compound, metal phthalocyanine and a metal complex which has benzoxazole or benzothiazole as ligands.

Preferable examples among these electron transporting hosts include metal complexes, azole compounds (e.g., a benzimidazole compound, an imidazopyridine compound and the like) and azine compounds (e.g., a pyridine compound, a pyrimidine compound, a triazine compound and the like). In view of durability, metal complex compounds are more preferred in the invention. The metal complex compound is a metal complex in which a ligand containing at least one nitrogen atom, one oxygen atom or one sulfur atom is coordinated to the metal. The metal ion in the metal complex is not particularly limited. It is preferably a beryllium ion, a magnesium ion, an aluminum ion, a gallium ion, a zinc ion, an indium ion or a tin ion, more preferably a beryllium ion, an aluminum ion, a gallium ion or a zinc ion, still more preferably an aluminum ion or a zinc ion.

Various ligands are known as the ligand contained in the metal complex. Examples thereof include the ligands described in H. Yersin, "Photochemistry and Photophysics of Coordination Compounds", Springer-Verlag (1987), and Akio Yamamoto, Yuki Kinzoku Kagaku "Kiso to Oyo (Organic Metal Chemistry—Basics and Applications—)", Shokabo (1982).

Preferable examples of the ligand include: a nitrogen-containing heterocyclic ligand (preferably having from 1 to 30 carbon atoms, more preferably from 2 to 20 carbon atoms, still more preferably from 3 to 15 carbon atoms; this may be a unidentate ligand or a bidentate or greater polydentate ligand, and is preferably a bidentate ligand; and examples thereof include pyridine ligands, bipyridyl ligands, quinolinol ligands and hydroxphenylazole ligands (e.g., a hydroxyphenylbenzimidazole ligand, a hydroxyphenylbenzoxazole ligand, a hydroxyphenylimidazole ligand and the like));

an alkoxy ligand (preferably having from 1 to 30 carbon atoms, more preferably from 1 to 20 carbon atoms, still more preferably from 1 to 10 carbon atoms; and examples thereof include a methoxy ligand, an ethoxy ligand, a butoxy ligand and a 2-ethylhexyloxy ligand);

an aryloxy ligand (preferably having from 6 to 30 carbon atoms, more preferably from 6 to 20 carbon atoms, still more preferably from 6 to 12 carbon atoms; and examples thereof include a phenyloxy ligand, a 1-naphthyloxy ligand, a 2-naphthyloxy ligand, a 2,4,6-methylphenyloxy ligand and a 4-biphenyloxy ligand), a heteroaryloxy ligand (preferably having from 1 to 30 carbon atoms, more preferably from 1 to 20 carbon atoms, still more preferably from 1 to 12 carbon atoms; and examples thereof include a pyridyloxy ligand, a pyrazyloxy ligand, a pyrimidyloxy ligand and a quinolyloxy ligand), an alkylthio ligand (preferably having from 1 to 30 carbon atoms, more preferably 1 to 20 carbon atoms, still more preferably from 1 to 12 carbon atoms; and examples thereof include a methylthio ligand and an ethylthio ligand);

an arylthio ligand (preferably having from 6 to 30 carbon atoms, more preferably 6 to 20 carbon atoms, still more preferably from 6 to 12 carbon atoms; and examples thereof include a phenylthio ligand);

a heteroarylthio ligand preferably having from 1 to 30 carbon atoms, more preferably 1 to 20 carbon atoms, still more preferably from 1 to 12 carbon atoms; and examples thereof include a pyridylthio ligand, a 2-benzimidazolylthio ligand, a 2-benzoxazoylthio ligand and a 2-benzothiazolylthio ligand); and a siloxy ligand (preferably having from 1 to 30 carbon atoms, more preferably from 3 to 25 carbon atoms, still more preferably from 6 to 20 carbon atoms; and examples thereof include a triphenylsiloxy ligand, a triethoxysiloxy ligand and a triisopropylsiloxy ligand).

More preferable examples thereof include a nitrogen containing heterocyclic ligand, an aryloxy ligand, a heteroaryloxy ligand and a siloxy ligand, and still more preferable examples thereof include a nitrogen-containing heterocyclic ligand, an aryloxy ligand and a siloxy ligand.

Specific examples of such an electron transporting host include the following materials.

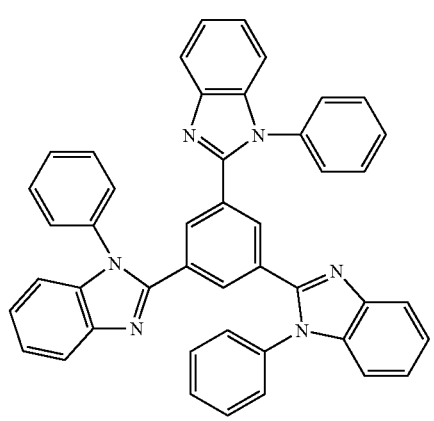

E-1

-continued
E-2
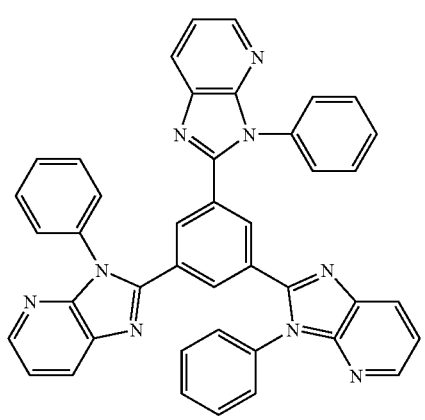
E-3
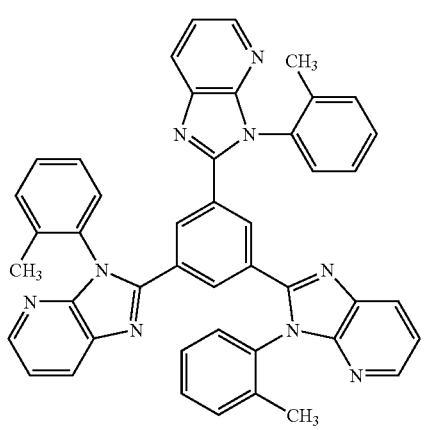
E-4
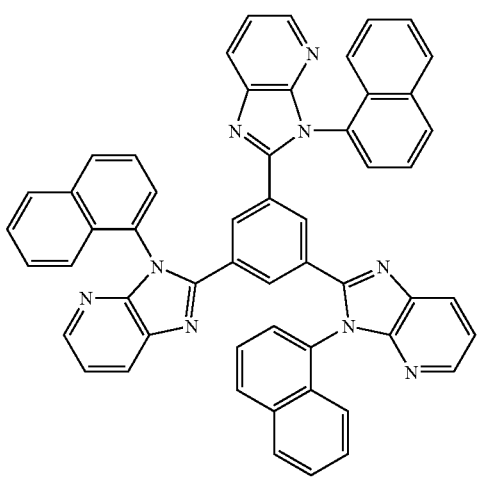
-continued
E-5
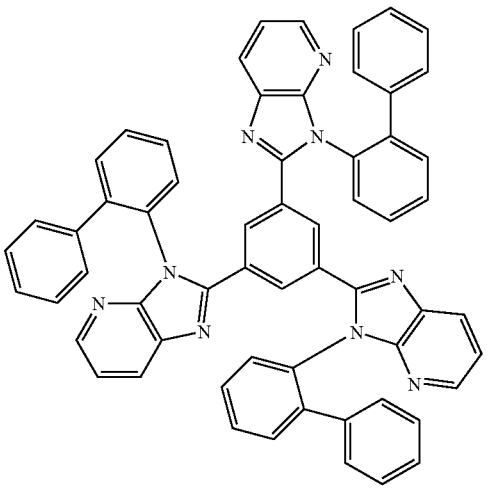
E-6
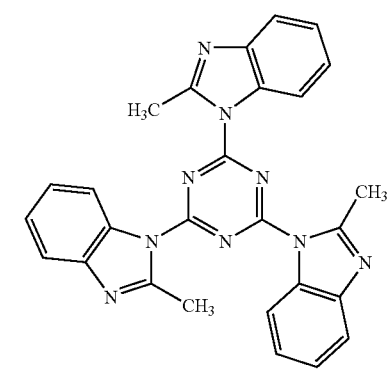
E-7
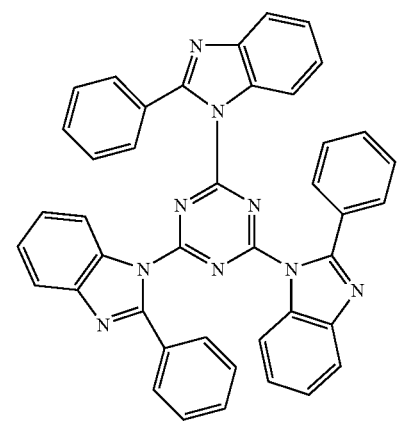
E-8
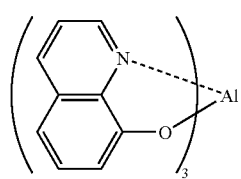

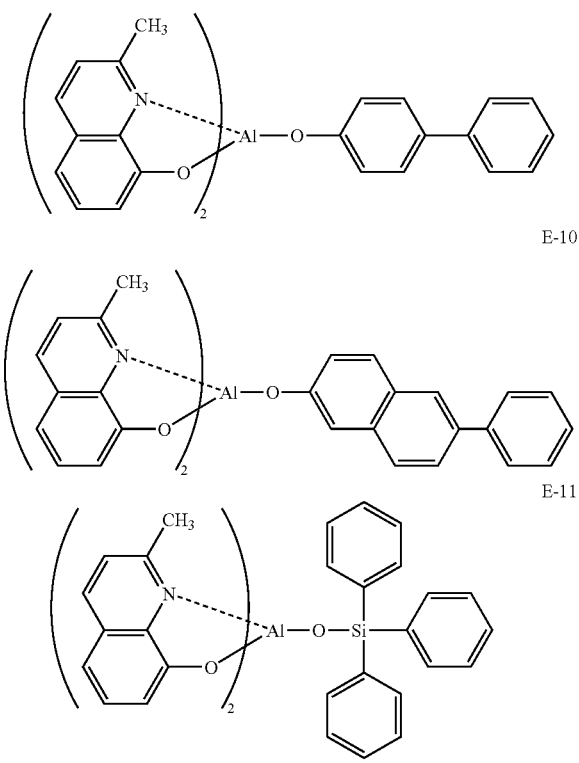

Among these, preferred as the electron transporting host satisfying the relationships of (3) and (4) are E-1 to E-7, and E-3 to E-5 are specifically preferable.

In the luminescent layer used in the invention, when a phosphorescent dopant is used as the luminescent dopant, the minimum triplet excitation energy T1(D) of the phosphorescent dopant and the minimum value $T1(H)_{min}$ out of the minimum triplet excitation energies of the plurality of host compounds preferably satisfy a relationship of $T1(H)_{min}$>T1(D) in view of color purity and light emission efficiency.

A content of each of the plurality of host compounds for use in the invention is not particularly limited. In view of light emission efficiency, driving voltage and driving durability, the content of each of the plurality of host compounds is preferably in a range from 10 to 90 mass %, more preferably in a range from 15 to 85 mass %, and specifically preferably in a range from 20 to 80 mass % based on the mass of all compounds constituting the luminescent layer.

A carrier mobility in the luminescent layer may be generally in a range from $10^{-7}$ to $10^{-1}$ cm$^2$/V/s. In view of light emission efficiency, the carrier mobility is preferably in a range from $10^{-5}$ to $10^{-1}$ cm$^2$/Vs, more preferably in a range from $10^{-4}$ to $10^{-1}$ cm$^2$/Vs, and still more preferably in a range from $10^{-3}$ to $10^{-1}$ cm$^2$/Vs.

In view of driving durability, the carrier mobility in the luminescent layer is preferably smaller than a carrier mobility in the carrier transporting layer, which is described below.

A value obtained by the measurement according to the TOF method (time-of-flight method) is herein used as the carrier mobility.

Hole Ejecting Layer and Hole Transporting Layer

The hole injecting layer and the hole transporting layer each have the function of receiving a hole from an anode or an anode side and of transporting the hole to the cathode side.

Specifically, the hole injecting layer and the hole transporting layer each preferably include, for example, a carbazole compound, a triazole compound, an oxazole compound, an oxadiazole compound, an imidazole compound, a polyarylalkane compound, a pyrazoline compound, a pyrazolone compound, a phenylenediamine compound, an arylamine compound, an amino-substituted compound, a styrylanthracene compound, a fluorenone compound, a hydrazone compound, a stilbene compound, a silazane compound, an aromatic tertiary amino compound, a styrylamine compound, an aromatic dimethylidyne-based compound, a porphiryn-based compound, an organic silane compound, carbon, or the like.

A thickness of the hole injecting layer or the hole transporting layer is not particularly limited. It is preferably in a range from 1 nm to 5 µm, more preferably in a range from 5 nm to 1 µm, and still more preferably in a range from 10 nm to 500 nm.

The hole injecting layer or the hole transporting layer may have a single layer structure comprising one kind or two or more kinds of the aforementioned materials, or may have a multilayer structure comprising a plurality of layers of the same composition or different compositions.

When the carrier transporting layer adjacent to the luminescent layer is a hole transporting layer, in view of driving durability, the Ip(HTL) of the hole transporting layer is preferably smaller than the IP(D) of the dopant contained in the luminescent layer.

The Ip(HTL) of the hole transporting layer can be measured by the above-described measurement method for the Ip.

A carrier mobility in the hole transporting layer may be generally in a range from $10^{-7}$ to $10^{-1}$ cm$^2$/Vs, and in view of light emission efficiency, preferably in a range from $10^{-5}$ to $10^{-1}$ m$^2$/Vs, more preferably in a range from $10^{-4}$ to $10^{-1}$ cm$^2$/Vs, and still more preferably in a range from $10^{-3}$ to $10^{-1}$ cm$^2$/Vs.

A value measured by the same method as the measurement method for the carrier mobility in the luminescent layer is employed as the carrier mobility.

In view of driving durability, the carrier mobility in the hole transporting layer is preferably larger than the carrier mobility in the luminescent layer.

The hole injecting layer or the hole transporting layer of the organic electroluminescent device of the invention may contain an electron-acceptive dopant. Any materials such as an organic compound or an inorganic compound can be used as the electron-acceptive dopant as long as it is electron-acceptive and capable of oxidizing organic compounds, and specific preferable examples thereof among inorganic compounds include Lewis acid compounds such as ferric chloride, aluminum chloride, gallium chloride, indium chloride, antimony pentachloride or the like.

Specific preferable examples thereof among organic compounds include a compound having a nitro group, a halogen, a cyano group, a trifluoromethyl group or the like as a substituent thereof, a quinone compound, an acid anhydride compound, and fullerene.

These electron-acceptive dopant may be used singly or in combination of two or more thereof An amount of the electron-acceptive dopant used in the hole injecting layer or the hole transporting layer may vary depending on a material thereof. It is preferably in a range of 0.01 to 50% by mass, more preferably in a range of 0.05 to 20% by mass, and further preferably in a range of 0.1 to 10% by mass relative to materials constituting the hole transporting layer.

Electron Injecting Layer and Electron Transporting Layer

The electron injecting layer and the electron transporting layer are each a layer having any one function of receiving an electron from the cathode, transporting an electron, and blocking a hole which is injectable from the anode.

Specific examples of the material used for the electron injecting layer and the electron transporting layer include pyridine, pyrimidine, triune, imidazole, triazole, oxazole, oxadiazole, fluorenone, anthraquinodimethane, anthrone, diphenylquinone, thiopyrandioxide, carbodiimide, fluorenylidenemethane, distyrylpyrazine, fluorine-substituted aromatic compounds, anhydrides or imides of aromatic tetracarboxylic acid (examples of aromatic ring thereof include naphthalene and perylene), anhydrides or imides of aromatic dicarboxylic acid (examples of aromatic ring thereof include benzene and naphthalene), phthalocyanine, modified compounds thereof (may form a condensed ring with another ring), and various metal complexes as represented by a metal complex of 8-quinolinol compound, metal phthalocyanine and a metal complex with the ligand being benzoxazole or benzothiazole.

The electron injecting layer and the electron transporting layer are not particularly limited in their thickness. From the standpoint of decreasing the driving voltage, the thickness is usually preferably in a range from 1 nm to 5 µm, more preferably in a range from 5 nm to 1 µm, and still more preferably in a range from 10 nm to 500 nm.

The electron injecting layer and the electron transporting layer each may have a single-layer structure comprising one kind or two or more kinds of the above-described materials or may have a multilayer structure comprising a plurality of layers having the same composition or differing in composition.

When the carrier transporting layer adjacent to the luminescent layer is an electron transporting layer, in view of driving durability, the Ea(ETL) of the electron transporting layer is preferably larger Man the Ea(D) of the dopant contained in the luminescent layer.

A value measured by the same method as the above-described measurement method for the Ea is employed as the Ea(ETL).

The carrier mobility in the electron transporting layer may be generally in a range from $10^{-7}$ to $10^{-1}$ cm$^2$/Vs and in view of light emission efficiency, preferably in a range from $10^{-5}$ to $10^{-1}$ m$^2$/Vs, more preferably in a range from $10^{-4}$ to $10^{-1}$ cm$^2$/Vs, and still more preferably in a range from $10^{-3}$ to $10^{-1}$ cm$^2$/Vs.

In view of driving durability, the carrier mobility in the electron transporting layer is preferably larger than the carrier mobility in the luminescent layer. The carrier mobility here is measured by the same method as that for the carrier mobility in the hole transporting layer.

With respect to the carrier mobility of the light-emitting element of the invention, in view of driving durability, the carrier mobility among the hole transporting layer, the electron transporting layer and the luminescent layer preferably satisfy a relationship of (electron transporting layer≧hole transporting layer)>luminescent layer.

The electron injecting layer or the electron transporting layer of the organic electroluminescent device of the invention may contain an electron-donative dopant. Any materials such as an organic compound or an inorganic compound can be used as the electron-donative dopant as long as it is electron-donative and capable of reducing organic compounds, and specific preferable examples thereof include alkali metals such as lithium, alkaline earth metals such as magnecium, transition metals including rare earth metals, redictive organic compounds and the like. Preferable examples of a metal which can be used as the electron-donative dopant include those having work function of 4.2 eV or less, and specific examples thereof include Li, Na, K, Be, Mg, Ca, Sr, Ba, Y, Cs, La, Sm, Gd and Yb. Examples of a reductive organic compound include a nitrogen-containing compound, a sulfur-containing compound and a phosphor-containing compound.

These electron-donative dopant may be used singly or in combination of two or more thereof. An amount of the electron-donative dopant used in the electron injecting layer or the electron transporting layer may vary depending on a material thereof. It is preferably in a range of 0.1 to 99% by mass, more preferably in a range of 1.0 to 80% by mass, and further preferably in a range of 2.0 to 70% by mass relative to materials constituting the electron transporting layer.

Hole Blocking Layer

The hole blocking layer is a layer having a function of preventing a hole which is transported from the anode side to the luminescent layer, from passing through to the cathode side. In the invention, the hole blocking layer can be provided as an organic compound layer adjacent to the luminescent layer on the cathode side.

The hole blocking layer is not particularly limited. Specific examples of materials which may be comprised therein include an aluminum complex (e.g., BAlq), a triazole compound, a pyrazole compound and the like.

In order to decrease the driving voltage, a thickness of the hole blocking layer is generally preferably 50 nm or less, more preferably from 1 to 50 nm, and still more preferably from 5 to 40 nm.

Anode

The anode may usually serve as an electrode that supplies holes to the organic compound layer. A shape, structure, size and the like thereof are not particularly limited and can be appropriately selected from well known electrodes depending on the applications and purposes of the luminescent device. As mentioned supra, the anode is usually formed as a transparent anode.

Preferable examples of the material of the anode that are suitable include metals, alloys, metal oxides, electric conductive organic compounds and mixtures thereof. It is preferable that the material of the anode have a work function of 4.0 eV or more. Specific examples the material of the anode include electric conductive metal oxides such as tin oxides doped with antimony or fluorine (ATO, FTO), tin oxide, zinc oxide, indium oxide, indium tin oxide (ITO), and indium zinc oxide (IZO); metals such as gold, silver, chromium, and nickel; mixtures or laminates of these metals and electric conductive metal oxides; electric conductive inorganic substances such as copper iodide and copper sulfate; electric conductive organic materials such as polyaniline, polythiophene, and polypyrrole; laminates and the like of these and ITO. Among them, the material of the anode is preferably an electric conductive metal oxide, and more preferably ITO from the viewpoint of productivity, high electric conductivity, transparency and the like.

An anode can be formed on the above-described substrate in accordance with a method selected, as appropriate, in consideration of its suitability to the materials constituting the above-described anode, from wet methods such as the printing method and the coating method, physical methods such as the vacuum deposition method, the sputtering method and the ion plating method, chemical methods such as CVD and the plasma CVD method, and the like. For instance, when ITO is selected as the material of the anode, the formation of the anode can be carried out according to the direct current or high-frequency sputtering method, the vacuum deposition method, the ion plating method or the like.

In the organic electroluminescent device of the invention, the position of the anode to be formed is not particularly limited and can be appropriately selected depending on the applications or purposes of the luminescent device. The anode may be formed on the entire surface of one side of the substrate, or may also be formed on a portion thereof.

Patterning for forming the anode may be carried out by chemical etching such as photolithography, or may also be carried out by physical etching such as by means of a laser, or may also be carried out by vacuum deposition or sputtering after placing a mask, or may also be carried out by a lift-off method or a printing method.

A thickness of the anode can be appropriately selected depending on the material constituting the above-described anode. It is usually from 10 nm to 50 µm, and is preferably from 50 nm to 20 µm.

A resistance value of the anode is preferably $10^3 \Omega$/sq or less, and more preferably $10^2 \Omega$/sq or less. When the anode is a transparent anode, the anode may be colorless transparent or may also be colored transparent. In view of extracting light emission from a transparent anode side, the transmittance is preferably 60% or more, and more preferably 70% or more.

Additionally, transparent anodes which can be applied to the invention are described in detail in "Tohmeidodenmaku No Shintenkai (Developments of Transparent Conductive Films)" edited by Yutaka Sawada, published by CMC (1999). When a plastic substrate of low heat resistance is used, and a transparent anode that employs ITO or IZO and is film formed at a low temperature of 150° C. or less is preferably used.

Cathode

The cathode may usually serve as an electrode that injects an electron to an organic compound layer. A shape, structure, size and the like are not particularly limited and can be appropriately selected from well known electrodes depending on the applications and purposes of the luminescent device.

Examples of the material of the cathode include metals, alloys, metal oxides, electric conductive compounds and mixtures thereof. It is preferable that the material of the cathode has a work function of 4.5 eV or less. Specific examples thereof include alkali metals (e.g., Li, Na, K, Cs and the like), alkali earth metals (e.g., Mg, Ca, and the like), gold, silver, lead, aluminum, sodium-potassium alloy, lithium-aluminum alloy, magnesium-silver alloy, indium, rare earth metals such as ytterbium and the like. These may be used singly and can be used in combination of two or more kinds from the standpoint of compatibility between stability and electron injection properties.

Among them, preferable examples of the material of the cathode include alkali metals and alkali earth metals in terms of electron injection properties. Specifically, a material primarily made of aluminum are preferable in terns of excellent shelf life.

The scope of the material primarily made of aluminum as used herein includes aluminum alone, an alloy of aluminum and a 0.01 to 10% by mass alkali metal or alkali earth metal, and a mixture thereof (e.g., lithium-aluminum alloy, magnesium-aluminum alloy, and the like).

In addition, details of materials of the cathode are described in JP-A Nos. 2-15595 and 5-121172, the disclosures of which are incorporated by reference herein, and the materials described in these gazettes can also be applied to the invention.

Methods for forming the cathode are not particularly limited and can be carried out in accordance with well known methods. For example, a cathode can be formed in accordance with a method selected, as appropriate, in consideration of its suitability to the materials constituting the above-described cathode, from wet methods such as the printing method and the coating method; physical methods such as the vacuum deposition method, the sputtering method and the ion plating method, chemical methods such as CVD and the plasma CVD method; and the like. For example, when metals and the like are selected as materials of the cathode, the formation can be carried out with one kind thereof or two or more kinds thereof at the same time or one by one in accordance with the sputtering method or the like.

The patterning for forming the cathode may be carried out by chemical etching such as photolithography, or may also be carried out by physical etching such as by means of a laser, or may also be carried out by vacuum deposition or sputtering after placing a mask, or may also be carried out by the lift-off method or the printing method.

In the invention, the position of a cathode to be formed is not particularly limited and may be formed on the entire organic compound layer, or may also be formed on a portion thereof.

Also, a dielectric layer with a thickness of 0.1 nm to 5 nm made of a fluoride or an oxide of an alkali metal or an alkali earth metal, or the like, may be inserted between the cathode and the organic compound layer. This dielectric layer can be considered to be a kind of electron injecting layer. The dielectric layer can be formed by, for example, a vacuum deposition method, a sputtering method, an ion plating method or the like.

The thickness of a cathode can be selected, as appropriate, depending On the material constituting the above-described cathode, cannot be unconditionally specified, while it may be normally from 10 nm to 5 µm, and is preferably from 50 nm to 1 µm.

The cathode may be transparent or may be opaque. A transparent cathode can be formed by a process that involves thinly film-forming the material constituting the above-described cathode to a thickness of from 1 to 10 nm, and then laminating thereon a transparent, electric conductive material of the aforementioned ITO, IZO, or the like.

Substrate

A substrate can be used in the invention The substrate to be used in the invention is preferably a substrate that does not scatter or attenuate light emitted from an organic compound layer. Specific examples of the substrate include inorganic materials such as Yttria-stabilized Zirconia (YSZ) and glass; polyesters such as polyethylene terephthalate, polybutylene phthalate, and polyethylene naphthalate; and organic materials such as polystyrene, polycarbonate, polyether sulfone, polyallylate, polyimides, polycycloolefins, norbornene resin, and poly(chlorotrifluoroethylene).

When the substrate is made of glass, the glass is preferably alkali-free glass in order to reduce ions deriving from the glass. When the substrate is made of soda lime glass, the substrate is preferably coated with a barrier coating such as silica When an organic material is used, the material is preferably excellent in heat resistance, dimension stability, solvent resistance, electric insulation and processability.

A shape, structure, size and the like of the substrate are not particularly limited and can be selected as appropriate depending on the applications, purposes and the like of a luminescent device. In general, the shape is preferably plate-shaped. The structure of the substrate may be a single-layer structure or may also be a laminated structure. The substrate may be fabricated with a single member or may also be formed with two or more members.

The substrate may be colorless transparent or may be colored transparent, and is preferably colorless transparent in terms of no scattering or attenuation of the light emitted from the luminescent layer.

A moisture penetration prevention layer (gas barrier layer) can be formed on a surface or a back (the aforementioned transparent electrode side) of the substrate. Materials for the moisture penetration prevention layer (gas barrier layer) that are suitably used include inorganic substances such as silicon nitrate or silicon oxide. The moisture penetration prevention layer (gas barrier layer) can be formed by, for example, a radio-frequency (high-frequency) sputtering process or the like.

When a thermoplastic substrate is used as the substrate, the substrate may be further equipped with a hard coat layer or an undercoat layer as required.

Protective Layer

In the invention, the whole organic electroluminescent device may be protected by a protective layer.

Any material may be contained in the protective layer insofar as it has the ability to prevent intrusions of materials, such as water or oxygen, which promote the deterioration of the element, into the device.

Specific examples of the material of the protective layer include metals such as In, Sn, Pb, Au, Cu, Ag, Al, Ti or Ni; metal oxides such as MgO, SiO, $SiO_2$, $Al_2O_3$, GeO, NiO, CaO, BaO, $Fe_2O_3$, $Y_2O_3$, or $TiO_2$; metal nitrates such as SiNx or $SiN_xO_y$; metal fluorides such as $MgF_2$, LiF, $AlF_3$ or $Ca_2$; polyethylene, polypropylene, polymethylmethacrylate, a polyimide, polyurea, polytetrafluoroethylene, polychlorotrifluoroethylene, polydichlorodifluoroethylene and copolymers of chlorotrifluoroethylene and dichlorodifluoroethylene; copolymers obtained by copolymerization of a monomer mixture including tetrafluoroethylene and at least one kind of comonomer; fluorine-containing copolymers having a ring structure on the copolymer backbone thereof; water absorptive materials having a water absorption of 1% or more; moisture-proof materials having a water absorption of 0.1% or less; and the like.

A process for forming the protective layer is not particularly limited. Examples of a method that can be used include a vacuum deposition process, a sputtering process, a reactive sputtering process, a MBE (molecular beam epitaxy) process, a cluster ion beam process, a ion plating process, a plasma polymerization process (the high-frequency excited ion plating process), a plasma CVD process, a laser CVD process, a thermal CVD process, a gas source CVD process, a coating process, a printing process, and a transfer process.

Sealing

Furthermore, in the organic electroluminescent device of the invention, the entire device may be sealed by a sealing container.

Also, a space between the sealing container and the luminescent device may be filled with a moisture absorbent or an inert liquid. The moisture absorbent is not particularly limited. Specific examples of the moisture absorbent include barium oxide, sodium oxide, potassium oxide, calcium oxide, sodium sulfate, calcium sulfate, magnesium sulfate, phosphorus pentaoxide, calcium chloride, magnesium chloride, copper chloride, cesium fluoride, niobium fluoride, calcium bromide, vanadium bromide, a molecular sieve, zeolite, magnesium oxide, and the like. An inert liquid is not particularly limited and the examples include paraffins, liquid paraffins, fluorine-based solvents such as perfluoroalkanes, perfluoroamines or perfluoroethers, chlorine-based solvents, and silicone oils.

In the organic electroluminescent device of the invention, a direct current (which, if desired, may contain an alternating current component) voltage (usually in a range of 2 to 15 V) or a direct current is applied between the anode and the cathode, whereby light emission can be obtained.

In the invention, the driving durability of the organic electroluminescent device can be measured by a brightness half-life time at a specific brightness. For example, a direct current voltage is applied to the organic electroluminescent device to cause light emission by using a source measure unit (trade name: MODEL 2400, manufactured by Keithley Instruments Inc.), a continuous driving test is performed under a condition of an initial brightness being 2,000 $cd/m^2$, the time period until the brightness decreases to 1,000 $cd/m^2$ is determined as the brightness half-life time $T(½)$, and this brightness half-life time is compared with that of a conventional luminescent device. The numerical value thus obtained is used as the brightness half-life time in the invention.

An important characteristic value of the organic electroluminescent device is its external quantum efficiency. The external quantum efficiency is calculated according to an equation of: "external quantum efficiency $\Phi$=(number of photons released from element)/(number of electrons injected to element)". The larger this value, the more advantageous the element is in view of electric power consumption.

The external quantum efficiency of the organic electroluminescent device is also determined according to "external quantum efficiency $\Phi$=internal quantum efficiency×light extraction efficiency". In the organic electroluminescent device utilizing fluorescence emitted from an organic compound, the limit value of internal quantum efficiency is 25%, the light extraction efficiency is about 20% and, therefore, the limit value of the external quantum efficiency is considered to be about 5%.

The external quantum efficiency of the element is preferably 6% or more, and more preferably 12% or more, because reduction in the power consumption and elevation of the driving durability can thus be realized.

A maximum value of external quantum efficiency when the element is driven at 20° C., or a value of external quantum efficiency in the vicinity of 100 to 300 $cd/m^2$ (preferably 200 $cd/m^2$) when the element is driven at 20° C., can be used as for the numerical value of the external quantum efficiency.

In the invention, the external quantum efficiency obtained as follows may be used: a constant direct current voltage is applied to an electroluminescent device to cause light emission by using a source measure unit (trade name: MODEL 2400, described above), a brightness is measured by using a brightness meter (trade name: BM-8, manufactured by Topcon Corporation), a external quantum efficiency at 200 $cd/m^2$ is calculated, and the value thus obtained is used.

The external quantum efficiency of the luminescent device can also be calculated from the measured values of light emission brightness, light emission spectrum and current density, and the relative luminosity curve. More specifically, a number of electrons input can be calculated by using a current density value. Then, the light emission brightness can be converted into a number of photons which are emitted as light by integral computation using the light emission spectrum and relative luminosity curve (spectrum), and from the values obtained, the external quantum efficiency (%) can be calculated according to an equation of: "(number of photons which are emitted as light/number of electrons input into element)×100".

Examples of a method for driving the organic electroluminescent device of the invention include those described in JP-A Nos. 2-148687, 6-301355, 5-29080, 7-134558, 8-234685 and 8-241047, Japanese Patent No. 2784615, U.S. Pat. Nos. 5,828,429 and 6,023,308 and the like.

The organic electroluminescent device of the invention can be suitably used in the fields of display devices, displays, backlights, electrophotography, light sources for illumination, light sources for recording, light sources for exposure, light sources for reading, signs, sign boards, interiors, optical communications, and the like.

EXAMPLES

Hereinafter, the organic EL device of the present invention is specifically described with reference to Examples. However, the Examples should not be construed as limiting the invention.

Example 1

On a 2.5 cm-square glass substrate with a thickness of 0.7 mm, an ITO thin film (thickness: 0.2 μm) was formed as a transparent anode by DC magnetron sputtering (conditions: substrate temperature of 100° C., oxygen pressure of $1\times10^{-3}$ Pa) using an ITO target having an $In_2O_3$ content of 95 mass %. The surface resistance of the ITO thin film was 10 Ω/square.

The substrate having the transparent anode formed thereon was placed in a washing vessel and subjected to IPA washing and then to UV-ozone treatment for 30 minutes. On this transparent anode, copper phthalocyanine was deposited at a rate of 0.5 nm/sec by a vacuum deposition method to provide a hole injecting layer of 10 nm.

Further, 4,4',4"-tris(2-methylphenylphenylamino)triphenylamine (m-MTDATA) was deposited on this hole injecting layer at a rate of 0.5 nm/sec by a vacuum deposition method to provide a hole transporting layer of 40 nm.

Further, the compound H-5, the compound E-3, and a platinum complex EM-1 (a metal complex having a tetra dentate ligand) shown below were co-deposited on this hole transporting layer as a hole transporting host material in the luminescent layer, an electron transporting host material in the luminescent layer, and a luminescent material, respectively, at a weight ratio of 50/42/8 by a vacuum deposition method to obtain a layer having a thickness of 30 nm.

On the luminescent layer, $BAlq_2$ was deposited as an electron transporting material in the electron transporting layer at a rate of 0.5 nm/sec by a vacuum deposition method so as to be a layer thickness thereof became 10 nm, and further, $Alq_3$ was deposited as an electron transporting material at a rate of 0.2 nm/sec by a vacuum deposition method, so as to provide an electron transporting layer having a thickness of 35 nm.

On this electron transporting layer, a patterned mask with a square opening to give a light-emitting area of 2 mm×2 mm was placed, and lithium fluoride was deposited by a vacuum deposition method so as to have a thickness of 1 nm, and filter, an aluminum was deposited thereon by a vacuum deposition method so to have a thickness of 0.15 μm so as to provide a cathode.

An aluminum lead wire was connected to each of the anode and the cathode provided above, whereby a luminescence stacked body was formed.

The thus obtained light-emitting stacked body was placed in a glove box purged with an argon gas, and then sealed by using a stainless steel-made sealing can having a desiccant provided therein as well as an ultraviolet-curable adhesive (trade name: XNR5516HV, produced by Nagase ChemteX Corporation) to obtain a luminescent device of the invention.

The operation from the vapor deposition of copper phthalocyanine to the sealing was performed in vacuum or in a nitrogen atmosphere to produce the element without any exposure to air.

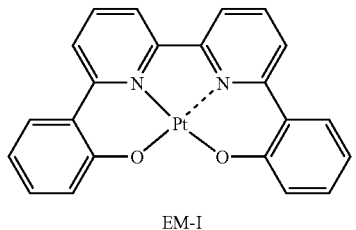

EM-1

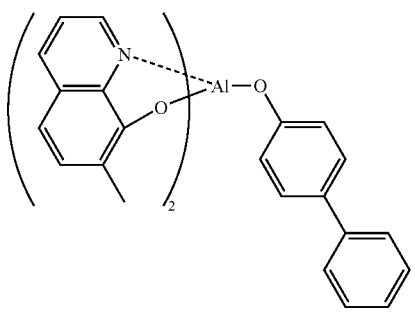

$BAlq_2$

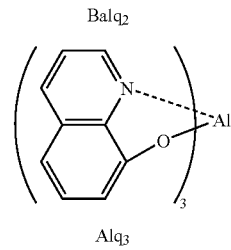

$Alq_3$

Evaluation

The ionization potential (Ip) and the electron affinity (Ea) of each of the hole injecting layer, the hole transporting layer, the hole transporting material in the hole transporting layer, the hole transporting host material in the luminescent layer, the electron transporting host material in the luminescent layer, the electron transporting layer, and the electron transporting material in the electron transporting layer were measured by the following method in terms of a single layer film (independent layer). The results obtained are shown in Table I below.

Ionization Potential (Ip)

The ionization potential (Ip) was measured by an ultraviolet photoelectron analyzer (trade name: AC-1, manufactured by Riken Keiki Co., Ltd.).

Electron Affinity (Ea)

The electron affinity (a) was obtained as follows: calculating the band gap from the absorption spectrum of the single layer film and then calculating the electron affinity (Ea) from the values of the calculated band gap and the above ionization potential (Ip).

Using the luminescent device obtained above, the external quantum efficiency was measured by the following method.

External Quantum Efficiency

The waveform of the light emission spectrum of the produced luminescent device was measured by using a multichannel analyzer (trade name: PMA-11, manufactured by Hamamatsu Photonics K.K). Based on the measured data, the wavelength value at the light emission peak was determined. Thereafter, the external quantum efficiency was calculated from the measured waveform of the light emission spectrum and the current and brightness (200 cd/m$^2$) at the measurement, and evaluated according to the following criteria The results are shown in Table 1 below.

Evaluation Criteria
  A: 10% or more
  B: 5% or more and less than 10%
  C: 3% or more and less than 5%
  D: less than 3%

Driving Durability Test

A continuous driving test was conducted by applying a direct current voltage to the electroluminescent device to cause light emission by using a source measure unit (trade name: MODEL 2400, described above) so that an initial brightness thereof becomes 300 cd/cm$^2$, and the time period until the brightness decreases to 150 cd/m$^2$ was determined as a brightness half-life time T(½) The brightness half-life time was evaluated according to the following criteria.

Evaluation Criteria
  A: 300 hr or more
  B: 150 hr or more and less than 300 hr
  C: 100 hr or more and less than 150 hr
  D: less than 100 hr Example 2

A luminescent device of Example 2 was obtained and evaluated in the same manner as Example 1, except that the following metal complex EM-2 was used in place of the metal complex EM-1 (luminescent dopant). The results are shown in Table 1 below.

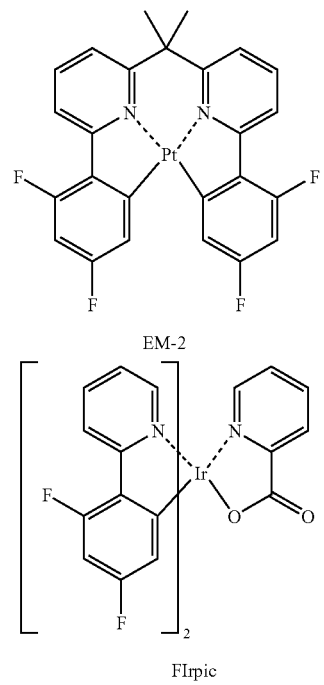

EM-2

FIrpic

Comparative Example 1

A luminescent device of Comparative example 1 was obtained and evaluated in the same manner as Example 1, except that the FIrpic (a metal complex containing a didentate ligand) was used in place of the metal complex EM-1 (a metal complex containing a tetradentate ligand). The results are shown in Table 1 below.

Comparative Example 2

A luminescent device of Comparative example 2 was obtained and evaluated in the same manner as Example 1, except that the electron transporting host material E-3 was not used, and the hole transporting host material H-5 and the metal complex EM-1 (a luminescent dopant) of the invention were co-deposited at a weight ratio of 92/8 by a vacuum deposition method. The results are shown in Table 1 below.

Comparative Example 3

A luminescent device of Comparative example 3 was obtained and evaluated in the same manner as Example 1, except that the hole transporting host material H-5 was not used, and the electron transporting host material E-3 and the metal complex EM-1 (a luminescent dopant) of the invention were co-deposited at a weight ratio of 92/8 by a vacuum deposition method. The results are shown in Table 1 below.

TABLE 1

| | | Example 1 | Example 2 | Comparative Example 1 | Comparative Example 2 | Comparative Example 3 |
|---|---|---|---|---|---|---|
| Hole injecting layer/Hole transporting layer | HIL/HTL | CuPc/m-MTDATA | CuPc/m-MTDATA | CuPc/m-MTDATA | CuPc/m-MTDATA | CuPc/m-MTDATA |
| Light-emitting layer | HTH | H-5 | H-5 | H-5 | H-5 | None |
| | ETH | E-3 | E-3 | E-3 | None | E-3 |
| | Metal complex(D) | EM-1 | EM-2 | FIrpic | EM-1 | EM-1 |
| Electron transporting layer/Electron injecting layer | ETL/EIL | $BAlq_2/Alq_3$ | $BAlq_2/Alq_3$ | $BAlq_2/Alq_3$ | $BAlq_2/Alq_3$ | $BAlq_2/Alq_3$ |
| Ip(D): Ip of Metal complex | | 5.9 eV | 5.9 eV | 5.9 eV | 5.9 eV | 5.9 eV |
| Ip(H)min: Ip of host compound having minimum Ip | | 5.7 eV | 5.7 eV | 5.7 eV | 5.7 eV | 6.3 eV |
| ΔIp: Ip(D) – Ip(H)min | | 0.2 eV | 0.2 eV | 0.2 eV | 0.2 eV | –0.4 eV |
| Ea(H)max: Ea of host compound having maximum Ea | | 3.6 eV | 3.6 eV | 3.6 eV | 2.3 eV | 3.6 eV |
| Ea(D) | | 2.8 eV | 3.1 eV | 3.0 eV | 2.8 eV | 2.8 eV |
| ΔEa: Ea(H)max – Ea(D) | | 0.8 eV | 0.5 eV | 0.6 eV | –0.5 eV | 0.8 eV |
| Ip: Ip of Hole injecting layer (HIL)/Ip of Hole transporting layer (HTL) | | 2.9 eV/3.0 eV | 2.9 eV/3.0 eV | 2.9 eV/3.0 eV | 2.9 eV/3.0 eV | 2.9 eV/3.0 eV |
| Ea: Ea of Electron transporting layer (ETL)/Ea of Electron injecting layer (EIL) | | 5.1 eV/5.1 eV | 5.1 eV/5.1 eV | 5.1 eV/5.1 eV | 5.1 eV/5.1 eV | 51 eV/5.1 eV |
| T1(D): Triplet excitation energy T1 of Metal complex | | 2.03 eV | 2.60 eV | 2.79 eV | 2.26 eV | 2.26 eV |
| T1(H)min: T1 of host compound having minimum triplet excitation energy | | 2.56 eV | 2.56 eV | 2.56 eV | 2.78 eV | 2.56 eV |
| External quantum efficiency | | A | B | C | D | D |
| Durability | | A | A | C | C | D |

As seen in Table 1, Examples 1 and 2, which are within the scope of the luminescent device the invention, the luminescent layers of which contain the metal complex containing a tri- or higher-dentate ligand and plurality of host compounds, are superior to Comparative examples 1 to 3 in both luminescent efficiency and driving durability.

Further, the invention enables to reduce driving voltage, whereby provides a luminescent device having superiority in electrisity consumption.

What is claimed is:

1. An organic electroluminescent device comprising an organic compound layer provided between a pair of electrodes, wherein:
   the organic compound layer comprises a luminescent layer; and
   the luminescent layer comprises: a metal complex and a plurality of host compounds;
   wherein the metal complex is represented by the following Formula (I):

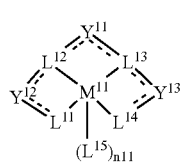

Formula (I)

wherein $M^{11}$ represents a metal ion; $L^{11}$ to $L^{15}$ each independently represent a ligand coordinated to $M^{11}$; in no case does an additional atomic group connect $L^{11}$ and $L^{14}$ to form a cyclic ligand; in no case, $L^{15}$ is bonded to both $L^{11}$ and $L^{14}$ to form a cyclic ligand; $Y^{11}$ to $Y^{13}$ each independently represent a connecting group, a single bond, or a double bond; when $Y^{11}$, $Y^{12}$, or $Y^{13}$ represent a connecting group, the bond between $L^{11}$ and $Y^{12}$, the bond between $Y^{12}$ and $L^{12}$, the bond between $L^{12}$ and $Y^{11}$, the bond between $Y^{11}$ and $L^{13}$, the bond between $L^{13}$ and $Y^{13}$, and the bond between $Y^{13}$ and $L^{14}$ are each independently a single bond or a double bond; and $n^{11}$ represents an integer of 0 to 4;

and wherein an ionization potential of the metal complex (Ip(D)), a minimum value out of ionization potentials of the plurality of host compounds (Ip(H)min), and ΔIp, which is defined by ΔIp=Ip(D)–Ip(H)min, satisfy a relationship of ΔIp>0 eV.

2. The organic electroluminescent device of claim 1, wherein the metal complex is a metal complex capable of obtaining light emission from a triplet exciton.

3. The organic electroluminescent device of claim 1, wherein a relationship of 1.2 eV>ΔIp≧0.2 eV is satisfied.

4. The organic electroluminescent device of claim 1, wherein the Ip(H)min is no less than 5.1 eV, the ionization potential (Ip) is a value determined by measuring a single layer film that is formed on quartz by vacuum-depositing each component at a vacuum degree of $10^{-4}$ Pa so as to have a layer thickness of 100 nm, and the ionization potential (Ip) is defined in terms of a value measured at 25° C. in air by using an ultraviolet photoelectric analyzer.

5. The organic electroluminescent device of claim 1, wherein an electron affinity of the metal complex (Ea(D)), a maximum value out of electron affinities of the plurality of host compounds (Ea(H)max), and ΔEa, which is defined by ΔEa=Ea(H)max–Ea(D), satisfy a relationship of ΔEa>0 eV.

6. The organic electroluminescent device of claim 5, wherein a relationship of 1.2 eV>ΔEa>0.2 eV is satisfied.

7. The organic electroluminescent device of claim 6, wherein the Ea(H)max is no greater than 3.0 eV, the ionization potential (Ip) and the electron affinity (Ea) are values determined by measuring a single layer film that is formed on quartz by vacuum-depositing each component at a vacuum degree of $10^{-4}$ Pa so as to have a layer thickness of 100 nm, the ionization potential (Ip) is defined in terms of a value measured at 25° C. in air by using an ultraviolet photoelectric analyzer, a band gap is calculated from a long wavelength end of an absorption spectrum of the single layer film, and the electron affinity (Ea) is defined by calculation based on the band gap and the ionization potential.

8. The organic electroluminescent device of claim 1, wherein no light emission spectrum component which is unassignable to a light-emission spectrum of a compound contained in the plurality of host compounds is observed in a fluorescent-phosphorescent spectrum of a single layer film formed from only the plurality of host compounds.

9. The organic electroluminescent device of claim 1, wherein the organic compound layer comprises a carrier transporting layer adjacent to the luminescent layer.

10. The organic electroluminescent device of claim 9, wherein the carrier transporting layer is an electron transporting layer, and an electron affinity of the electron transporting layer is larger than an electron affinity of the metal complex in the luminescent layer.

11. The organic electroluminescent device of claim 10, wherein an electron mobility in the electron transporting layer is larger than an electron mobility in the luminescent layer.

12. The organic electroluminescent device of claim 9, wherein the carrier transporting layer is a hole transporting layer, and an ionization potential of the hole transporting layer is smaller than an ionization potential of the metal complex in the luminescent layer.

13. The organic electroluminescent device of claim 12, wherein a hole mobility in the hole transporting layer is larger than a hole mobility in the luminescent layer.

14. The organic electroluminescent device of claim 1, wherein a minimum value out of minimum triplet excitation energies of the plurality of host compounds is larger than a minimum triplet excitation energy of the metal complex in the luminescent layer.

15. The organic electroluminescent device of claim 1, wherein a content of each of the plurality of host compounds is in a range from 15 to 85 mass % based on a mass of all compounds constituting the luminescent layer.

* * * * *